US009005870B2

(12) United States Patent
Takahashi et al.

(10) Patent No.: US 9,005,870 B2
(45) Date of Patent: Apr. 14, 2015

(54) ACTINIC-RAY- OR RADIATION-SENSITIVE RESIN COMPOSITION AND METHOD OF FORMING PATTERN USING THE COMPOSITION

(75) Inventors: Hidenori Takahashi, Haibara-gun (JP); Shuji Hirano, Haibara-gun (JP); Hideaki Tsubaki, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/015,169

(22) Filed: Jan. 27, 2011

(65) Prior Publication Data

US 2011/0183263 A1 Jul. 28, 2011

(30) Foreign Application Priority Data

Jan. 27, 2010 (JP) ................................ 2010-016035

(51) Int. Cl.

| | |
|---|---|
| ***G03F 7/004*** | (2006.01) |
| ***G03F 7/039*** | (2006.01) |
| ***G03F 7/20*** | (2006.01) |

(52) U.S. Cl.

CPC ............ *G03F 7/0045* (2013.01); *G03F 7/0046* (2013.01); *G03F 7/0397* (2013.01); *G03F 7/2041* (2013.01)

(58) Field of Classification Search

USPC ...................................... 430/270.1, 326, 910

See application file for complete search history.

(56) References Cited

U.S. PATENT DOCUMENTS

| | | | | |
|---|---|---|---|---|
| 6,989,224 B2 | 1/2006 | Adams et al. | | |
| 7,026,098 B2 | 4/2006 | Komatsu et al. | | |
| 7,569,326 B2 | 8/2009 | Ohsawa et al. | | |
| 2008/0102407 A1* | 5/2008 | Ohsawa et al. | ............ | 430/286.1 |
| 2009/0202940 A1* | 8/2009 | Hatakeyama et al. | ..... | 430/270.1 |
| 2009/0202943 A1 | 8/2009 | Ohsawa et al. | | |
| 2009/0305161 A1* | 12/2009 | Nakamura et al. | ......... | 430/270.1 |
| 2010/0055608 A1* | 3/2010 | Ohashi et al. | .............. | 430/270.1 |
| 2010/0233617 A1 | 9/2010 | Wada | | |
| 2010/0316955 A1* | 12/2010 | Masunaga et al. | ......... | 430/285.1 |
| 2011/0159433 A1* | 6/2011 | Takahashi et al. | ......... | 430/286.1 |
| 2011/0177453 A1 | 7/2011 | Masubuchi et al. | | |
| 2012/0156618 A1* | 6/2012 | Takahashi et al. | ......... | 430/283.1 |

FOREIGN PATENT DOCUMENTS

| | | |
|---|---|---|
| JP | 2003-233190 A | 8/2003 |
| JP | 2004-158287 A | 6/2004 |
| JP | 2008-133448 A | 6/2008 |
| JP | 2008-162101 A | 7/2008 |
| JP | 2009-093137 A | 4/2009 |
| JP | 2009-211050 A | 9/2009 |
| JP | 2009-217253 A | 9/2009 |
| JP | 2010-095643 A | 4/2010 |

OTHER PUBLICATIONS

Edited by Hirai, Y., Fundamentals of nanoimprint and its technology development/application deployment—technology of nanoimprint substrate and its latest technology deployment—Science and New Technology in Nanoprint, Jun. 2006, Frontier Publishing.

Japanese Office Action issued in corresponding application No. 2011-014691 dated Feb. 18, 2014.

* cited by examiner

*Primary Examiner* — Anca Eoff

(74) *Attorney, Agent, or Firm* — Sughrue Mion, PLLC

(57) ABSTRACT

According to one embodiment, an actinic-ray- or radiation-sensitive resin composition includes a resin (P) containing a repeating unit (A) that when exposed to actinic rays or radiation, is decomposed to thereby generate an acid and at least two types of repeating units B1), (B2) that when acted on by an acid, are decomposed to thereby generate an alkali-soluble group, wherein the alkali-soluble group generated by the repeating unit (B1) is different from the alkali-soluble group generated by the repeating unit (B2).

15 Claims, No Drawings

ACTINIC-RAY- OR RADIATION-SENSITIVE RESIN COMPOSITION AND METHOD OF FORMING PATTERN USING THE COMPOSITION

CROSS-REFERENCE TO RELATED APPLICATIONS

This application is based upon and claims the benefit of priority from prior Japanese Patent Application No. 2010-016035, filed Jan. 27, 2010, the entire contents of which are incorporated herein by reference.

BACKGROUND OF THE INVENTION

1. Field of the Invention

The present invention relates to an actinic-ray- or radiation-sensitive resin composition employed in a semiconductor production process for an IC and the like, a circuit board production process for a liquid crystal, a thermal head and the like and other photofabrication processes, and also relates to a method of forming a pattern with the use of the composition. More particularly, the present invention relates to an actinic-ray- or radiation-sensitive resin composition that is suitable when, for example, far-ultraviolet rays of wavelength 250 nm or shorter, an electron beam or soft X-rays are used as an exposure radiation source, and also relates to a method of forming a pattern with the use of the composition.

2. Description of the Related Art

In recent years, the field of lithographic microfabrication of integrated circuits has seen increased demand for the achievement of ultrafine patterns of the order of tens of nanometers in order to realize high circuit density. This demand has led to a trend toward short-wavelength exposure—for example, from g-rays to i-rays and onward to KrF excimer laser light. At the same time, the development of lithography using an electron beam, X-rays or EUV light in addition to excimer laser light is also advancing.

In the case of microfabrication using a resist composition, not only is this being directly used in the manufacture of integrated circuits but, in recent years, has also been applied to the fabrication of so-called imprint mold structures, etc. (See, for example, patent references 1 and 2, and non-patent reference 1.)

Electron beam lithography in particular is now positioned as the next-generation or a future-generation pattern formation technology. Positive resists of high sensitivity and high resolution are needed for such lithography, increasing the sensitivity being an especially important matter with regard to reducing wafer processing time. However, increasing the sensitivity of positive resists to an electron beam is likely not only to reduce the resolving power but also to increase line edge roughness and degrade iso/dense bias. Thus, there is great demand for the development of resists in which none of these properties is compromised. Line edge roughness refers to the phenomenon wherein the edge at an interface of a resist pattern and substrate irregularly varies perpendicularly to the line because of the characteristics of the resist, so that viewed from above, the pattern edge appears uneven. This unevenness is transferred when etching using the resist as a mask, thereby causing poor electrical properties and hence poor yield. Especially in the ultrafine region of 0.25 μm or less, line edge roughness is now an extremely important area in which to achieve improvement. Iso/dense bias refers to the pattern dimension difference between an area of high resist pattern density and one of low resist pattern density. When this difference is great, the process margin is unfavorably narrow in the actual pattern formation. How to minimize this difference is an important aspect of resist technology development. Since there are trade-offs between high resolution, good pattern configuration, good line edge roughness and good iso/dense bias, how to achieve them all without compromise is a critical issue. This is also the case in lithography using X-rays or EUV light.

As a means for solving these problems, using a resin containing two types of repeating units that, when acted on by an acid, are decomposed to thereby generate an alkali-soluble group is now being studied (see, for example, patent reference 3). However, in the technology disclosed in patent reference 3, use was made of a composition comprising a photoacid generator and a resin containing two types of repeating units that when acted on by an acid, were decomposed to thereby generate an alkali-soluble group, so that it was difficult to simultaneously satisfy the requirements for sensitivity, resolution and line edge roughness in the ultrafine region.

Still further, using a resin containing a photoacid generator in its polymer side chain is being studied (see, for example, patent references 4 and 5). Patent reference 4 discloses a resin containing in its molecule both a photoacid generating group and a group whose solubility in an alkali developer is increased by acid decomposition. However, the sensitivity thereof in the exposure to EB or EUV could hardly be stated as being satisfactory. Patent reference 5 discloses a resin containing a photoacid generator with specified structure in its polymer side chain. However, the invention could not be stated as realizing good iso/dense bias.

As apparent from the above, the current situation is that the prior art technologies known to now cannot simultaneously fully satisfy the requirements for high sensitivity, high resolution, desirable pattern configuration, desirable line edge roughness, desirable iso/dense bias and the like in lithography using an electron beam, X-rays or EUV light.

PRIOR ART REFERENCE

Patent Reference

[Patent reference 1] Jpn. Pat. Appln. KOKAI Publication No. (hereinafter referred to as JP-A-) 2004-158287,

[Patent reference 2] JP-A-2008-162101,

[Patent reference 3] JP-A-2003-233190,

[Patent reference 4] JP-A-2009-93137, and

[Patent reference 5] JP-A-2008-133448.

Non-Patent Reference

[Non-patent reference 1] "Fundamentals of nanoimprint and its technology development/application deployment—technology of nanoimprint substrate and its latest technology deployment" edited by Yoshihiko Hirai, published by Frontier Publishing (issued in June, 2006).

BRIEF SUMMARY OF THE INVENTION

It is an object of the present invention to provide, in view of the above background art, an actinic-ray- or radiation-sensitive resin composition that can simultaneously satisfy the requirements for high sensitivity, high resolution, desirable pattern configuration, desirable line edge roughness (LER) and desirable iso/dense bias in especially lithography using an electron beam, X-rays or EUV light as an exposure radiation source. It is another object of the present invention to provide a method of forming a pattern using the composition.

According to an aspect of embodiments, the present invention is as described below.

(1) An actinic-ray- or radiation-sensitive resin composition comprising a resin (P) containing a repeating unit (A) that when exposed to actinic rays or radiation, is decomposed to thereby generate an acid and at least two types of repeating units (B1),(B2) that when acted on by an acid, are decomposed to thereby generate an alkali-soluble group, wherein the alkali-soluble group generated by the repeating unit (B1) is different from the alkali-soluble group generated by the repeating unit (B2).

(2) The actinic-ray- or radiation-sensitive resin composition according to item (1), wherein the repeating unit (B1) is expressed by general formula (V) below, and the repeating unit (B2) is expressed by general formula (VI) below, (V)

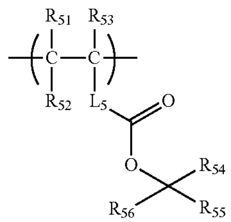

(VI)

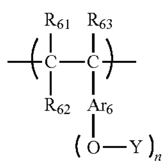

in general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring, which $R_{52}$ represents an alkylene group;

$L_5$ represents a single bond or a bivalent connecting group, provided that when a ring is formed in cooperation with $R_{52}$, $L_5$ represents a trivalent connecting group; and $R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, and provided that $R_{55}$ and $R_{56}$ are not simultaneously hydrogen atoms, and in general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, which $R_{62}$ represents an alkylene group;

$Ar_6$ represents a bivalent aromatic ring group;

Y, or each of Y's independently, represents a hydrogen atom or a group that when acted on by an acid, is cleaved, provided that at least one ofY's is a group that when acted on by an acid, is cleaved; and n is an integer of 1 to 4.

(3) The actinic-ray- or radiation-sensitive resin composition according to item (1) or (2), wherein the resin (P) further comprises a repeating unit (C) containing a group that when acted on by an alkali developer, is decomposed to thereby increase its solubility in the alkali developer.

(4) A resist film produced from the composition according to any one of items (1) to (3).

(5) A method of forming a pattern, comprising forming the actinic-ray- or radiation-sensitive resin composition according to any one of items (1) or (3) into a film, exposing the film and developing the exposed film.

The present invention has made it feasible to provide a pattern formed of an actinic-ray- or radiation-Sensitive resin composition ensuring excellent sensitivity, resolution, pattern configuration, line edge roughness and iso/dense bias in the lithography using an electron beam, X-rays or EUV light as an exposure radiation source.

DETAILED DESCRIPTION OF THE INVENTION

The present invention will be described in detail below.

With respect to the term of a group (atomic group) used in this specification, the term even when there is no mention of "substituted and unsubstituted" encompasses groups not only having no substituent but also having substituents. For example, the term "alkyl groups" encompasses not only alkyls having no substituent (unsubstituted alkyls) but also alkyls having substituents (substituted alkyls).

In the present invention, the terms "actinic rays" and "radiation" mean, for example, brightline spectra from a mercury lamp, far ultraviolet represented by excimer laser, extreme ultraviolet, X-rays, soft X-rays, an electron beam and the like. In the present invention, the term "light" means actinic rays or radiation.

The term "exposure" used in this description, unless otherwise specified, includes not only the exposure to far-ultraviolet radiation represented by an excimer laser or a mercury lamp, X-rays, EUV light and the like but also the lithography by means of particle beams, such as an electron beam or ion beams.

<Resin (P)>

The resin (P) to be contained in the actinic-ray- or radiation-sensitive resin composition of the present invention contains a repeating unit (A) that when exposed to actinic rays or radiation, is decomposed to thereby generate an acid and at least two types of repeating units (B1),(B2) that when acted on by an acid, are decomposed to thereby generate an alkali-soluble group, wherein the alkali-soluble group generated by the repeating unit (B1) is different from the alkali-soluble group generated by the repeating unit (B2).

[Repeating Unit (A)]

It is preferred for the repeating unit (A) to be one that when exposed to actinic rays or radiation, is decomposed to thereby generate an acid anion in a side chain of the resin and that in its one form, contains an aromatic ring in at least the side chain excluding the cation counter to the acid anion.

In particular, it is preferred for the repeating unit (A) to be any of the repeating units of general formulae (I) and (II) below.

(I)

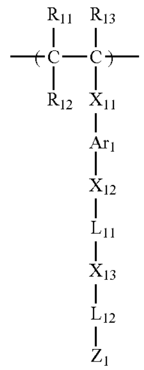

(II)

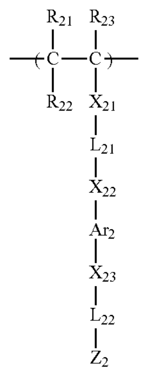

In general formula (I), each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as that mentioned above with respect to $R_{11}$, $R_{12}$ and $R_{13}$.

As the monovalent aliphatic hydrocarbon ring group, there can be mentioned an optionally substituted monocyclic or polycyclic aliphatic hydrocarbon ring group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is most preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{11}$ to $R_{13}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (I), each of $R_{11}$, $R_{12}$ and $R_{13}$ is preferably a hydrogen atom, an alkyl group or a halogen atom. A hydrogen atom, a methyl group, an ethyl group, a trifluoromethyl group (—$CF_3$), a hydroxymethyl group (—$CH_2$—OH), a chloromethyl group (—$CH_2$—Cl) and a fluorine atom (—F) are especially preferred.

Each of $X_{11}$, $X_{12}$ and $X_{13}$ independently represents a single bond, —O—, —S—, —CO—, —$SO_2$—, —NR— (R represents a hydrogen atom or an alkyl group), a bivalent nitrogen-containing nonaromatic heterocyclic group or a group composed of a combination of these.

With respect to —NR—, the alkyl group represented by R is an optionally substituted linear or branched alkyl group. Particular examples thereof are the same as those of the alkyl groups represented by $R_{11}$, $R_{12}$ and $R_{13}$. R is most preferably a hydrogen atom, a methyl group or an ethyl group.

The bivalent nitrogen-containing nonaromatic heterocyclic group refers to a preferably 3- to 8-membered nonaromatic heterocyclic group having at least one nitrogen atom. In particular, there can be mentioned, for example, bivalent connecting groups with the following structures.

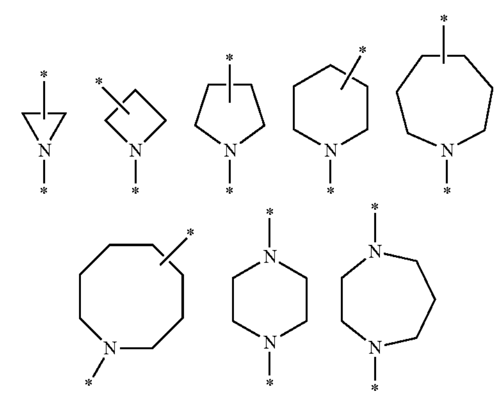

When $X_{11}$ is a single bond, $R_{12}$ may form a ring in cooperation with $Ar_1$, which $R_{12}$ represents an alkylene group. $X_{11}$ is preferably a single bond, —COO— or —CONR— (R represents a hydrogen atom or an alkyl group). A single bond and —COO— are most preferred.

$X_{12}$ is preferably a single bond, —O—, —CO—, —$SO_2$—, —NR— (R represents a hydrogen atom or an alkyl group) or a group composed of a combination of these. $X_{12}$ is most preferably a single bond, —OCO— or —$OSO_2$—.

$X_{13}$ is preferably a single bond, —O—, —CO—, —$SO_2$—, —NR— (R represents a hydrogen atom or an alkyl group) or a group composed of a combination of these. $X_{13}$ is most preferably a single bond, —COO— or —$OSO_2$—.

$L_{11}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these.

The alkylene group represented by $L_{11}$ may be linear or branched. As preferred examples thereof, there can be mentioned, for example, alkylene groups having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group described above in connection with $L_{11}$.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is more preferred.

As the bivalent aromatic ring group, there can be mentioned, for example, an optionally substituted arylene group having 6 to 14 carbon atoms, such as a phenylene group, a tolylene group or a naphthylene group, or a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the —NR— and bivalent nitrogenous nonaromatic heterocyclic group are the same as mentioned above in connection with $X_{11}$. Preferred examples are also the same.

$L_{11}$ is more preferably a single bond, an alkylene group or a bivalent aliphatic hydrocarbon ring group, most preferably a single bond or an alkylene group.

$L_{12}$ represents a single bond, an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these.

Preferably, $L_{12}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group at least partially or entirely substituted with a fluorine atom are especially preferred. $L_{12}$ is most preferably an alkylene group, 30 to 100% of the hydrogen atoms of which are substituted with a fluorine atom.

The alkylene group represented by $L_{12}$ may be linear or branched. As preferred examples thereof, there can be mentioned, for example, alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diadamantanylene group.

Particular examples of the bivalent aromatic ring group are the same as set forth above with respect to the bivalent aromatic ring group as a connecting group represented by $L_{11}$.

Particular examples of the —NR— and bivalent nitrogen-containing nonaromatic heterocyclic group as connecting groups represented by $L_{12}$ are the same as mentioned above in connection with $X_{11}$. Preferred examples are also the same.

Preferred particular examples of $L_{12}$ are shown below, which in no way limit the scope of appropriate $L_{12}$

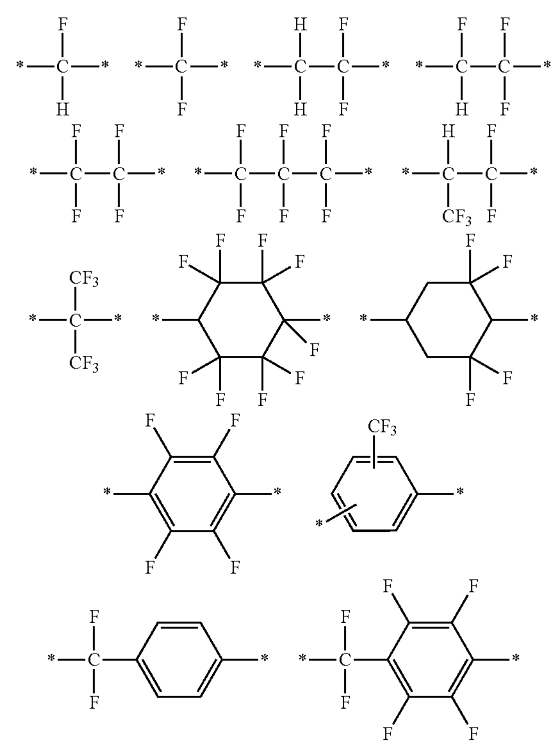

$Ar_1$ represents a bivalent aromatic ring group or a group composed of a combination of a bivalent aromatic ring group and an alkylene group.

A substituent may be introduced in the bivalent aromatic ring group. As preferred examples thereof, there can be mentioned, for example, an arylene group having 6 to 18 carbon atoms, such as a phenylene group, a tolylene group or a naphthylene group; and a bivalent aromatic ring group containing a heteroring, such as thiophene, furan, pyrrole, benzothiophene, benzofuran, benzopyrrole, triazine, imidazole, benzimidazole, triazole, thiadiazole or triazole.

Preferred substituents that can be introduced in these groups are, for example, the alkyl group mentioned in connection with $R_{11}$ to $R_{13}$, an alkoxy group such as a methoxy group, an ethoxy group, a hydroxyethoxy group, a propoxy group, a hydroxypropoxy group or a butoxy group and an aryl group such as a phenyl group.

As a preferred example of the group composed of a combination of a bivalent aromatic ring group and an alkylene group, there can be mentioned an aralkylene group composed of a combination of any of the above-mentioned bivalent aromatic ring groups and, for example, an alkylene group having 1 to 8 carbon atoms (may be linear or branched), such as a methylene group, an ethylene group, a propylene group, a butylene group, a hexylene group or an octylene group.

Preferably, $Ar_1$ is an optionally substituted arylene group having 6 to 18 carbon atoms. A phenylene group, a naphthylene group, a biphenylene group and a phenylene group substituted with a phenyl group are especially preferred.

$Z_1$ represents a moiety that when exposed to actinic rays or radiation, is converted to a sulfonate group, an imidate group or a methide group.

It is preferred for the moiety represented by $Z_1$ to be an onium salt. The onium salt is preferably a sulfonium salt or an iodonium salt. The onium salt preferably has any of the structures of general formulae (ZI) to (ZIII) below.

(ZI)

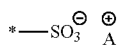

(ZII)

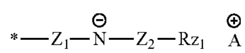

(ZIII)

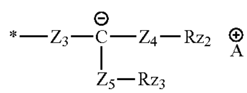

In general formulae (ZII) and (ZIII), each of $Z_1$, $Z_2$, $Z_3$, $Z_4$ and $Z_5$ independently represents —CO— or —$SO_2$—, preferably —$SO_2$—.

Each of $Rz_1$, $Rz_2$ and $Rz_3$ independently represents an alkyl group, a monovalent aliphatic hydrocarbon ring group, an aryl group or an aralkyl group. Forms of these groups having the hydrogen atoms thereof partially or entirely substituted with a fluorine atom or a fluoroalkyl group (especially a perfluoroalkyl group) are preferred. Forms of these groups having 30 to 100% of the hydrogen atoms thereof substituted with a fluorine atom are most preferred.

The above alkyl group may be linear or branched. As a preferred form thereof, there can be mentioned, for example, an alkyl group having 1 to 8 carbon atoms, such as a methyl group, an ethyl group, a propyl group, a butyl group, a hexyl group or an octyl group. An alkyl group having 1 to 6 carbon atoms is more preferred. An alkyl group having 1 to 4 carbon atoms is most preferred.

The monovalent aliphatic hydrocarbon ring group is preferably a monovalent aliphatic hydrocarbon ring group having 3 to 10 carbon atoms, such as a cyclobutyl group, a cyclopentyl group or a cyclohexyl group. A monovalent aliphatic hydrocarbon ring group having 3 to 6 carbon atoms is more preferred.

The aryl group is preferably one having 6 to 18 carbon atoms. An aryl group having 6 to 10 carbon atoms is more preferred. A phenyl group is most preferred.

As a preferred form of the aralkyl group, there can be mentioned one resulting from the bonding of the above aryl group to an alkylene group having 1 to 8 carbon atoms. An aralkyl group resulting from the bonding of the above aryl group to an alkylene group having 1 to 6 carbon atoms is more preferred. An aralkyl group resulting from the bonding of the above aryl group to an alkylene group having 1 to 4 carbon atoms is most preferred.

Each of $Rz_1$, $Rz_2$ and $Rz_3$ is preferably an alkyl group having the hydrogen atoms thereof partially or entirely substituted with a fluorine atom or a fluoroalkyl group (especially a perfluoroalkyl group), most preferably an alkyl group having 30 to 100% of the hydrogen atoms thereof substituted with a fluorine atom.

In general formulae (ZI) to (ZIII) above, $A^+$ represents a sulfonium cation or an iodonium cation. It is preferred for $A^+$ to have any of the structures of general formulae (ZA-1) and (ZA-2) below.

(ZA-1)

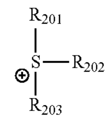

(ZA-2)

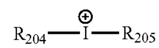

In general formula (ZA-I), each of $R_{201}$, $R_{202}$ and $R_{203}$ independently represents an organic group. The number of carbon atoms of the organic group represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure (including a condensed ring). This ring structure within the ring may contain an oxygen atom, a sulfur atom, an ester bond, an amido bond and/or a carbonyl group in addition to the sulfur atom shown in the formula. As the group formed by the mutual bonding of two of $R_{201}$ to $R_{203}$, there can be mentioned, for example, an alkylene group (for example, a butylene group or a pentylene group).

As the organic groups represented by $R_{201}$, $R_{202}$ and $R_{203}$, there can be mentioned, for example, groups corresponding to the groups (ZA-1-1), (ZA-1-2) and (ZA-1-3) to be described hereinafter. The groups (ZA-1-1) and (ZA-1-3) are most preferred.

Now, the groups (ZA-1-1) will be described below.

The groups (ZA-1-1) are cations of arylsulfonium groups of general formula (ZA-1) wherein at least one of $R_{201}$ to $R_{203}$ is an aryl group.

In the arylsulfonium groups, all of the $R_{201}$ to $R_{203}$ may be aryl groups. It is also appropriate that the $R_{201}$ to $R_{203}$ are partially an aryl group and the remainder is an alkyl group or a monovalent aliphatic hydrocarbon ring group.

As the arylsulfonium groups, there can be mentioned, for example, a triarylsulfonium, a diarylalkylsulfonium, an aryldialkylsulfonium, a diarylcycloalkylsulfonium and an aryldicycloalkylsulfonium.

The aryl group of the arylsulfonium is preferably a phenyl group or a naphthyl group. The aryl group may be one having a heterocyclic structure containing an oxygen atom, nitrogen atom, sulfur atom and the like. As the heterocyclic structure, there can be mentioned, for example, a pyrrole, a furan, a thiophene, an indole, a benzofuran, a benzothiophene and the like.

When the arylsulfonium compound has two or more aryl groups, the two or more aryl groups may be identical to or different from each other.

The alkyl group or monovalent aliphatic hydrocarbon ring group contained in the arylsulfonium compound according to necessity is preferably a linear or branched alkyl group having 1 to 15 carbon atoms or a monovalent aliphatic hydrocarbon ring group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group and the like.

The aryl group, alkyl group or monovalent aliphatic hydrocarbon ring group represented by $R_{201}$ to $R_{203}$ may have as its substituent an alkyl group (for example, 1 to 15 carbon atoms), a monovalent aliphatic hydrocarbon ring group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a monovalent aliphatic hydrocarbon ring group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

As preferred examples of the groups of formula (ZA-1-1), there can be mentioned a triarylsulfonium and the structures of general formulae (ZA-1-1A) and (ZA-1-1B) below.

(ZA-1-1A)

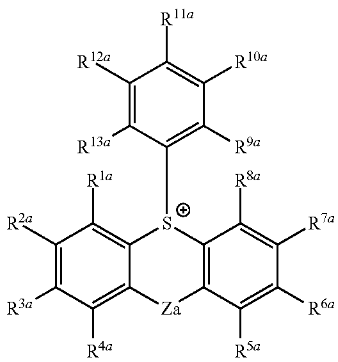

(ZA-1-1B)

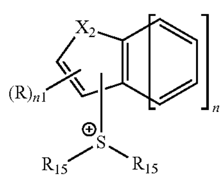

In general formula (ZA-1-1A), each of $R^{1a}$ to $R^{13a}$ independently represents a hydrogen atom or a substituent, provided that at least one of $R^{1a}$ to $R^{13a}$ is a substituent containing an alcoholic hydroxyl group.

Za represents a single bond or a bivalent connecting group.

In the present invention, the alcoholic hydroxyl group refers to a hydroxyl group bonded to a carbon atom of a linear, branched or cyclic alkyl group.

When $R^{1a}$ to $R^{13a}$ represent substituents containing an alcoholic hydroxyl group, it is preferred for the $R^{1a}$ to $R^{13a}$ to represent the groups of the formula —W—Y, wherein Y represents a hydroxyl-substituted linear, branched or cyclic alkyl group and W represents a single bond or a bivalent connecting group.

As the linear, branched or cyclic alkyl group represented by Y, there can be mentioned a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, a cyclopropyl group, a cyclopentyl group, a cyclohexyl group, an adamantyl group, a norbornyl group, a boronyl group and the like. Of these, an ethyl group, a propyl group, an isopropyl group, an n-butyl group, an isobutyl group and a sec-butyl group are preferred. An ethyl group, a propyl group and an isopropyl group are more preferred. Especially preferably, Y contains the structure of $—CH_2CH_2OH$.

W is preferably a single bond, or a bivalent group as obtained by replacing with a single bond any hydrogen atom of a group selected from among an alkoxy group, an acyloxy group, an acylamino group, an alkyl- or arylsulfonylamino group, an alkylthio group, an alkylsulfonyl group, an acyl group, an alkoxycarbonyl group and a carbamoyl group. More preferably, W is a single bond, or a bivalent group as obtained by replacing with a single bond any hydrogen atom of a group selected from among an acyloxy group, an alkylsulfonyl group, an acyl group and an alkoxycarbonyl group.

When $R^{1a}$ to $R^{13a}$ represent substituents containing an alcoholic hydroxyl group, the number of carbon atoms contained in each of the substituents is preferably in the range of 2 to 10, more preferably 2 to 6 and further preferably 2 to 4.

Each of the substituents containing an alcoholic hydroxyl group represented by $R^{1a}$ to $R^{13a}$ may have two or more alcoholic hydroxyl groups. The number of alcoholic hydroxyl groups contained in each of the substituents containing an alcoholic hydroxyl group represented by $R^{1a}$ to $R^{13a}$ is in the range of 1 to 6, preferably 1 to 3 and more preferably 1.

The number of alcoholic hydroxyl groups contained in any of the compounds of the general formula (ZA-1-1A) as the total of those of $R^{1a}$ to $R^{13a}$ is preferably in the range of 1 to 10, more preferably 1 to 6 and still more preferably 1 to 3.

When $R^{1a}$ to $R^{13a}$ do not contain any alcoholic hydroxyl group, each of $R^{1a}$ to $R^{13a}$ preferably represents a hydrogen atom, a halogen atom, an alkyl group, a monovalent aliphatic hydrocarbon ring group, an alkenyl group (including a cycloalkenyl group and a bicycloalkenyl group), an alkynyl group, an aryl group, a cyano group, a carboxyl group, an alkoxy group, an aryloxy group, an acyloxy group, a carbamoyloxy group, an acylamino group, an aminocarbonylamino group, an alkoxycarbonylamino group, an aryloxycarbonylamino group, a sulfamoylamino group, an alkyl- or arylsulfonylamino group, an alkylthio group, an arylthio group, a sulfamoyl group, an alkyl- or arylsulfonyl group, an aryloxycarbonyl group, an alkoxycarbonyl group, a carbamoyl group, an imido group, a silyl group or a ureido group.

When $R^{1a}$ to $R^{13a}$ do not contain any alcoholic hydroxyl group, each of $R^{1a}$ to $R^{13a}$ more preferably represents a hydrogen atom, a halogen atom, an alkyl group, a monovalent aliphatic hydrocarbon ring group, a cyano group, an alkoxy group, an acyloxy group, an acylamino group, an aminocarbonylamino group, an alkoxycarbonylamino group, an alkyl- or arylsulfonylamino group, an alkylthio group, a sulfamoyl group, an alkyl- or arylsulfonyl group, an alkoxycarbonyl group or a carbamoyl group.

When $R^{1a}$ to $R^{13a}$ do not contain any alcoholic hydroxyl group, especially preferably, each of $R^{1a}$ to $R^{13a}$ represents a hydrogen atom, any of alkyl groups, any of a monovalent aliphatic hydrocarbon ring group, a halogen atom or an alkoxy group.

Any two adjacent to each other of $R^{1a}$ to $R^{13a}$ can cooperate with each other so as to form a ring (an aromatic or nonaromatic cyclohydrocarbon or heterocycle which can form a condensed polycycle through further combination; as such, there can be mentioned, for example, a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring).

In general formula (ZA-1-1A), at least one of $R^{1a}$ to $R^{13a}$ contains an alcoholic hydroxyl group. Preferably, at least one of $R^{9a}$ to $R^{13a}$ contains an alcoholic hydroxyl group.

Za represents a single bond or a bivalent connecting group. The bivalent connecting group is, for example, an alkylene group, an arylene group, a carbonyl group, a sulfonyl group, a carbonyloxy group, a carbonylamino group, a sulfonylamido group, an ether group, a thioether group, an amino group, a disulfide group, an acyl group, an alkylsulfonyl group, —CH═CH—, —C≡C—, an aminocarbonylamino group, an aminosulfonylamino group and the like. The bivalent connecting group may have a substituent. The same substituents as mentioned above with respect to $R^{1a}$ to $R^{13a}$ can be employed. Preferably, Za is a single bond or a substituent exhibiting no electron withdrawing properties, such as an alkylene group, an arylene group, an ether group, a thioether group, an amino group, —CH═CH—, —CH≡CH—, an aminocarbonylamino group or an aminosulfonylamino group. More preferably, Z is a single bond, an ether group or a thioether group. Most preferably, Z is a single bond.

Now, general formula (ZA-1-1B) will be described.

In general formula (ZA-1-1B), each of $R_{15}$s independently represents an alkyl group, a monovalent aliphatic hydrocarbon ring group or a naphthyl group, provided that two $R_{15}$s may be bonded to each other to thereby form a ring.

$X_2$ represents any of —$CR_{21}$═$CR_{22}$—, —$NR_{23}$—, —S— and —O—. Each of $R_{21}$ and $R_{22}$ independently represents a hydrogen atom, an alkyl group, a monovalent aliphatic hydrocarbon ring group or an aryl group. $R_{23}$ represents a hydrogen atom, an alkyl group, a monovalent aliphatic hydrocarbon ring group, an aryl group or an acyl group.

R, or each of R's independently, represents a substituent. As the substituent represented by R, there can be mentioned, for example, the corresponding groups of general formulae (ZI-1) to (ZI-3) to be described below as preferred forms of general formula (ZA-1-1B).

In the formula, n is an integer of 0 to 3, and n1 is an integer of 0 to 11.

Substituents may be introduced in the alkyl groups represented by $R_{15}$ and $R_{21}$ to $R_{23}$. A linear or branched alkyl group having 1 to 20 carbon atoms is preferred. An oxygen atom, a sulfur atom or a nitrogen atom may be introduced in the alkyl chain.

In particular, as a substituted alkyl group, there can be mentioned a linear or branched alkyl group substituted with a monovalent aliphatic hydrocarbon ring group (for example, an adamantylmethyl group, an adamantylethyl group, a cyclohexylethyl group, a camphor residue and the like).

Substituents may be introduced in the monovalent aliphatic hydrocarbon ring groups represented by $R_{15}$ and $R_{21}$ to $R_{23}$. A cycloalkyl group having 3 to 20 carbon atoms is preferred. An oxygen atom may be introduced in the ring.

Substituents may be introduced in the aryl groups represented by $R_{15}$ and $R_{21}$ to $R_{23}$. An aryl group having 6 to 14 carbon atoms is preferred.

As substituents that may be introduced in these groups, there can be mentioned, for example, a halogen atom, a hydroxyl group, a nitro group, a cyano group, a carboxyl group, a carbonyl group, an alkyl group (preferably 1 to 10 carbon atoms), a monovalent aliphatic hydrocarbon ring group (preferably 3 to 10 carbon atoms), an aryl group (preferably 6 to 14 carbon atoms), an alkoxy group (preferably 1 to 10 carbon atoms), an aryloxy group (preferably 6 to 14 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms), an alkylthio group (preferably 1 to 10 carbon atoms), an arylthio group (preferably 6 to 14 carbon atoms), and the like. In the cyclic structure of the aryl group, monovalent aliphatic hydrocarbon ring group and the like and in the aminoacyl group, an alkyl group (preferably 1 to 20 carbon atoms) may further be introduced as a substituent.

The ring that may be formed by the mutual bonding of two $R_{15}$s is preferably a ring structure formed in cooperation with $-S^+$ shown in formula (ZA-1-1B), in particular, a 5-membered ring containing one sulfur atom or a condensed ring containing the same. The condensed ring is preferably one containing one sulfur atom and up to 18 carbon atoms, more preferably any of the ring structures of general formulae (IV-1) to (IV-3) below.

In the formulae, * represents a bonding hand. R represents an arbitrary substituent. As such, there can be mentioned, for example, any of the same substituents that may be introduced in the groups represented by $R_{15}$ and $R_{21}$ to $R_{23}$. In the formulae, n is an integer of 0 to 4, and n2 is an integer of 0 to 3.

(IV-1)

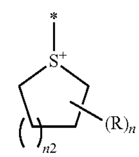

(IV-2)

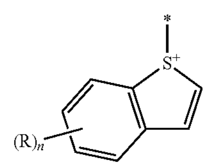

(IV-3)

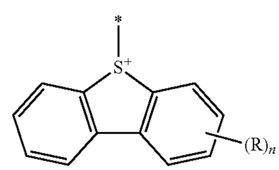

Among the compounds of general formula (ZA-1-1B), as preferred cation structures, there can be mentioned the following cation structures (ZI-1) to (ZI-3).

The cation structure (ZI-1) refers to the structure of general formula (ZI-1) below.

(ZI-1)

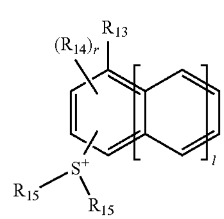

In general formula (ZI-1), $R_{13}$ represents any of a hydrogen atom, a fluorine atom, a hydroxyl group, an alkyl group, a monovalent aliphatic hydrocarbon ring group, an alkoxy group, an alkoxycarbonyl group and a group with a cycloalkyl skeleton of a single ring or multiple rings.

$R_{14}$, each independently in the instance of $R_{14}$s, represents any of an alkyl group, a monovalent aliphatic hydrocarbon ring group, an alkoxy group, an alkylsulfonyl group, a cycloalkylsulfonyl group, a hydroxyl group and a group with a cycloalkyl skeleton of a single ring or multiple rings.

Each of $R_{15}$s independently represents an alkyl group, a monovalent aliphatic hydrocarbon ring group or a naphthyl group, provided that the two $R_{15}$s may be bonded to each other to thereby form a ring.

In the formula, 1 is an integer of 0 to 2, and r is an integer of 0 to 8.

In general formula (ZI-1), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

The monovalent aliphatic hydrocarbon ring groups represented by $R_{13}$, $R_{14}$ and $R_{15}$ may be a structure of a single ring or multiple rings, and preferably have 3 to 12 carbon atoms. As such, there can be mentioned a cyclopropyl, cyclobutyl, cyclopentyl, cyclohexyl, cycloheptyl, cyclooctyl, cyclododecanyl, cyclopentenyl, cyclohexenyl, cyclooctadienyl, bicycloheptyl (norbornyl), adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ is preferably a linear or branched one having 2 to 11 carbon atoms. For example, as such, there can be mentioned any of the carbonyl groups substituted with any of the alkoxy groups represented by $R_{13}$ and $R_{14}$. As such, there can be mentioned a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group and the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group and the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

The alkylsulfonyl and cycloalkylsulfonyl groups represented by $R_{14}$ may be linear, branched or cyclic and preferably each have 1 to 10 carbon atoms. For example, as such, there can be mentioned any of sulfonyl groups substituted with any of the alkyl groups represented by $R_{13}$, $R_{14}$ and $R_{15}$. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

In formula, 1 is preferably 0 or 1, more preferably 1, and r is preferably 0 to 2.

Substituents may further be introduced in the groups represented by $R_{13}$, $R_{14}$ and $R_{15}$. As optionally introduced substituents, there can be mentioned those including an alkyl group such as a methyl group, an ethyl group, a propyl group, a butyl group, a pentyl group, a hexyl group, a heptyl group, an octyl group, a dodecyl group, a 2-ethylhexyl group, an isopropyl group, a sec-butyl group, a t-butyl group or an isoamyl group; a monovalent aliphatic hydrocarbon ring group (may be monocyclic or polycyclic, preferably having 3 to 20 carbon atoms, more preferably 5 to 8 carbon atoms); a hydroxyl group; a halogen atom (fluorine, chlorine, bromine or iodine); a nitro group; a cyano group; an amido group; a sulfonamido group; an alkoxy group; an alkoxyalkyl group; an alkoxycarbonyl group; an alkoxycarbonyloxy group; an acyl group such as a formyl group, an acetyl group or a benzoyl group; an acyloxy group such as an acetoxy group or a butyryloxy group; and a carboxyl group.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-1). The cyclic structure may condense with an aryl group or an aliphatic hydrocarbon ring group. The bivalent $R_{15}$s may have substituents. As such substituents, there can be mentioned, for example, an alkyl group, a hydroxyl group, a carboxyl group, a cyano group, a nitro group, an alkoxy group, an alkoxyalkyl group, an alkoxycarbonyl group, an alkoxycarbonyloxy group and the like as mentioned above.

It is especially preferred for the $R_{15}$ of general formula (ZI-1) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-1), and the like.

As mentioned above, substituents may be introduced in the alkyl group, monovalent aliphatic hydrocarbon ring group, alkoxy group and alkoxycarbonyl group represented by $R_{13}$ and also the alkyl group, monovalent aliphatic hydrocarbon ring group, alkoxy group, alkylsulfonyl group and cycloalkylsulfonyl group represented by $R_{14}$. Preferred substituents are a hydroxyl group, an alkoxy group, an alkoxycarbonyl group and a halogen atom (especially a fluorine atom).

Preferred specific examples of the cation structures of general formula (ZI-1) will be shown below.

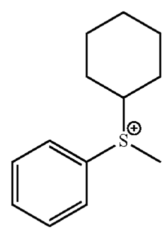

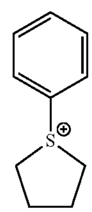

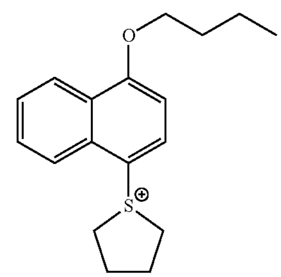

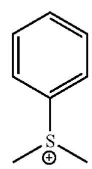

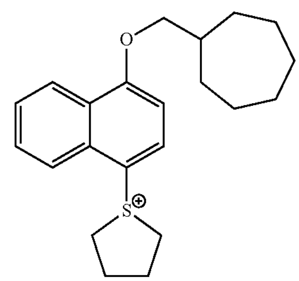

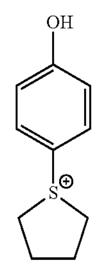

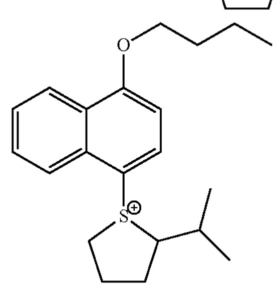

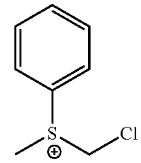

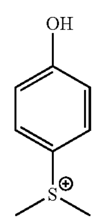

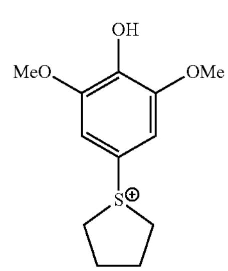

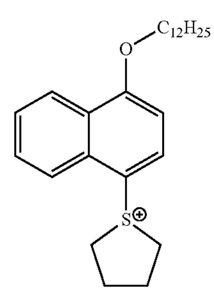

-continued

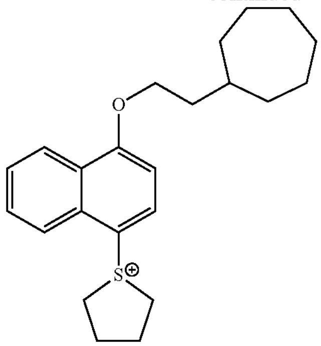
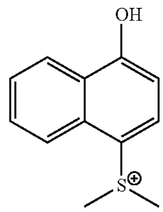
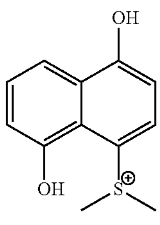
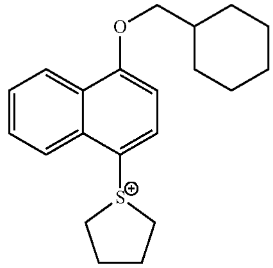
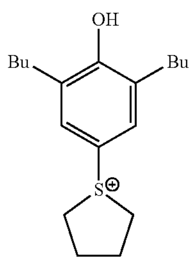
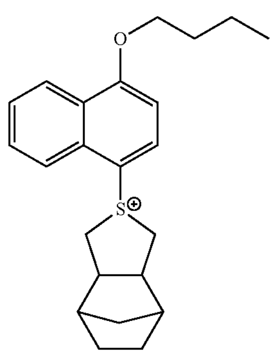
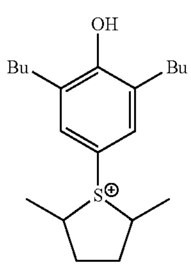
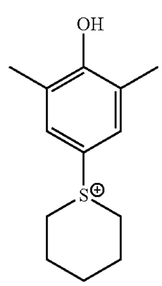
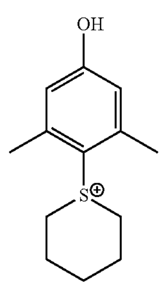
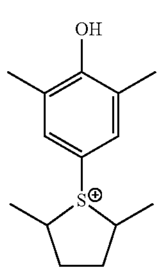
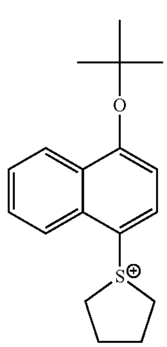

-continued

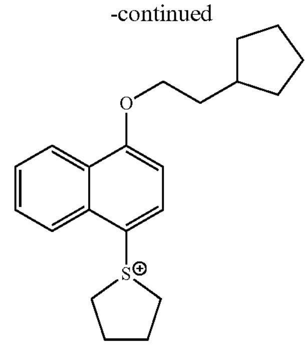
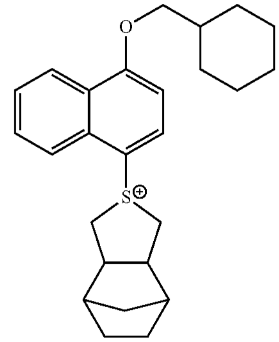

The cation structure (ZI-2) refers to the structure of general formula (ZI-2) below.

(ZI-2)

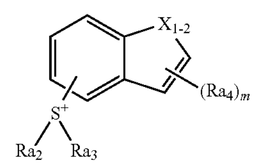

In general formula (ZI-2), $X_{I-2}$ represents an oxygen atom, a sulfur atom or any of the groups of the formula —$NRa_1$—, in which $Ra_1$ represents a hydrogen atom, an alkyl group, a monovalent aliphatic hydrocarbon ring group, an aryl group or an acyl group.

Each of $Ra_2$ and $Ra_3$ independently represents an alkyl group, a monovalent aliphatic hydrocarbon ring group or a naphthyl group, provided that $Ra_2$ and $Ra_3$ may be bonded to each other to thereby form a ring.

$Ra_4$, or each of $Ra_4$s independently, represents a monovalent group.

In the formula, m is an integer of 0 to 3.

Each of the alkyl groups represented by $Ra_1$ to $Ra_3$ is preferably a linear or branched alkyl group having 1 to 20 carbon atoms. As such, there can be mentioned, for example, a methyl group, an ethyl group, a propyl group, an isopropyl group, an n-butyl group, an isobutyl group, a sec-butyl group, a pentyl group, a neopentyl group, a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, an eicosyl group and the like.

Each of the monovalent aliphatic hydrocarbon ring groups represented by $Ra_1$ to $Ra_3$ is preferably a monovalent aliphatic hydrocarbon ring group having 3 to 20 carbon atoms. As such, there can be mentioned, for example, a cyclopropyl group, a cyclobutyl group, a cyclopentyl group, a cyclohexyl group, a cyclooctyl group, an adamantyl group, a norbornyl group, an isobornyl group, a camphonyl group, a dicyclopentyl group, an α-pinel group, a tricyclodecanyl group, a tetracyclododecyl group, an androstanyl group and the like.

Each of the aryl groups represented by $Ra_1$ to $Ra_3$ is preferably an aryl group having 6 to 10 carbon atoms. As such, there can be mentioned, for example, a phenyl group, a naphthyl group and the like.

The acyl group represented by $Ra_1$ is preferably one having 2 to 20 carbon atoms. As such, there can be mentioned, for example, a formyl group, an acetyl group, a propanoyl group, a butanoyl group, a pivaloyl group, a benzoyl group and the like.

The ring structure that may be formed by the mutual bonding of $Ra_2$ and $Ra_3$ is preferably a group forming a 5- or 6-membered ring, especially a 5-membered ring (for example, a tetrahydrothiophene ring) in cooperation with the sulfur atom of general formula (ZI-2), in which an oxygen atom may be contained. As such, there can be mentioned, for example, the same ring as may be formed by the mutual linkage of $R_{15}$s of general formula (ZI-1).

As the monovalent group represented by $Ra_4$, there can be mentioned, for example, an alkyl group (preferably 1 to 20 carbon atoms), a monovalent aliphatic hydrocarbon ring group (preferably 3 to 20 carbon atoms), an aryl group (preferably 6 to 10 carbon atoms), an alkoxy group (preferably 1 to 20 carbon atoms), an acyl group (preferably 2 to 20 carbon atoms), an acyloxy group (preferably 2 to 20 carbon atoms), a fluorine atom, a chlorine atom, a bromine atom, an iodine atom, a hydroxyl group, a carboxyl group, a nitro group, a cyano group, an alkoxycarbonyl group, an alkylsulfonyl group, an arylsulfonyl group, an arylcarbonyl group, an alkylcarbonyl group, an alkenylcarbonyl group and the like.

$Ra_1$ is preferably an alkyl group, more preferably an alkyl group having 1 to 4 carbon atoms.

Preferably, $Ra_2$ and $Ra_3$ are linked to each other to thereby form a 5- or 6-membered ring.

Substituents may further be introduced in the groups represented by $Ra_1$ to $Ra_4$. As optionally introduced further substituents, there can be mentioned those set forth above as being optionally introduced in the groups represented by $R_{13}$ to $R_{15}$ of general formula (ZI-1).

Preferred particular examples of the cations contained in the compounds of general formula (ZI-2) will be shown below.

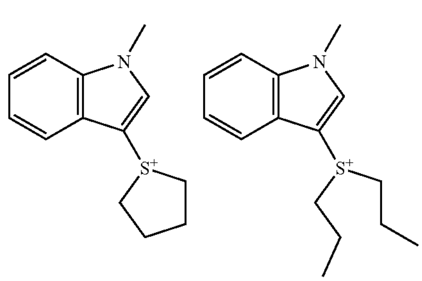

-continued

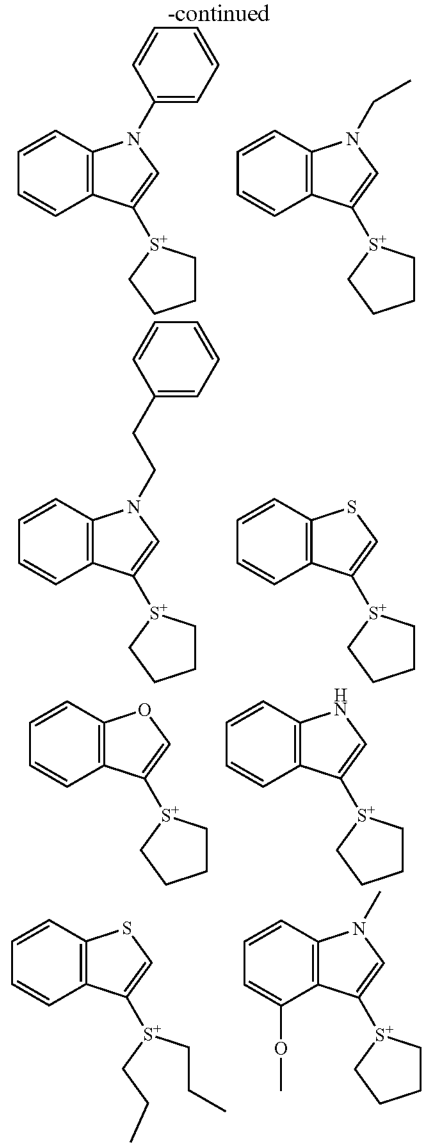

The cation structure (ZI-3) refers to the structure of general formula (ZI-3) below.

(ZI-3)

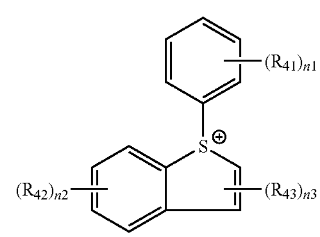

In general formula (ZI-3), each of $R_{41}$ to $R_{43}$ independently represents an alkyl group, an acetyl group, an alkoxy group, a carboxyl group, a halogen atom, a hydroxyl group or a hydroxyalkyl group.

As the alkyl group and alkoxy group represented by $R_{41}$ to $R_{43}$, there can be mentioned those set forth above in connection with $R_{13}$ to $R_{15}$ of general formula (ZI-1).

The hydroxyalkyl group is preferably any of the above alkyl groups having one or a plurality of hydrogen atoms thereof substituted with a hydroxyl group. As such, there can be mentioned a hydroxymethyl group, a hydroxyethyl group, a hydroxypropyl group and the like.

In the formula, n1 is an integer of 0 to 3, preferably 1 or 2 and more preferably 1;

n2 is an integer of 0 to 3, preferably 0 or 1 and more preferably 0; and n3 is an integer of 0 to 2, preferably 0 or 1 and more preferably 1.

Substituents may further be introduced in the groups represented by $R_{41}$ to $R_{43}$. As optionally introduced further substituents, there can be mentioned those set forth above as being optionally introduced in the groups represented by $R_{13}$ to $R_{15}$ of general formula (ZI-1).

Preferred particular examples of the cations contained in the compounds of general formula (ZI-4) will be shown below.

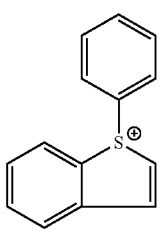

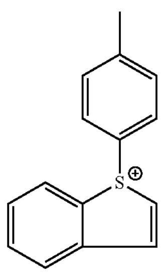

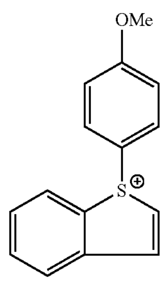

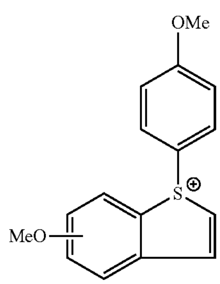

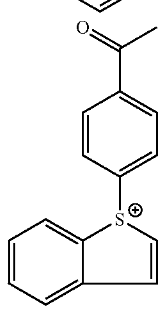

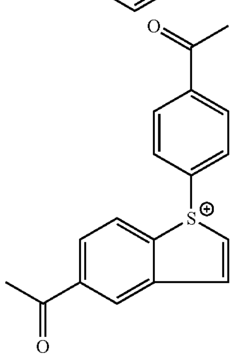

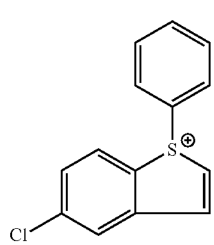

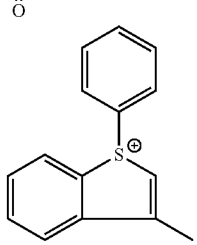

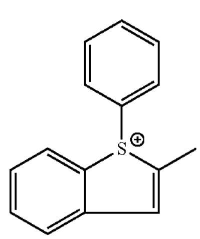

-continued

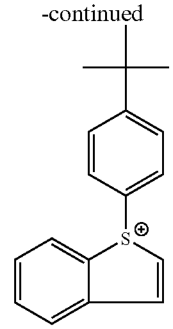

Among the cation structures of general formulae (ZI-1) to (ZI-3), the structures of general formulae (ZI-1) and (ZI-2) are preferred. The structure of general formula (ZI-1) is more preferred.

The groups (ZA-1-2) will be described below.

The groups (ZA-1-2) refer to the groups of general formula (ZA-1) wherein each of $R_{201}$ to $R_{203}$ independently represents an organic group containing no aromatic ring. Herein, the aromatic ring includes one containing a heteroatom.

Each of the organic groups containing no aromatic ring represented by $R_{201}$ to $R_{203}$ generally has 1 to 30 carbon atoms, preferably 1 to 20 carbon atoms.

Preferably, each of $R_{201}$ to $R_{203}$ independently is an alkyl group, a monovalent aliphatic hydrocarbon ring group, an allyl group or a vinyl group. A linear or branched 2-oxoalkyl group, a 2-oxo aliphatic hydrocarbon ring group and an alkoxycarbonylmethyl group are more preferred. A linear or branched 2-oxo aliphatic hydrocarbon ring group is most preferred.

As preferred alkyl groups and aliphatic hydrocarbon ring groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and an aliphatic hydrocarbon ring group having 3 to 10 carbon atoms (for example, a cyclopentyl group, a cyclohexyl group or a norbornyl group). The alkyl group is more preferably a 2-oxoalkyl group or an alkoxycarbonylmethyl group. The aliphatic hydrocarbon ring group is more preferably a 2-oxo aliphatic hydrocarbon ring group.

The 2-oxoalkyl group may be linear or branched. Preferably, it is any of the above alkyl groups in which >0=0 is introduced in the 2-position thereof.

Preferably, the 2-oxo aliphatic hydrocarbon ring group is any of the above aliphatic hydrocarbon ring groups in which >0=0 is introduced in the 2-position thereof.

As preferred alkoxy groups of the alkoxycarbonylmethyl groups, there can be mentioned alkoxy groups each having 1 to 5 carbon atoms (a methoxy group, an ethoxy group, a propoxy group, a butoxy group and a pentoxy group).

These $R_{201}$ to $R_{203}$ may further be substituted with a halogen atom, an alkoxy group (for example, 1 to 5 carbon atoms), a hydroxyl group, a cyano group or a nitro group.

Now, the groups (ZA-1-3) will be described below.

The groups (ZA-1-3) are those represented by general formula (ZA-1-3), below, which have a phenacylsulfonium structure.

(ZA-1-3)

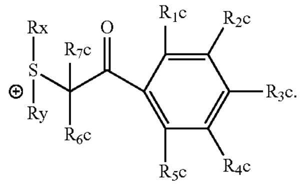

In general formula (ZA-1-3), each of $R_{1c}$ to $R_{5c}$ independently represents a hydrogen atom, an alkyl group, a monovalent aliphatic hydrocarbon ring group, an alkoxy group, a phenylthio group or a halogen atom.

Each of $R_{6c}$ and $R_{7c}$ independently represents a hydrogen atom, an alkyl group or a monovalent aliphatic hydrocarbon ring group.

Each of $R_x$ and $R_y$ independently represents an alkyl group, a monovalent aliphatic hydrocarbon ring group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group and the like.

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group).

As the monovalent aliphatic hydrocarbon ring group represented by $R_{1c}$ to $R_{7c}$, there can be mentioned, for example, a monovalent aliphatic hydrocarbon ring group (monocyclic or polycyclic) having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a monovalent aliphatic hydrocarbon ring group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

As the alkyl groups and monovalent aliphatic hydrocarbon ring groups represented by $R_x$ and $R_y$, there can be mentioned the same alkyl groups and monovalent aliphatic hydrocarbon ring groups as mentioned with respect to $R_{1c}$ to $R_{7c}$. Among them, a 2-oxoalkyl group, a 2-oxoaliphatic hydrocarbon ring group and an alkoxycarbonylmethyl group are preferred.

As the 2-oxoalkyl group and 2-oxoaliphatic hydrocarbon ring group, there can be mentioned groups having >C═O at the 2-position of the alkyl group and aliphatic hydrocarbon ring group represented by $R_{1c}$ to $R_{7c}$.

Regarding the alkoxy group of the alkoxycarbonylmethyl group, there can be mentioned the same alkoxy groups as mentioned with respect to $R_{1c}$ to $R_{5c}$.

Each of $R_x$ and $R_y$ is preferably an alkyl group or a monovalent aliphatic hydrocarbon ring group having preferably 4 or more carbon atoms. The alkyl group or monovalent aliphatic hydrocarbon ring group has more preferably 6 or more carbon atoms and still more preferably 8 or more carbon atoms.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group and the like) in cooperation with the sulfur atom of general formula (ZA-1-3).

Now, general formula (ZA-2) will be described below.

In general formula (ZA-2), each of $R_{204}$ and $R_{205}$ independently represents an aryl group, an alkyl group or a monovalent aliphatic hydrocarbon ring.

Each of the aryl groups represented by $R_{204}$ and $R_{205}$ is preferably a phenyl group or a naphthyl group, more preferably a phenyl group. Each of the aryl groups represented by $R_{204}$ and $R_{205}$ may be an aryl group with a heterocyclic structure containing an oxygen atom, a nitrogen atom, a sulfur atom and the like. As the aryl group with a heterocyclic structure, there can be mentioned, for example, a pyrrole residue (group formed by the loss of one hydrogen atom from pyrrole), a furan residue (group formed by the loss of one hydrogen atom from furan), a thiophene residue (group formed by the loss of one hydrogen atom from thiophene), an indole residue (group formed by the loss of one hydrogen atom from indole), a benzofuran residue (group formed by the loss of one hydrogen atom from benzofuran), a benzothiophene residue (group formed by the loss of one hydrogen atom from benzothiophene) and the like.

As preferred alkyl groups and monovalent aliphatic hydrocarbon ring groups represented by $R_{204}$ and $R_{205}$, there can be mentioned a linear or branched alkyl group having 1 to 10 carbon atoms (for example, a methyl group, an ethyl group, a propyl group, a butyl group or a pentyl group) and a monovalent aliphatic hydrocarbon ring group having 3 to 10 carbon atoms (for example, a cyclopentyl group, a cyclohexyl group or a norbornyl group).

Substituents may be introduced in the aryl group, alkyl group and monovalent aliphatic hydrocarbon ring group represented by each of $R_{204}$ and $R_{205}$. As the substituents that may be introduced in the aryl group, alkyl group and monovalent aliphatic hydrocarbon ring group represented by each of $R_{204}$ and $R_{205}$, there can be mentioned, for example, an alkyl group (for example, 1 to 15 carbon atoms), a monovalent aliphatic hydrocarbon ring group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

Examples of particular structures of the cations for constituting onium salts suitable as $Z_1$ in general formula (I) will be shown hereinafter.

With respect to the polymerizable monomer units corresponding to the repeating units of general formula (I), examples thereof will be shown below as sulfonate, imidate and methide units formed by the cleavage of a cation upon exposure to actinic rays or radiation.

-continued
(I-1)
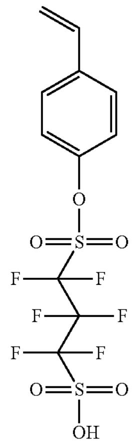
(I-2)
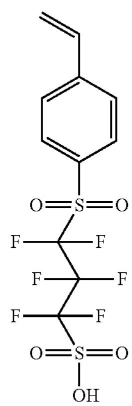
(I-3)
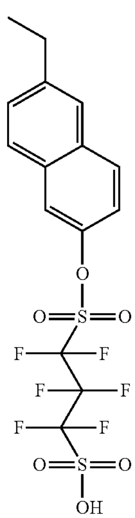
(I-4)
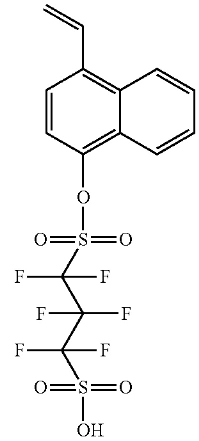
(I-5)
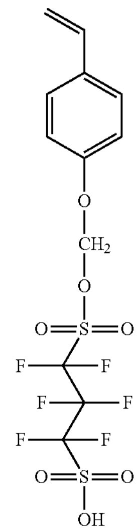
(I-6)
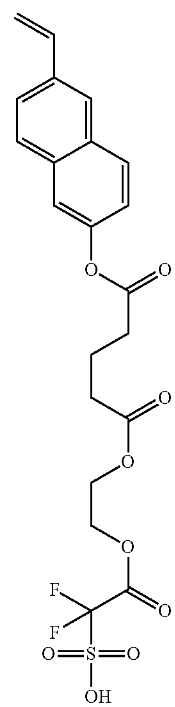

-continued
(I-7)
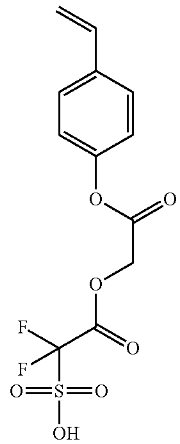
(I-8)
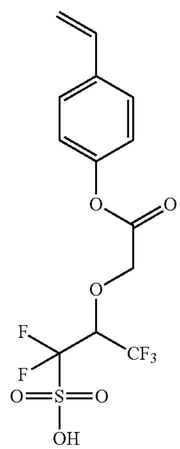
(I-9)
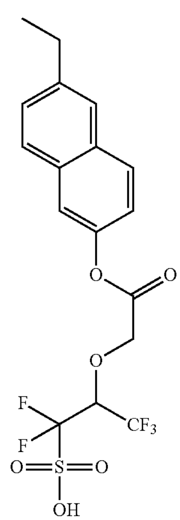
-continued
(I-10)
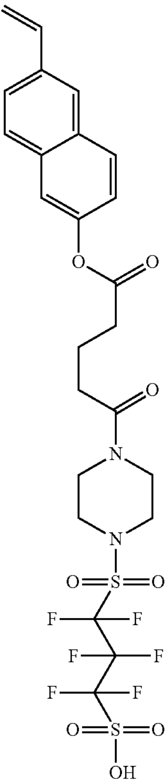
(I-11)
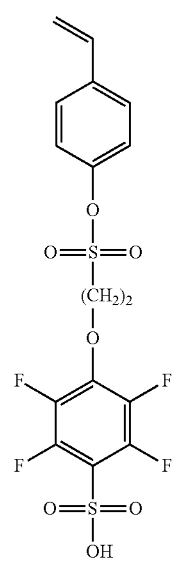

-continued
(I-12)
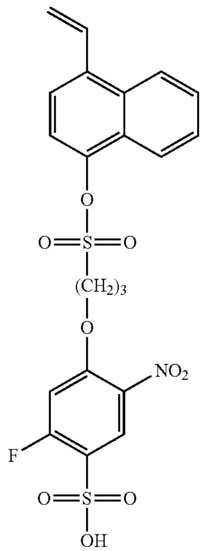
(I-13)
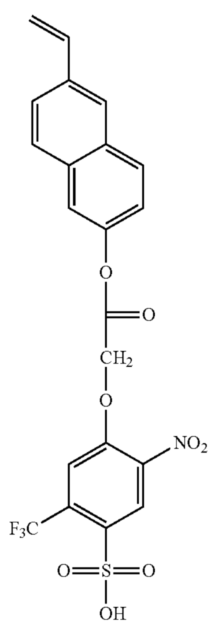
-continued
(I-14)
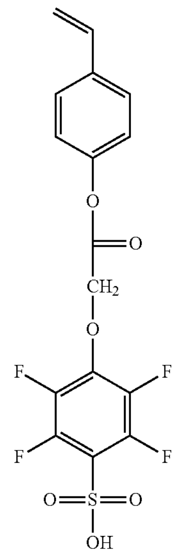
(I-15)
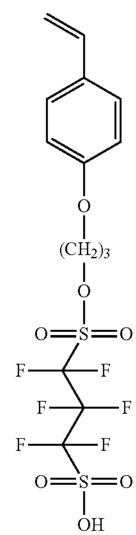

-continued
(I-16)
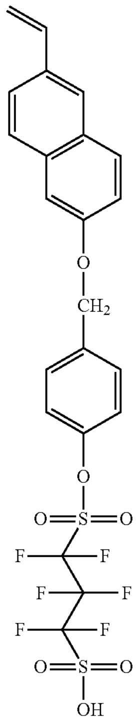
(I-17)
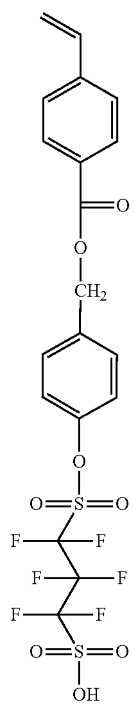
-continued
(I-18)
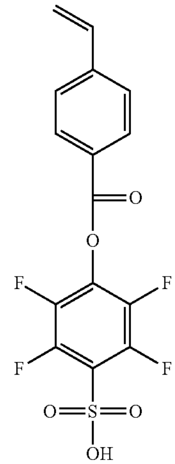
(I-19)
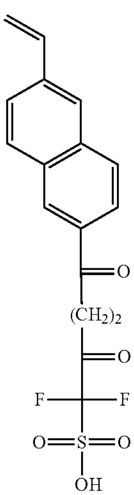

-continued
(I-20)
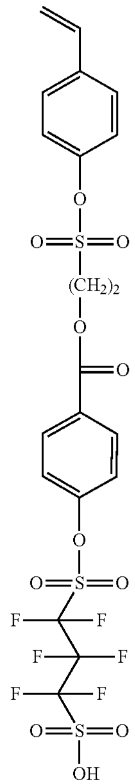
(I-21)
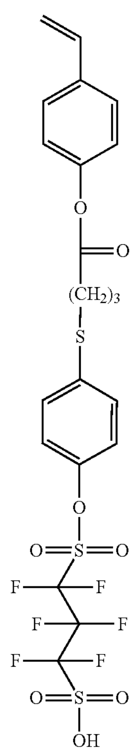
-continued
(I-22)
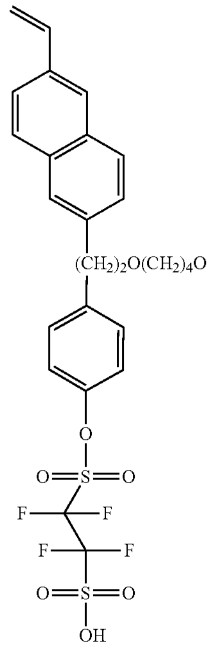
(I-23)
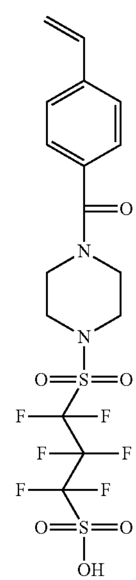

-continued
(I-24)
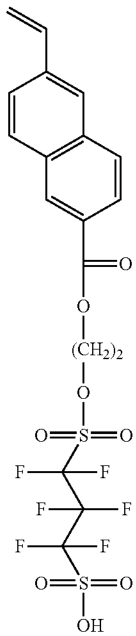
(I-25)
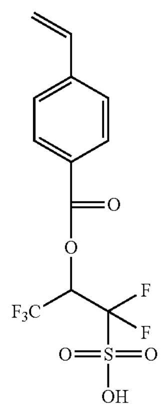
(I-26)
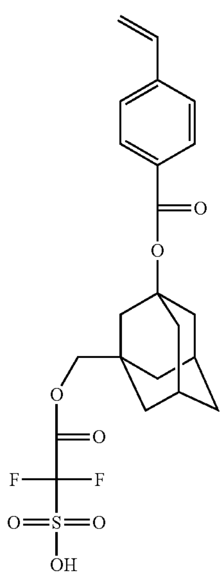
-continued
(I-27)
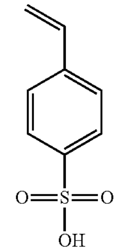
(I-28)
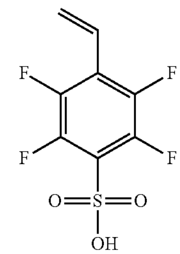
(I-29)
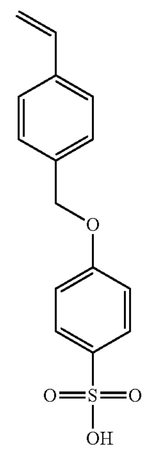
(I-30)
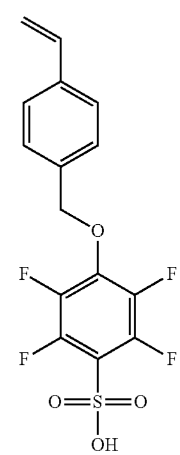

-continued
(I-31)
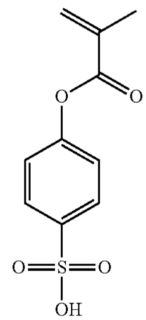
(I-32)
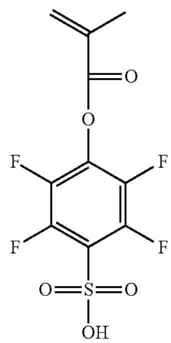
(I-33)
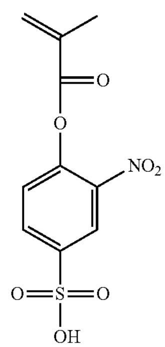
(I-34)
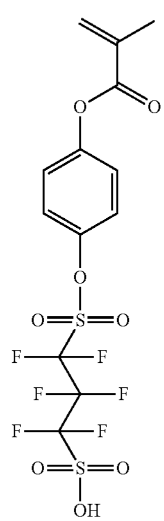
-continued
(I-35)
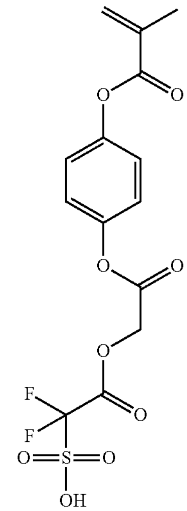
(I-36)
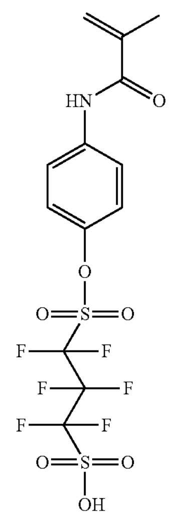
(I-37)
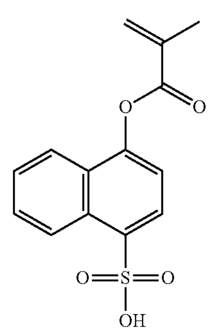

(I-38)
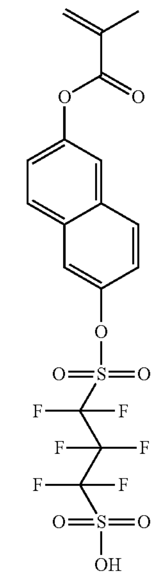
(I-39)
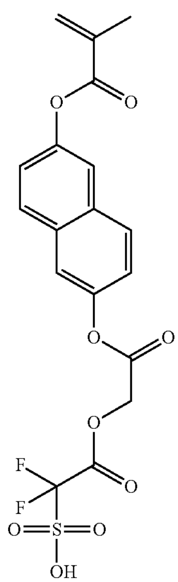
(I-40)
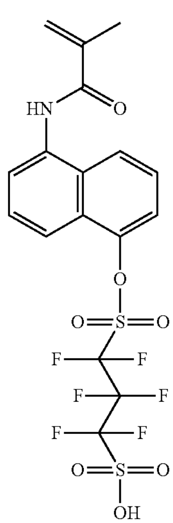
(I-41)
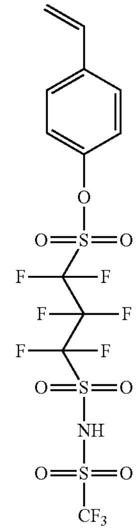
(I-42)
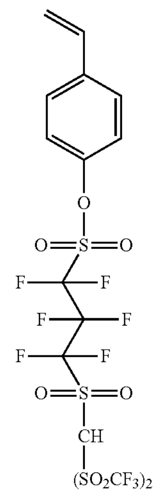
(I-43)
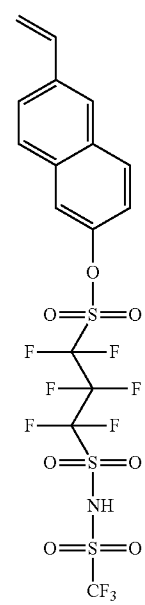

-continued
(I-44)
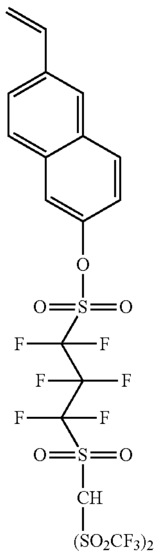
(I-45)
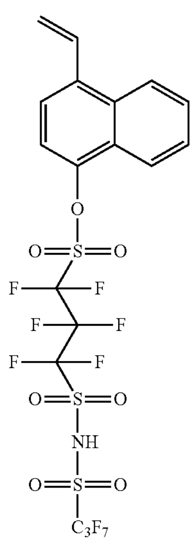
-continued
(I-46)
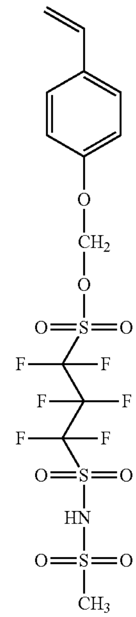
(I-47)
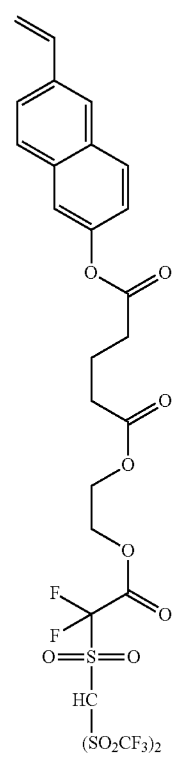

-continued
(I-48)
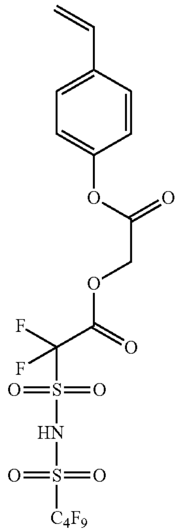
(I-49)
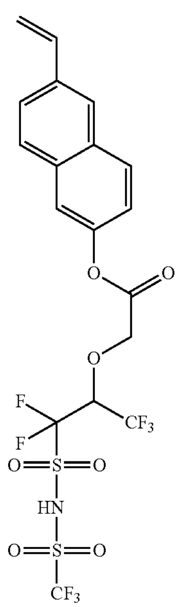
-continued
(I-50)
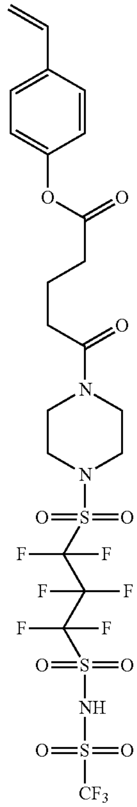
(I-51)
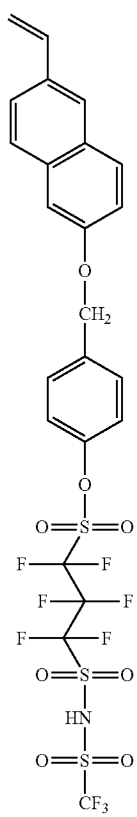

-continued
(I-52)
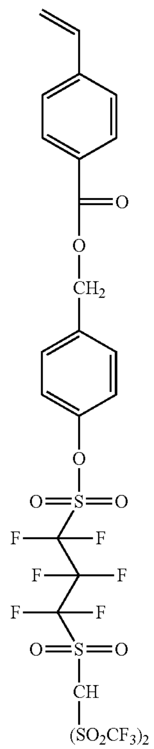
(I-53)
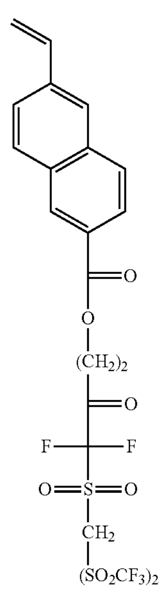
-continued
(I54)
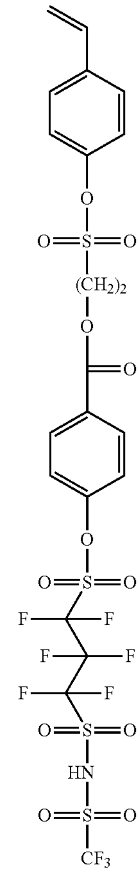
(I-55)
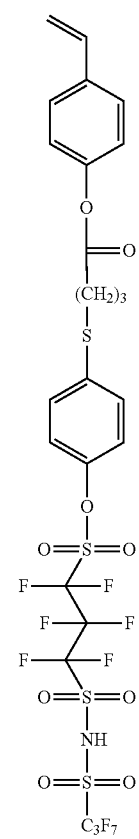

-continued
(I-56)
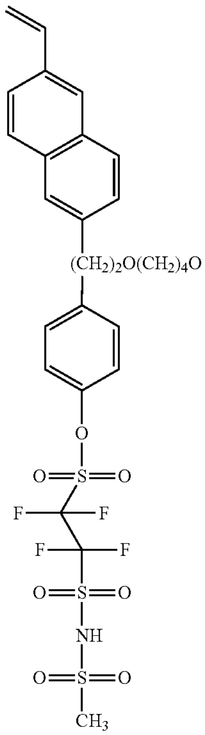
(I-57)
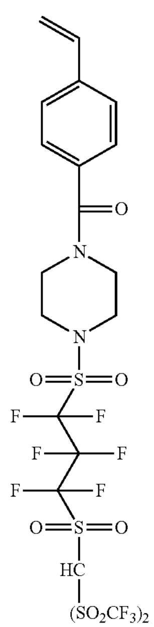
-continued
(I-58)
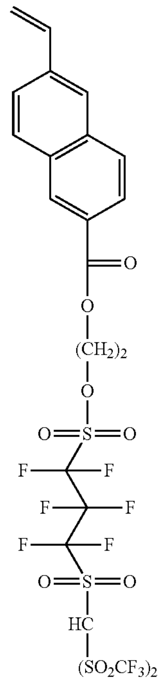
(I-59)
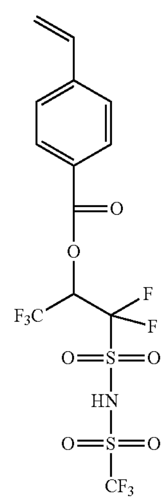

-continued
(I-60)
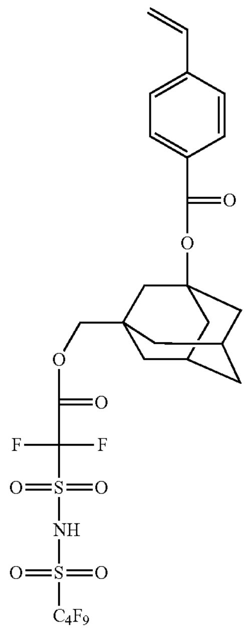
(I-61)
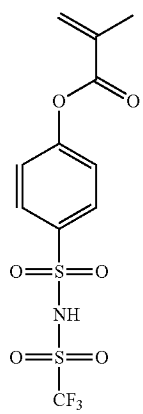
(I-62)
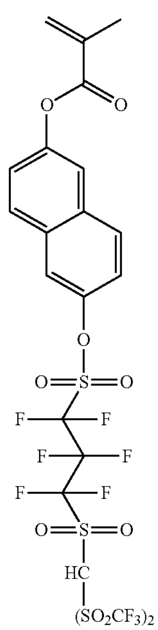
-continued
(I-63)
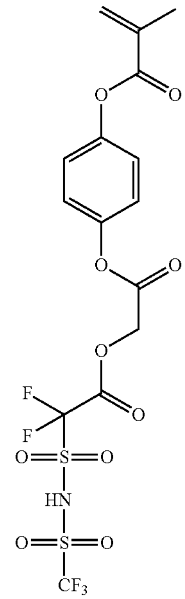
(I-64)
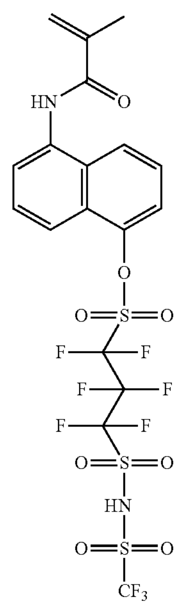

-continued (I-65)

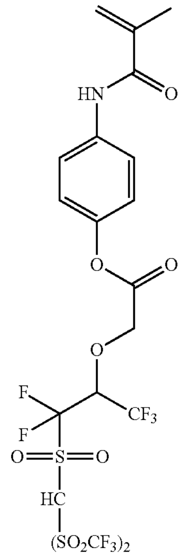

Below, general formula (II) will be described.

In general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{21}$, $R_{22}$ and $R_{23}$.

As the monovalent aliphatic hydrocarbon ring group, there can be mentioned an optionally substituted mono- or polycycloalkyl group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{21}$ to $R_{23}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (II), each of $R_{21}$, $R_{22}$ and $R_{23}$ preferably represents a hydrogen atom, an alkyl group or a halogen atom, especially preferably a hydrogen atom, a methyl group, an ethyl group, a trifluoromethyl group ($—CF_3$), a hydroxymethyl group ($—CH_2—OH$), a chloromethyl group ($—CH_2—Cl$) and a fluorine atom (—F).

$X_{21}$ represents —O—, —S—, —CO—, $—SO_2—$, —NR— (R represents a hydrogen atom or an alkyl group), a bivalent nitrogen-containing nonaromatic heterocyclic group or a group composed of a combination of these.

In —NR—, the alkyl group represented by R is an optionally substituted linear or branched alkyl group. Particular examples of such alkyl groups are the same as mentioned above with respect to the alkyl groups represented by $R_{21}$, $R_{22}$ and $R_{23}$. Most preferably, R is a hydrogen atom, a methyl group or an ethyl group.

The above bivalent nitrogen-containing nonaromatic heterocyclic group refers to a nonaromatic heterocyclic group, preferably 3- to 8-membered, containing at least one nitrogen atom. For example, there can be mentioned any of the structures set forth above as examples with respect to $X_{11}$ to $X_{13}$ of general formula (I).

Preferably, $X_{21}$ is —O—, —CO— or —NR— (R represents a hydrogen atom or an alkyl group) or a group composed of a combination of these. —COO— and —CONR— (R represents a hydrogen atom or an alkyl group) are especially preferred.

$L_{21}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, $—SO_2—$, —NR— (R represents a hydrogen atom or an alkyl group), a bivalent nitrogen-containing nonaromatic heterocyclic group, a bivalent aromatic ring group or a group composed of a combination of these.

The alkylene group represented by $L_{21}$ may be linear or branched. As preferred examples thereof, there can be mentioned, for example, alkylene groups having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group described above in connection with $L_{21}$.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is more preferred.

As the bivalent aromatic ring group of the connecting group, there can be mentioned, for example, an optionally substituted arylene group having 6 to 14 carbon atoms, such as a phenylene group, a tolylene group or a naphthylene group, or an optionally substituted bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the —NR— and bivalent nitrogen-containing nonaromatic heterocyclic group are the same as mentioned above in connection with $X_{21}$. Preferred examples are also the same.

Most preferably, $L_{21}$ is an alkylene group, a bivalent aliphatic hydrocarbon ring group or a group composed of two or more of these combined through —COO—, —O— or —CONH— as a connecting group (for example, -alkylene group-O-alkylene group-, -alkylene group-OCO-alkylene group-, -bivalent aliphatic hydrocarbon ring group-O-alkylene group-, -alkylene group-CONH-alkylene group- and the like).

Each of $X_{22}$ and $X_{23}$ independently represents a single bond, —O—, —S—, —CO—, —$SO_2$—, —NR— (R represents a hydrogen atom or an alkyl group), a bivalent nitrogen-containing nonaromatic heterocyclic group or a group composed of a combination of these.

Particular examples of the —NR— and bivalent nitrogen-containing nonaromatic heterocyclic group represented by $X_{22}$ and $X_{23}$ are the same as mentioned above in connection with $X_{21}$. Preferred examples are also the same.

$X_{22}$ is preferably a single bond, —S—, —O—, —CO—, —$SO_2$— or a group composed of a combination of these, most preferably a single bond, —S—, —OCO— or —$OSO_2$—.

$X_{23}$ is preferably —O—, —CO—, —$SO_2$— or a group composed of a combination of these, most preferably —$OSO_2$—.

$Ar_2$ represents a bivalent aromatic ring group or a group composed of a combination of a bivalent aromatic ring group and an alkylene group.

A substituent may be introduced in the bivalent aromatic ring group. As preferred examples of the bivalent aromatic ring group, there can be mentioned, for example, an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or triazole.

Preferred substituents that can be introduced in the above groups are, for example, the alkyl group mentioned in connection with $R_{21}$ to $R_{23}$, an alkoxy group such as a methoxy group, an ethoxy group, a hydroxyethoxy group, a propoxy group, a hydroxypropoxy group or a butoxy group and an aryl group such as a phenyl group.

As a preferred example of the group composed of a combination of a bivalent aromatic ring group and an alkylene group, there can be mentioned an aralkylene group composed of a combination of any of the above-mentioned bivalent aromatic ring groups and, for example, an alkylene group having 1 to 8 carbon atoms (may be linear or branched), such as a methylene group, an ethylene group, a propylene group, a butylene group, a hexylene group or an octylene group.

$Ar_2$ is preferably an aralkylene group composed of a combination of any of the optionally substituted arylene groups having 6 to 18 carbon atoms and an alkylene group having 1 to 4 carbon atoms. A phenylene group, a naphthylene group, a biphenylene group or a phenylene group substituted with a phenyl group are most preferred.

$L_{22}$ represents an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these.

Preferably, $L_{22}$ is an alkylene group, bivalent aromatic ring group or group composed of a combination of these whose hydrogen atoms are partially or entirely substituted with a fluorine atom or a fluoroalkyl group (more preferably a perfluoroalkyl group). An alkylene group and bivalent aromatic ring group at least partially or entirely substituted with a fluorine atom are especially preferred. $L_{22}$ is most preferably an alkylene group or bivalent aromatic ring group, 30 to 100% of the hydrogen atoms of which are substituted with a fluorine atom.

The alkylene group represented by $L_{22}$ may be linear or branched. As preferred examples thereof, there can be mentioned, for example, alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diadamantanylene group.

Particular examples of the bivalent aromatic ring group are the same as set forth above with respect to the bivalent aromatic ring group as a connecting group represented by $L_{21}$.

Particular examples of the —NR— and bivalent nitrogen-containing nonaromatic heterocyclic group as connecting groups represented by $L_{22}$ are the same as mentioned above in connection with $X_{21}$. Preferred examples are also the same.

As preferred particular examples of the structures represented by $L_{22}$, there can be mentioned those set forth above with respect to $L_{12}$ of general formula (I).

$Z_2$ represents a moiety that when exposed to actinic rays or radiation, becomes a sulfonate group, an imidate group or a methide group. The meaning of $Z_2$ is the same as that of $Z_1$ of general formula (I). The above description regarding $Z_1$ also applies to $Z_2$.

Examples of particular structures of the cations for constituting onium salts suitable as $Z_2$ in general formula (II) will be shown hereinafter.

With respect to the polymerizable monomer unit corresponding to the repeating unit of general formula (II), examples thereof will be shown below as sulfonate, imidate and methide units formed by the cleavage of a cation upon exposure to actinic rays or radiation.

-continued
(II-1)
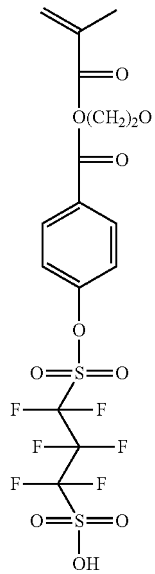
(II-2)
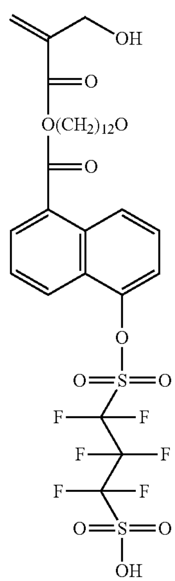
(II-3)
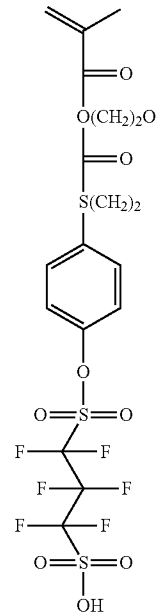
(II-4)
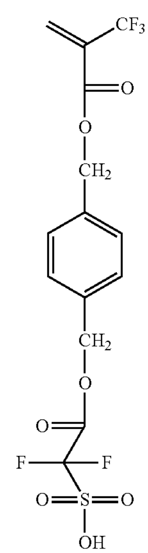

-continued
(II-5)
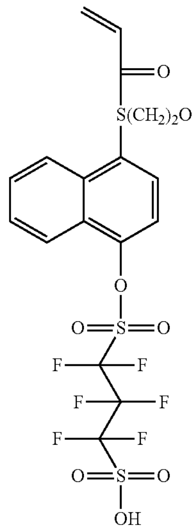
(II-6)
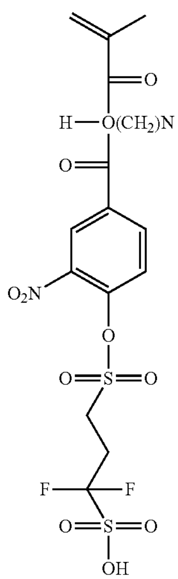
(II-7)
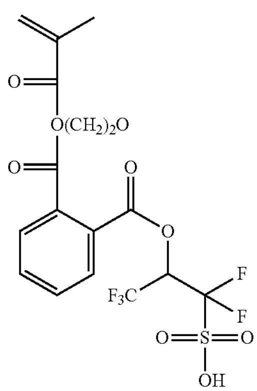
-continued
(II-8)
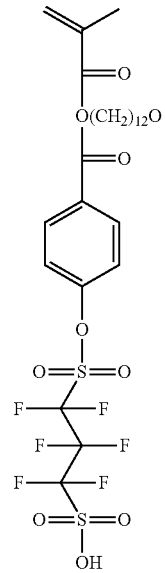
(II-9)
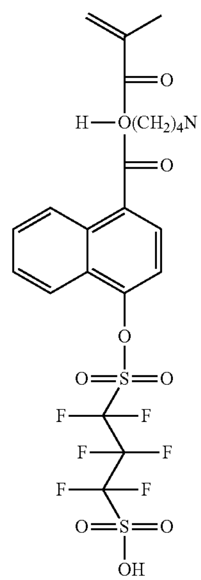

(II-10)
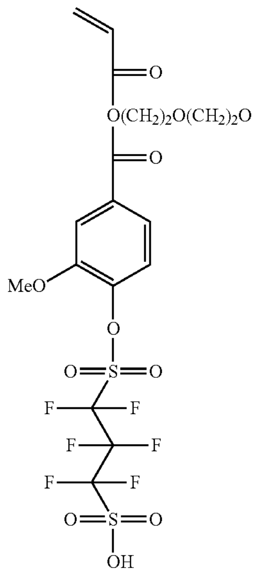
(II-11)
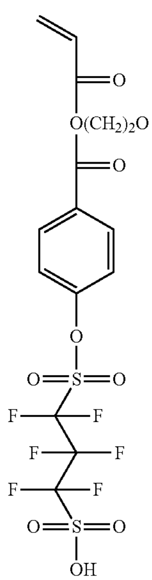
(II-12)
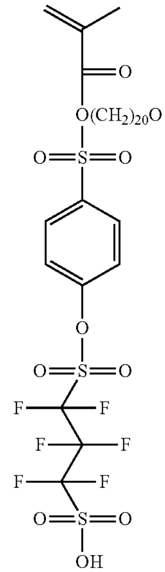
(II-13)
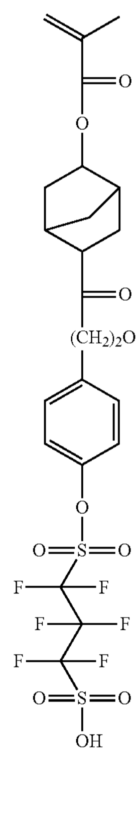

-continued
(II-14)
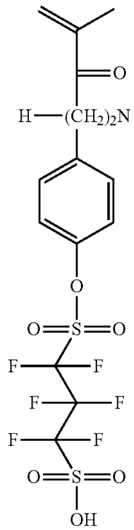
(II-15)
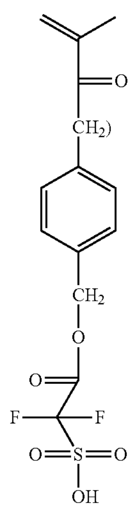
-continued
(II-16)
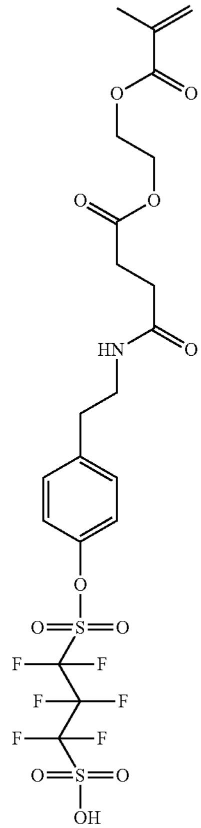
(II-17)
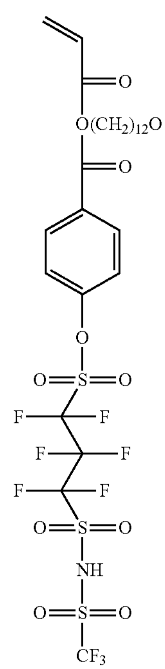

-continued
(II-18)
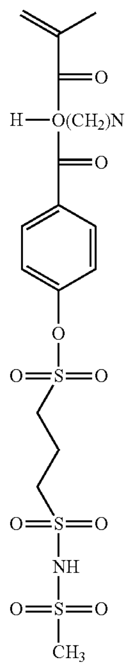
(II-19)
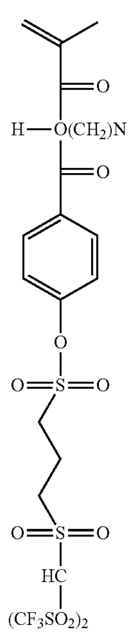
-continued
(II-20)
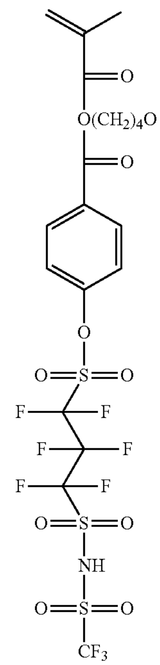
(II-21)
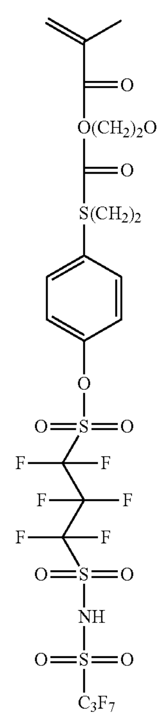

-continued
(II-22)
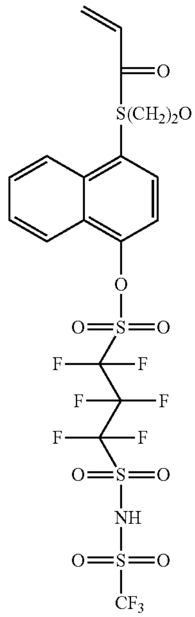
(II-23)
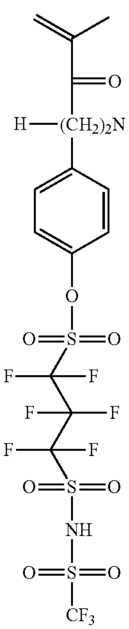
-continued
(II-24)
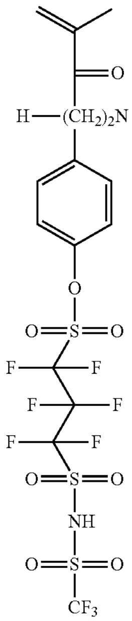
(II-25)
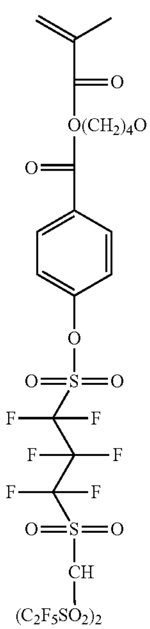

-continued (II-26)

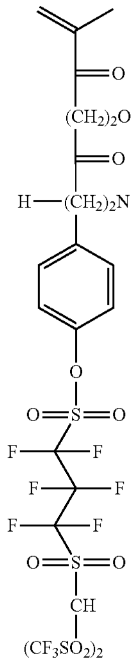

(II-27)

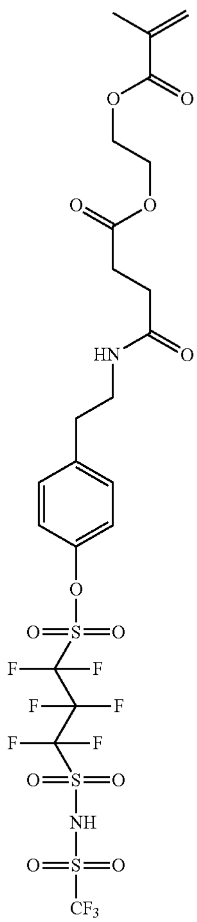

Moreover, the repeating unit (A) in its other form may be any of repeating units wherein an aromatic ring is contained in the side chain excluding the cation counter to the acid anion, expressed by formulae other than general formulae (I) and (II).

With respect to the polymerizable monomer unit corresponding to this repeating unit (A), examples thereof will be shown below as sulfonate, imidate and methide units formed by the cleavage of a cation upon exposure to actinic rays or radiation.

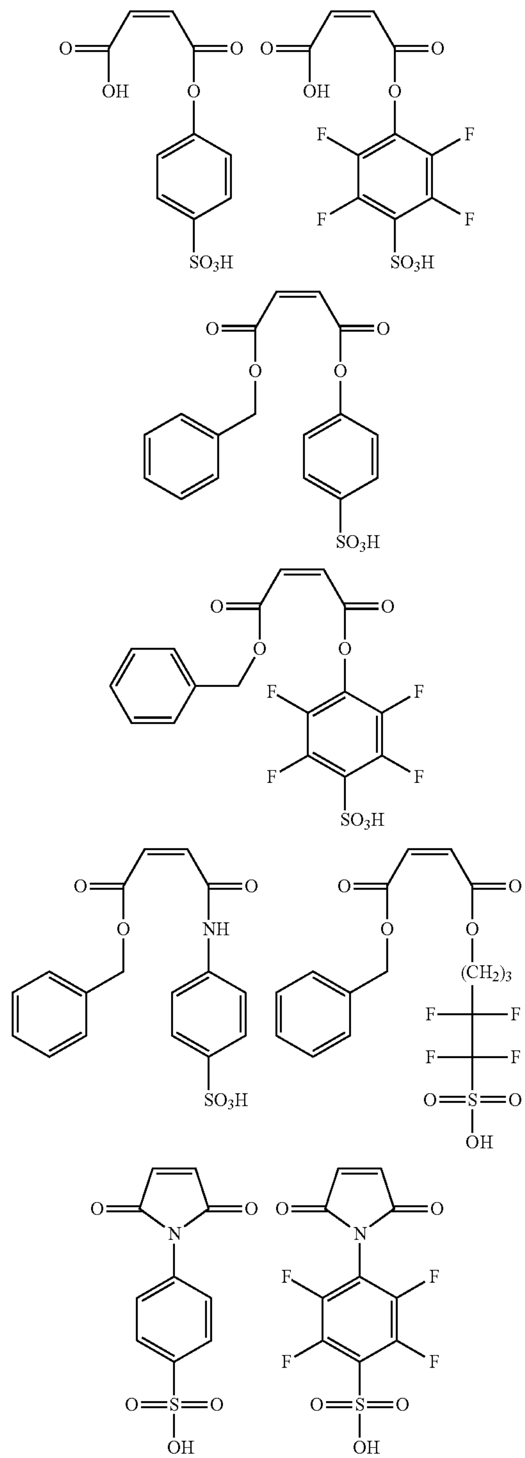

-continued

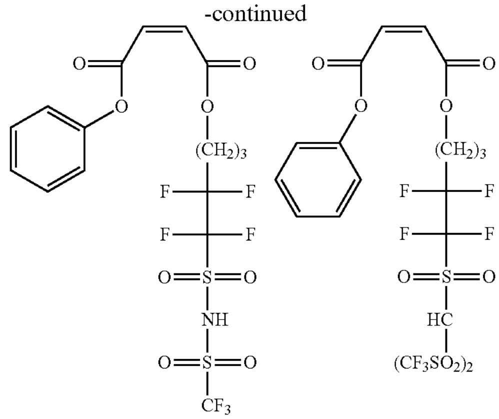

The repeating units of general formula (III) below are also preferred as the repeating unit (A).

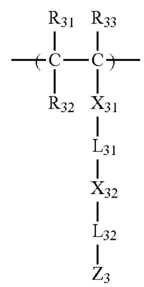

(III)

In general formula (III), each of $R_{31}$, $R_{32}$ and $R_{33}$ independently represents a hydrogen atom, an alkyl group, a monovalent aliphatic hydrocarbon ring group, a halogen atom, a cyano group or an alkoxycarbonyl group.

The alkyl group is an optionally substituted linear or branched alkyl group, preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred. An alkyl group having 3 or less carbon atoms is most preferred.

The alkyl group contained in the alkoxycarbonyl group is preferably the same as the alkyl group mentioned above with respect to $R_{31}$, $R_{32}$ and $R_{33}$.

As the monovalent aliphatic hydrocarbon ring group, there can be mentioned an optionally substituted mono- or polycycloalkyl group. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is especially preferred.

As preferred substituents that can be introduced in these groups, there can be mentioned a hydroxyl group; a halogen atom (fluorine, chlorine, bromine or iodine); a nitro group; a cyano group; an amido group; a sulfonamido group; any of the alkyl groups mentioned above with respect to $R_{21}$ to $R_{23}$; an alkoxy group, such as a methoxy group, an ethoxy group, a hydroxyethoxy group, a propoxy group, a hydroxypropoxy group or a butoxy group; an alkoxycarbonyl group, such as a methoxycarbonyl group or an ethoxycarbonyl group; an acyl group, such as a formyl group, an acetyl group or a benzoyl group; an acyloxy group, such as an acetoxy group or a butyryloxy group; and a carboxyl group. A hydroxyl group and a halogen atom are especially preferred.

In general formula (III), each of $R_{31}$, $R_{32}$ and $R_{33}$ preferably represents a hydrogen atom, an alkyl group or a halogen atom, especially preferably a hydrogen atom, a methyl group, an ethyl group, a trifluoromethyl group (—$CF_3$), a hydroxymethyl group (—$CH_2$—OH), a chloromethyl group (—$CH_2$—Cl) and a fluorine atom (—F).

Each of $X_{31}$ and $X_{32}$ independently represents a single bond, —O—, —S—, —CO—, —$SO_2$—, —NR— (R represents a hydrogen atom or an alkyl group), a bivalent nitrogen-containing nonaromatic heterocyclic group or a group composed of a combination of these.

In —NR—, the alkyl group represented by R is an optionally substituted linear or branched alkyl group. Particular examples of such alkyl groups are the same as mentioned above with respect to the alkyl groups represented by $R_{31}$, $R_{32}$ and $R_{33}$. Most preferably, R is a hydrogen atom, a methyl group or an ethyl group.

The above bivalent nitrogen-containing nonaromatic heterocyclic group refers to a nonaromatic heterocyclic group, preferably 3- to 8-membered, containing at least one nitrogen atom. For example, there can be mentioned any of the structures set forth above as examples with respect to $X_{11}$ to $X_{13}$ of general formula (I).

Preferably, $X_{31}$ is a single bond, —O—, —CO— or —NR— (R represents a hydrogen atom or an alkyl group) or a group composed of a combination of these. —COO— and —CONR— (R represents a hydrogen atom or an alkyl group) are especially preferred.

Preferably, $X_{32}$ is a single bond, —O—, —CO—, —$SO_2$— or a bivalent nitrogen-containing nonaromatic heterocyclic group or a group composed of a combination of these. —COO—, —$OSO_2$— and a group composed of a combination of a bivalent nitrogen-containing nonaromatic heterocyclic group and —$SO_2$— are especially preferred.

$L_{31}$ represents a single bond, an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these.

The alkylene group represented by $L_{31}$ may be linear or branched. As preferred examples thereof, there can be mentioned, for example, alkylene groups having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the alkylene group described above in connection with $L_{31}$.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diamantanylene group. A bivalent aliphatic hydrocarbon ring group having 5 to 12 carbon atoms is more preferred. A bivalent aliphatic hydrocarbon ring group having 6 to 10 carbon atoms is more preferred.

Particular examples of the —NR— and bivalent nitrogen-containing nonaromatic heterocyclic group are the same as mentioned above in connection with $X_{31}$. Preferred examples are also the same.

Most preferably, $L_{31}$ is a single bond, an alkylene group, a bivalent aliphatic hydrocarbon ring group or a group composed of two or more of these combined through —OCO—, —O— or —CONH— as a connecting group (for example, -alkylene group-O-alkylene group-, -alkylene group-OCO-alkylene group-, -bivalent aliphatic hydrocarbon ring group-O-alkylene group-, -alkylene group-CONH-alkylene group- and the like).

$L_{32}$ represents an alkylene group, an alkenylene group, a bivalent aliphatic hydrocarbon ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these.

Preferably, $L_{32}$ is an alkylene group whose hydrogen atoms are partially or entirely substituted with a fluorine atom or a fluoroalkyl group (more preferably a perfluoroalkyl group). An alkylene group at least partially or entirely substituted with a fluorine atom are especially preferred. $L_{32}$ is most preferably an alkylene group, 30 to 100% of the hydrogen atoms of which are substituted with a fluorine atom.

The alkylene group represented by $L_{32}$ may be linear or branched. As preferred examples thereof, there can be mentioned, for example, alkylene groups each having 1 to 8 carbon atoms, such as a methylene group, an ethylene group, a propylene group, a butylene group, a hexylene group and an octylene group. An alkylene group having 1 to 6 carbon atoms is more preferred. An alkylene group having 1 to 4 carbon atoms is most preferred.

As the alkenylene group, there can be mentioned a group resulting from the introduction of a double bond in any position of the above alkylene group.

The bivalent aliphatic hydrocarbon ring group may be monocyclic or polycyclic. As preferred examples thereof, there can be mentioned, for example, bivalent aliphatic hydrocarbon ring groups each having 3 to 17 carbon atoms, such as a cyclobutylene group, a cyclopentylene group, a cyclohexylene group, a norbornanylene group, an adamantylene group or a diadamantanylene group.

Particular examples of the —NR— and bivalent nitrogen-containing nonaromatic heterocyclic group as connecting groups represented by $L_{32}$ are the same as mentioned above in connection with $X_{31}$. Preferred examples are also the same.

As preferred particular examples of the structures represented by $L_{32}$, there can be mentioned those set forth above with respect to $L_{12}$ of general formula (I).

$Z_3$ represents a moiety that when exposed to actinic rays or radiation, becomes a sulfonate group, an imidate group or a methide group. The meaning of $Z_3$ is the same as that of $Z_1$ of general formula (I). The above description regarding $Z_1$ also applies to $Z_3$.

Examples of particular structures of the cations for constituting onium salts suitable as $Z_3$ in general formula (III) will be shown hereinafter.

With respect to the polymerizable monomer unit corresponding to the repeating unit of general formula (III), examples thereof will be shown below as sulfonate, imidate and methide units formed by the cleavage of a cation upon exposure to actinic rays or radiation.

(III-1)

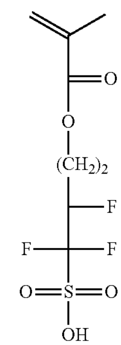

(III-2)

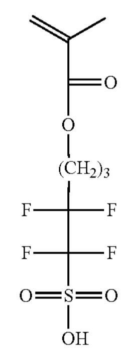

(III-3)

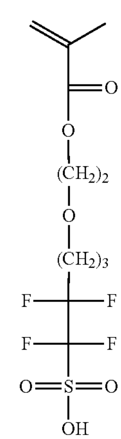

-continued
(III-4)
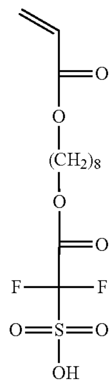
(III-5)
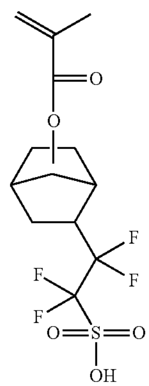
(III-6)
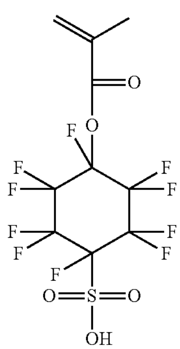
(III-7)
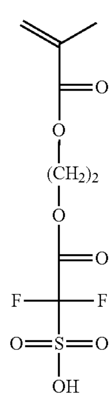
-continued
(III-8)
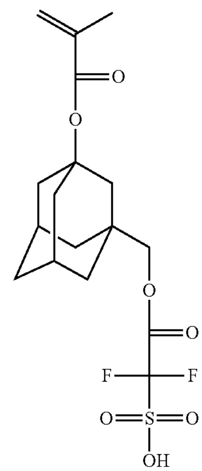
(III-9)
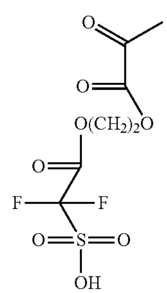
(III-10)
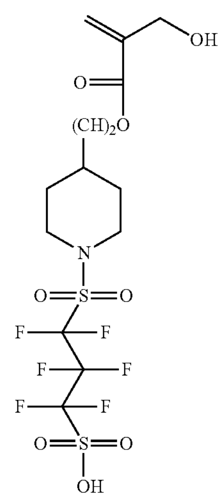

-continued
(III-11)
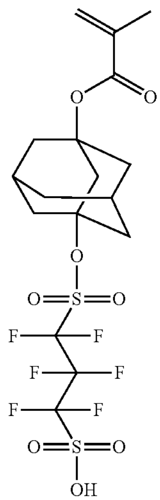
(III-12)
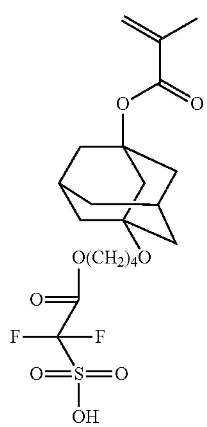
(III-13)
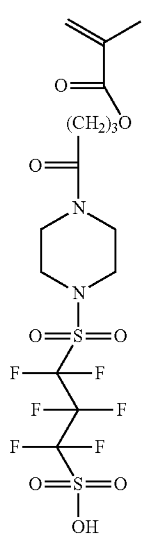
-continued
(III-14)
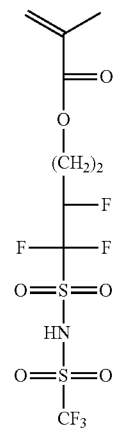
(III-15)
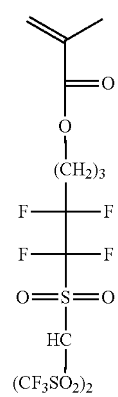
(III-16)
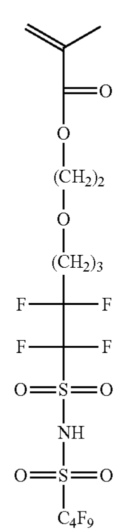

-continued
(III-17)
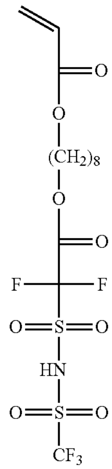
(III-18)
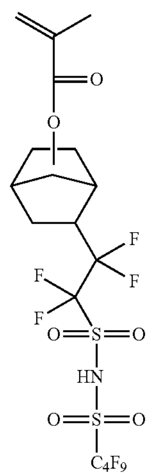
(III-19)
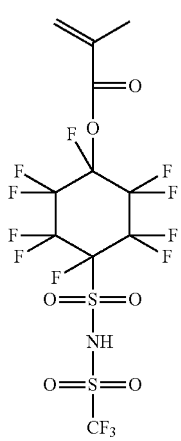
-continued
(III-20)
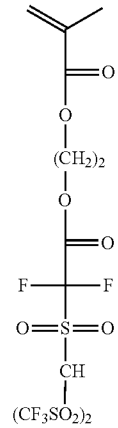
(III-21)
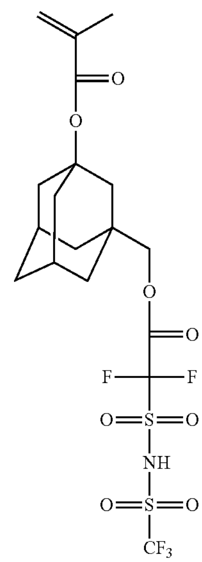
(III-22)
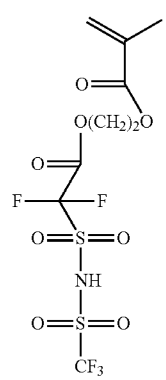

-continued
(III-23)
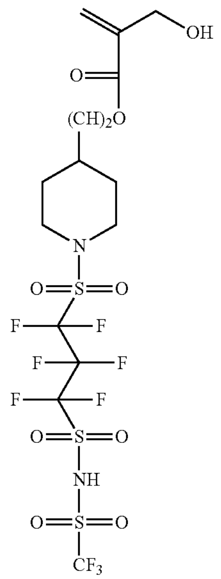
(III-24)
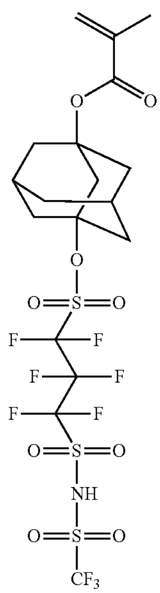
(III-25)
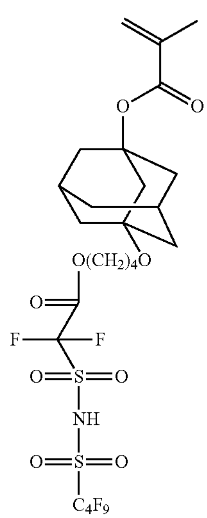
-continued
(III-26)
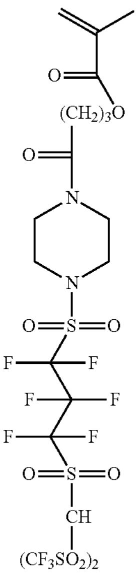
(III-27)
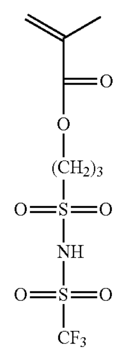
(III-28)
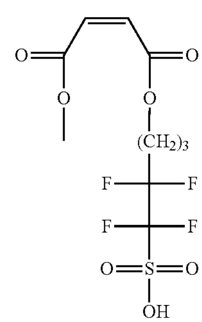
(III-29)
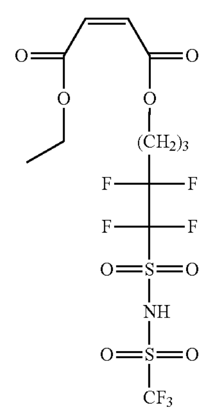

-continued
(III-30)
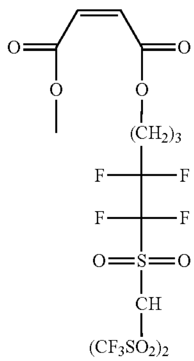
(III-31)
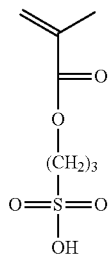
(III-32)
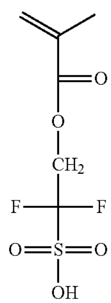
(III-33)
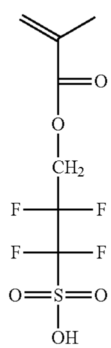
(III-34)
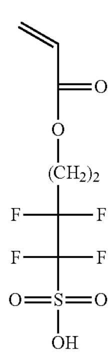
-continued
(III-35)
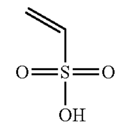
(III-36)
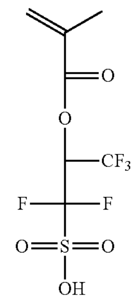
(III-37)
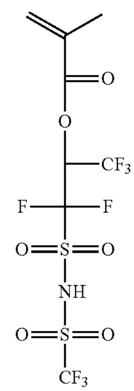
(III-38)
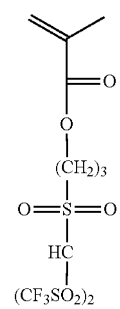
(III-39)
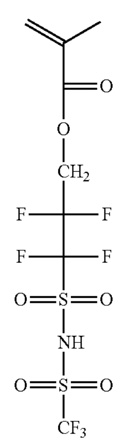

-continued (III-40)

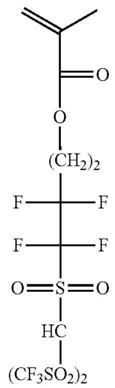

The polymerizable compounds corresponding to the repeating units (A) can be synthesized through the general sulfonating reaction or sulfonamidating reaction. For example, the polymerizable compounds can be obtained by either a method in which one of the sulfonyl halide moieties of a bissulfonyl halide compound is selectively reacted with an amine, an alcohol and the like to thereby form a sulfonamide bond or a sulfonic ester bond and thereafter the other sulfonyl halide moiety is hydrolyzed, or a method in which the ring of a cyclic sulfonic anhydride is opened by an amine or an alcohol. Further, the polymerizable compounds can be easily synthesized through the methods described in U.S. Pat. No. 5,554,664, J. Fluorine Chem. 105 (2000) 129-136 and J. Fluorine Chem. 116 (2002) 45-48.

The polymerizable compounds corresponding to the repeating units (A) can be easily synthesized from a lithium, sodium or potassium salt of organic acid synthesized above, a hydroxide, bromide or chloride of iodonium or sulfonium, etc. through the salt exchange method described in Jpn. PCT National Publication No. 11-501909 and JP-A-2003-246786, or the salt exchange method described in JP-A-10-232490 and Japanese Patent No. 4025039.

With respect to the repeating unit (A), specific examples of the cations counter to the acid anions generated in side chains of the resin by the decomposition upon exposure to actinic rays or radiation will be shown below.

(Z-1)

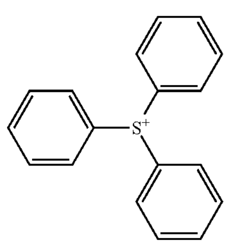

(Z-2)

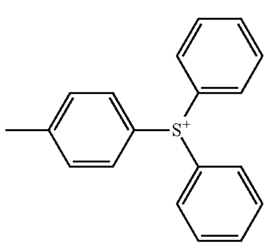

-continued (Z-3)

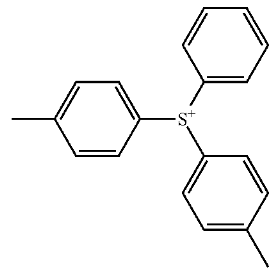

(Z-4)

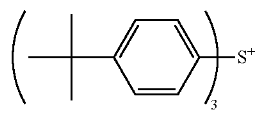

(Z-5)

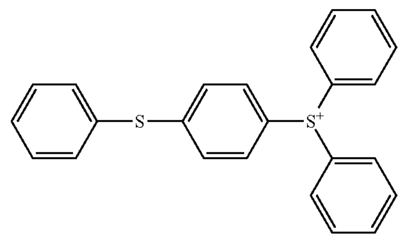

(Z-6)

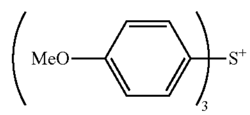

(Z-7)

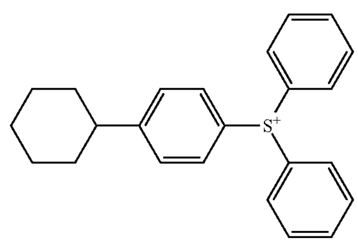

(Z-8)

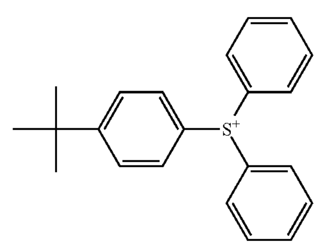

(Z-9)

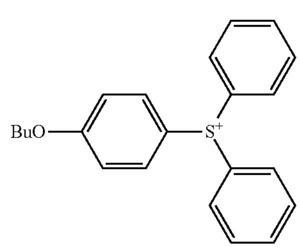

-continued
(Z-10)
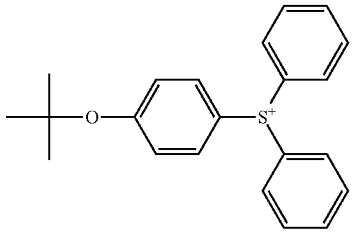
(Z-11)
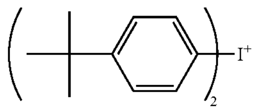
(Z-12)
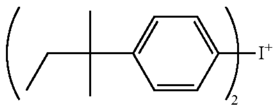
(Z-13)
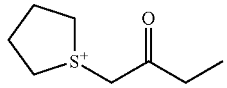
(Z-14)
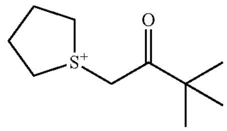
(Z-15)
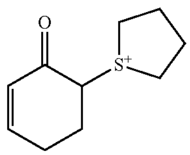
(Z-16)
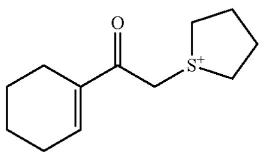
(Z-17)
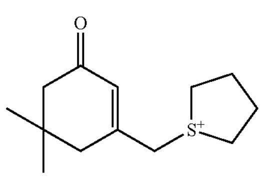
(Z-18)
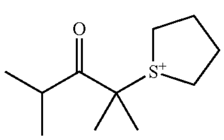
(Z-19)
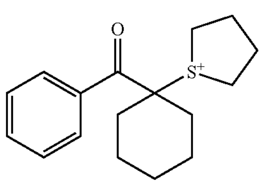
-continued
(Z-20)
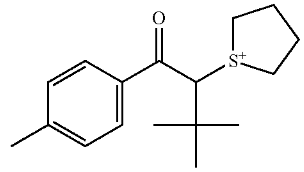
(Z-21)
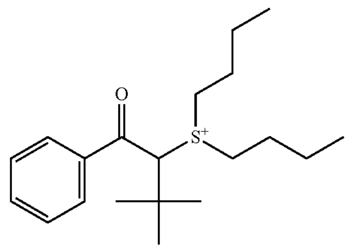
(Z-22)
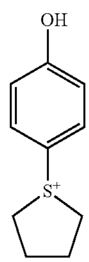
(Z-23)
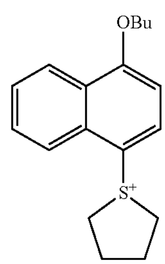
(Z-24)
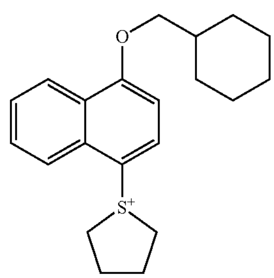
(Z-25)
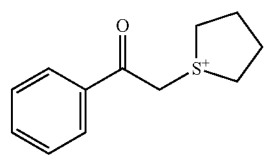
(Z-26)
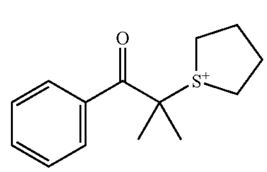

-continued
(Z-27)
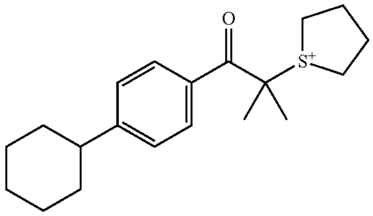
(Z-28)
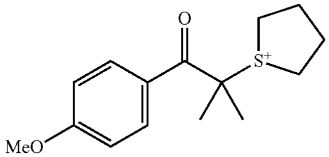
(Z-29)
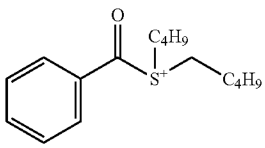
(Z-30)
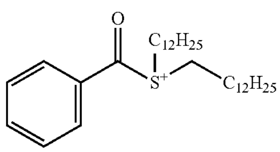
(Z-31)
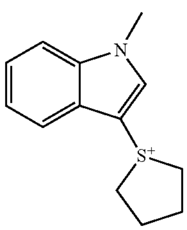
(Z-32)
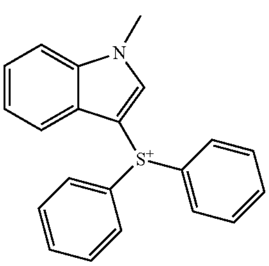
(Z-33)
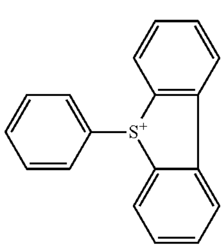
-continued
(Z-34)
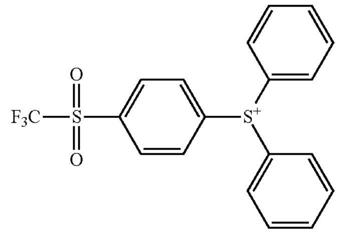
(Z-35)
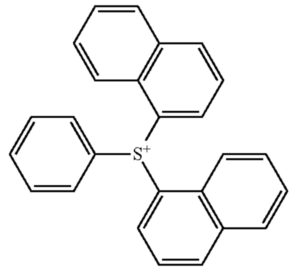
(Z-36)
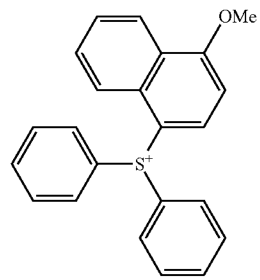
(Z-37)
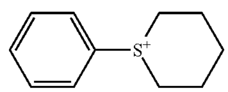
(Z-38)
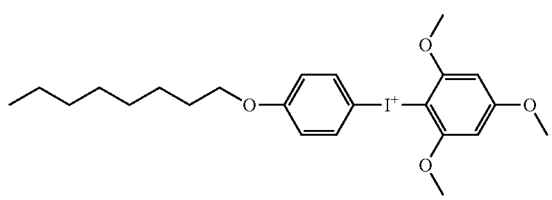
(Z-39)
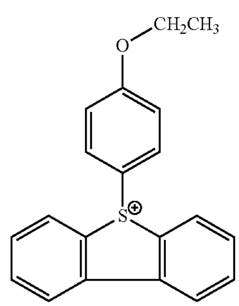

-continued
(Z-40)
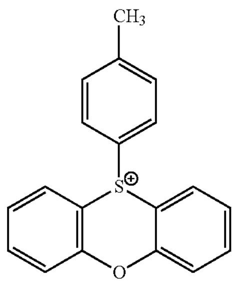
(Z-41)
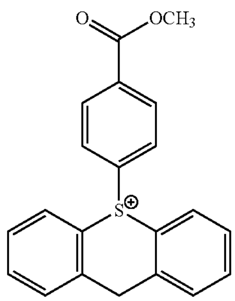
(Z-42)
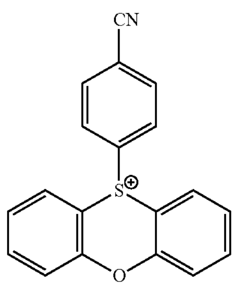
(Z-43)
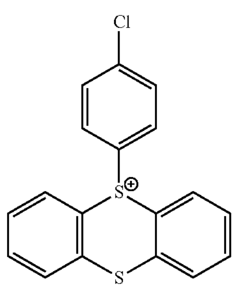
(Z-44)
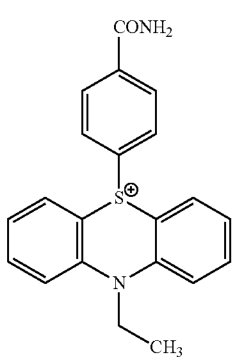
-continued
(Z-45)
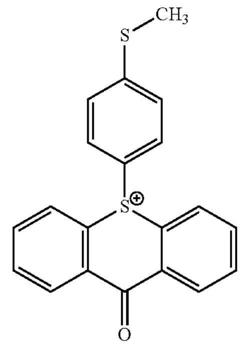
(Z-46)
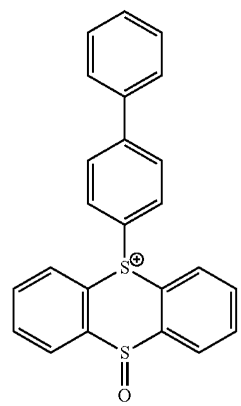
(Z-47)
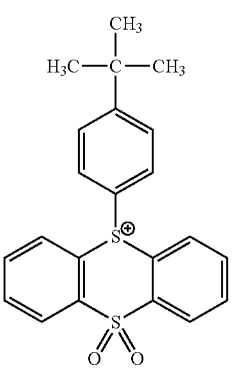
(Z-48)
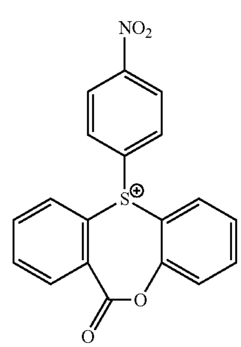

-continued
(Z-49)
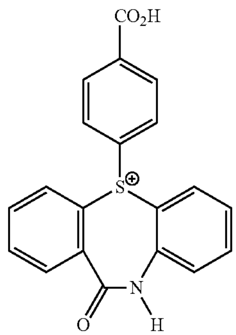
(Z-50)
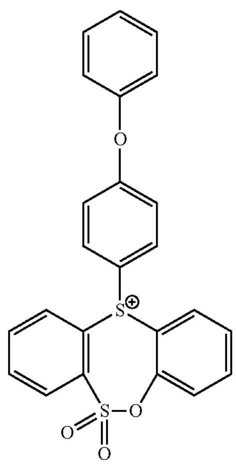
(Z-51)
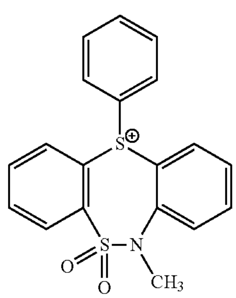
(Z-52)
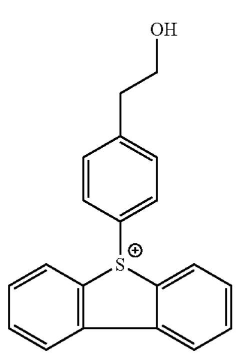
-continued
(Z-53)
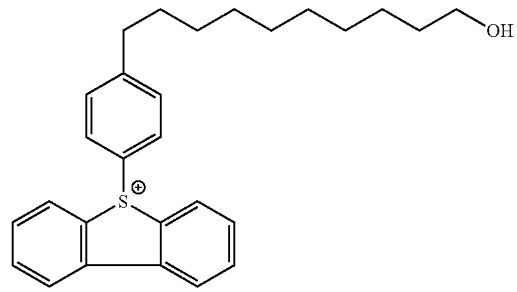
(Z-54)
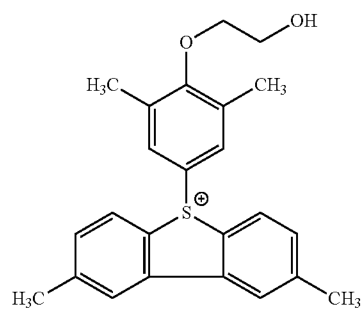
(Z-55)
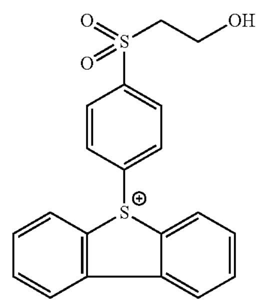
(Z-56)
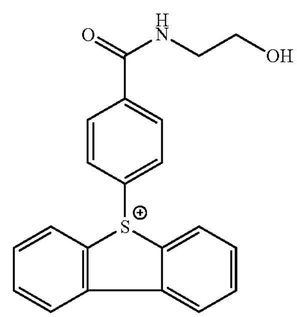
(Z-57)
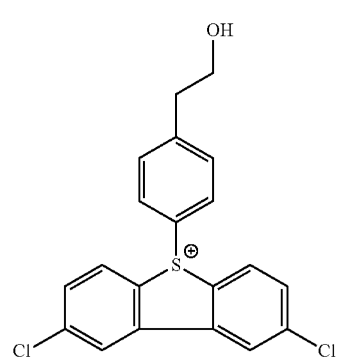

-continued (Z-58)

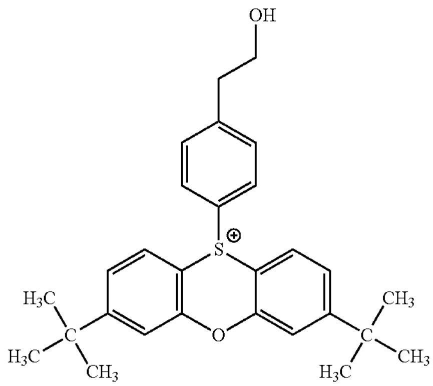

The following Tables list particular examples of the polymerizable compounds (M) corresponding to the repeating units (A) as combinations of cation structure (examples (Z-1) to (Z-58) given above) and anion structure (anions resulting from the removal of a hydrogen atom from organic acid examples (I-1) to (I-65), (II-1) to (II-27) and (III-1) to (III-40) given above).

TABLE 1

| Polymerizable comp. (M) | Cation structure | Anion structure |
|---|---|---|
| M-I-1 | Z-1 | I-1 |
| M-I-2 | Z-2 | I-2 |
| M-I-3 | Z-1 | I-3 |
| M-I-4 | Z-1 | I-4 |
| M-I-5 | Z-3 | I-5 |
| M-I-6 | Z-1 | I-6 |
| M-I-7 | Z-4 | I-7 |
| M-I-8 | Z-1 | I-8 |
| M-I-9 | Z-5 | I-9 |
| M-I-10 | Z-1 | I-10 |
| M-I-11 | Z-6 | I-11 |
| M-I-12 | Z-1 | I-12 |
| M-I-13 | Z-7 | I-13 |
| M-I-14 | Z-1 | I-14 |
| M-I-15 | Z-8 | I-15 |
| M-I-16 | Z-1 | I-16 |
| M-I-17 | Z-9 | I-17 |
| M-I-18 | Z-1 | I-18 |
| M-I-19 | Z-10 | I-19 |
| M-I-20 | Z-1 | I-20 |
| M-I-21 | Z-1 | I-21 |
| M-I-22 | Z-11 | I-22 |
| M-I-23 | Z-1 | I-23 |
| M-I-24 | Z-1 | I-24 |
| M-I-25 | Z-12 | I-25 |
| M-I-26 | Z-1 | I-26 |
| M-I-27 | Z-1 | I-27 |
| M-I-28 | Z-13 | I-28 |
| M-I-29 | Z-1 | I-29 |
| M-I-30 | Z-14 | I-30 |
| M-I-31 | Z-1 | I-31 |
| M-I-32 | Z-15 | I-32 |
| M-I-33 | Z-1 | I-33 |
| M-I-34 | Z-1 | I-34 |
| M-I-35 | Z-1 | I-35 |
| M-I-36 | Z-17 | I-36 |
| M-I-37 | Z-1 | I-37 |
| M-I-38 | Z-18 | I-38 |
| M-I-39 | Z-1 | I-39 |
| M-I-40 | Z-19 | I-40 |
| M-I-41 | Z-1 | I-41 |
| M-I-42 | Z-1 | I-42 |
| M-I-43 | Z-1 | I-43 |
| M-I-44 | Z-1 | I-44 |
| M-I-45 | Z-1 | I-45 |

TABLE 1-continued

| Polymerizable comp. (M) | Cation structure | Anion structure |
|---|---|---|
| M-I-46 | Z-20 | I-46 |
| M-I-47 | Z-1 | I-47 |
| M-I-48 | Z-21 | I-48 |
| M-I-49 | Z-22 | I-49 |
| M-I-50 | Z-1 | I-50 |
| M-I-51 | Z-23 | I-50 |
| M-I-52 | Z-1 | I-51 |
| M-I-53 | Z-1 | I-52 |
| M-I-54 | Z-24 | I-53 |
| M-I-55 | Z-1 | I-54 |
| M-I-56 | Z-25 | I-55 |
| M-I-57 | Z-1 | I-56 |
| M-I-58 | Z-1 | I-57 |
| M-I-59 | Z-26 | I-58 |
| M-I-60 | Z-1 | I-59 |
| M-I-61 | Z-27 | I-60 |
| M-I-62 | Z-1 | I-61 |
| M-I-63 | Z-28 | I-62 |
| M-I-64 | Z-1 | I-63 |
| M-I-65 | Z-29 | I-64 |
| M-I-66 | Z-1 | I-65 |
| M-I-67 | Z-30 | I-2 |
| M-I-68 | Z-31 | I-4 |
| M-I-69 | Z-32 | I-5 |
| M-I-70 | Z-33 | I-6 |
| M-I-71 | Z-34 | I-7 |
| M-I-72 | Z-35 | I-8 |
| M-I-73 | Z-36 | I-9 |
| M-I-74 | Z-37 | I-10 |
| M-I-75 | Z-38 | I-11 |
| M-I-76 | Z-39 | I-12 |
| M-I-77 | Z-40 | I-13 |
| M-I-78 | Z-41 | I-14 |
| M-I-79 | Z-42 | I-15 |
| M-I-80 | Z-43 | I-16 |
| M-I-81 | Z-44 | I-17 |
| M-I-82 | Z-45 | I-18 |
| M-I-83 | Z-46 | I-19 |
| M-I-84 | Z-47 | I-20 |
| M-I-85 | Z-48 | I-21 |
| M-I-86 | Z-49 | I-22 |
| M-I-87 | Z-50 | I-23 |
| M-I-88 | Z-51 | I-24 |
| M-I-89 | Z-52 | I-1 |
| M-I-90 | Z-52 | I-3 |
| M-I-91 | Z-52 | I-41 |
| M-I-92 | Z-52 | I-43 |
| M-I-93 | Z-52 | I-44 |
| M-I-94 | Z-53 | I-25 |
| M-I-95 | Z-54 | I-26 |
| M-I-96 | Z-55 | I-27 |
| M-I-97 | Z-56 | I-28 |
| M-I-98 | Z-57 | I-29 |
| M-I-99 | Z-57 | I-30 |
| M-I-100 | Z-58 | I-31 |

TABLE 2

| Polymerizable comp. (M) | Cation structure | Anion structure |
|---|---|---|
| M-II-1 | Z-1 | II-1 |
| M-II-2 | Z-1 | II-2 |
| M-II-3 | Z-1 | II-3 |
| M-II-4 | Z-1 | II-4 |
| M-II-5 | Z-1 | II-5 |
| M-II-6 | Z-1 | II-6 |
| M-II-7 | Z-1 | II-7 |
| M-II-8 | Z-1 | II-8 |
| M-II-9 | Z-1 | II-9 |
| M-II-10 | Z-1 | II-10 |
| M-II-11 | Z-1 | II-11 |
| M-II-12 | Z-1 | II-12 |
| M-II-13 | Z-1 | II-13 |

TABLE 2-continued

| Polymerizable comp. (M) | Cation structure | Anion structure |
|---|---|---|
| M-II-14 | Z-1 | II-14 |
| M-II-15 | Z-1 | II-15 |
| M-II-16 | Z-1 | II-16 |
| M-II-17 | Z-1 | II-17 |
| M-II-18 | Z-1 | II-18 |
| M-II-19 | Z-1 | II-19 |
| M-II-20 | Z-1 | II-20 |
| M-II-21 | Z-1 | II-21 |
| M-II-22 | Z-1 | II-22 |
| M-II-23 | Z-1 | II-23 |
| M-II-24 | Z-1 | II-24 |
| M-II-25 | Z-1 | II-25 |
| M-II-26 | Z-1 | II-26 |
| M-II-27 | Z-1 | II-27 |
| M-II-28 | Z-2 | II-1 |
| M-II-29 | Z-3 | II-2 |
| M-II-30 | Z-4 | II-3 |
| M-II-31 | Z-5 | II-4 |
| M-II-32 | Z-6 | II-5 |
| M-II-33 | Z-7 | II-6 |
| M-II-34 | Z-8 | II-7 |
| M-II-35 | Z-9 | II-8 |
| M-II-36 | Z-10 | II-9 |
| M-II-37 | Z-11 | II-10 |
| M-I1-38 | Z-12 | II-11 |
| M-II-39 | Z-13 | II-12 |
| M-II-40 | Z-14 | II-13 |
| M-II-41 | Z-15 | II-14 |
| M-II-42 | Z-16 | II-15 |
| M-II-43 | Z-17 | II-16 |
| M-II-44 | Z-18 | II-17 |
| M-II-45 | Z-19 | II-18 |
| M-II-46 | Z-20 | II-19 |
| M-II-47 | Z-21 | II-20 |
| M-II-48 | Z-22 | II-21 |
| M-II-49 | Z-23 | II-22 |
| M-II-50 | Z-24 | II-23 |
| M-II-51 | Z-25 | II-24 |
| M-II-52 | Z-26 | II-25 |
| M-II-53 | Z-27 | II-26 |
| M-II-54 | Z-28 | II-27 |
| M-II-55 | Z-29 | II-1 |
| M-II-56 | Z-30 | II-2 |
| M-II-57 | Z-31 | II-3 |
| M-II-58 | Z-32 | II-4 |
| M-II-59 | Z-33 | II-5 |
| M-II-60 | Z-34 | II-6 |
| M-II-61 | Z-35 | II-7 |
| M-II-62 | Z-36 | II-8 |
| M-II-63 | Z-37 | II-9 |
| M-II-64 | Z-38 | II-10 |
| M-II-65 | Z-39 | II-11 |
| M-II-66 | Z-40 | II-12 |
| M-II-67 | Z-41 | II-13 |
| M-II-68 | Z-42 | II-14 |
| M-II-69 | Z-43 | II-15 |
| M-II-70 | Z-44 | II-16 |
| M-II-71 | Z-45 | II-17 |
| M-II-72 | Z-46 | II-18 |
| M-II-73 | Z-47 | II-19 |
| M-II-74 | Z-48 | II-20 |
| M-II-75 | Z-49 | II-21 |
| M-II-76 | Z-50 | II-22 |
| M-II-77 | Z-51 | II-23 |
| M-II-78 | Z-52 | II-24 |
| M-II-79 | Z-52 | II-25 |
| M-II-80 | Z-52 | II-26 |
| M-II-81 | Z-52 | II-27 |
| M-II-82 | Z-52 | II-1 |
| M-II-83 | Z-52 | II-2 |
| M-II-84 | Z-52 | II-3 |
| M-II-85 | Z-52 | II-4 |
| M-II-86 | Z-52 | II-5 |
| M-II-87 | Z-52 | II-6 |
| M-II-88 | Z-52 | II-7 |
| M-II-89 | Z-52 | II-8 |
| M-II-90 | Z-52 | II-9 |

TABLE 2-continued

| Polymerizable comp. (M) | Cation structure | Anion structure |
|---|---|---|
| M-II-91 | Z-52 | II-10 |
| M-II-92 | Z-52 | II-11 |
| M-II-93 | Z-52 | II-12 |
| M-II-94 | Z-52 | II-13 |
| M-II-95 | Z-53 | II-14 |
| M-II-96 | Z-54 | II-15 |
| M-II-97 | Z-55 | II-16 |
| M-II-98 | Z-56 | II-17 |
| M-II-99 | Z-57 | II-18 |
| M-II-100 | Z-58 | II-19 |

TABLE 3

| Polymerizable comp. (M) | Cation structure | Anion structure |
|---|---|---|
| M-III-1 | Z-1 | III-1 |
| M-III-2 | Z-1 | III-2 |
| M-III-3 | Z-1 | III-3 |
| M-III-4 | Z-1 | III-4 |
| M-III-5 | Z-1 | III-5 |
| M-III-6 | Z-1 | III-6 |
| M-III-7 | Z-1 | III-7 |
| M-III-8 | Z-1 | III-8 |
| M-III-9 | Z-1 | III-9 |
| M-III-10 | Z-1 | III-10 |
| M-III-11 | Z-1 | III-11 |
| M-III-12 | Z-1 | III-12 |
| M-III-13 | Z-1 | III-13 |
| M-III-14 | Z-1 | III-14 |
| M-III-15 | Z-1 | III-15 |
| M-III-16 | Z-1 | III-16 |
| M-III-17 | Z-1 | III-17 |
| M-III-18 | Z-1 | III-18 |
| M-III-19 | Z-1 | III-19 |
| M-III-20 | Z-1 | III-20 |
| M-III-21 | Z-1 | III-21 |
| M-III-22 | Z-1 | III-22 |
| M-III-23 | Z-1 | III-23 |
| M-III-24 | Z-1 | III-24 |
| M-III-25 | Z-1 | III-25 |
| M-III-26 | Z-1 | III-26 |
| M-III-27 | Z-1 | III-27 |
| M-III-28 | Z-1 | III-28 |
| M-III-29 | Z-52 | III-37 |
| M-III-30 | Z-1 | III-40 |
| M-III-31 | Z-1 | III-31 |
| M-III-32 | Z-1 | III-32 |
| M-III-33 | Z-1 | III-33 |
| M-III-34 | Z-1 | III-34 |
| M-III-35 | Z-1 | III-35 |
| M-III-36 | Z-1 | III-36 |
| M-III-37 | Z-1 | III-37 |
| M-III-38 | Z-1 | III-38 |
| M-III-39 | Z-1 | III-39 |
| M-III-40 | Z-2 | III-1 |
| M-III-41 | Z-3 | III-2 |
| M-III-42 | Z-4 | III-3 |
| M-III-43 | Z-5 | III-4 |
| M-III-44 | Z-6 | III-5 |
| M-III-45 | Z-7 | III-6 |
| M-III-46 | Z-8 | III-7 |
| M-III-47 | Z-9 | III-8 |
| M-III-48 | Z-10 | III-9 |
| M-III-49 | Z-11 | III-10 |
| M-III-50 | Z-12 | III-11 |
| M-III-51 | Z-13 | III-12 |
| M-III-52 | Z-14 | III-13 |
| M-III-53 | Z-15 | III-14 |
| M-III-54 | Z-16 | III-15 |
| M-III-55 | Z-17 | III-16 |
| M-III-56 | Z-18 | III-17 |
| M-III-57 | Z-19 | III-18 |
| M-III-58 | Z-20 | III-19 |

TABLE 3-continued

| Polymerizable comp. (M) | Cation structure | Anion structure |
|---|---|---|
| M-III-59 | Z-21 | III-20 |
| M-III-60 | Z-22 | III-21 |
| M-III-61 | Z-23 | III-22 |
| M-III-62 | Z-24 | III-23 |
| M-III-63 | Z-25 | III-24 |
| M-III-64 | Z-26 | III-25 |
| M-III-65 | Z-27 | III-26 |
| M-III-66 | Z-28 | III-27 |
| M-III-67 | Z-29 | III-28 |
| M-III-68 | Z-30 | III-29 |
| M-III-69 | Z-31 | III-30 |
| M-III-70 | Z-32 | III-31 |
| M-III-71 | Z-33 | III-32 |
| M-III-72 | Z-34 | III-33 |
| M-III-73 | Z-35 | III-34 |
| M-III-74 | Z-36 | III-35 |
| M-III-75 | Z-37 | III-36 |
| M-III-76 | Z-38 | III-37 |
| M-III-77 | Z-39 | III-38 |
| M-III-78 | Z-40 | III-39 |
| M-III-79 | Z-41 | III-1 |
| M-III-80 | Z-42 | III-2 |
| M-III-81 | Z-43 | III-3 |
| M-III-82 | Z-44 | III-4 |
| M-III-83 | Z-45 | III-5 |
| M-III-84 | Z-46 | III-6 |
| M-III-85 | Z-47 | III-7 |
| M-III-86 | Z-48 | III-8 |
| M-III-87 | Z-49 | III-9 |
| M-III-88 | Z-50 | III-10 |
| M-III-89 | Z-51 | III-11 |
| M-III-90 | Z-52 | III-12 |
| M-III-91 | Z-53 | III-13 |
| M-III-92 | Z-54 | III-14 |
| M-III-93 | Z-55 | III-15 |
| M-III-94 | Z-56 | III-16 |
| M-III-95 | Z-57 | III-17 |
| M-III-96 | Z-58 | III-18 |
| M-III-97 | Z-23 | III-27 |
| M-III-98 | Z-27 | III-27 |
| M-III-99 | Z-38 | III-27 |
| M-III-100 | Z-52 | III-27 |

The content of repeating unit (A) in the resin (P), based on all the repeating units of the resin, is preferably in the range of 0.5 to 80 mol %, more preferably 1 to 60 mol % and further more preferably 3 to 40 mol %.

[Repeating unit (B)] The resin (P) contains, in addition to the above repeating unit (A), a repeating unit (B) that when acted on by an acid, is decomposed to thereby generate an alkali-soluble group (hereinafter may be referred to as a "repeating unit containing an acid-decomposable group"). In the present invention, the resin (P) contains, as the repeating unit (B), at least two different types of repeating units (B1), (B2), wherein the alkali-soluble group generated by the repeating unit (B1) is different from the alkali-soluble group generated by the repeating unit (B2).

As the alkali soluble group, there can be mentioned a phenolic hydroxyl group, a carboxyl group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group and the like.

As preferred alkali soluble groups, there can be mentioned a phenolic hydroxyl group, a carboxyl group, a fluoroalcohol group (preferably hexafluoroisopropanol) and a sulfonate group.

With respect to the combination between the alkali-soluble group generated by the repeating unit (B1) and the alkali-soluble group generated by the repeating unit (B2), it is preferred to combine two types of alkali-soluble groups selected from among a phenolic hydroxyl group, a carboxyl group, a fluoroalcohol group (preferably, hexafluoroisopropanol) and a sulfonate group. The combination of a phenolic hydroxyl group and a carboxyl group is most preferred.

The acid-decomposable group is preferably a group as obtained by substituting the hydrogen atom of any of these alkali soluble groups with an acid eliminable group.

As the acid eliminable group, there can be mentioned, for example, $-O(R_{36})(R_{37})(R_{38})$, $-C(R_{01})(R_{02})(OR_{39})$, $-C(=O)-O-C(R_{36})(R_{37})(R_{38})$, $-C(R_{01})(R_{02})-O(=O)-O-C(R_{36})(R_{37})(R_{38})$, $-CH(R_{36})(Ar)$ and the like.

In the formulae, each of $R_{36}$ to $R_{39}$ independently represents an alkyl group, a monovalent aliphatic hydrocarbon ring group, a monovalent aromatic ring group, a combination of an alkylene group and a monovalent aromatic ring group or an alkenyl group. $R_{36}$ and $R_{37}$ may be bonded with each other to thereby form a ring structure.

Each of $R_{01}$ to $R_{02}$ independently represents a hydrogen atom, an alkyl group, a monovalent aliphatic hydrocarbon ring group, a monovalent aromatic ring group, a combination of an alkylene group and a monovalent aromatic ring group or an alkenyl group.

Ar represents a monovalent aromatic ring group.

The alkyl groups represented by $R_{36}$ to $R_{39}$, $R_{01}$ and $R_{02}$ each preferably have 1 to 8 carbon atoms. For example, there can be mentioned a methyl group, an ethyl group, a propyl group, an n-butyl group, a sec-butyl group, a hexyl group, an octyl group and the like.

The monovalent aliphatic hydrocarbon ring groups represented by $R_{36}$ to $R_{39}$, $R_{01}$ and $R_{02}$ may be monocyclic or polycyclic. The monocyclic groups are preferably aliphatic hydrocarbon ring groups each having 3 to 8 carbon atoms. As such, there can be mentioned, for example, a cyclopropyl group, a cyclobutyl group, a cyclopentyl group, a cyclohexyl group, a cyclooctyl group and the like. The polycyclic groups are preferably aliphatic hydrocarbon ring groups each having 6 to 20 carbon atoms. As such, there can be mentioned, for example, an adamantyl group, a norbornyl group, an isobornyl group, a camphonyl group, a dicyclopentyl group, an α-pinel group, a tricyclodecanyl group, a tetracyclododecyl group, an androstanyl group and the like. With respect to these aliphatic hydrocarbon ring groups, the carbon atoms of each thereof may be partially substituted with a heteroatom, such as an oxygen atom.

The monovalent aromatic ring groups represented by $R_{36}$ to $R_{39}$, $R_{01}$, $R_{02}$ and Ar each preferably have 6 to 10 carbon atoms. As such, there can be mentioned, for example, an aryl group, such as a phenyl group, a naphthyl group or an anthryl group, and a monovalent aromatic ring group containing a heterocycle, such as thiophene, furan, pyrrole, benzothiophene, benzofuran, benzopyrrole, triazine, imidazole, benzimidazole, triazole, thiadiazole or thiazole.

The group composed of a combination of any of alkylene groups represented by $R_{36}$ to $R_{39}$, $R_{01}$ and $R_{02}$ and a monovalent aromatic ring group is preferably an aralkyl group having 7 to 12 carbon atoms. As such, there can be mentioned, for example, a benzyl group, a phenethyl group, a naphthylmethyl group and the like.

The alkenyl groups represented by $R_{36}$ to $R_{39}$, $R_{01}$ and $R_{02}$ each preferably have 2 to 8 carbon atoms. For example, there can be mentioned a vinyl group, an allyl group, a butenyl group, a cyclohexenyl group and the like.

The ring formed by the mutual bonding of $R_{36}$ and $R_{37}$ may be monocyclic or polycyclic. The monocyclic structure is preferably an aliphatic hydrocarbon ring structure having 3 to 8 carbon atoms. As such, there can be mentioned, for example, a cyclopropane structure, a cyclobutane structure, a cyclopentane structure, a cyclohexane structure, a cycloheptane structure, a cyclooctane structure and the like. The polycyclic structure is preferably an aliphatic hydrocarbon ring structure having 6 to 20 carbon atoms. As such, there can be mentioned, for example, an adamantane structure, a norbornane structure, a dicyclopentane structure, a tricyclodecane structure, a tetracyclododecane structure and the like. With respect to these, the carbon atoms of each of the aliphatic hydrocarbon ring structures may be partially substituted with a heteroatom, such as an oxygen atom.

Substituents may be introduced in these groups represented by $R_{36}$ to $R_{39}$, $R_{01}$, $R_{02}$ and Ar. As the substituents, there can be mentioned, for example, an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group and the like. Substituents having 8 or less carbon atoms are preferred.

The repeating unit (B1) is more preferably any of those of general formula (V), below.

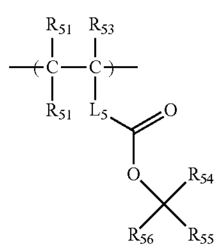

(V)

In general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring (preferably a 5- or 6-membered ring), which $R_{52}$ in this instance is an alkylene group.

$L_5$ represents a single bond or a bivalent connecting group. When a ring is formed in cooperation with $R_{52}$, $L_5$ is a trivalent connecting group.

$R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, and $R_{55}$ and $R_{56}$ are not simultaneously hydrogen atoms.

General formula (V) will be described in greater detail below.

As a preferred alkyl group represented by each of $R_{51}$ to $R_{53}$ in general formula (V), there can be mentioned an optionally substituted alkyl group having up to 20 carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having up to 8 carbon atoms is more preferred, and an alkyl group having up to 3 carbon atoms is most preferred.

The alkyl group contained in the alkoxycarbonyl group is preferably the same as that represented by each of $R_{51}$ to $R_{53}$ above.

The monovalent aliphatic hydrocarbon ring group may be monocyclic or polycyclic. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is most preferred.

As preferred substituents that can be introduced in these groups, there can be mentioned, for example, an alkyl group, a monovalent aliphatic hydrocarbon ring group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, a nitro group and the like. Preferably, the number of carbon atoms of each of the substituents is up to 8.

When $R_{52}$ is an alkylene group, the alkylene group is preferably an alkylene group having 1 to 8 carbon atoms, such as a methylene group, an ethylene group, a propylene group, a butylene group, a hexylene group or an octylene group. An alkylene group having 1 to 4 carbon atoms is more preferred, and an alkylene group having 1 or 2 carbon atoms is most preferred.

In formula (V), each of $R_{51}$ and $R_{53}$ is more preferably a hydrogen atom, an alkyl group or a halogen atom, most preferably a hydrogen atom, a methyl group, an ethyl group, a trifluoromethyl group (—$CF_3$), a hydroxymethyl group (—$CH_2$—OH), a chloromethyl group (—$CH_2$—Cl) or a fluorine atom (—F). $R_{52}$ is more preferably a hydrogen atom, an alkyl group, a halogen atom or an alkylene group (forming a ring in cooperation with $L_5$), most preferably a hydrogen atom, a methyl group, an ethyl group, a trifluoromethyl group (—$CF_3$), a hydroxymethyl group (—$CH_2$—OH), a chloromethyl group (—$CH_2$—Cl), a fluorine atom (—F), a methylene group (forming a ring in cooperation with $L_5$) or an ethylene group (forming a ring in cooperation with $L_5$).

As the bivalent connecting group represented by $L_5$, there can be mentioned an alkylene group, a bivalent aromatic ring group, —OCO-$L_1$-, —O-$L_1$-, a group composed of a combination of two or more of these, and the like. $L_1$ represents an alkylene group, a bivalent aliphatic hydrocarbon ring group, a bivalent aromatic ring group or a group composed of a combination of an alkylene group and a bivalent aromatic ring group.

$L_5$ is preferably a single bond, —OCO-$L_1$- ($L_1$ is preferably an alkylene group having 1 to 5 carbon atoms, more preferably a methylene group or a propylene group) or a bivalent aromatic ring group.

The alkyl group represented by each of $R_{54}$ to $R_{56}$ is preferably an alkyl group having 1 to 20 carbon atoms, more preferably 1 to 10 carbon atoms. An alkyl group having 1 to 4 carbon atoms, such as a methyl group, an ethyl group, an n-propyl group, an isopropyl group, an n-butyl group, an isobutyl group or a t-butyl group, is most preferred.

The monovalent aliphatic hydrocarbon ring group represented by each of $R_{55}$ and $R_{56}$ preferably has 3 to 20 carbon atoms. It may be a monocyclic one, such as a cyclopentyl group or a cyclohexyl group, or a polycyclic one, such as a norbornyl group, an adamantyl group, a tetracyclodecanyl group or a tetracyclododecanyl group.

The ring formed by the mutual bonding of $R_{55}$ and $R_{56}$ preferably has 3 to 20 carbon atoms. The ring may be a monocyclic one, such as a cyclopentyl group or a cyclohexyl group, or a polycyclic one, such as a norbornyl group, an adamantyl group, a tetracyclodecanyl group or a tetracyclododecanyl group. When a ring is formed by the mutual bonding of $R_{55}$ and $R_{56}$, $R_{54}$ is preferably an alkyl group having 1 to 3 carbon atoms, more preferably a methyl group or an ethyl group.

The monovalent aromatic ring group represented by each of $R_{55}$ and $R_{56}$ preferably has 6 to 20 carbon atoms. As such, there can be mentioned, for example, a phenyl group, a naphthyl group and the like. When either $R_{55}$ or $R_{56}$ is a hydrogen atom, the other is preferably a monovalent aromatic ring group.

In the synthesis of the monomers corresponding to the repeating units of general formula (V), any of general methods of synthesizing an ester containing a polymerizable group can be used, and the synthetic method is not particularly limited.

Particular examples of the repeating units of general formula (V) will be shown below, which in no way limit the scope of the present invention.

(V-1)

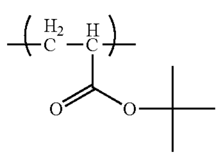

(V-2)

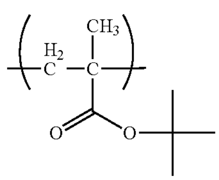

(V-3)

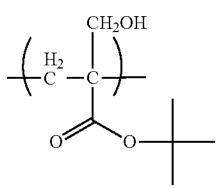

(V-4)

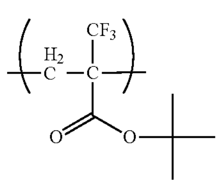

(V-5)

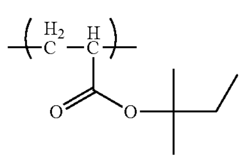

(V-6)

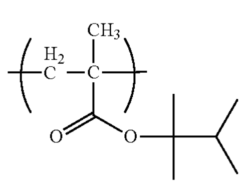

-continued (V-7)

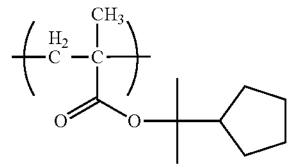

(V-8)

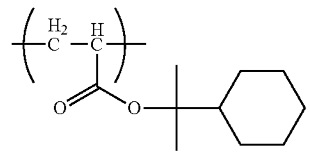

(V-9)

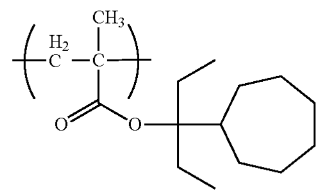

(V-10)

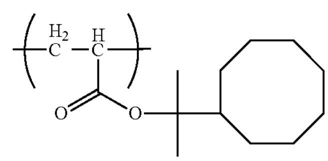

(V-11)

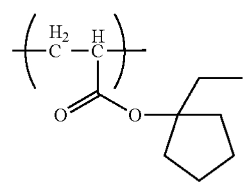

(V-12)

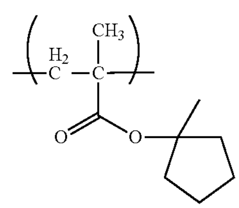

(V-13)

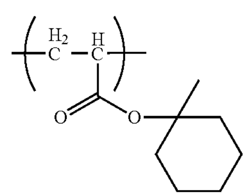

(V-14)

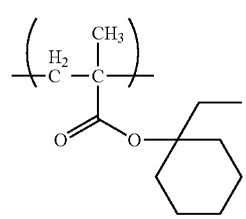

-continued
(V-15)
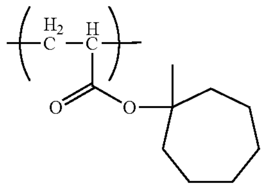
(V-16)
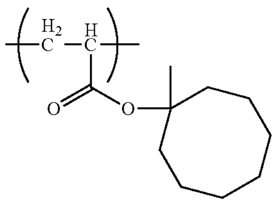
(V-17)
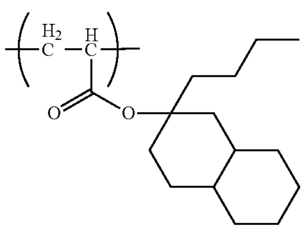
(V-18)
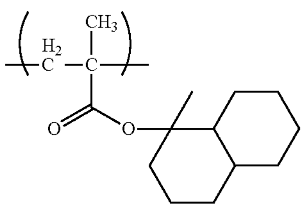
(i-19)
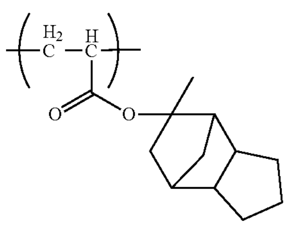
(V-20)
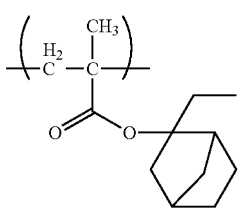
(V-21)
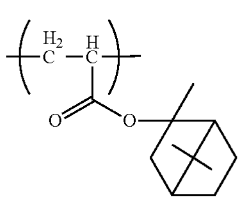
-continued
(V-22)
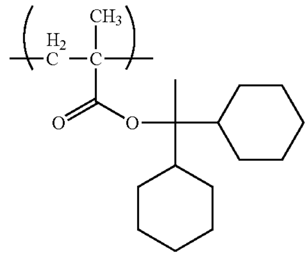
(V-23)
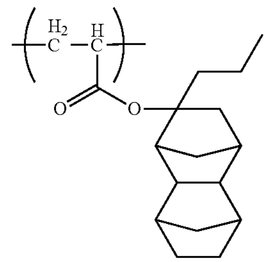
(V-24)
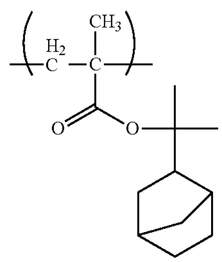
(V-25)
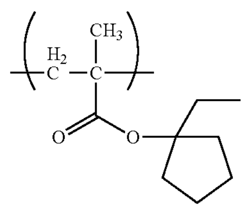
(V-26)
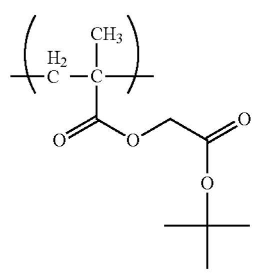
(V-27)
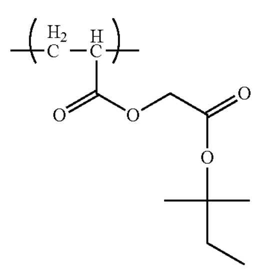

-continued
(V-28)
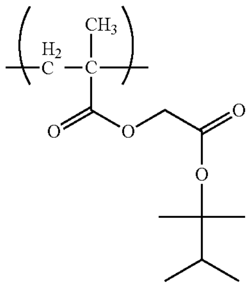
(V-29)
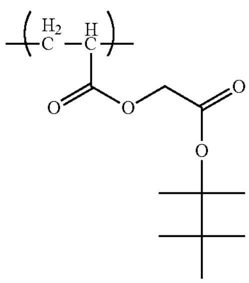
(V-30)
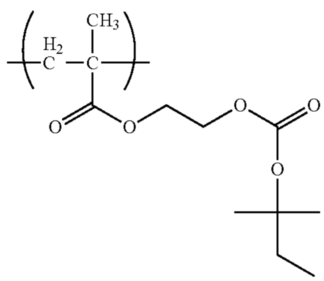
(V-31)
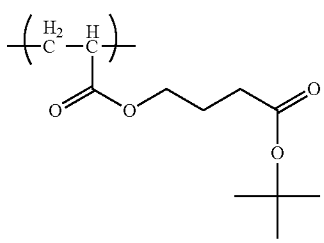
(V-32)
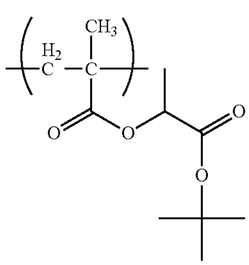
(V-33)
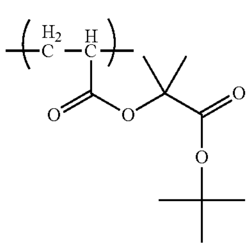
-continued
(V-34)
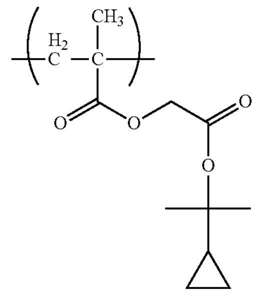
(V-35)
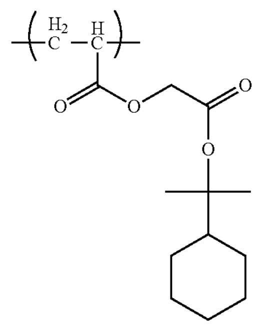
(V-36)
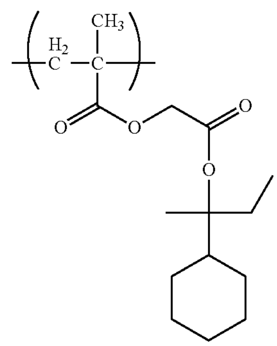
(V-37)
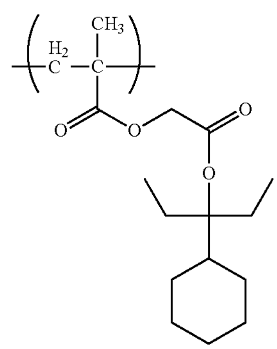
(V-38)
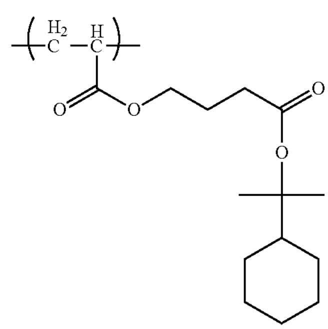

-continued
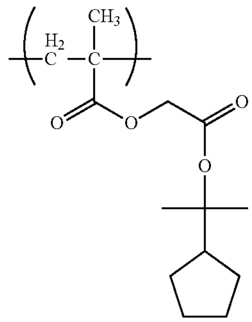
(V-39)
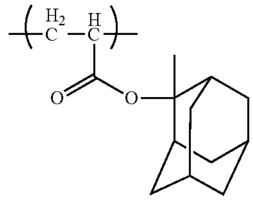
(V-40)
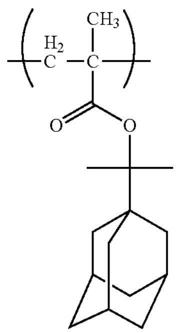
(V-41)
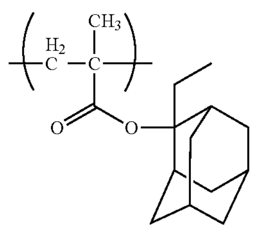
(V-42)
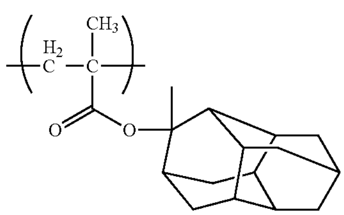
(V-43)
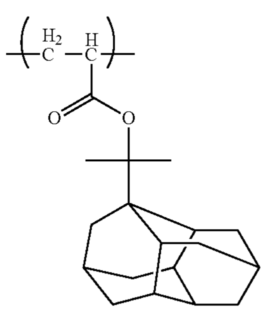
(V-44)
-continued
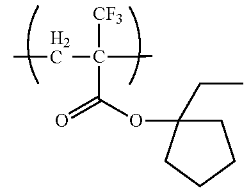
(V-45)
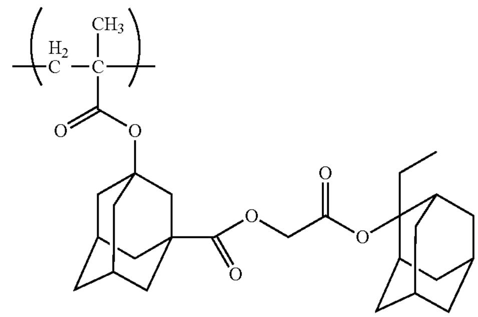
(V-46)
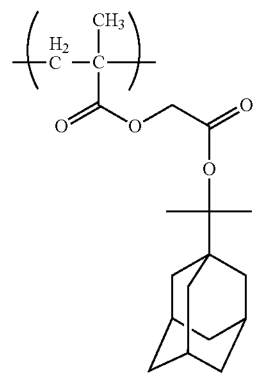
(V-47)
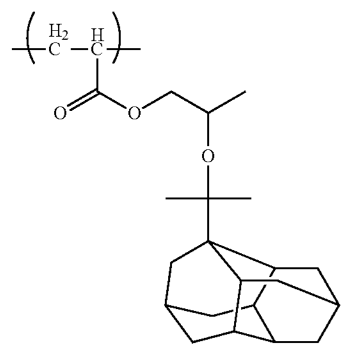
(V-48)
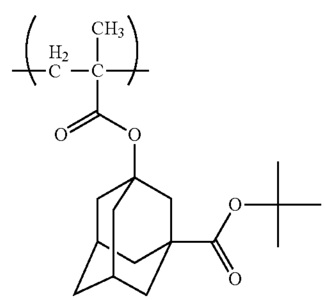
(V-49)

-continued
(V-50)
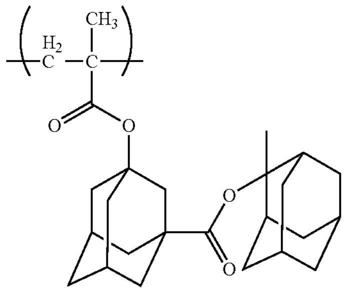
(V-51)
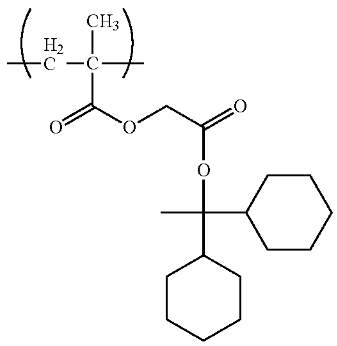
(V-52)
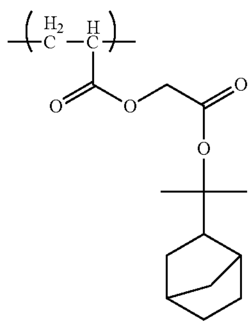
(V-53)
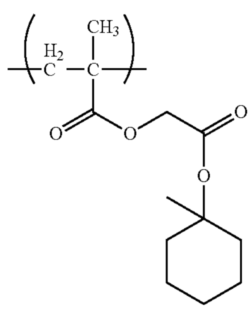
(V-54)
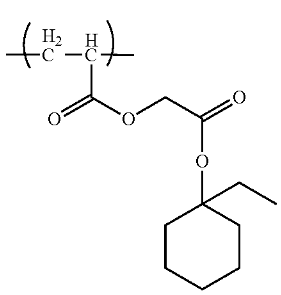
-continued
(V-55)
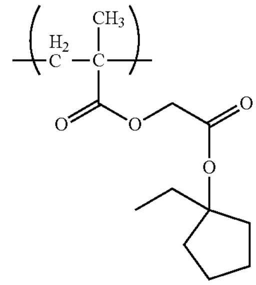
(V-56)
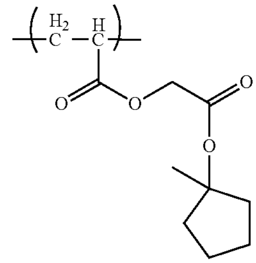
(V-57)
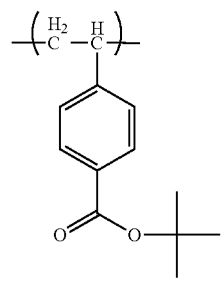
(V-58)
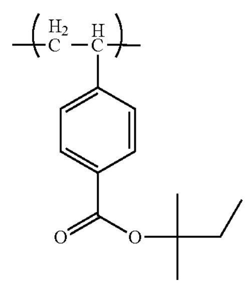
(V-59)
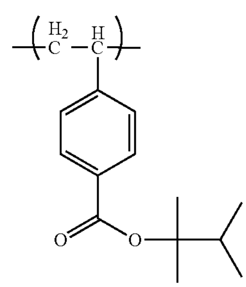

-continued
(V-60)
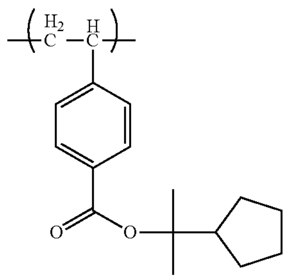
(V-61)
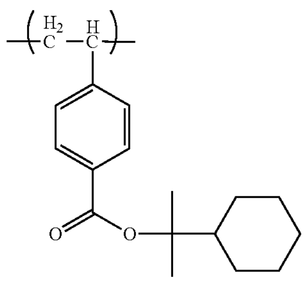
(V-62)
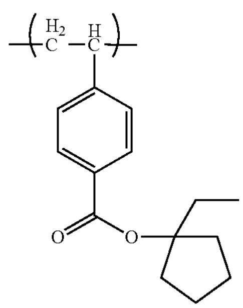
(V-63)
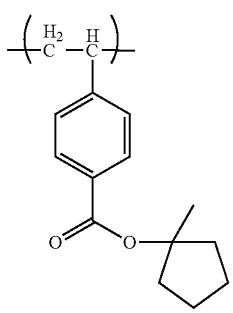
(V-64)
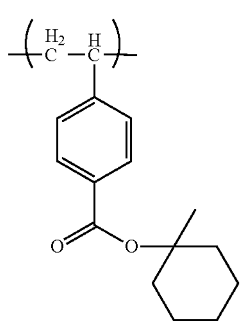
-continued
(V-65)
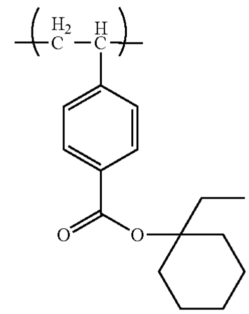
(V-66)
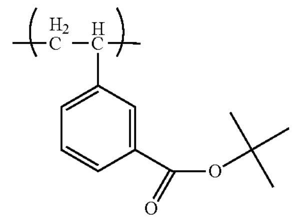
(V-67)
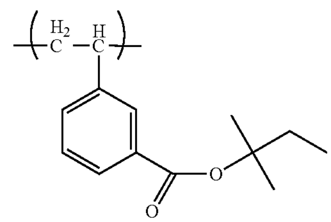
(V-68)
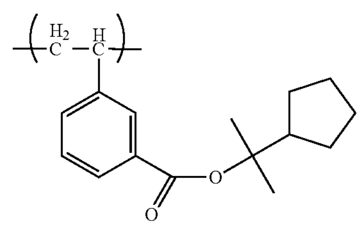
(V-69)
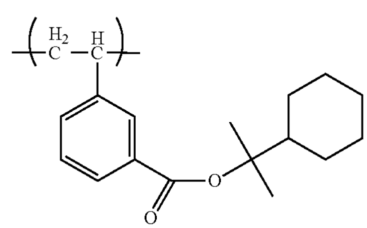
(V-70)
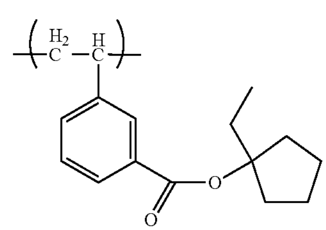

-continued
(V-71)
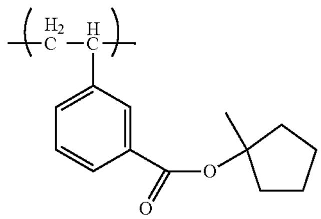
(V-72)
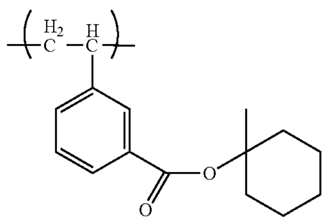
(V-73)
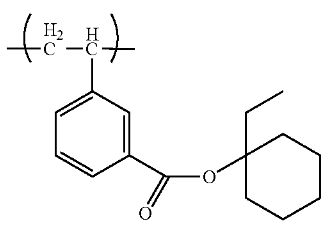
(V-74)
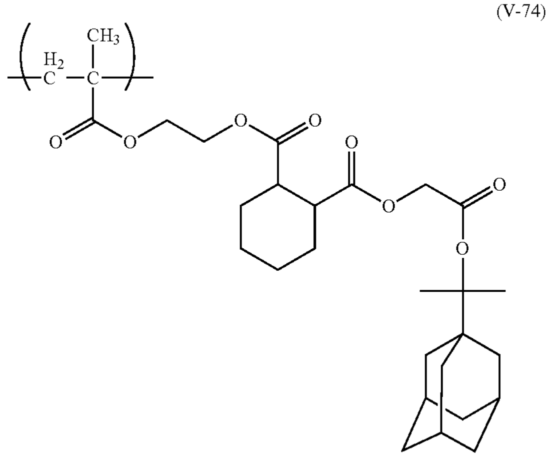
(V-75)
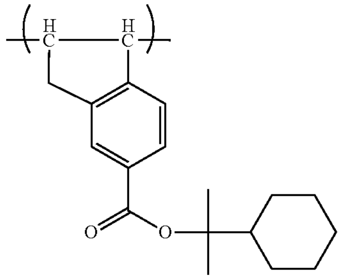
-continued
(V-76)
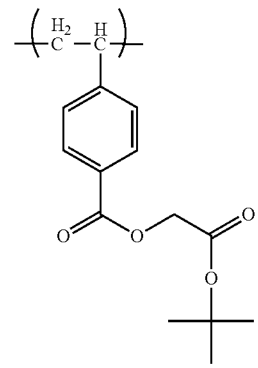
(V-77)
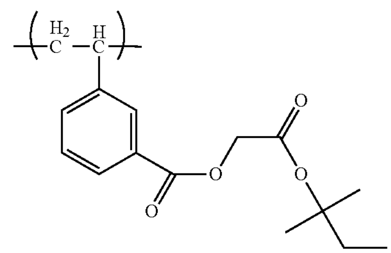
(V-78)
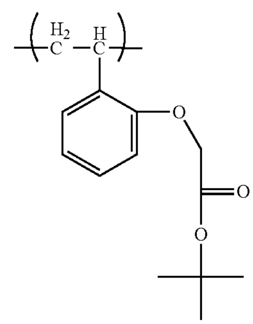
(V-79)
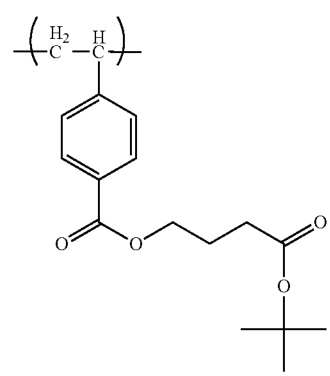
(V-80)
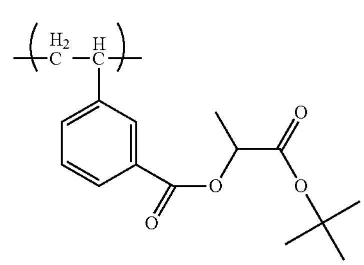

-continued
(V-81)
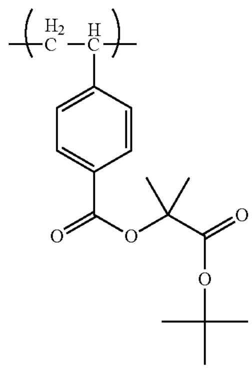
(V-82)
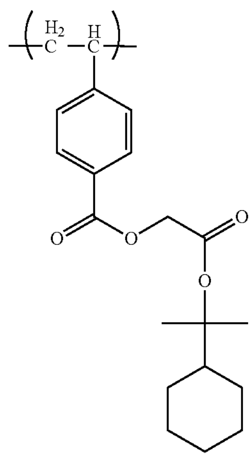
(V-83)
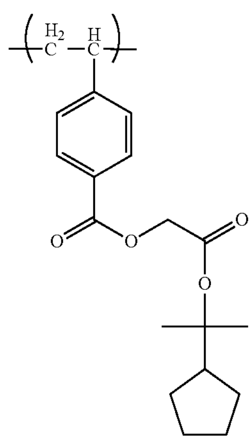
(V-84)
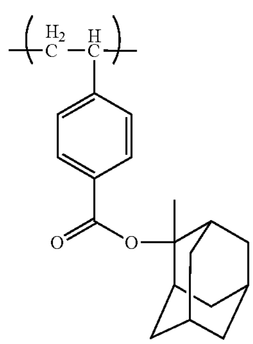
-continued
(V-85)
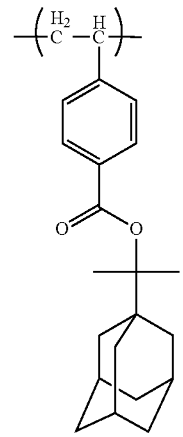
(V-86)
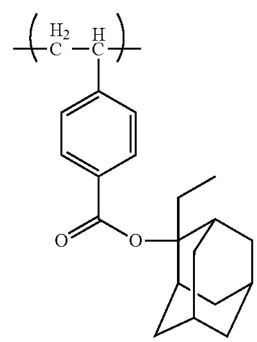
(V-87)
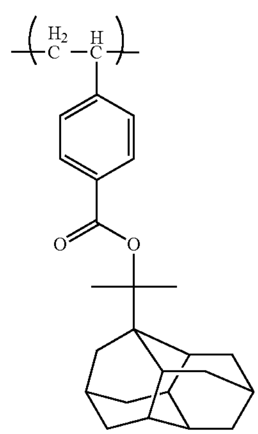

-continued
(V-88)
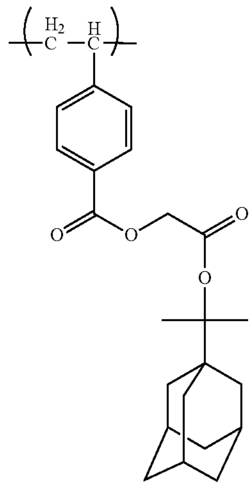
(V-89)
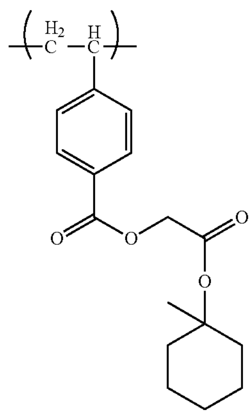
(V-90)
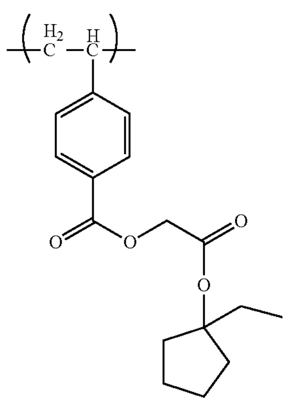
(V-91)
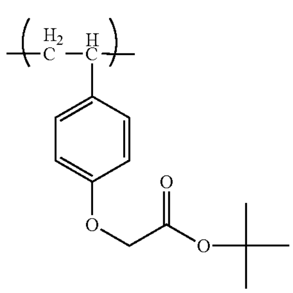
-continued
(V-92)
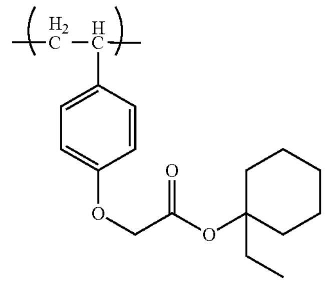
(V-93)
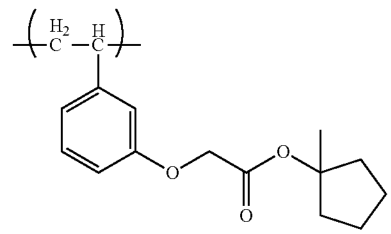
(V-94)
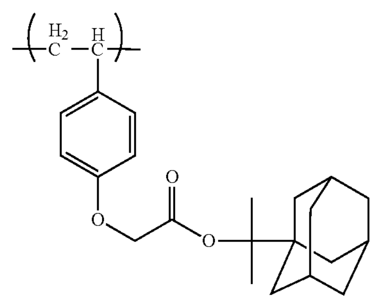
(V-95)
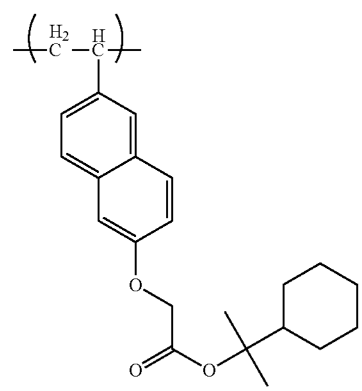
(V-96)
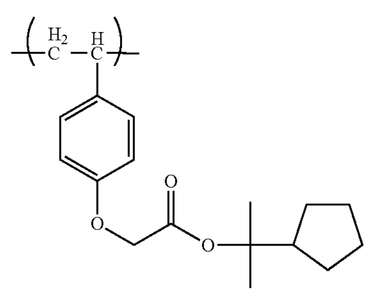

-continued (V-97)

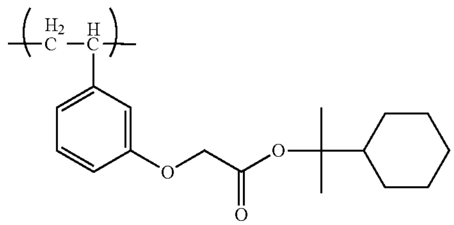

(V-98)

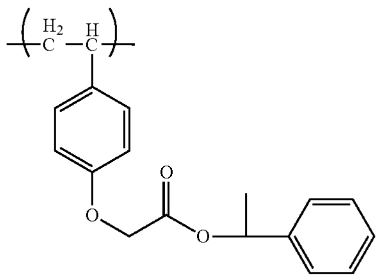

(V-99)

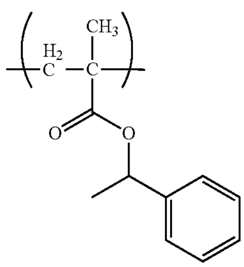

(V-100)

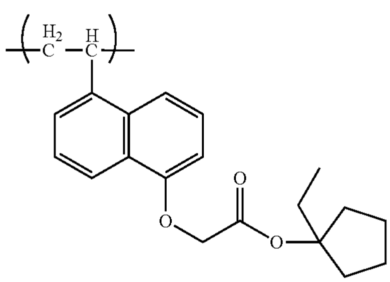

The repeating units of general formula (VI) below are more preferred as the repeating unit (B2).

(VI)

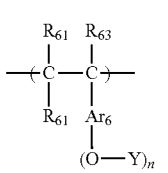

In general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring (preferably a 5- or 6-membered ring), which $R_{62}$ in this instance is an alkylene group.

$Ar_6$ represents an aromatic ring group.

Y, or each of Ys independently, represents a hydrogen atom or a group that when acted on by an acid, is cleaved, provided that at least one of Ys is a group that when acted on by an acid, is cleaved.

In the formula, n is an integer of 1 to 4.

General formula (VI) will be described in greater detail below.

The alkyl group represented by each of $R_{61}$ to $R_{63}$ of general formula (VI) is preferably an optionally substituted alkyl group having 20 or less carbon atoms, such as a methyl group, an ethyl group, a propyl group, an isopropyl group, an n-butyl group, a sec-butyl group, a hexyl group, a 2-ethylhexyl group, an octyl group or a dodecyl group. An alkyl group having 8 or less carbon atoms is more preferred.

The alkyl group contained in the alkoxycarbonyl group is preferably the same as the alkyl group mentioned above with respect to $R_{61}$ to $R_{63}$.

The monovalent aliphatic hydrocarbon ring group may be monocyclic or polycyclic. An optionally substituted monocyclic monovalent aliphatic hydrocarbon ring group having 3 to 8 carbon atoms, such as a cyclopropyl group, a cyclopentyl group or a cyclohexyl group, is preferred.

As the halogen atom, there can be mentioned a fluorine atom, a chlorine atom, a bromine atom or an iodine atom. A fluorine atom is preferred.

When $R_{62}$ represents an alkylene group, the alkylene group is preferably an optionally substituted alkylene group having 1 to 8 carbon atoms, such as a methylene group, an ethylene group, a propylene group, a butylene group, a hexylene group or an octylene group.

$Ar_6$ represents a bivalent aromatic ring group. Substituents may be introduced in the bivalent aromatic ring groups. As preferred examples thereof, there can be mentioned, for example, an arylene group having 6 to 18 carbon atoms, such as a phenylene group, a tolylene group or a naphthylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Particular examples of the substituents that can be introduced in the above alkyl group, monovalent aliphatic hydrocarbon ring group, alkoxycarbonyl group, alkylene group and bivalent aromatic ring group are the same as set forth above with respect to the $R_{51}$ to $R_{53}$ of general formula (V).

In the formula, n is preferably 1 or 2, more preferably 1.

Each of n Ys independently represents a hydrogen atom or a group that is cleaved by the action of an acid, provided that at least one of n Ys is a group that is cleaved by the action of an acid.

As the group that is cleaved by the action of an acid, Y, there can be mentioned those set forth above by way of example, namely, $-C(R_{36})(R_{37})(R_{38})$, $-C(=O)-O-C(R_{36})(R_{37})(R_{38})$, $-C(R_{01})(R_{02})(OR_{39})$, $-C(R_{01})(R_{02})-C(=O)-O-C(R_{36})(R_{37})(R_{38})$, $-CH(R_{36})(Ar)$ and the like. In these formulae, $R_{36}$ to $R_{39}$, $R_{01}$ and $R_{02}$ are as defined above.

The group that is cleaved by the action of an acid, Y, preferably has any of the structures of general formula (VI-A) below.

(VI-A)

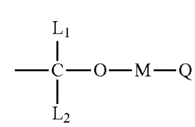

In the formula, each of $L_1$ and $L_2$ independently represents a hydrogen atom, an alkyl group, a monovalent aliphatic hydrocarbon ring group, a monovalent aromatic ring group or a group consisting of an alkylene group combined with a monovalent aromatic ring group.

M represents a single bond or a bivalent connecting group.

Q represents an alkyl group, a monovalent aliphatic hydrocarbon ring group optionally containing a heteroatom, a monovalent aromatic ring group optionally containing a heteroatom, an amino group, an ammonium group, a mercapto group, a cyano group or an aldehyde group.

At least two of Q, M and $L_1$ may be bonded to each other to thereby form a ring (preferably, a 5-membered or 6-membered ring).

The alkyl groups represented by $L_1$ and $L_2$ are, for example, alkyl groups having 1 to 8 carbon atoms. As preferred examples thereof, there can be mentioned a methyl group, an ethyl group, a propyl group, an n-butyl group, a sec-butyl group, a hexyl group and an octyl group.

The monovalent aliphatic hydrocarbon ring groups represented by $L_1$ and $L_2$ are, for example, aliphatic hydrocarbon ring groups each having 3 to 15 carbon atoms. As preferred examples thereof, there can be mentioned a cyclopentyl group, a cyclohexyl group, a norbornyl group, an adamantyl group and the like.

The monovalent aromatic ring groups represented by $L_1$ and $L_2$ are, for example, aryl groups having 6 to 15 carbon atoms. As preferred examples thereof, there can be mentioned a phenyl group, a tolyl group, a naphthyl group, an anthryl group and the like.

The groups each consisting of an alkylene group combined with a monovalent aromatic ring group, represented by $L_1$ and $L_2$ are, for example, those having 6 to 20 carbon atoms. There can be mentioned aralkyl groups, such as a benzyl group and a phenethyl group.

The bivalent connecting group represented by M is, for example, an alkylene group (e.g., a methylene group, an ethylene group, a propylene group, a butylene group, a hexylene group, an octylene group, etc.), a bivalent aliphatic hydrocarbon ring group (e.g., a cyclopentylene group, a cyclohexylene group, an adamantylene group, etc.), an alkenylene group (e.g., an ethylene group, a propenylene group, a butenylene group, etc.), a bivalent aromatic ring group (e.g., a phenylene group, a tolylene group, a naphthylene group, etc.), —S—, —O—, —CO—, —$SO_2$—, —$N(R_0)$— or a bivalent connecting group resulting from combination of these groups. $R_0$ represents a hydrogen atom or an alkyl group (for example, an alkyl group having 1 to 8 carbon atoms; in particular, a methyl group, an ethyl group, a propyl group, an n-butyl group, a sec-butyl group, a hexyl group, an octyl group and the like).

The alkyl group represented by Q is the same as mentioned above with respect to $L_1$ and $L_2$.

As the aliphatic hydrocarbon ring group containing no heteroatom and monovalent aromatic ring group containing no heteroatom respectively contained in the monovalent aliphatic hydrocarbon ring group optionally containing a heteroatom and monovalent aromatic ring group optionally containing a heteroatom both represented by Q, there can be mentioned, for example, the monovalent aliphatic hydrocarbon ring group and monovalent aromatic ring group mentioned above as being represented by each of $L_1$ and $L_2$. Preferably, each thereof has 3 to 15 carbon atoms.

As the monovalent aliphatic hydrocarbon ring group containing a heteroatom and monovalent aromatic ring group containing a heteroatom, there can be mentioned, for example, groups having a heterocyclic structure, such as thiirane, cyclothiorane, thiophene, furan, pyrrole, benzothiophene, benzofuran, benzopyrrole, triazine, imidazole, benzimidazole, triazole, thiadiazole, thiazole and pyrrolidone. However, the above monovalent aliphatic hydrocarbon ring groups and monovalent aromatic ring groups are not limited to these as long as a structure generally known as a heteroring (ring formed by carbon and a heteroatom or ring formed by heteroatoms) is included.

As the ring that may be formed by the mutual bonding of at least two of Q, M and $L_1$, there can be mentioned one resulting from the mutual bonding of at least two of Q, M and $L_1$ so as to form, for example, a propylene group or a butylene group and the subsequent formation of a 5-membered or 6-membered ring containing an oxygen atom.

In general formula (VI-A), a substituent may be introduced in each of the groups represented by $L_1$, $L_2$, M and Q. As the substituent, there can be mentioned, for example, any of those set forth above as being optionally introduced in $R_{36}$ to $R_{39}$, $R_{01}$, $R_{02}$ and Ar. Preferably, the number of carbon atoms of each of the substituents is up to 8.

The groups of the formula -M-Q are preferably groups each composed of 1 to 30 carbon atoms, more preferably groups each composed of 5 to 20 carbon atoms.

Particular examples of the repeating units of general formula (VI) will be shown below as preferred particular examples of the repeating units (B), which however in no way limit the scope of the present invention.

(VI-1)

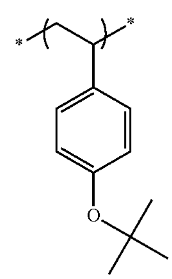

(VI-2)

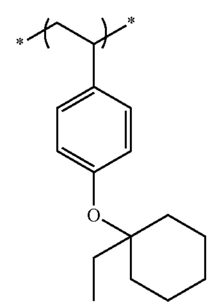

(VI-3)

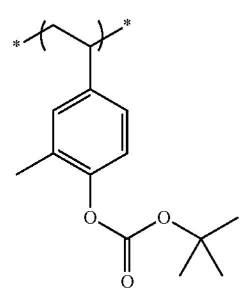

-continued
(VI-4)
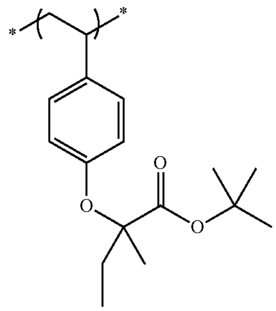
(VI-5)
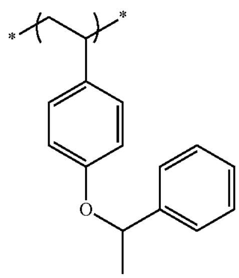
(VI-6)
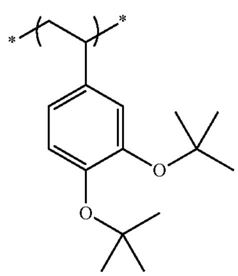
(VI-7)
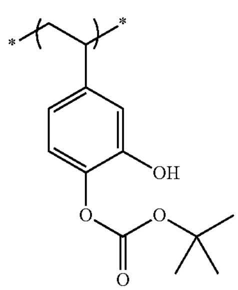
(VI-8)
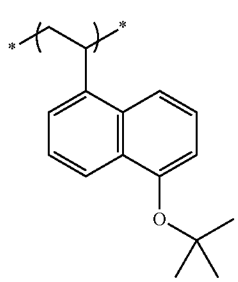
-continued
(VI-9)
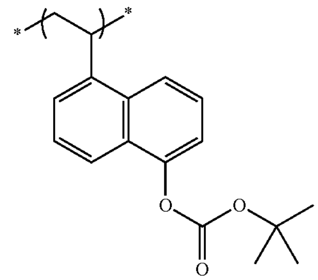
(VI-10)
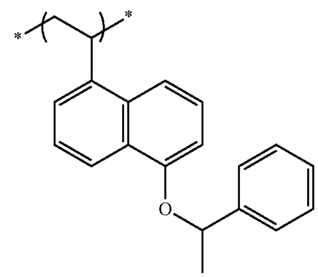
(VI-11)
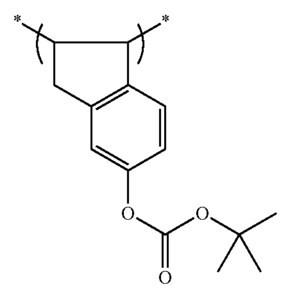
(VI-12)
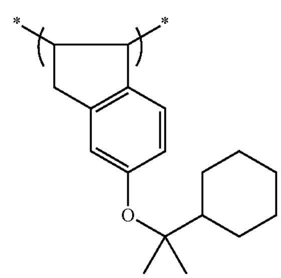
(VI-13)
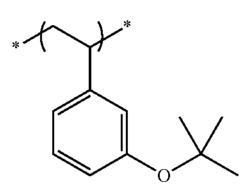
(VI-14)
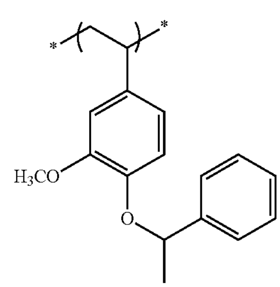

-continued
(VI-15)
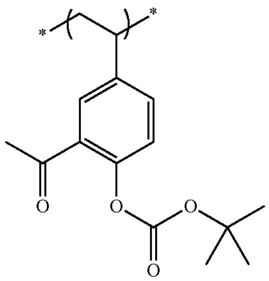
(VI-16)
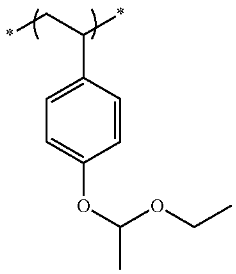
(VI-17)
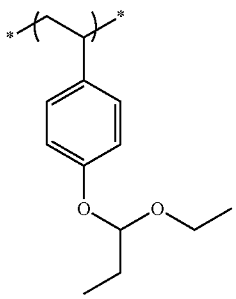
(VI-18)
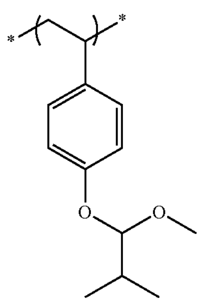
(VI-19)
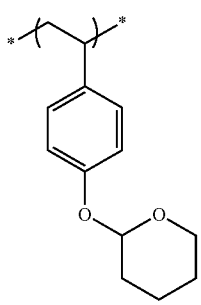
-continued
(VI-20)
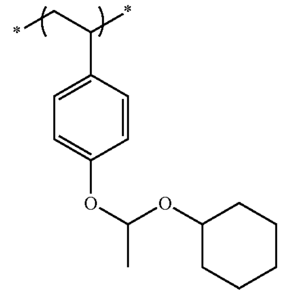
(VI-21)
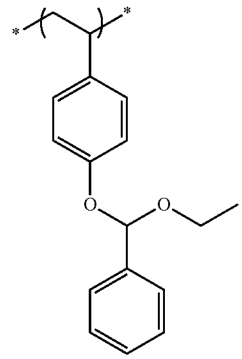
(VI-22)
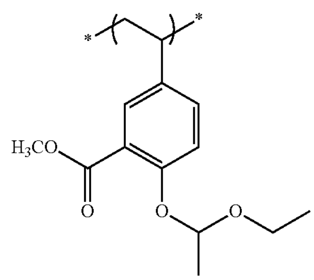
(VI-23)
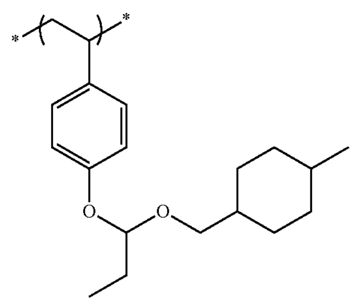
(VI-24)
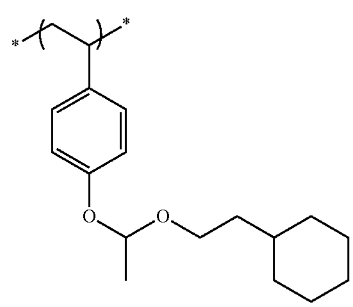

-continued
(VI-25)
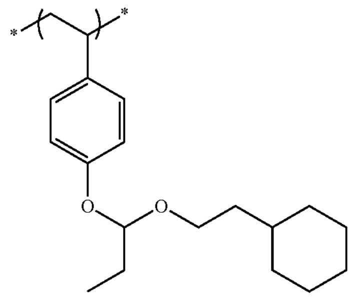
(VI-26)
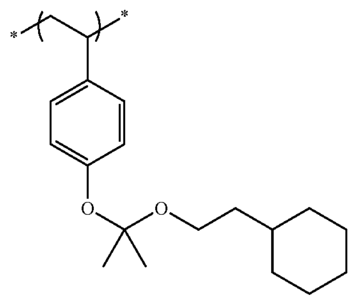
(VI-27)
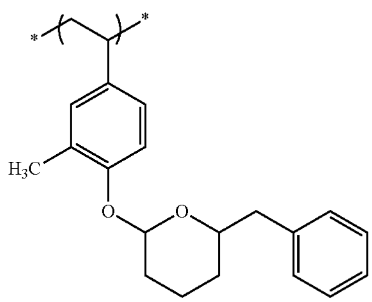
(VI-28)
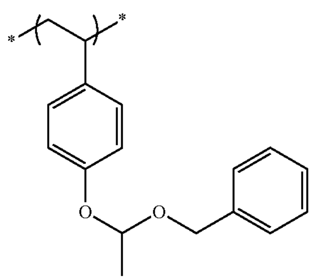
(VI-29)
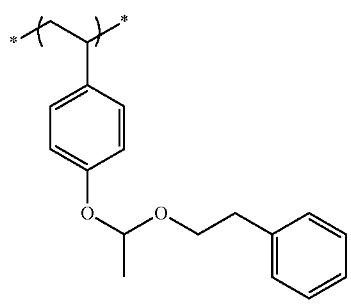
-continued
(VI-30)
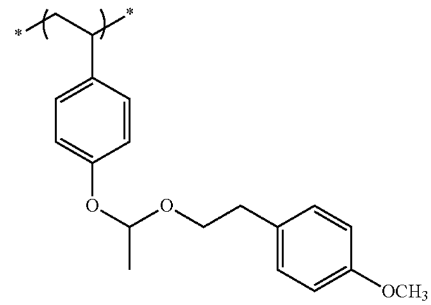
(VI-31)
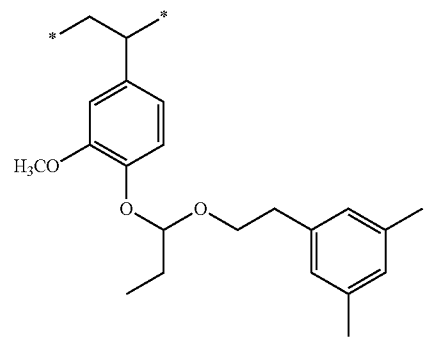
(VI-32)
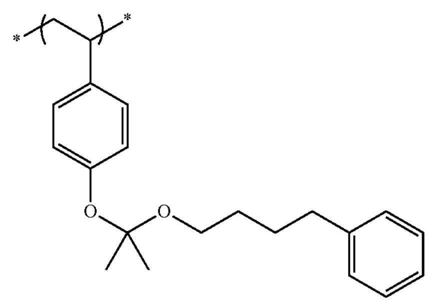
(VI-33)
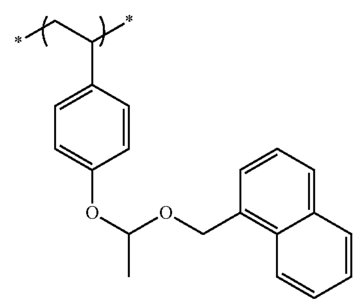
(VI-34)
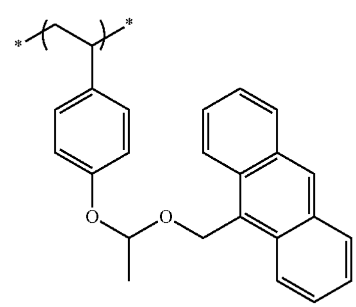

-continued
(VI-35)
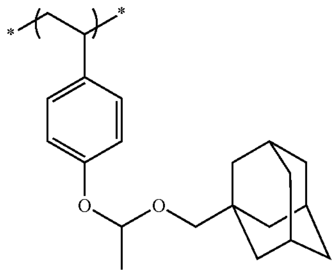
(VI-36)
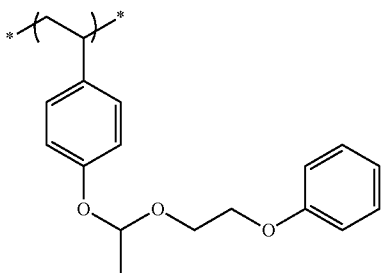
(VI-37)
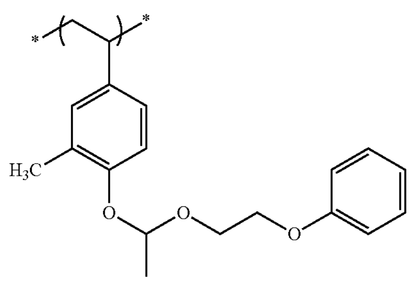
(VI-38)
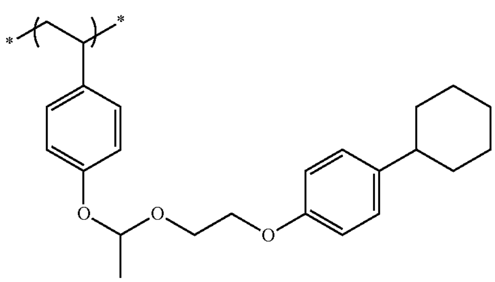
(VI-39)
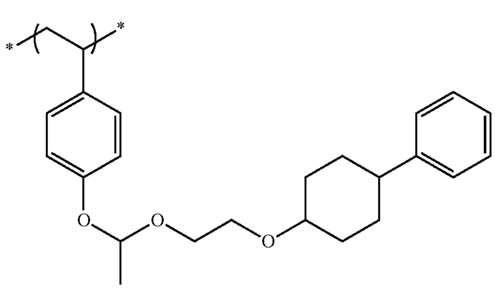
-continued
(VI-40)
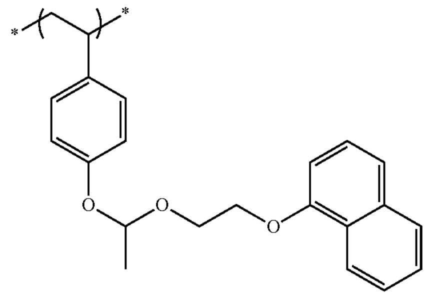
(VI-41)
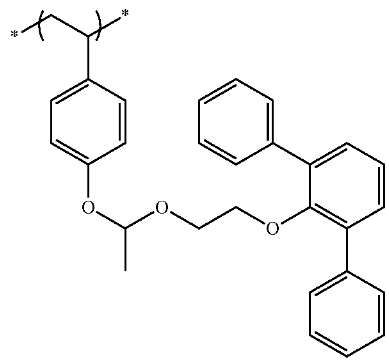
(VI-42)
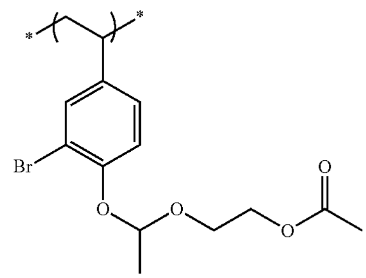
(VI-43)
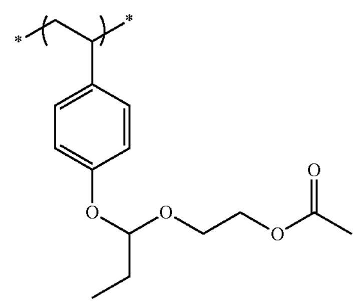
(VI-44)
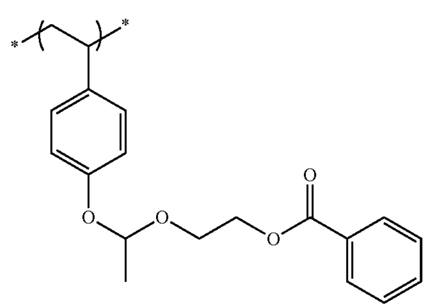

-continued
(VI-45)
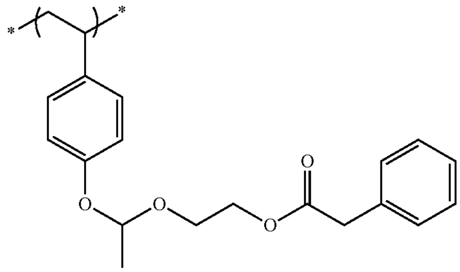
(VI-46)
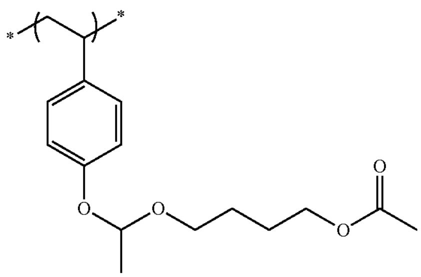
(VI-47)
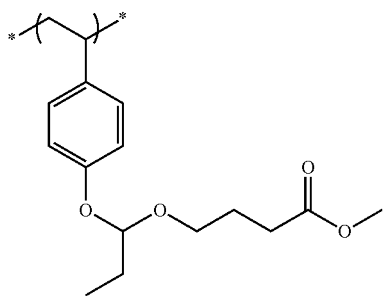
(VI-48)
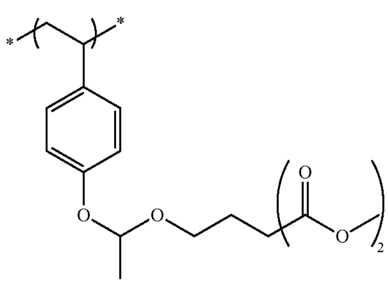
(VI-49)
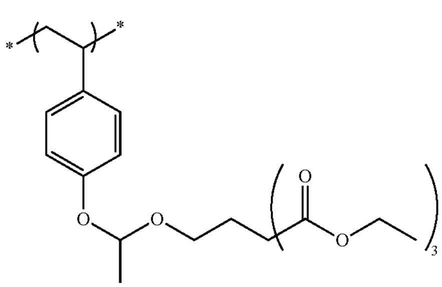
-continued
(VI-50)
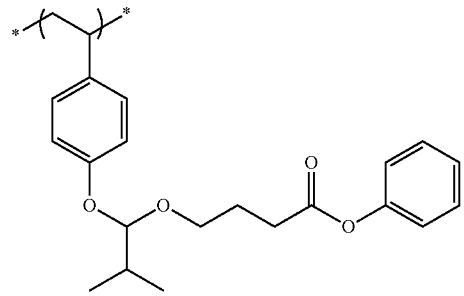
(VI-51)
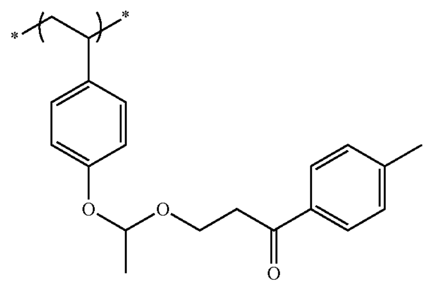
(VI-52)
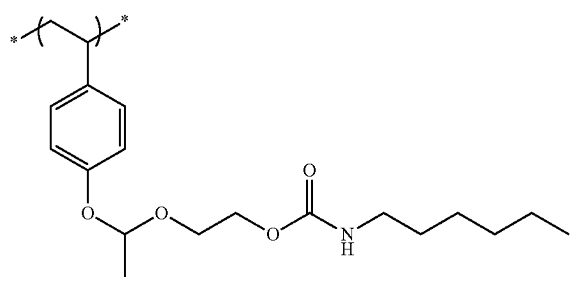
(VI-53)
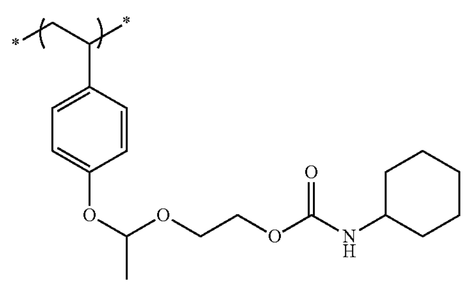
(VI-54)
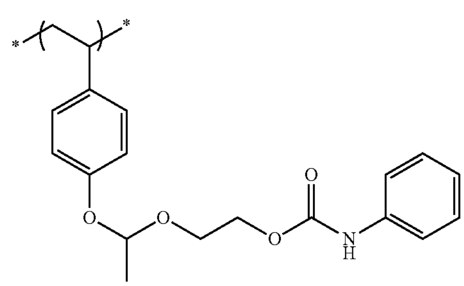

(VI-55)
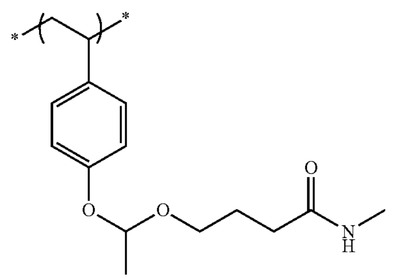
(VI-56)
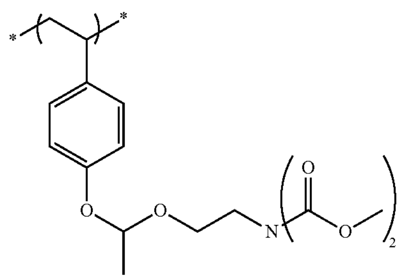
(VI-57)
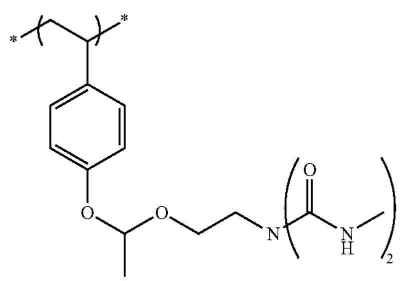
(VI-58)
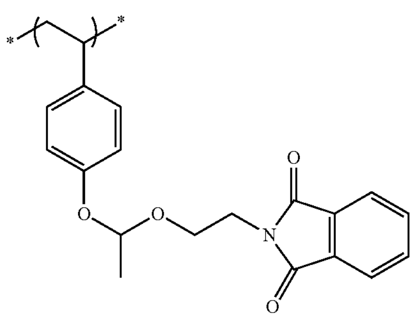
(VI-59)
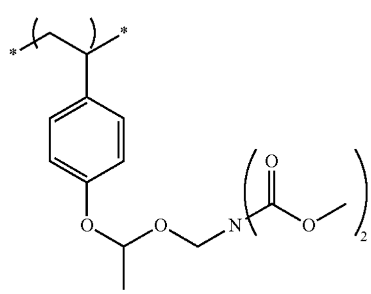
(VI-60)
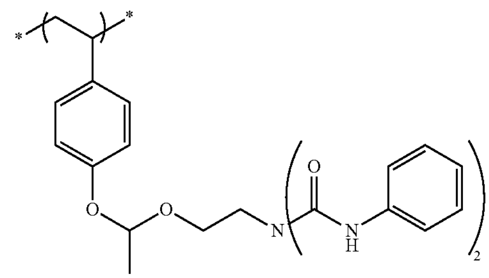
(VI-61)
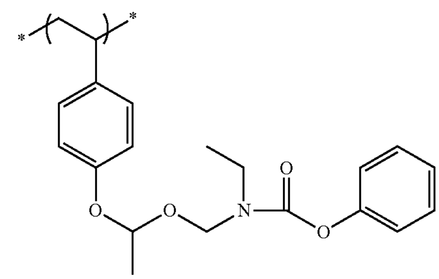
(VI-62)
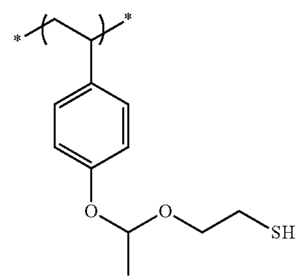
(VI-63)
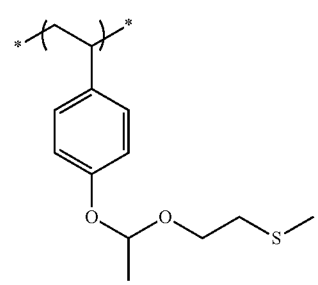
(VI-64)
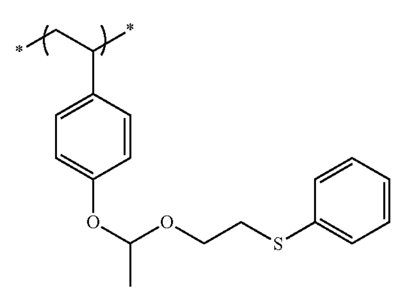

-continued
(VI-65)
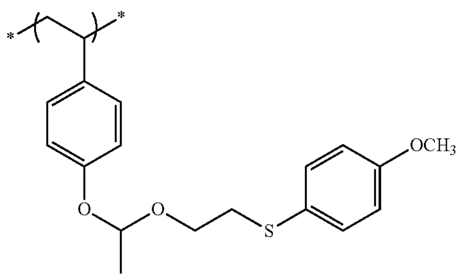
(VI-66)
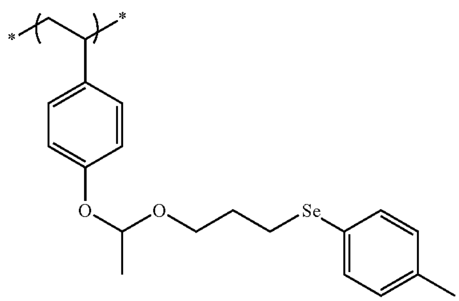
(VI-67)
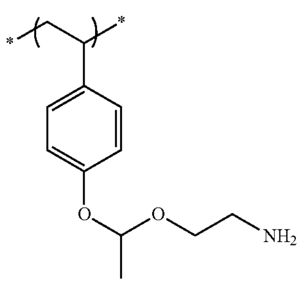
(VI-68)
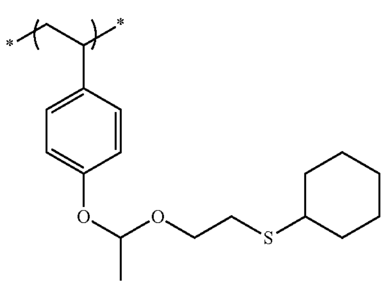
(VI-69)
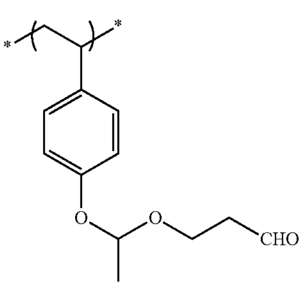
-continued
(VI-70)
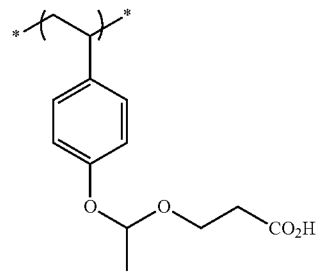
(VI-71)
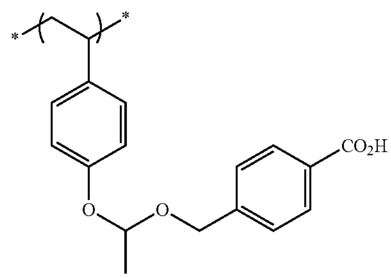
(VI-72)
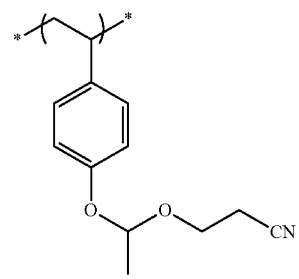
(VI-73)
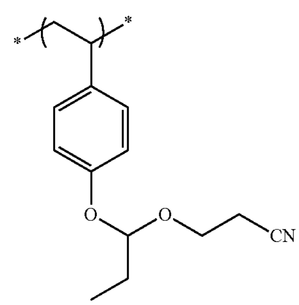
(VI-74)
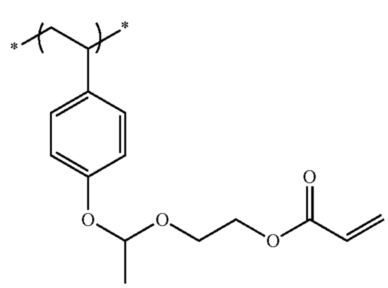

-continued
(VI-75)
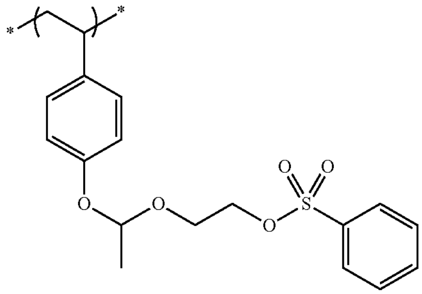
(VI-76)
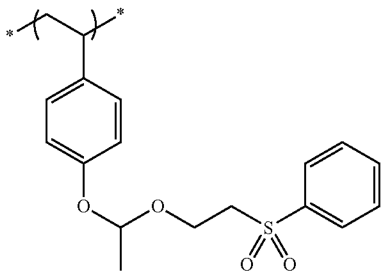
(VI-77)
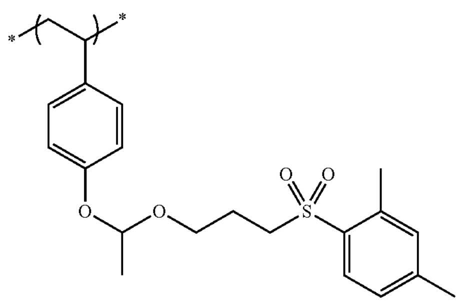
(VI-78)
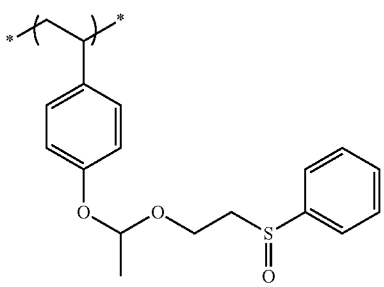
(VI-79)
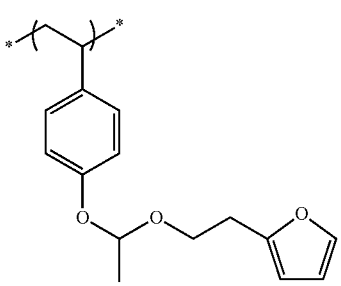
-continued
(VI-80)
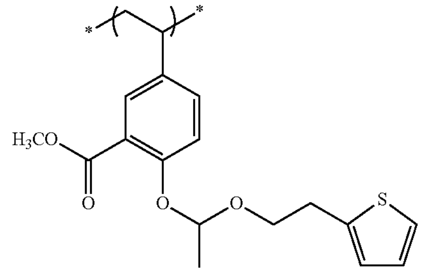
(VI-81)
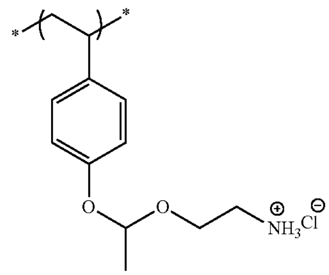
(VI-82)
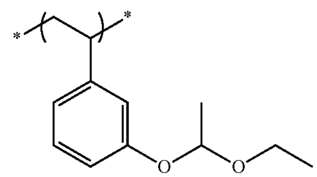
(VI-83)
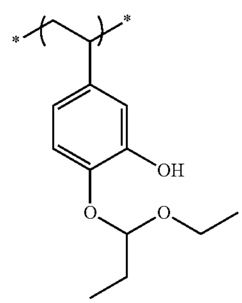
(VI-84)
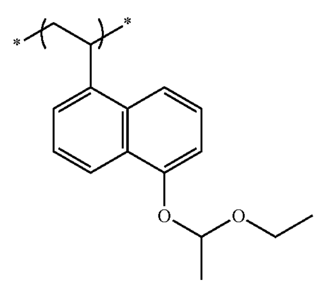
(VI-85)
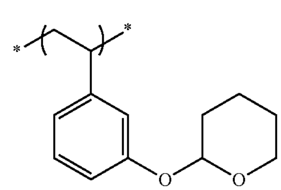

-continued
(VI-86)
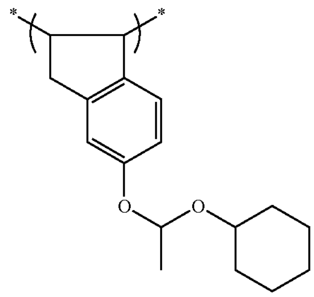
(VI-87)
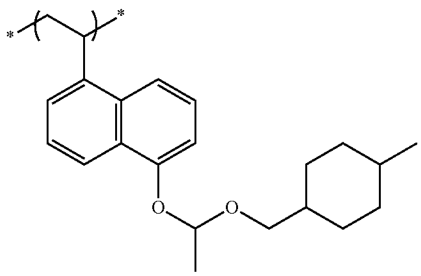
(VI-88)
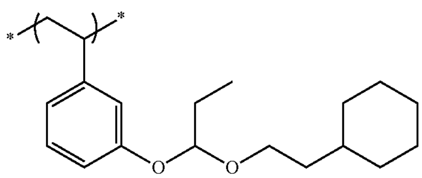
(VI-89)
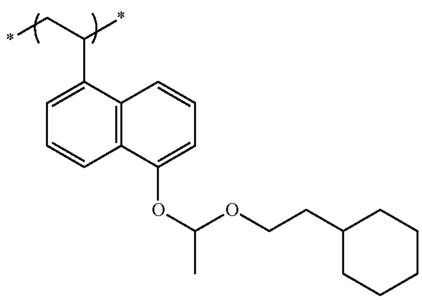
(VI-90)
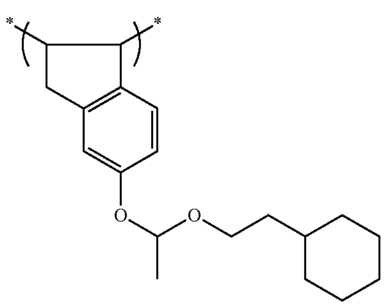
(VI-91)
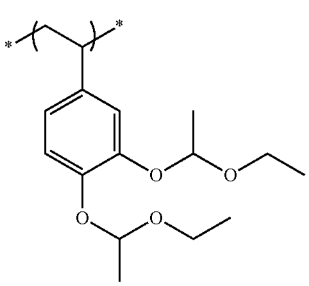
-continued
(VI-92)
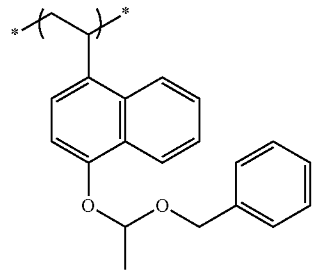
(VI-93)
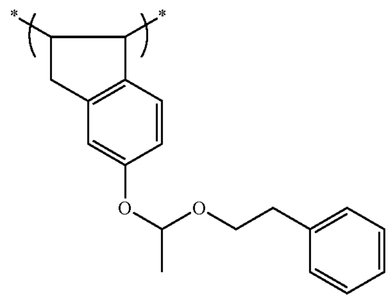
(VI-94)
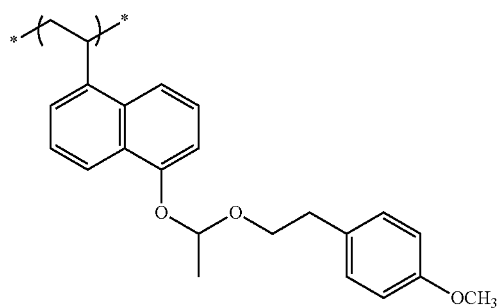
(VI-95)
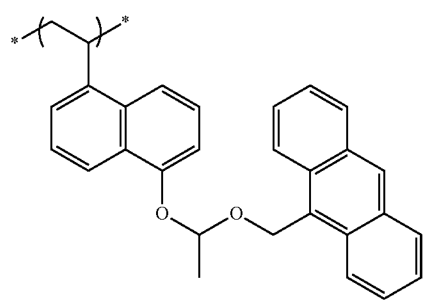
(VI-96)
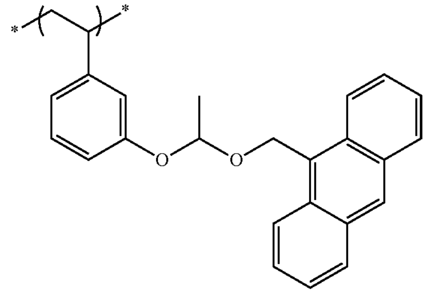

-continued
(VI-97)
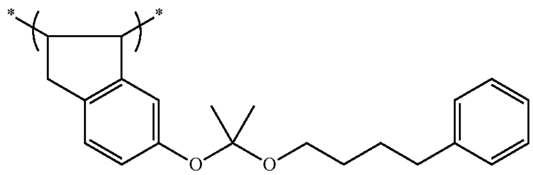
(VI-98)
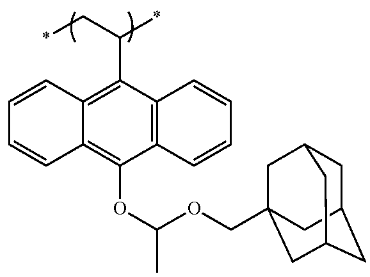
(VI-99)
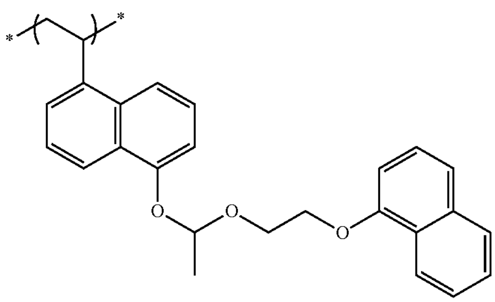
(VI-100)
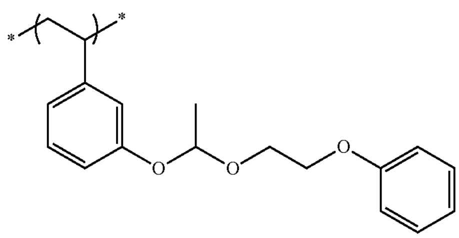
(VI-101)
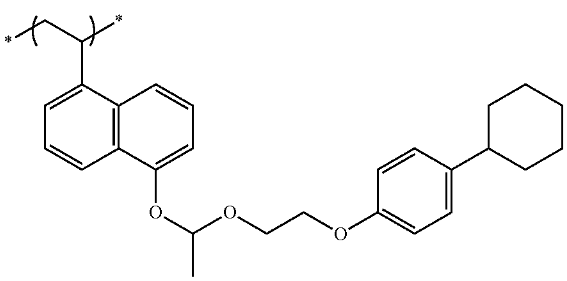
(VI-102)
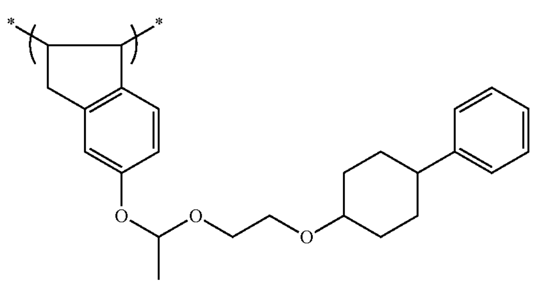
-continued
(VI-103)
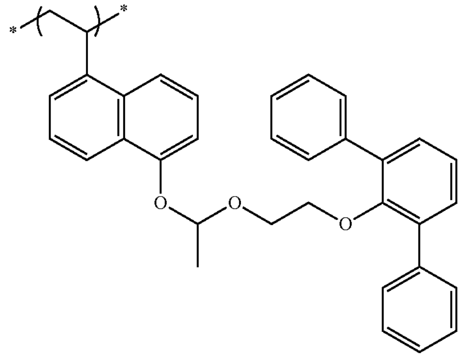
(VI-104)
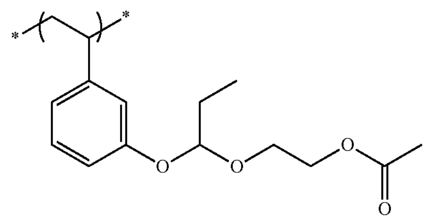
(VI-105)
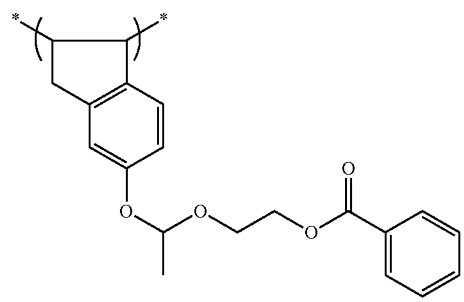
(VI-106)
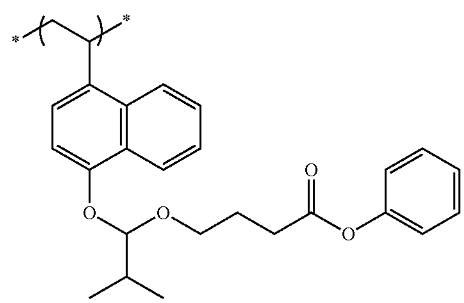
(VI-107)
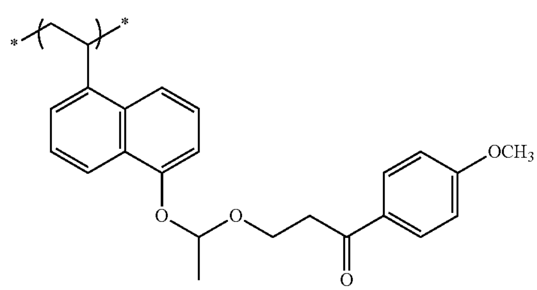

-continued (VI-108)

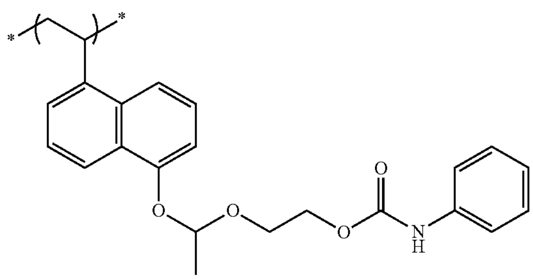

(VI-109)

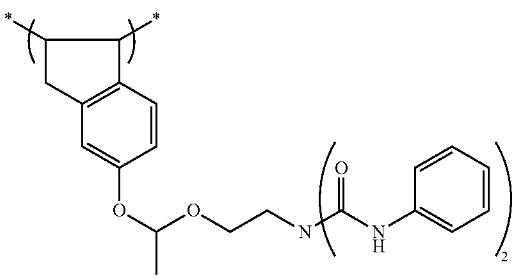

(VI-110)

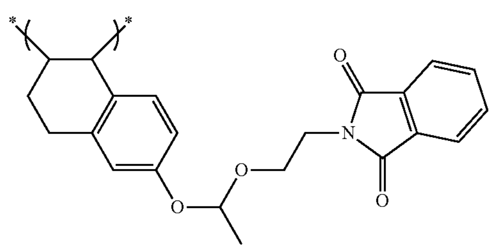

(VI-111)

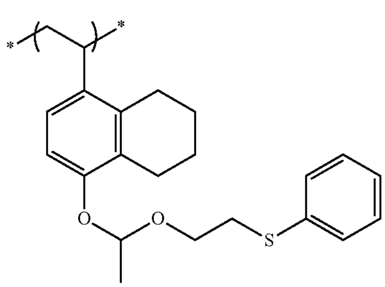

(VI-112)

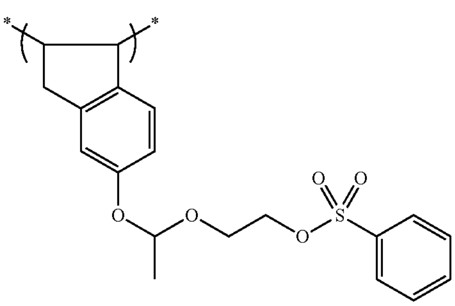

The content of repeating unit (B) in the resin (P) of the present invention, based on all the repeating units of the resin, is preferably in the range of 3 to 90 mol %, more preferably 5 to 80 mol % and further more preferably 7 to 70 mol %.

The molar ratio of the repeating unit (B1) and the repeating unit (B2) (repeating unit (B1)/repeating unit (B2)) is preferably in the range of 0.03 to 32.0, more preferably 0.05 to 19.0 and further more preferably 0.10 to 9.0.

The molar ratio of the repeating unit (A) and the repeating unit (B) (repeating unit (A)/repeating unit (B)) in the resin is preferably in the range of 0.04 to 1.0, more preferably 0.05 to 0.9 and further more preferably 0.06 to 0.8.

[Repeating Unit (C)]

Preferably, the resin (P) may further contain a repeating unit (C) that contains a group that when acted on by an alkali developer, is decomposed to thereby increase its rate of dissolution in the alkali developer.

As the group that when acted on by an alkali developer, is decomposed to thereby increase its rate of dissolution in the alkali developer, there can be mentioned, for example, a lactone structure, phenylester structure and the like.

The repeating unit (C) is more preferably any of those of general formula (AII), below.

(AII)

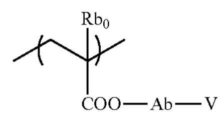

In the general formula (AII), $Rb_0$ represents a hydrogen atom, a halogen atom or an optionally substituted alkyl group (preferably having 1 to 4 carbon atoms).

As a preferred substituent optionally contained in the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. The $Rb_0$ is preferably a hydrogen atom, a methyl group, a hydroxymethyl group or a trifluoromethyl group. A hydrogen atom and a methyl group are especially preferred.

Ab represents a single bond, an alkylene group, a bivalent connecting group with an alicyclic hydrocarbon structure of a single ring or multiple rings, an ether group, an ester group, a carbonyl group, or a bivalent connecting group resulting from combination thereof. A single bond and a bivalent connecting group of the formula $-Ab_1-CO_2-$ are preferred.

$Ab_1$ is a linear or branched alkylene group or a cycloalkylene group of a single ring or multiple rings, being preferably a methylene group, an ethylene group, a cyclohexylene group, an adamantylene group or a norbornylene group.

V represents a group that when acted on by an alkali developer, is decomposed to thereby increase its rate of dissolution in the alkali developer. The group is preferably a group having an ester bond, more preferably a group having a lactone structure.

Any groups having a lactone structure can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of the formulae (LC1-1), (LC1-4), (LC1-5), (LC1-6), (LC1-13) and (LC1-14).

-continued
LC1-1
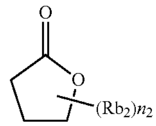
LC1-2
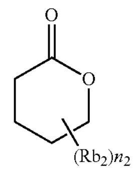
LC1-3
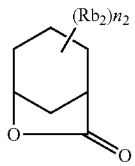
LC1-4
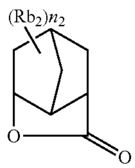
LC1-5
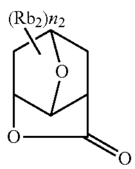
LC1-6
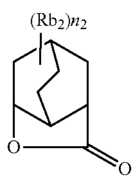
LC1-7
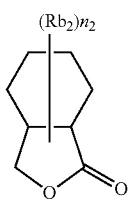
LC1-8
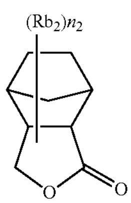
LC1-9
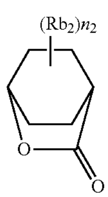
LC1-10
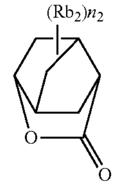
LC1-11
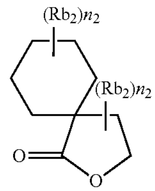
LC1-12
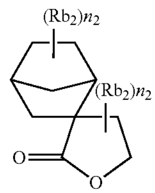
LC1-13
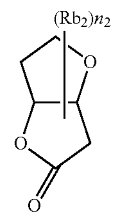
LC1-14
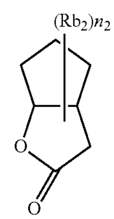
LC1-15
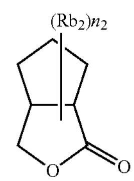
LC1-16
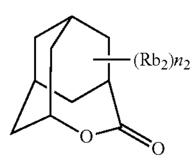
LC1-17
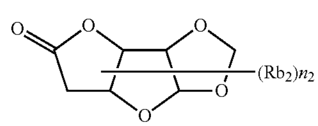
The presence of a substituent ($Rb_2$) on the portion of the lactone structure is optional. As a preferred substituent ($Rb_2$), there can be mentioned an alkyl group having 1 to 8 carbon atoms, a monovalent aliphatic hydrocarbon ring group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group and the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded with each other to thereby form a ring.

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% or higher, more preferably 95% or higher.

The content ratio of the repeating unit (C) based on all the repeating units of the resin (P) is preferably in the range of 0.5 to 80 mol %, more preferably 1 to 60 mol % and still more preferably 2 to 40 mol %. The repeating unit (C) can be used either individually or in combination. The use of specified lactone structures would ensure improvement in the line edge roughness and development defect.

Specific examples of the repeating units (C) of the resin (P) will be shown below, which however in no way limit the scope of the present invention. In the formulae, Rx represents H, $CH_3$, $CH_2OH$ or $CF_3$.

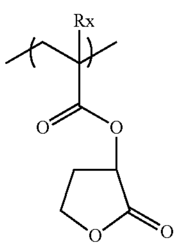
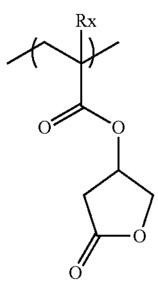
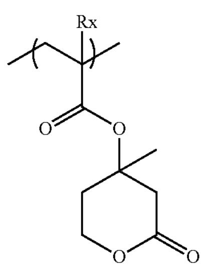
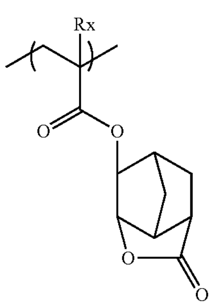
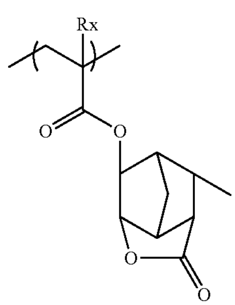
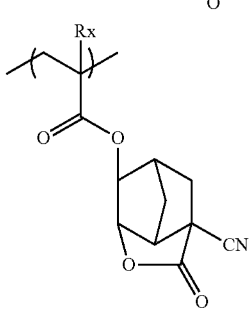
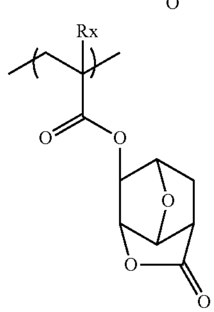

-continued

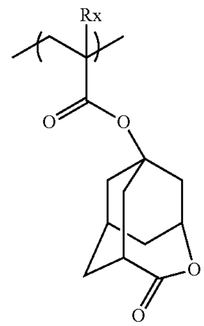
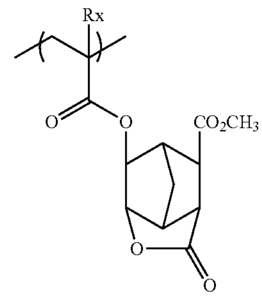
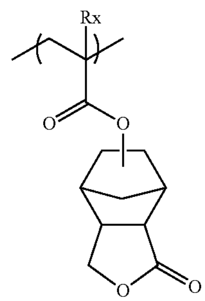
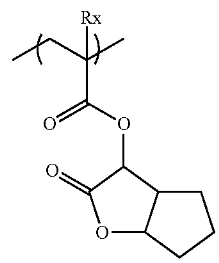
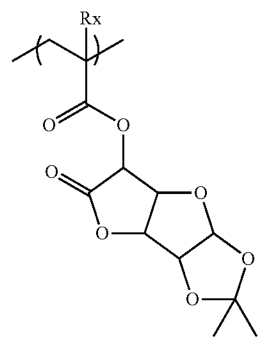
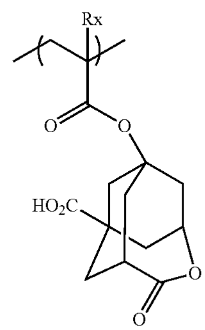
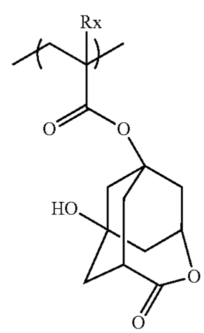
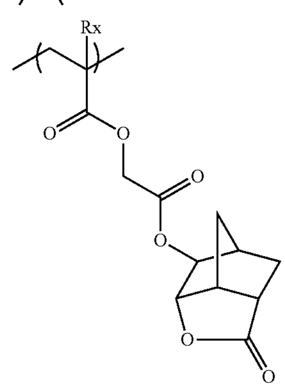
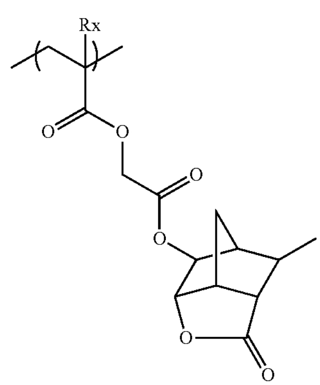

-continued
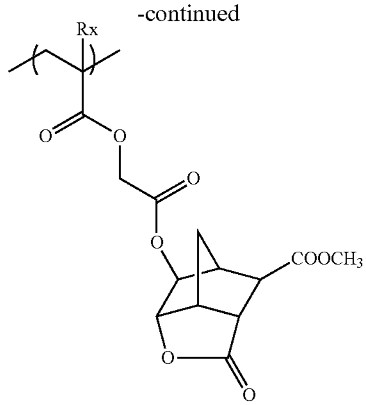
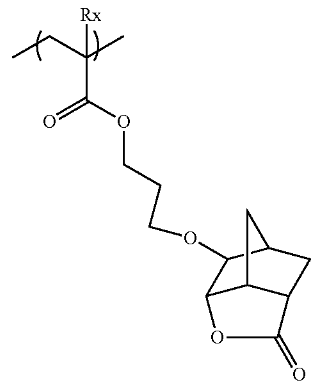
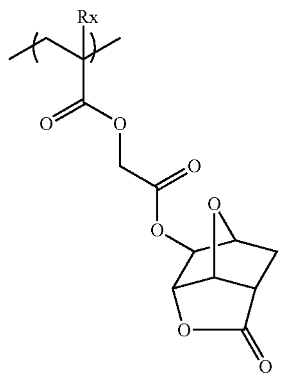
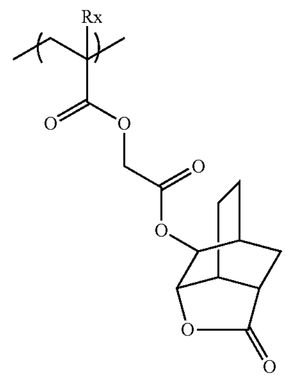
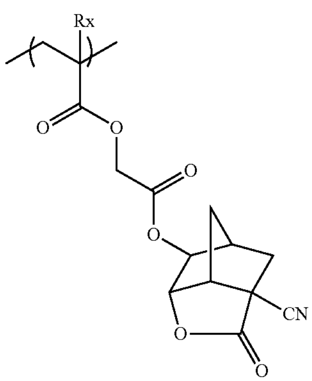
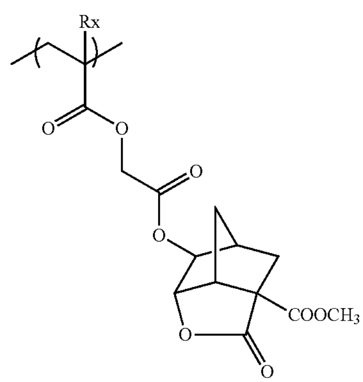
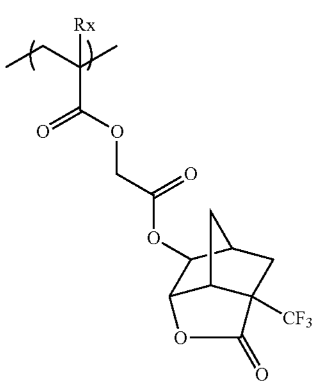
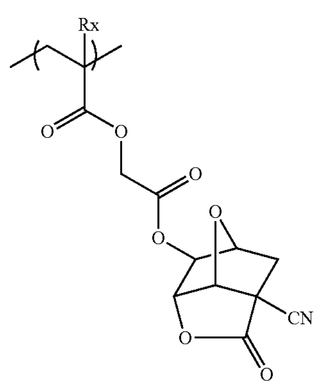

-continued

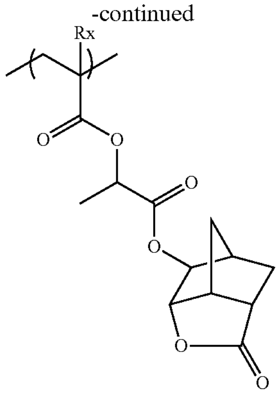

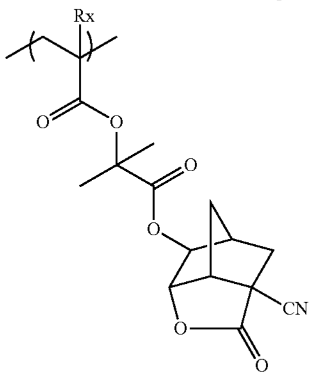

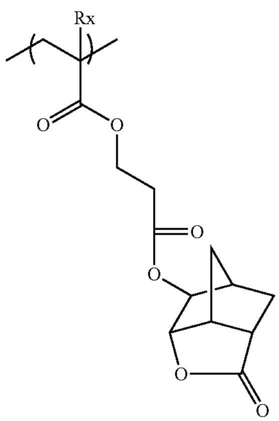

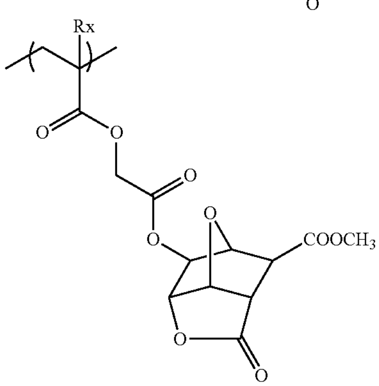

[Repeating Unit (D)]

The resin (P) according to the present invention preferably contains a repeating unit (D) containing an alkali-soluble group. As the alkali-soluble group, there can be mentioned a phenolic hydroxyl group, a carboxyl group, a sulfonamido group, a sulfonylimido group, a bissulfonylimido group or an aliphatic alcohol substituted at its α-position with an electron withdrawing group (for example, a hexafluoroisopropanol group).

When the exposure is performed using an ArF excimer laser, it is preferred to contain a repeating unit containing a carboxyl group. The incorporation of the repeating unit containing an alkali-soluble group increases the resolution in contact hole usage. The repeating unit containing an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a mono- or polycyclohydrocarbon structure. The repeating unit of acrylic acid or methacrylic acid is especially preferred.

The content ratio of the repeating unit having an alkali-soluble group based on all the repeating units of the resin (P) is preferably in the range of 0 to 20 mol %, more preferably 0 to 15 mol % and still more preferably 0 to 10 mol %.

Specific examples of the repeating units having an alkali-soluble group will be shown below, which however in no way limit the scope of the present invention.

In the formulae, Rx represents H, $CH_3$, $CH_2OH$ or $CF_3$.

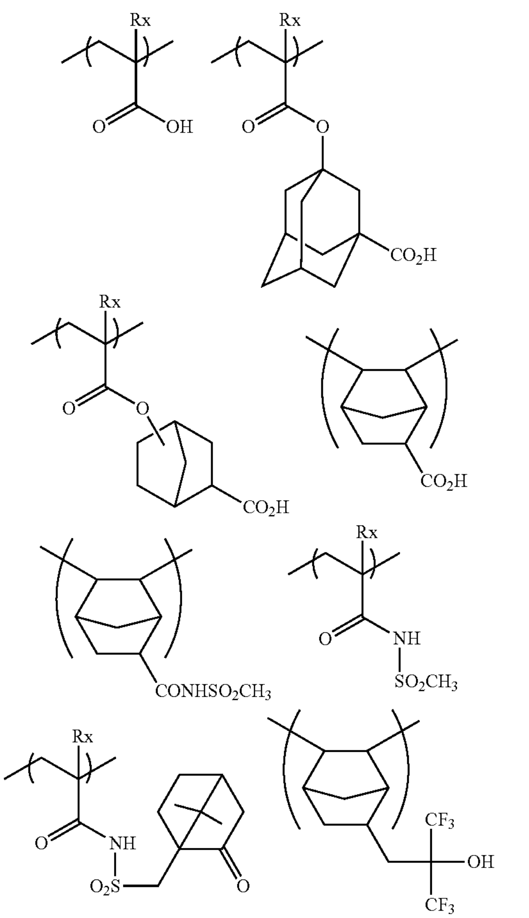

-continued

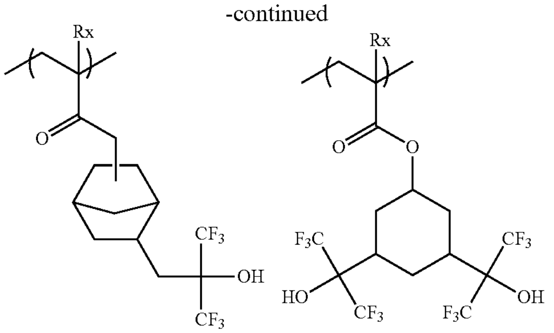

When the exposure is performed using a KrF excimer laser light, an electron beam, X-rays or high-energy rays of wavelength 50 nm or shorter (for example, EUV), it is preferred to contain an alkali-soluble group containing an aromatic ring group. The structures of general formula (IV) below are more preferred.

(IV)

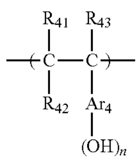

In the formula, each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring (preferably a 5- or 6-membered ring), which $R_{42}$ in this instance is an alkylene group.

$Ar_4$ represents a bivalent aromatic ring group; and n is an integer of 1 to 4.

Particular examples of the alkyl group, monovalent aliphatic hydrocarbon ring group, halogen atom and alkoxycarbonyl group represented by each of $R_{41}$, $R_{42}$ and $R_{43}$ of formula (IV) and also particular examples of the substituents that can be introduced in these groups are the same as set forth above in connection with general formula (V).

$Ar_4$ represents a bivalent aromatic ring group. A substituent may be introduced in the bivalent aromatic ring group. As preferred examples of the bivalent aromatic ring group, there can be mentioned, for example, an arylene group having 6 to 18 carbon atoms, such as a phenylene group, a tolylene group, a naphthylene group or an anthracenylene group, and a bivalent aromatic ring group containing a heteroring, such as thiophene, furan, pyrrole, benzothiophene, benzofuran, benzopyrrole, triazine, imidazole, benzimidazole, triazole, thiadiazole or thiazole.

Preferred substituents that can be introduced in these groups include an alkyl group, an alkoxy group such as a methoxy group, an ethoxy group, a hydroxyethoxy group, a propoxy group, a hydroxypropoxy group or a butoxy group and an aryl group such as a phenyl group, as mentioned in connection with $R_{51}$ to $R_{53}$.

$Ar_4$ is more preferably an optionally substituted arylene group having 6 to 18 carbon atoms. A phenylene group, a naphthylene group and a biphenylene group are most preferred.

The content ratio of the repeating units with alkali-soluble groups of general formula (IV) is preferably in the range of 3 to 90 mol %, more preferably 5 to 80 mol % and further more preferably 7 to 70 mol %, based on all the repeating units of the resin (P).

Specific examples of the repeating units with alkali-soluble groups of general formula (IV) will be shown below, which however in no way limit the scope of the present invention. In the following formulae, a represents an integer of 0 to 2.

(B-1)

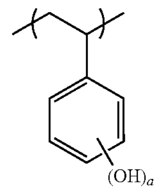

(B-2)

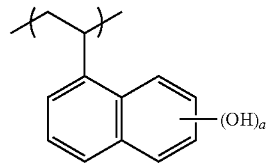

(B-3)

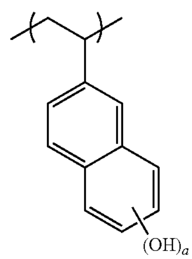

(B-4)

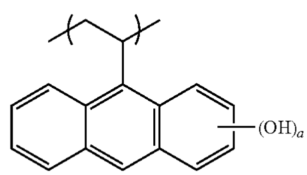

(B-5)

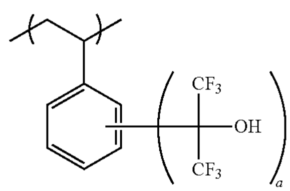

(B-6)

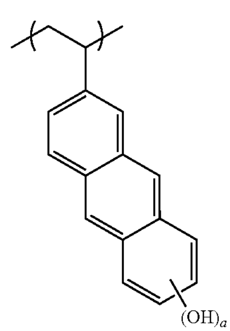

-continued
(B-7)
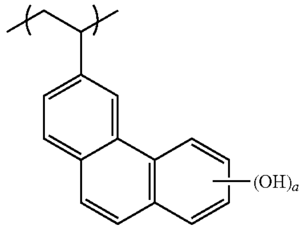
(B-8)
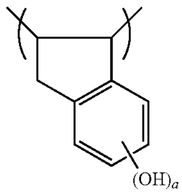
(B-9)
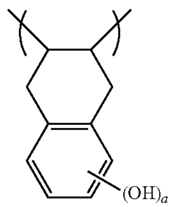
(B-10)
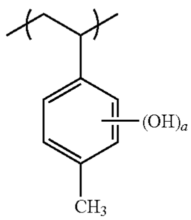
(B-11)
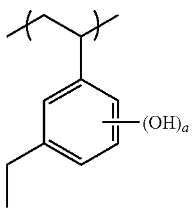
(B-12)
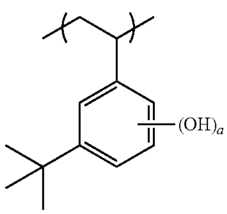
(B-13)
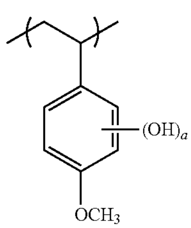
-continued
(B-14)
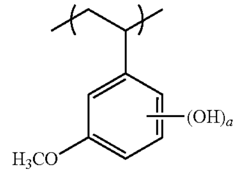
(B-15)
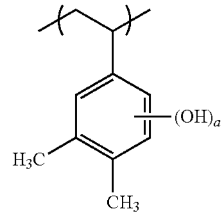
(B-16)
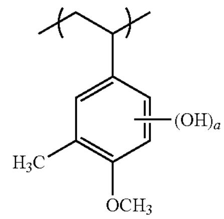
(B-17)
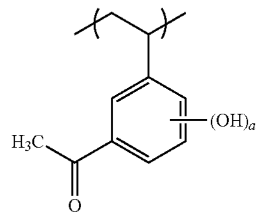
(B-18)
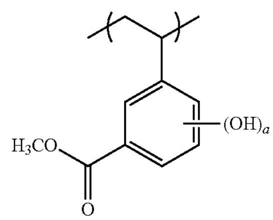
(B-19)
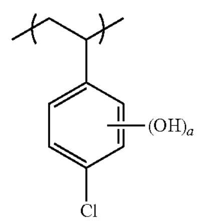
(B-20)
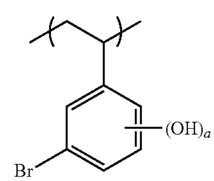

-continued
(B-21)
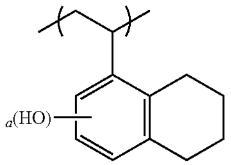
(B-22)
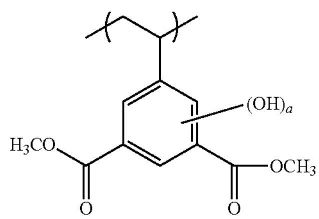
(B-23)
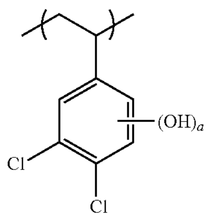
(B-24)
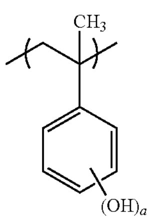
(B-25)
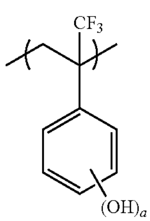
(B-26)
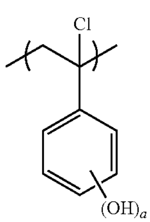
(B-27)
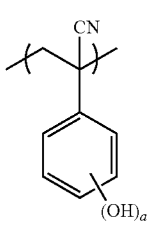
-continued
(B-28)
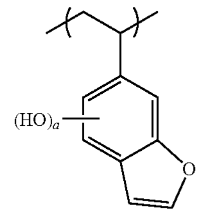
(B-29)
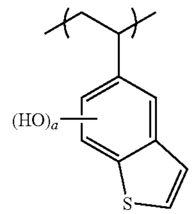
(B-30)
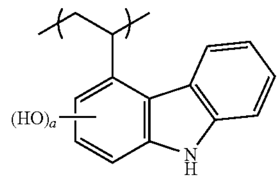
(B-31)
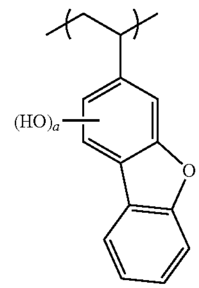
(B-32)
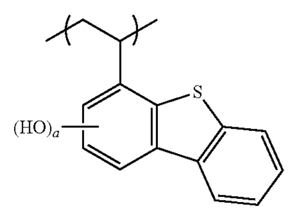
(B-33)
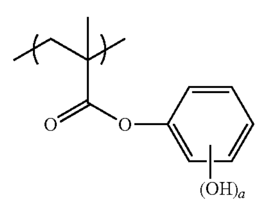
(B-34)
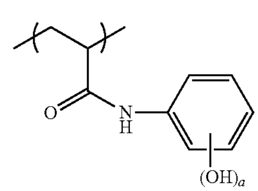

-continued (B-35)

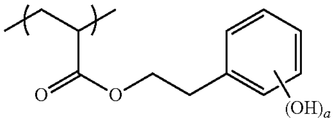

[Other Repeating Units]

The resin (P) may further contain a repeating unit that contains a hydroxyl group or a cyano group other than the repeating units mentioned above. The containment of this repeating unit would realize enhancements of adhesion to substrate and developer affinity. The repeating unit containing a hydroxyl group or a cyano group is preferably a repeating unit with a structure of alicyclic hydrocarbon substituted with a hydroxyl group or a cyano group, and preferably has no acid-decomposable group. In the alicyclic hydrocarbon structure substituted with a hydroxyl group or a cyano group, the alicyclic hydrocarbon structure preferably consists of an adamantyl group, a diamantyl group or a norbornane group. As preferred alicyclic hydrocarbon structures substituted with a hydroxyl group or a cyano group, there can be mentioned the partial structures of general formulae (VIIa) to (VIId), below.

(VIIAa)

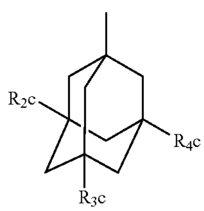

(VIIb)

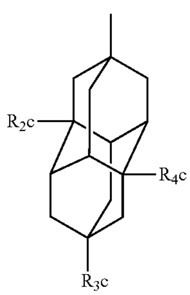

(VIIc)

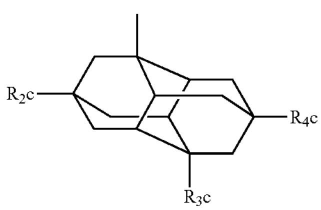

(VIId)

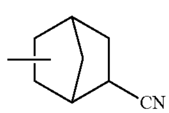

In the general formulae (VIIa) to (VIIc), each of $R_{2c}$ to $R_{4c}$ independently represents a hydrogen atom, a hydroxyl group or a cyano group, providing that at least one of the $R_{2c}$ to $R_{4c}$ represents a hydroxyl group or a cyano group. Preferably, one or two of the $R_{2c}$ to $R_{4c}$ are hydroxyl groups and the remainder is a hydrogen atom. In the general formula (VIIa), more preferably, two of the $R_{2c}$ to $R_{4c}$ are hydroxyl groups and the remainder is a hydrogen atom.

As the repeating units having any of the partial structures of the general formulae (VIIa) to (VIId), there can be mentioned those of the following general formulae (AIIa) to (AIId).

(AIIa)

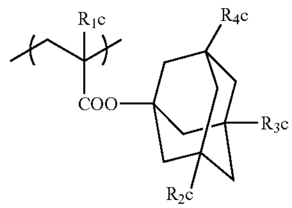

(AIIb)

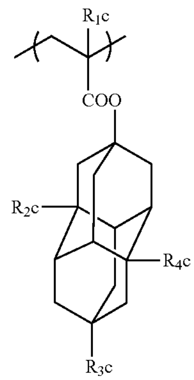

(AIIc)

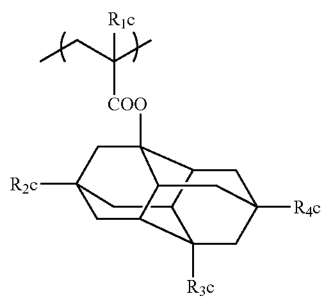

(AIId)

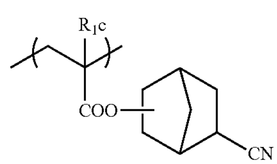

In the general formulae (Alia) to (AIId), $R_1c$ represents a hydrogen atom, a methyl group, a trifluoromethyl group or a hydroxymethyl group.

$R_2c$ to $R_4c$ have the same meaning as those of the general formulae (VIIa) to (VIIc).

Specific examples of the repeating units containing a hydroxyl group or a cyano group will be shown below, which however in no way limit the scope of the present invention.

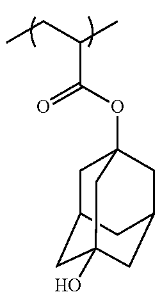
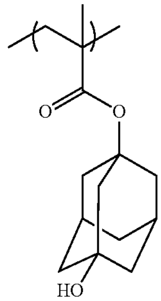
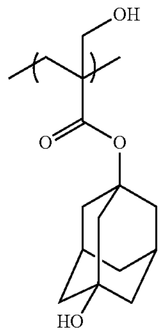
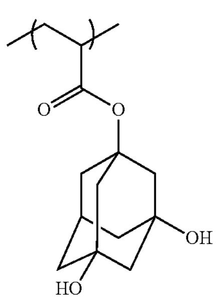
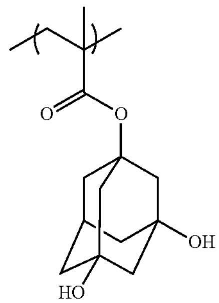
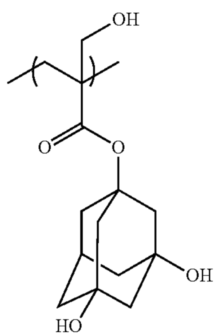
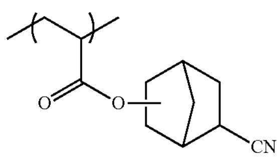
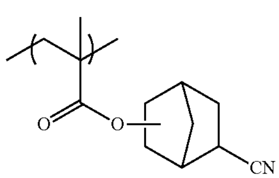
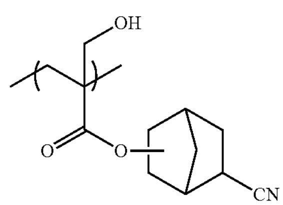
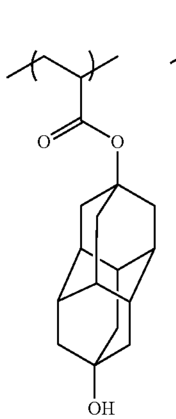
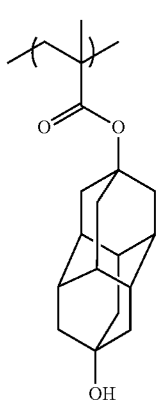
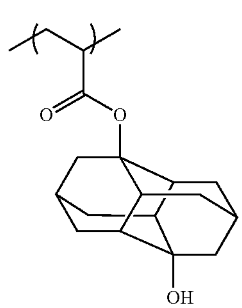

-continued

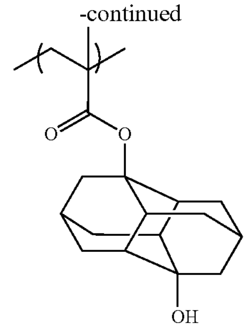

Resin (P) according to the present invention can further contain a repeating unit that has a structure of alicyclic hydrocarbon having no polar group, exhibiting no acid decomposability. As such a repeating unit, there can be mentioned any of the repeating units of general formula (VII) below.

(VII)

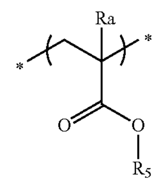

In general formula (VII), $R_5$ represents a hydrocarbon group having at least one alicyclic hydrocarbon structure in which neither a hydroxyl group nor a cyano group is contained.

Ra represents a hydrogen atom, an alkyl group or a group of the formula —$CH_2$—O—$Ra_2$ in which $Ra_2$ represents a hydrogen atom, an alkyl group or an acyl group. Ra preferably represents a hydrogen atom, a methyl group, a trifluoromethyl group, a hydroxymethyl group and the like, more preferably a hydrogen atom and a methyl group.

The alicyclic hydrocarbon structures contained in $R_5$ include a monocyclic hydrocarbon group and a polycyclic hydrocarbon group. As the monocyclic hydrocarbon group, there can be mentioned, for example, a cycloalkyl group having 3 to 12 carbon atoms, such as a cyclopentyl group, a cyclohexyl group, a cycloheptyl group or a cyclooctyl group, or a cycloalkenyl group having 3 to 12 carbon atoms, such as a cyclohexenyl group. Preferably, the monocyclic hydrocarbon group is a monocyclic hydrocarbon group having 3 to 7 carbon atoms. A cyclopentyl group and a cyclohexyl group are more preferred.

The polycyclic hydrocarbon groups include ring-assembly hydrocarbon groups and crosslinked-ring hydrocarbon groups. Examples of the ring-assembly hydrocarbon groups include a bicyclohexyl group, a perhydronaphthalene group and the like. As the crosslinked-ring hydrocarbon rings, there can be mentioned, for example, bicyclic hydrocarbon rings, such as pinane, bornane, norpinane, norbornane and bicyclooctane rings (e.g., bicyclo[2.2.2]octane ring or bicyclo [3.2.1]octane ring); tricyclic hydrocarbon rings, such as homobledane, adamantane, tricyclo[$5.2.1.0^{2,6}$]decane and tricyclo[$4.3.1.1^{2,5}$]undecane rings; and tetracyclic hydrocarbon rings, such as tetracyclo[$4.4.0.1^{2,5}.1^{7,10}$]dodecane and perhydro-1,4-methano-5,8-methanonaphthalene rings. Further, the crosslinked-ring hydrocarbon rings include condensed-ring hydrocarbon rings, for example, condensed rings resulting from condensation of multiple 5- to 8-membered cycloalkane rings, such as perhydronaphthalene (decalin), perhydroanthracene, perhydrophenanthrene, perhydroacenaphthene, perhydrofluorene, perhydroindene and perhydrophenarene rings.

As preferred crosslinked-ring hydrocarbon rings, there can be mentioned, for example, a norbornyl group, an adamantyl group, a bicyclooctanyl group and a tricyclo[5,2,1,$0^{2,6}$]decanyl group. As more preferred crosslinked-ring hydrocarbon rings, there can be mentioned a norbornyl group and an adamantyl group.

These alicyclic hydrocarbon groups may have substituents. As preferred substituents, there can be mentioned, for example, a halogen atom, an alkyl group, a hydroxyl group protected by a protective group and an amino group protected by a protective group. The halogen atom is preferably a bromine, chlorine or fluorine atom, and the alkyl group is preferably a methyl, ethyl, butyl or t-butyl group. The alkyl group may further have a substituent. As the optional further substituent, there can be mentioned a halogen atom, an alkyl group, a hydroxyl group protected by a protective group or an amino group protected by a protective group.

As the protective group, there can be mentioned, for example, an alkyl group, a cycloalkyl group, an aralkyl group, a substituted methyl group, a substituted ethyl group, an alkoxycarbonyl group or an aralkyloxycarbonyl group. The alkyl group is preferably an alkyl group having 1 to 4 carbon atoms. The substituted methyl group is preferably a methoxymethyl, methoxythiomethyl, benzyloxymethyl, t-butoxymethyl or 2-methoxyethoxymethyl group. The substituted ethyl group is preferably a 1-ethoxyethyl or 1-methyl-1-methoxyethyl group. The acyl group is preferably an aliphatic acyl group having 1 to 6 carbon atoms, such as a formyl, acetyl, propionyl, butyryl, isobutyryl, valeryl or pivaloyl group. The alkoxycarbonyl group is, for example, an alkoxycarbonyl group having 1 to 4 carbon atoms.

The content ratio of any of the repeating units that have a structure of alicyclic hydrocarbon having no polar group, exhibiting no acid decomposability, based on all the repeating units of resin (P), is preferably in the range of 0 to 40 mol %, more preferably 0 to 20 mol %.

Specific examples of the repeating units that have a structure of alicyclic hydrocarbon having no polar group, exhibiting no acid decomposability will be shown below, which however in no way limit the scope of the present invention. In the formulae, Ra represents H, $CH_3$, $CH_2OH$ or $CF_3$.

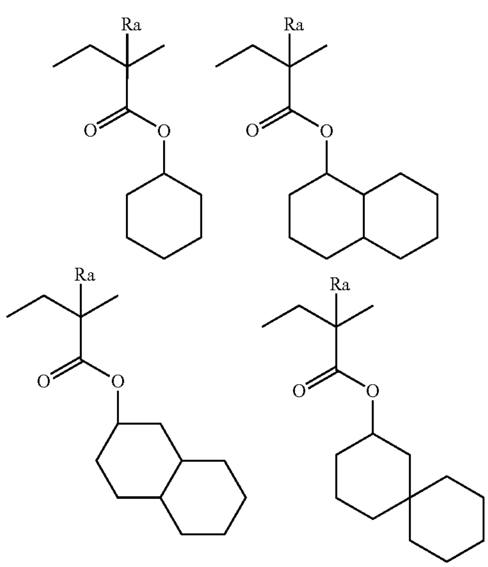

-continued

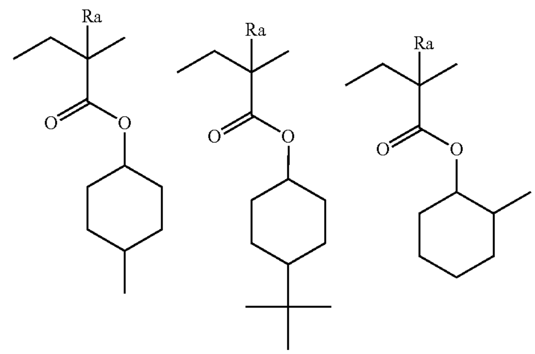

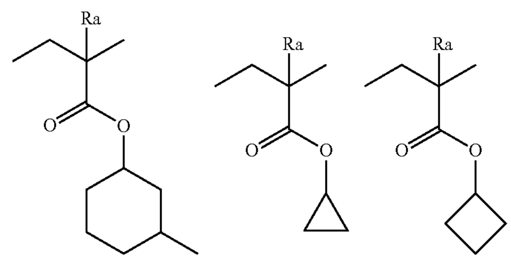

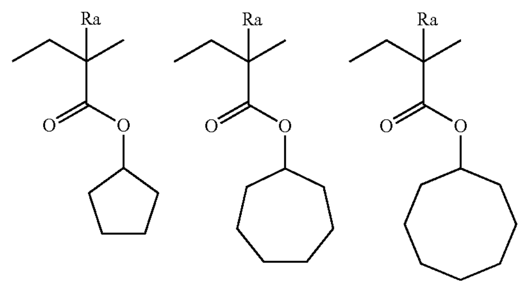

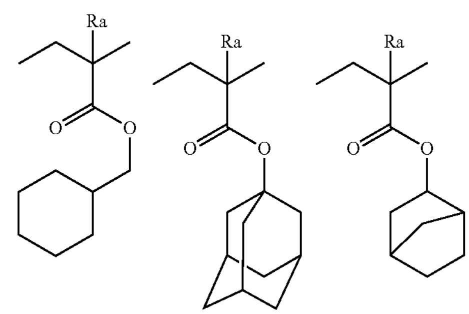

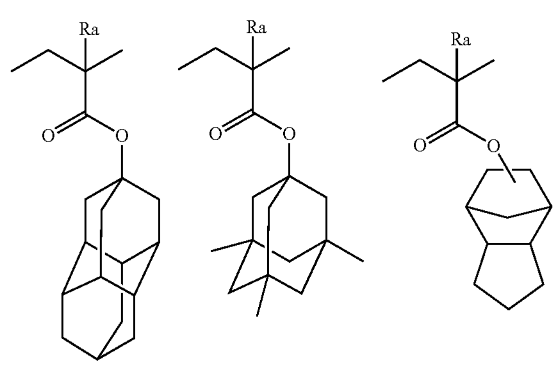

-continued

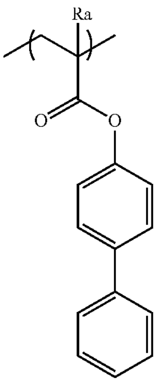

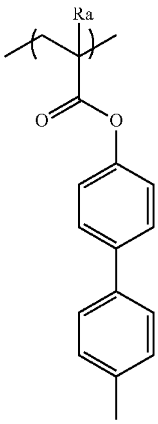

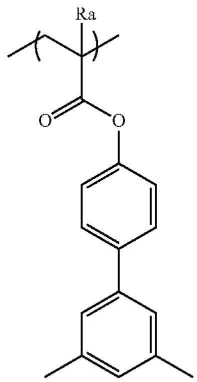

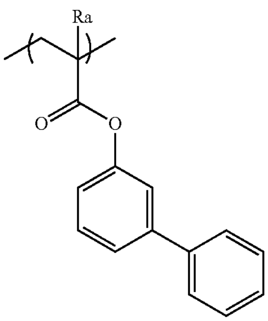

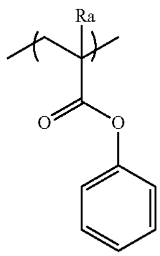

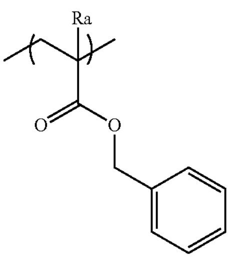

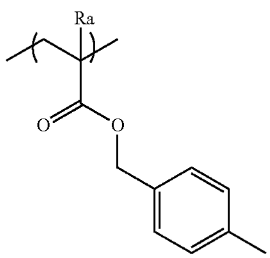

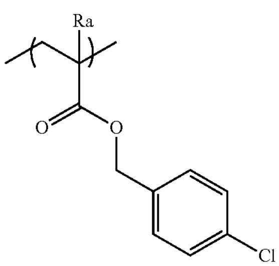

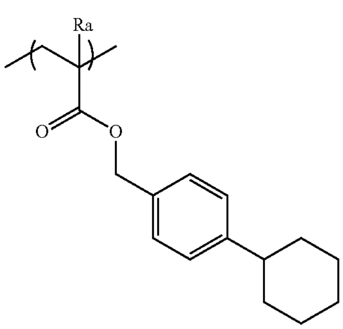

-continued

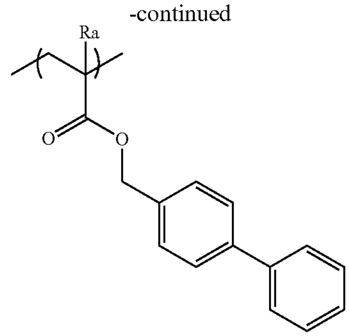

Resin (P) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of resin (A), especially:

(1) solubility in applied solvents, (2) film forming easiness (glass transition point), (3) alkali developability, (4) film thinning (selections of hydrophilicity/hydrophobicity and alkali-soluble group), (5) adhesion of unexposed area to substrate, (6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters, styrenes, crotonic esters and the like.

In addition, any unsaturated compound capable of addition polymerization that is copolymerizable with monomers corresponding to the above various repeating structural units may be copolymerized therewith.

The molar ratios of individual repeating structural units contained in resin (P) are appropriately determined from the viewpoint of regulation of not only the dry etching resistance of the resist but also the standard developer adaptability, substrate adhesion, resist profile and generally required properties of the resist such as the resolving power, heat resistance and sensitivity.

The resin (P) according to the present invention may have any of the random, block, comb and star configurations.

The resin (P) can be synthesized by, for example, the radical, cation or anion polymerization of unsaturated monomers corresponding to given structures. Further, the intended resin can be obtained by first polymerizing unsaturated monomers corresponding to the precursors of given structures and thereafter carrying out a polymer reaction.

For example, as general synthetic methods, there can be mentioned a batch polymerization method in which an unsaturated monomer and a polymerization initiator are dissolved in a solvent and heated so as to accomplish polymerization, a dropping polymerization method in which a solution of unsaturated monomer and polymerization initiator is dropped into a heated solvent over a period of 1 to 10 hours, etc. The dropping polymerization method is preferred.

As the solvents for use in polymerization, there can be mentioned, for example, those employable in the preparation of the actinic-ray- or radiation-sensitive resin composition to be described hereinafter. It is preferred to perform the polymerization with the use of the same solvent as employed in the composition of the present invention. This inhibits any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, the polymerization may be carried out in the presence of a chain transfer agent (for example, an alkyl mercaptan and the like).

The concentration during the reaction is generally in the range of 5 to 70 mass %, preferably 10 to 50 mass %. The reaction temperature is generally in the range of 10° to 150° C., preferably 30° to 120° C. and more preferably 40° to 100° C.

The reaction time is generally in the range of 1 to 48 hours, preferably 1 to 24 hours and further more preferably 1 to 12 hours.

After the completion of the reaction, the mixture is allowed to stand still to cool to room temperature and purified. In the purification, use is made of routine methods, such as a liquid-liquid extraction method in which residual monomers and oligomer components are removed by water washing or by the use of a combination of appropriate solvents, a method of purification in solution form such as ultrafiltration capable of extraction removal of only components of a given molecular weight or below, a re-precipitation method in which a resin solution is dropped into a poor solvent to thereby coagulate the resin in the poor solvent and thus remove residual monomers, etc. and a method of purification in solid form such as washing of a resin slurry obtained by filtration with the use of a poor solvent. For example, the reaction solution is brought into contact with a solvent wherein the resin is poorly soluble or insoluble (poor solvent) amounting to 10 or less, preferably 10 to 5 times the volume of the reaction solution to thereby precipitate the resin as a solid.

The solvent for use in the operation of precipitation or re-precipitation from a polymer solution (precipitation or re-precipitation solvent) is not limited as long as the solvent is a poor solvent for the polymer. According to the type of polymer, use can be made of any one appropriately selected from among a hydrocarbon, a halogenated hydrocarbon, a nitro compound, an ether, a ketone, an ester, a carbonate, an alcohol, a carboxylic acid, water, a mixed solvent containing these solvents and the like. Of these, it is preferred to employ a solvent containing at least an alcohol (especially methanol and the like) or water as the precipitation or re-precipitation solvent.

The amount of precipitation or re-precipitation solvent used is generally in the range of 100 to 10,000 parts by mass, preferably 200 to 2000 parts by mass and more preferably 300 to 1000 parts by mass per 100 parts by mass of the polymer solution, according to intended efficiency, yield, etc.

The temperature at which the precipitation or re-precipitation is carried out is generally in the range of about 0° to 50° C., preferably about room temperature (for example, about 20° to 35° C.), according to efficiency and operation easiness. The operation of precipitation or re-precipitation can be carried out by a publicly known method, such as a batch or continuous method, with the use of a common mixing vessel, such as an agitation vessel.

The polymer obtained by the precipitation or re-precipitation is generally subjected to common solid/liquid separation, such as filtration or centrifugal separation, and dried before use. The filtration is carried out with the use of a filter medium ensuring solvent resistance, preferably under pressure. The drying is performed at about 30° to 100° C., preferably about 30° to 50° C. at ordinary pressure or reduced pressure (preferably reduced pressure).

Alternatively, after the resin precipitation and separation, the obtained resin may be once more dissolved in a solvent and brought into contact with a solvent wherein the resin is poorly soluble or insoluble. Specifically, the method may include the steps of, after the completion of the radical polymerization reaction, bringing the polymer into contact with a solvent wherein the polymer is poorly soluble or insoluble to thereby precipitate a resin (step a), separating the resin from the solution (step b), re-dissolving the resin in a solvent to thereby obtain a resin solution (A) (step c), thereafter bringing the resin solution (A) into contact with a solvent wherein the resin is poorly soluble or insoluble amounting to less than 10 times (preferably 5 times or less) the volume of the resin solution (A) to thereby precipitate a resin solid (step d) and separating the precipitated resin (step e).

The molecular weight of the resin (P) according to the present invention is not particularly limited. Preferably, the weight average molecular weight thereof is in the range of 1000 to 100,000. It is more preferably in the range of 1500 to 60,000, most preferably 2000 to 30,000. The regulation of the weight average molecular weight to 1000 to 100,000 would prevent deteriorations of heat resistance and dry etching resistance and also prevent deterioration of developability and increase of viscosity leading to poor film forming property. Herein, the weight average molecular weight of the resin refers to the molecular weight in terms of polystyrene molecular weight measured by GPC (carrier: THF or N-methyl-2-pyrrolidone (NMP)).

The molecular weight dispersity (Mw/Mn) of the resin is preferably in the range of 1.00 to 5.00, more preferably 1.03 to 3.50 and further more preferably 1.05 to 2.50. The lower the molecular weight distribution, the more excellent the resolving power and resist profile and the smoother the side wall of the resist pattern to thereby attain an excellence in roughness.

In the present invention, a single type of resin (P) can be used alone, or two or more types of resins (P) can be used in combination. The content of resin (P) in the actinic-ray- or radiation-sensitive resin composition of the present invention based on the total solids thereof is preferably in the range of 30 to 100 mass %, more preferably 50 to 100 mass % and most preferably 70 to 100 mass %.

More preferred particular examples of resins (P) will be shown below, which however in no way limit the scope of the present invention.

-continued
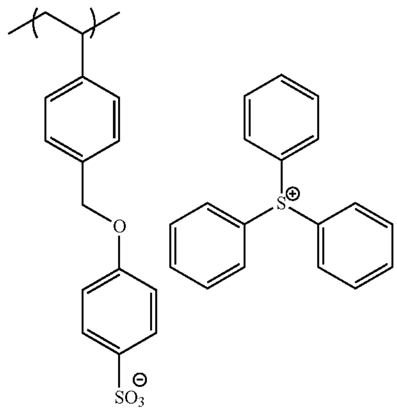
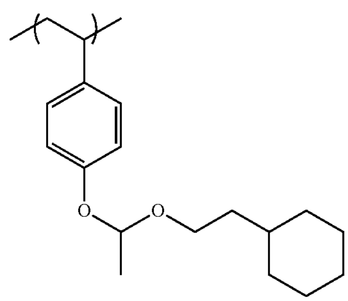
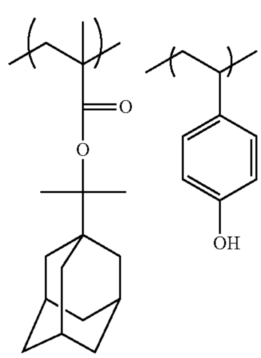
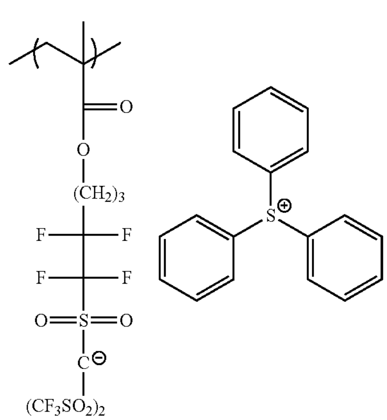
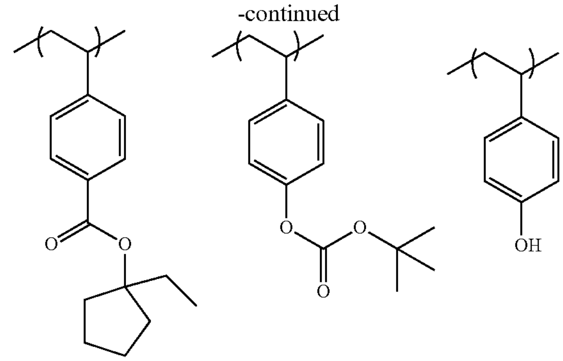
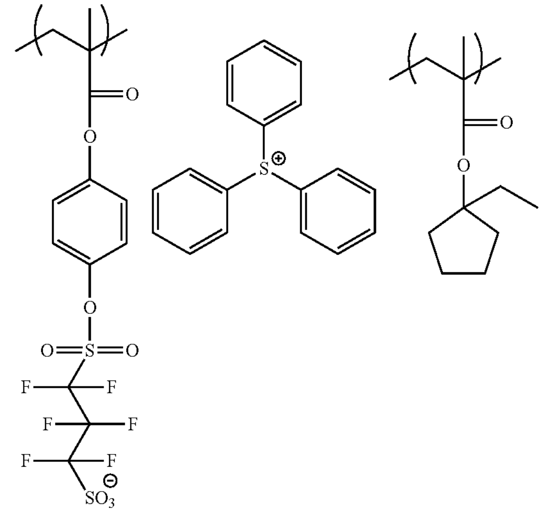
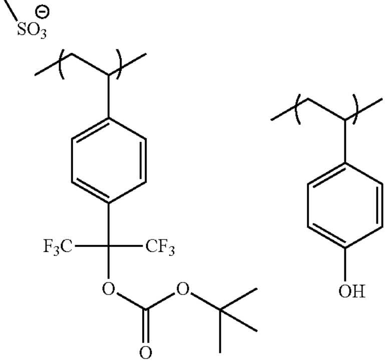
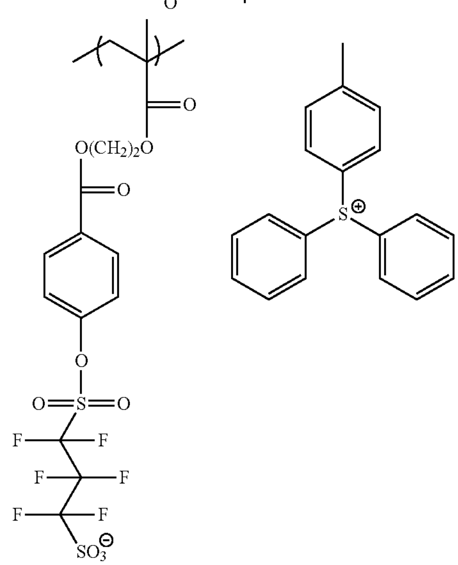

-continued
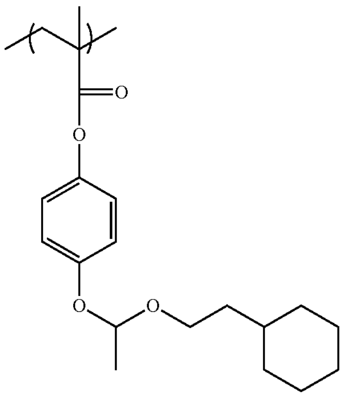
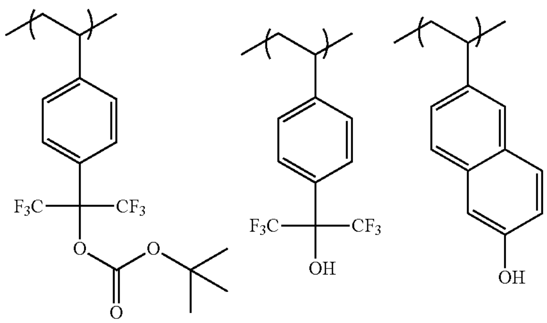
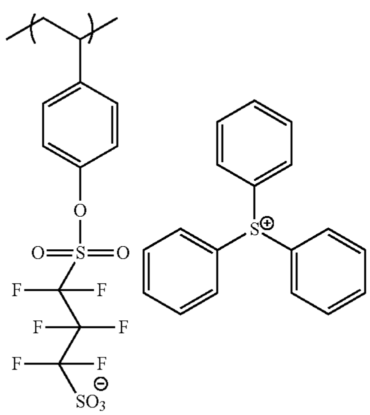
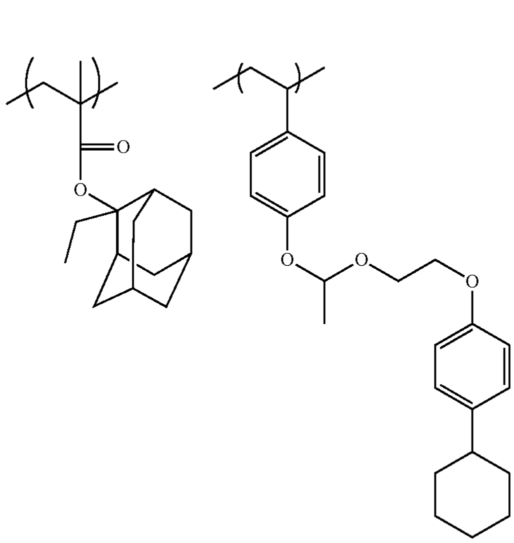
-continued
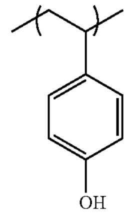
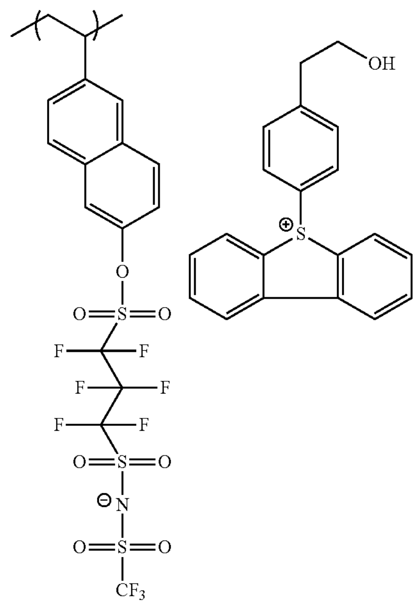
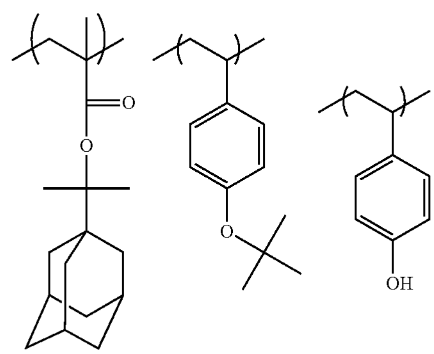
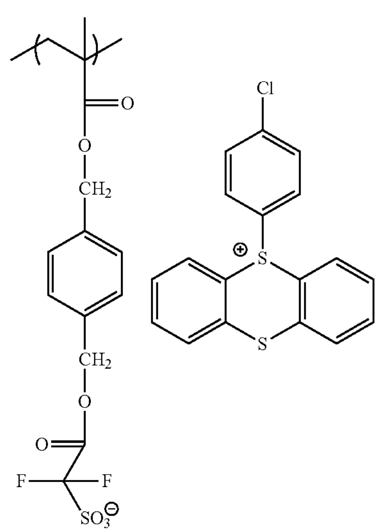

-continued
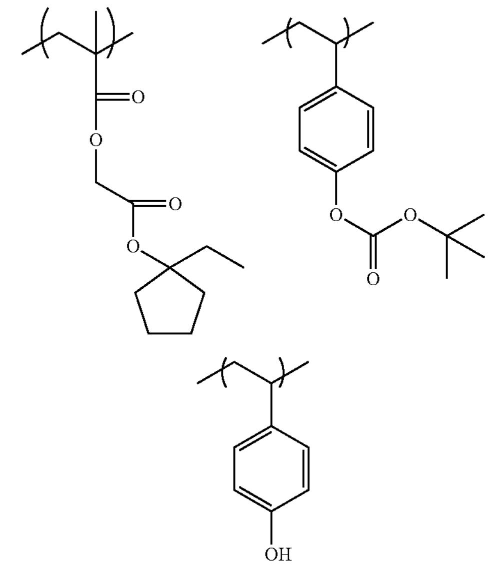
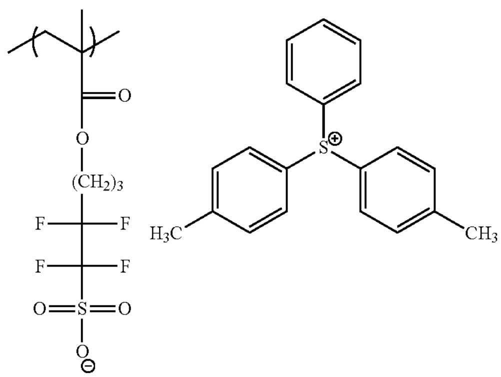
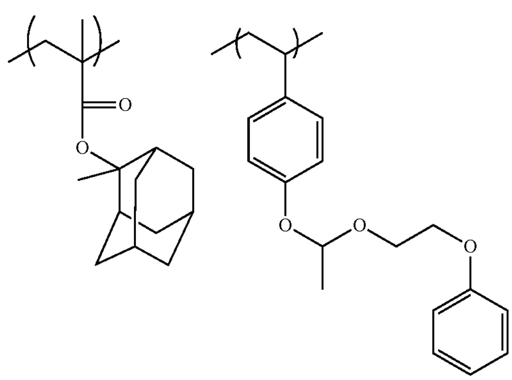
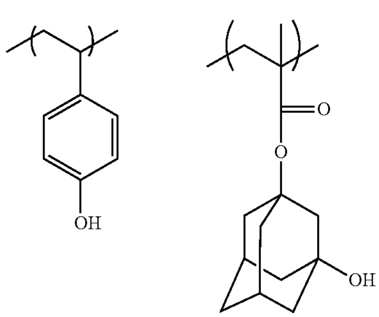
-continued
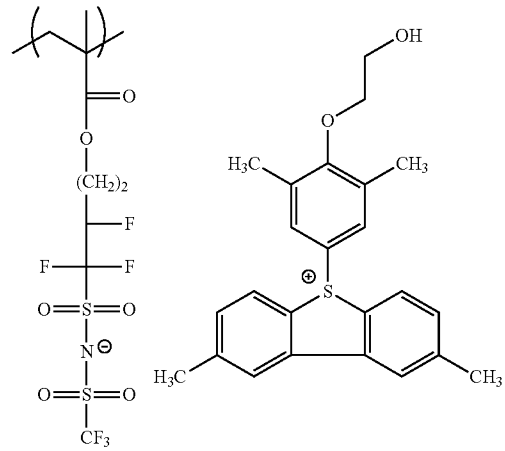
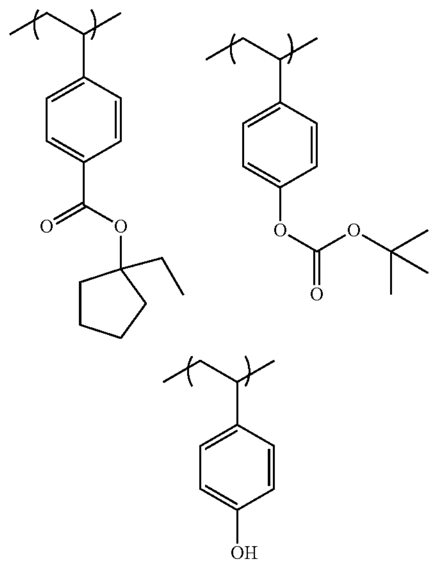
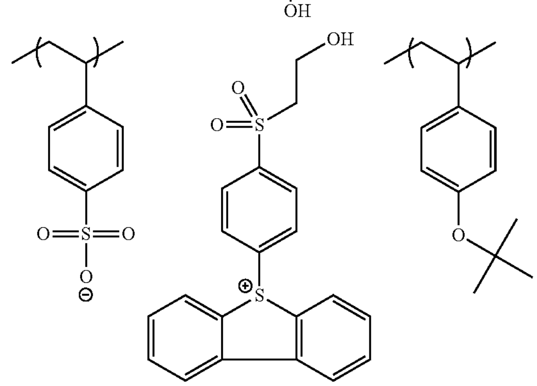
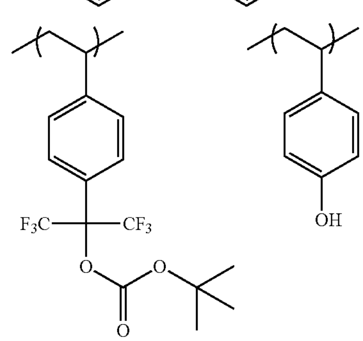

-continued
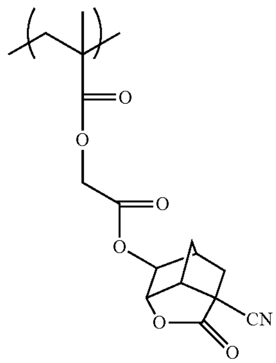
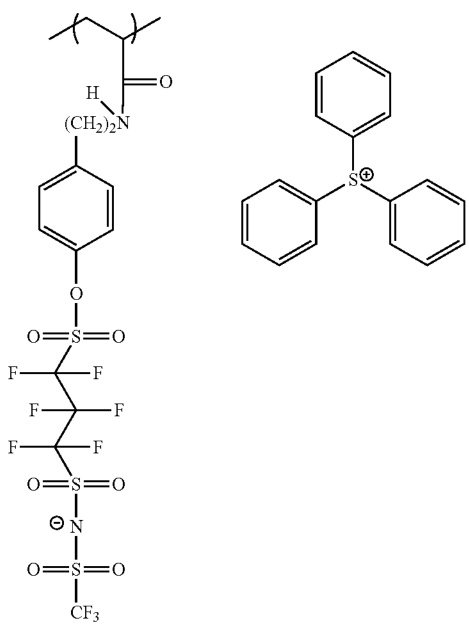
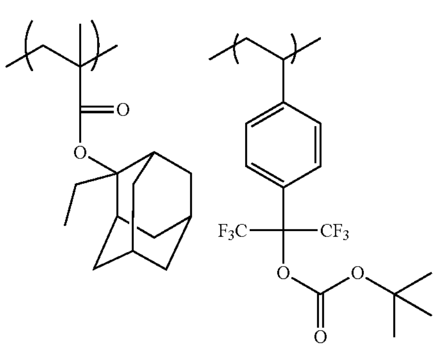
-continued
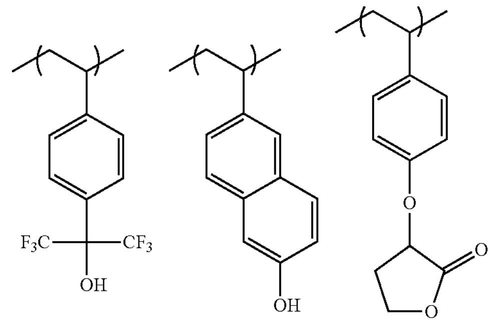
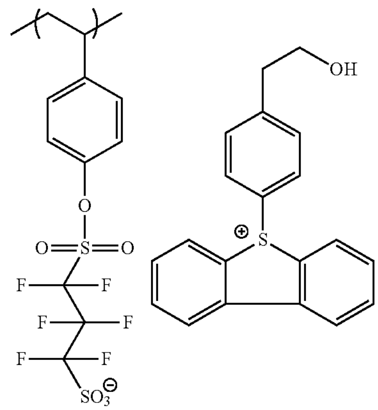
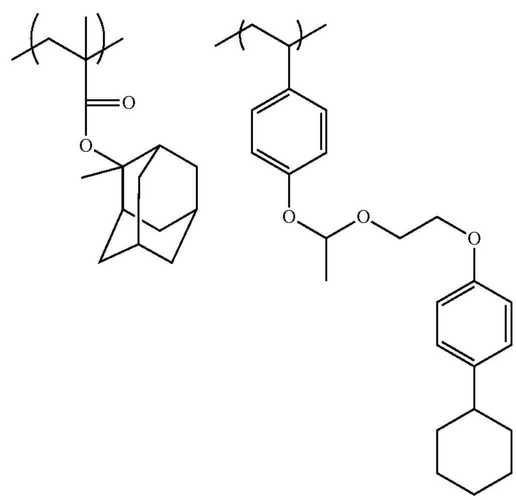
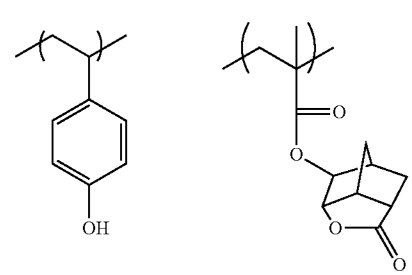

-continued
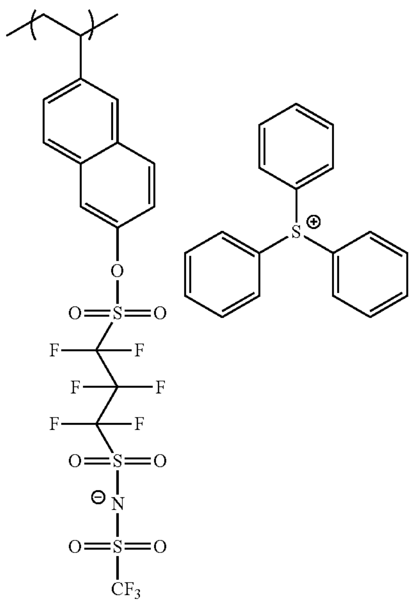
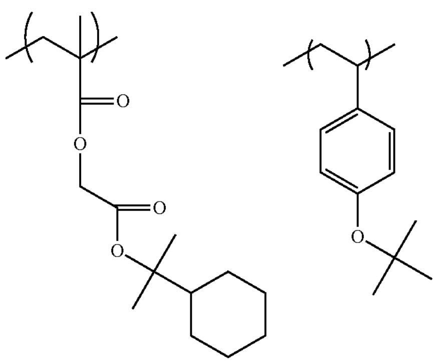
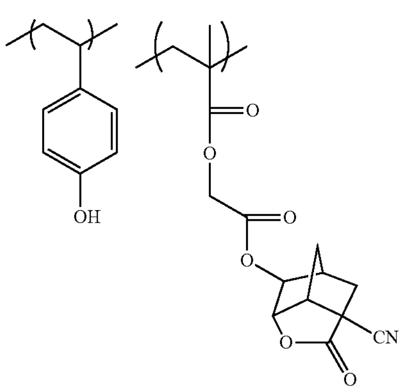
-continued
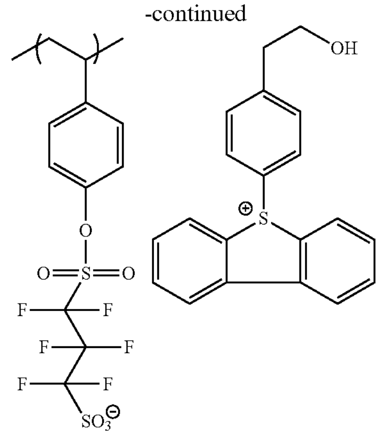
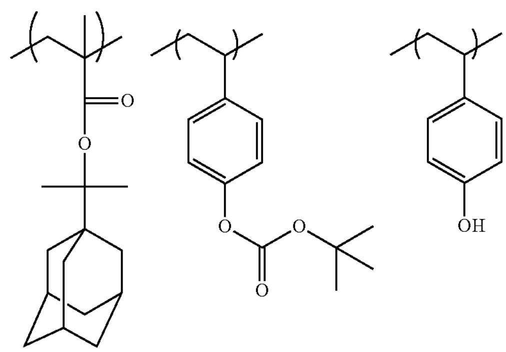
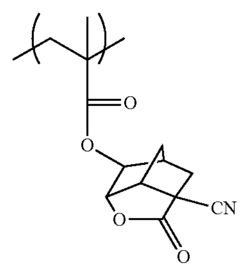
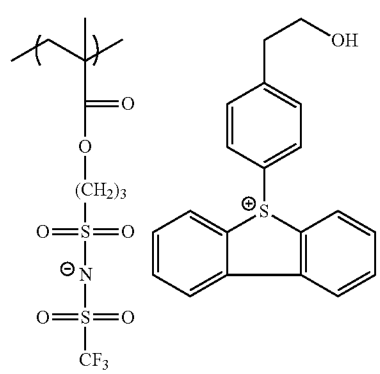

-continued
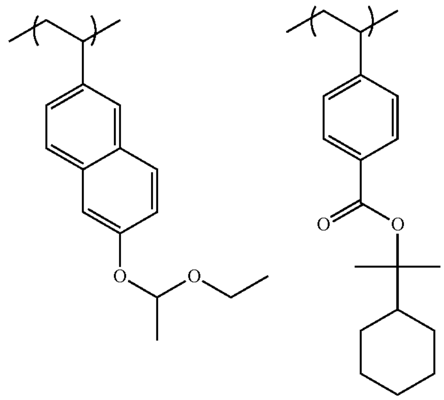
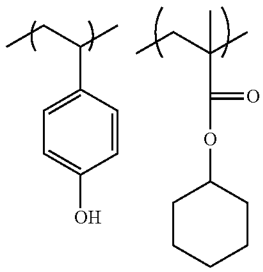
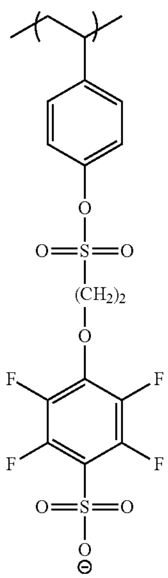
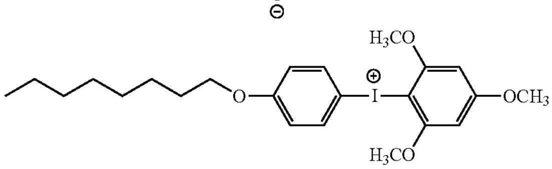
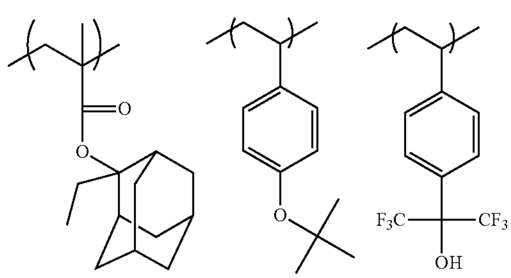
-continued
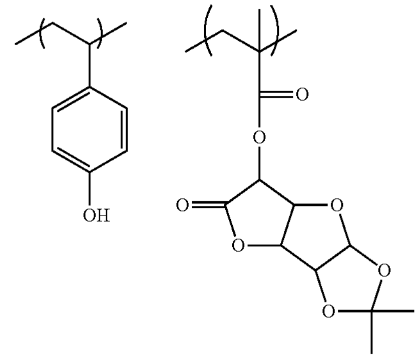
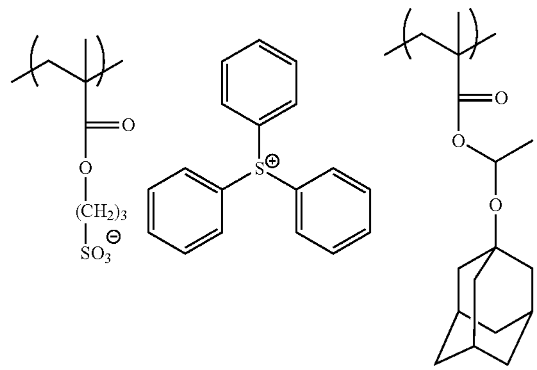
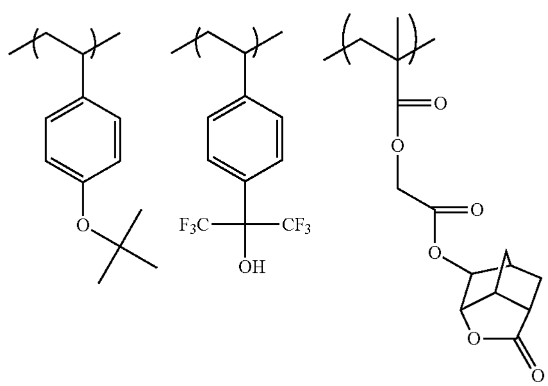
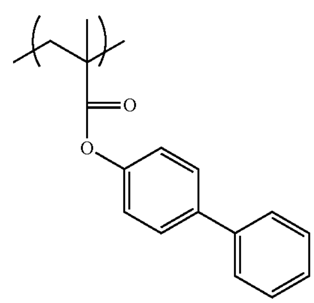
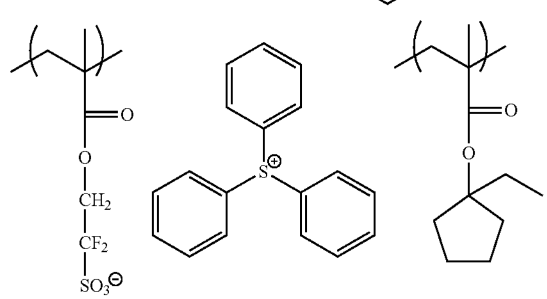

-continued
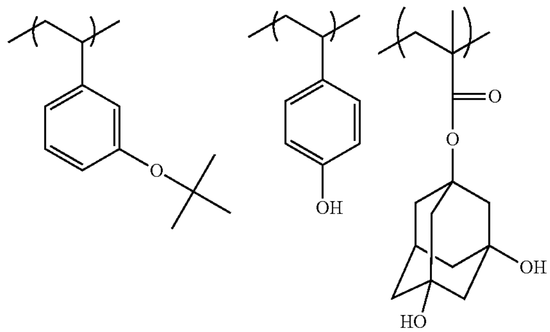
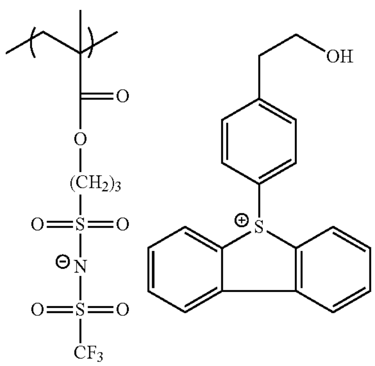
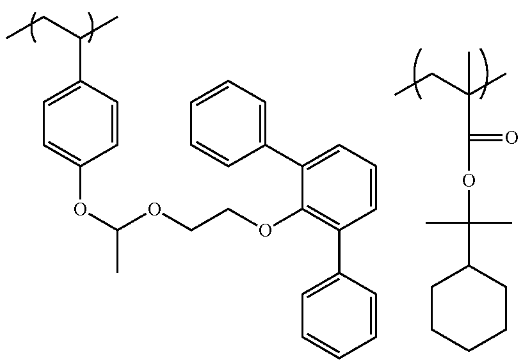
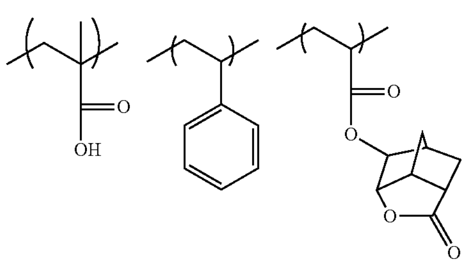
-continued
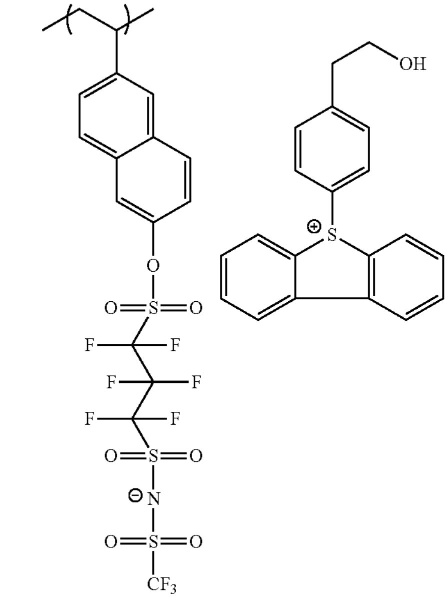
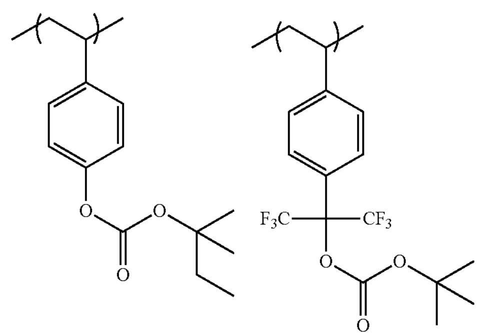
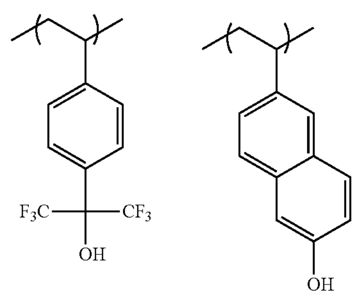
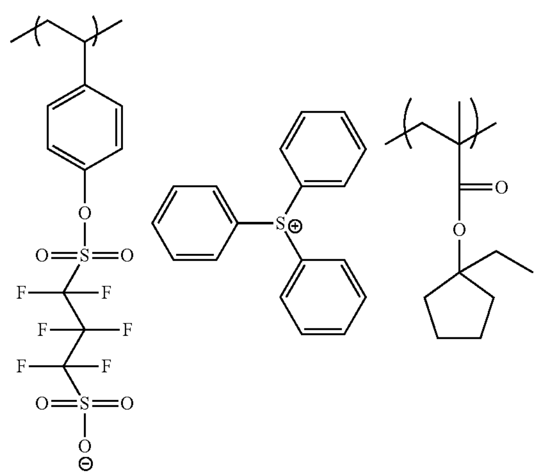

-continued
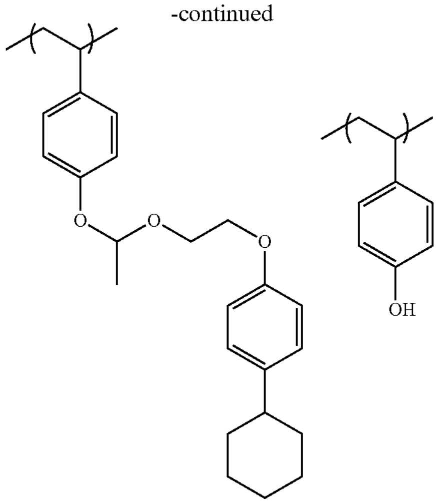
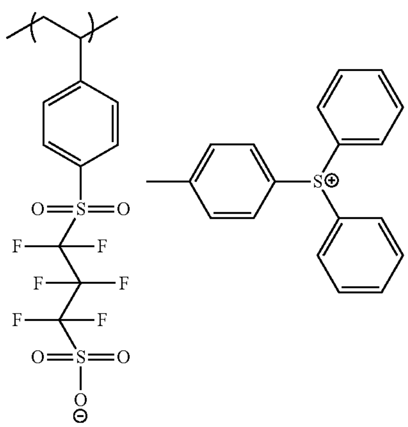
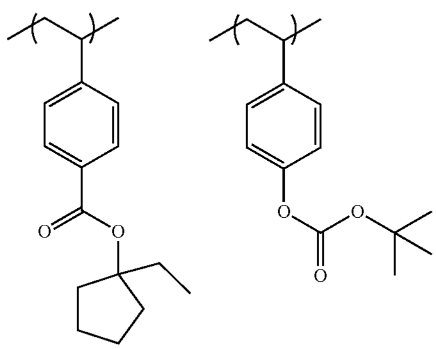
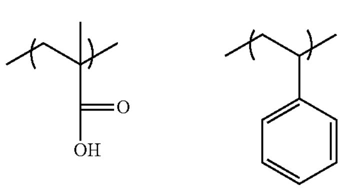
-continued
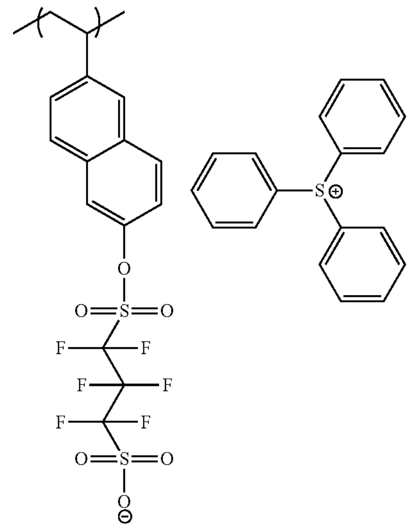
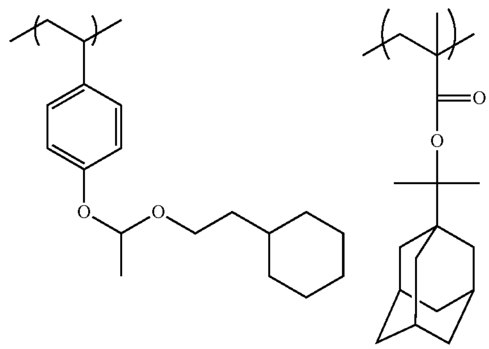
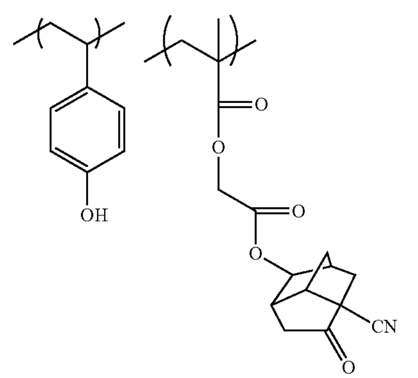
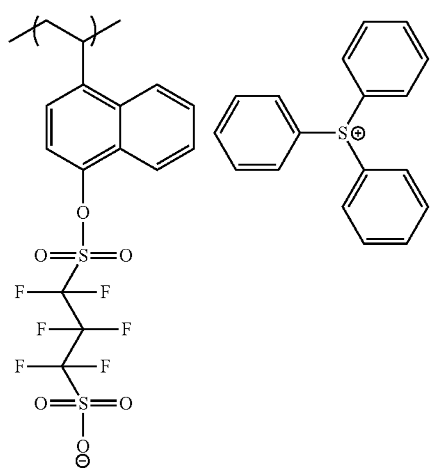

-continued
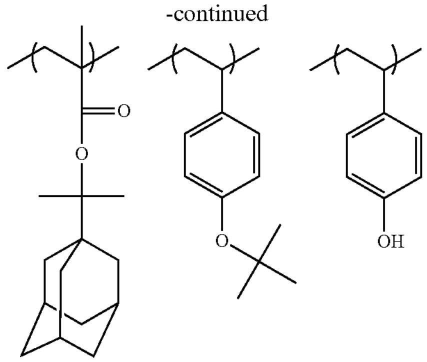
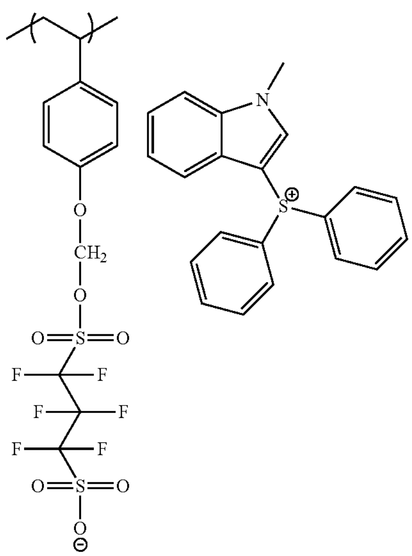
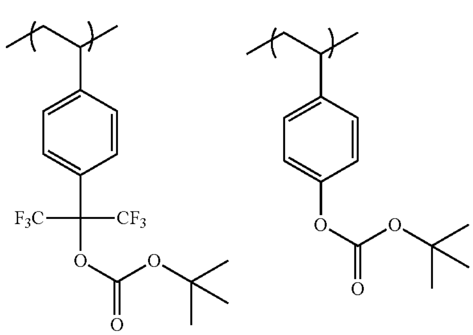
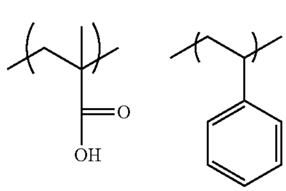
-continued
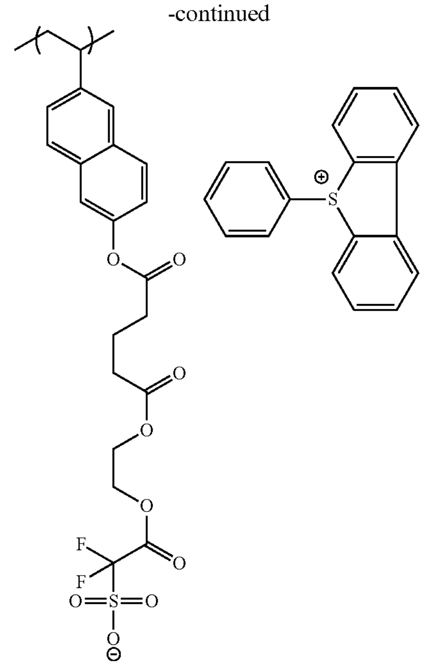
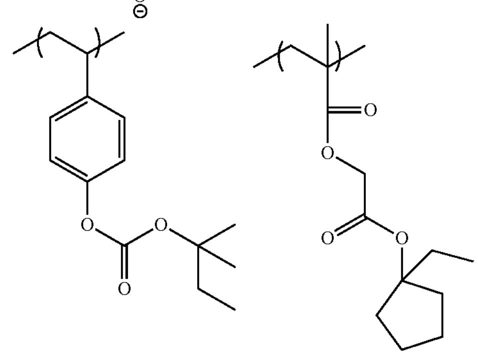
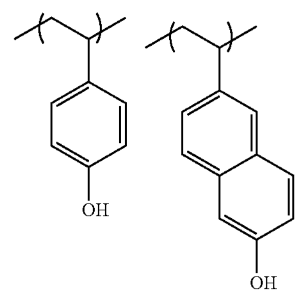
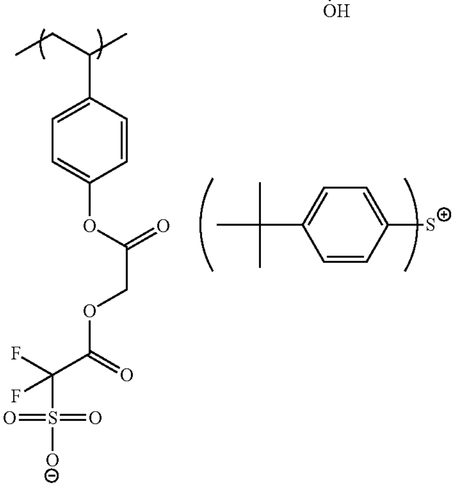

-continued
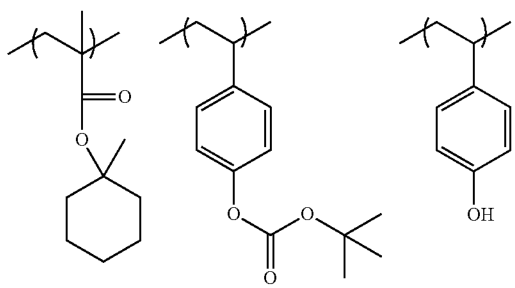
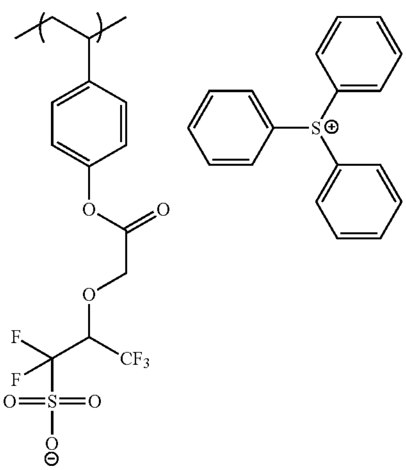
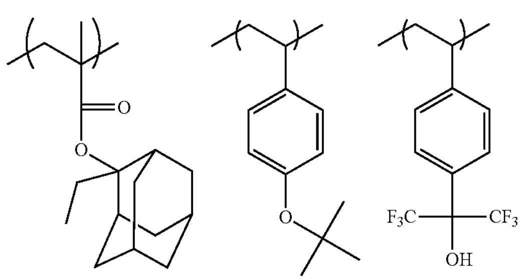
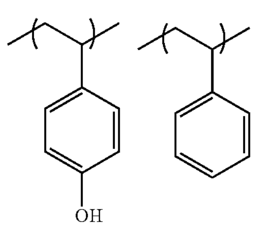
-continued
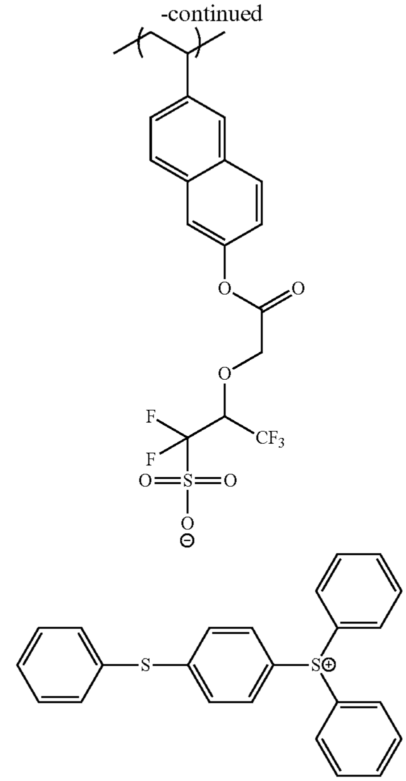
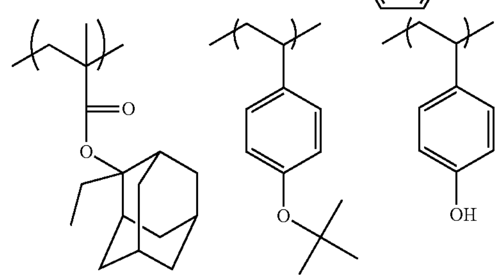
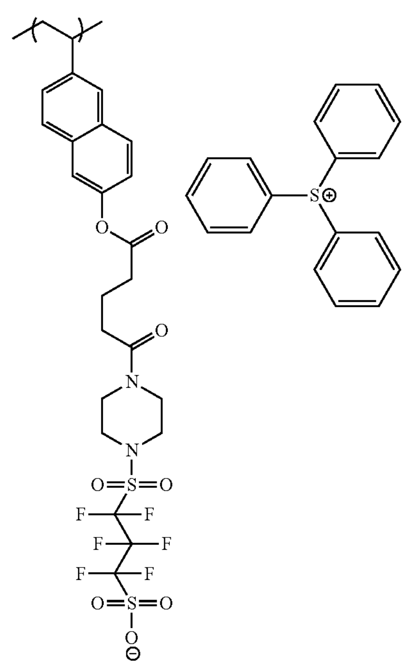

-continued
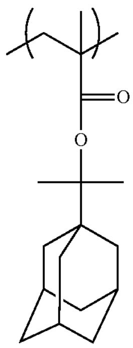
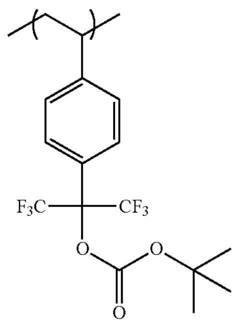
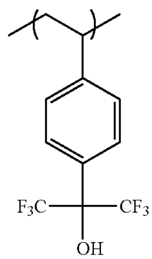
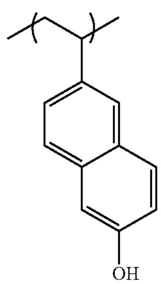
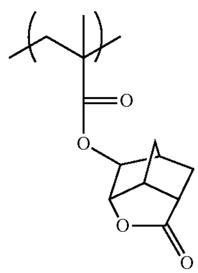
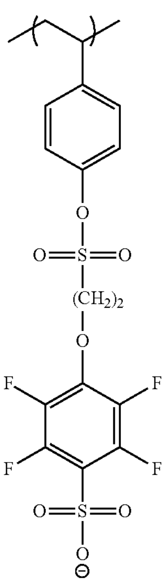
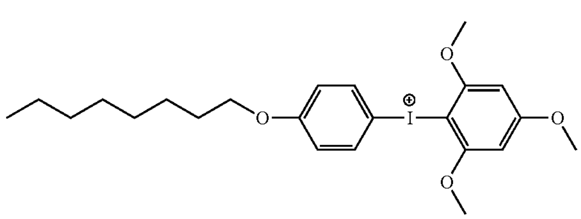
-continued
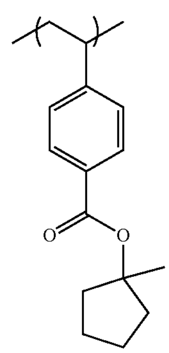
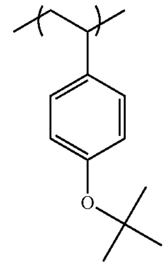
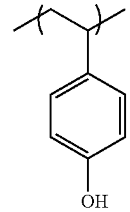
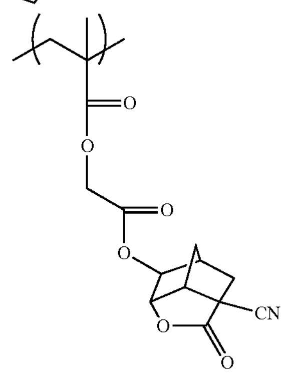
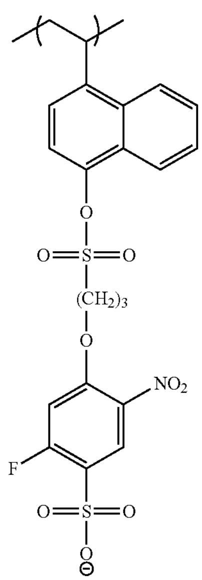
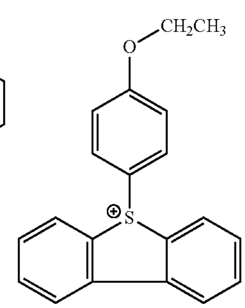
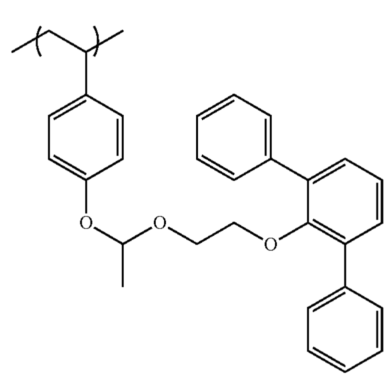

-continued
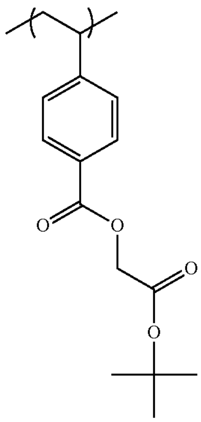
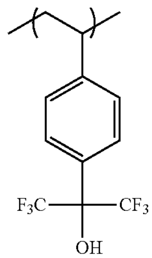
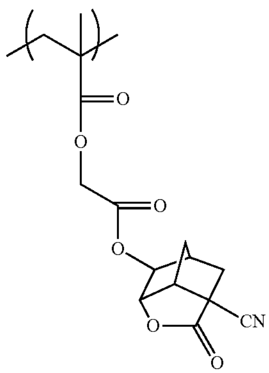
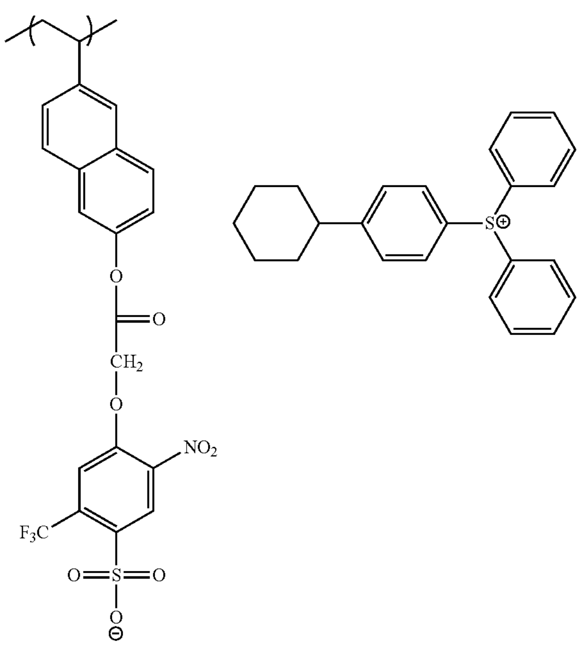
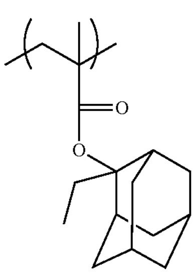
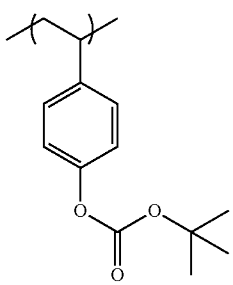
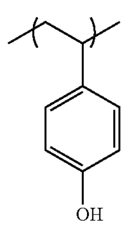
-continued
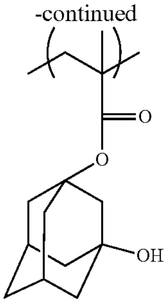
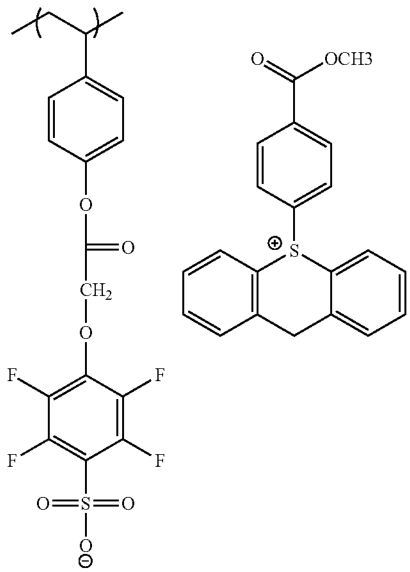
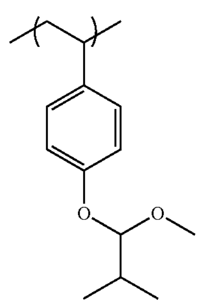
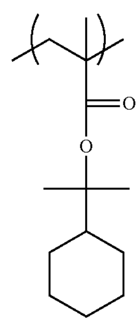
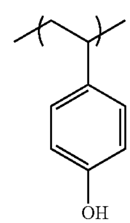
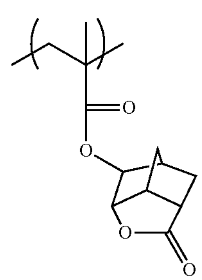

-continued
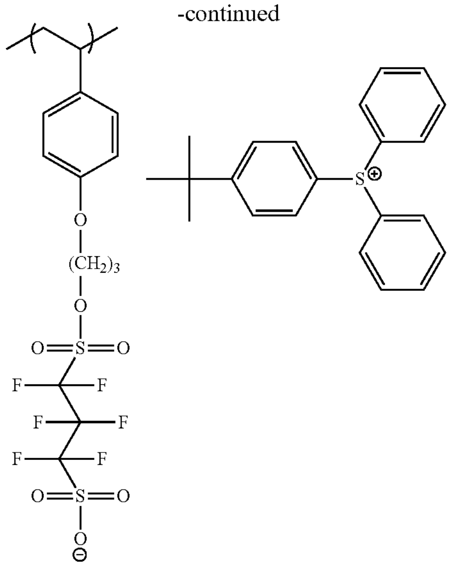
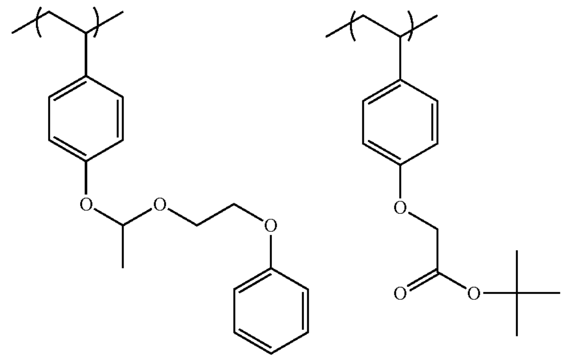
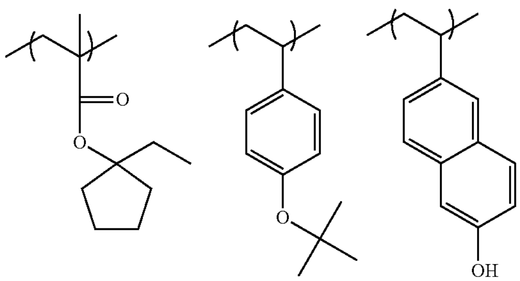
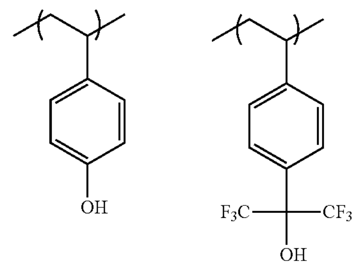
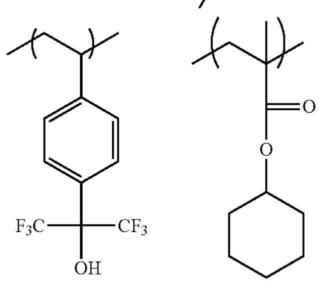
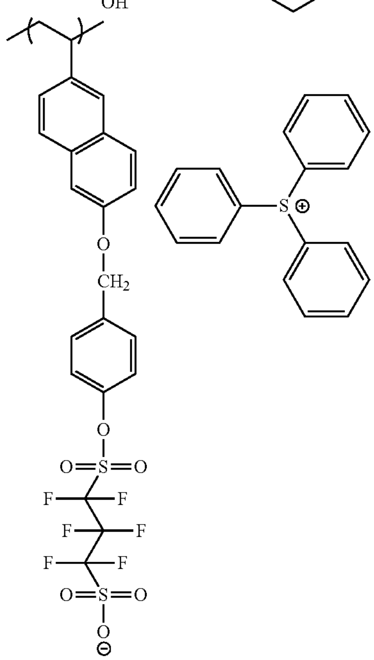
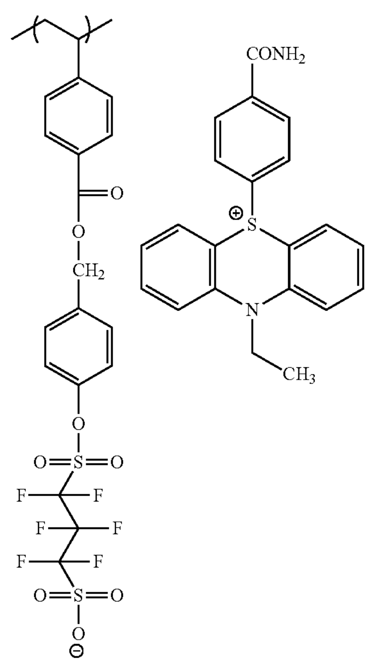

-continued
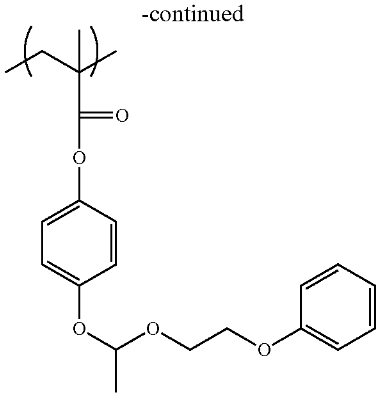
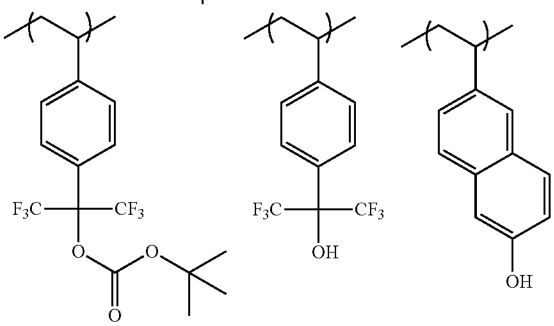
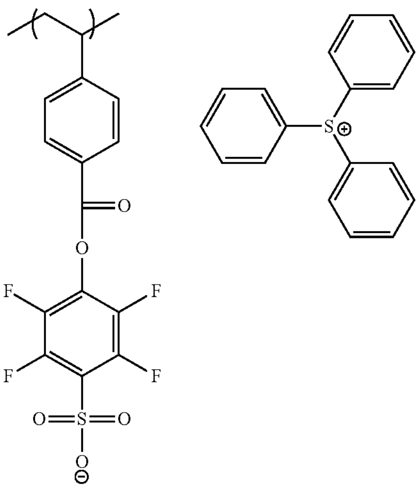
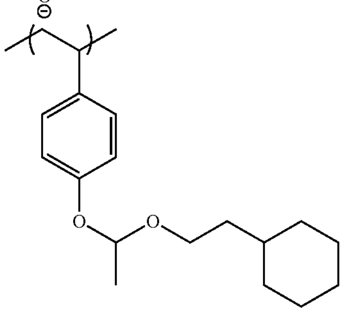
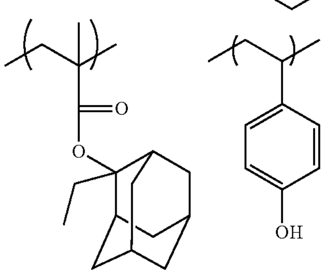
-continued
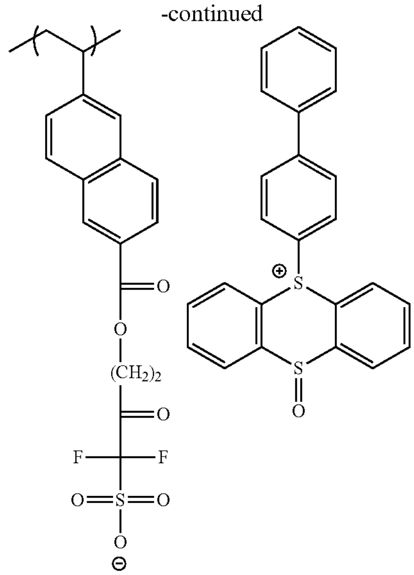
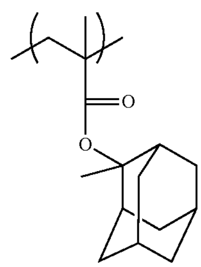
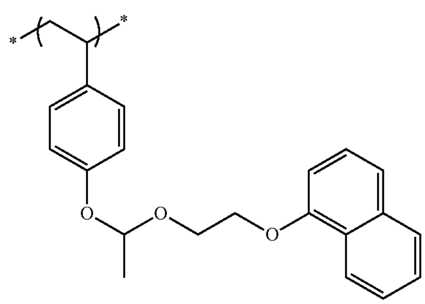
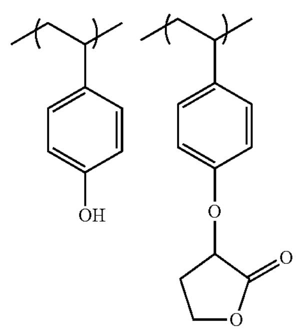

-continued
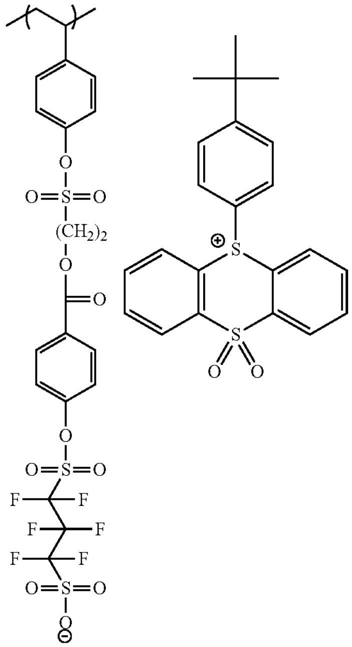
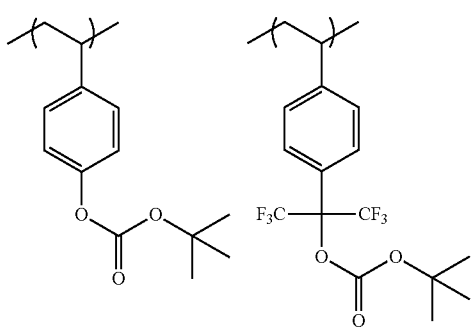
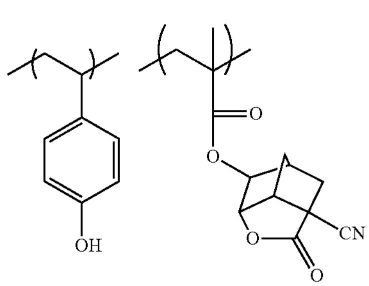
-continued
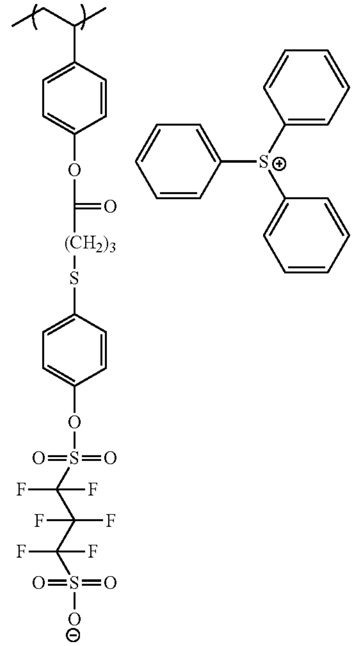
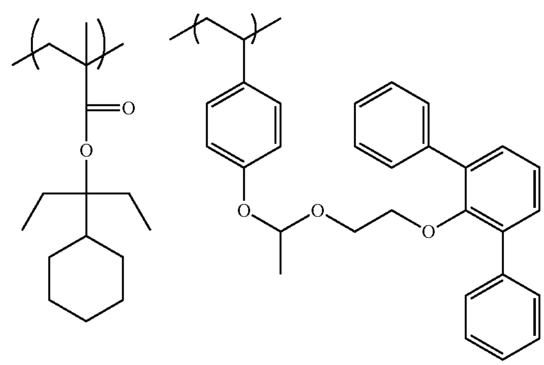
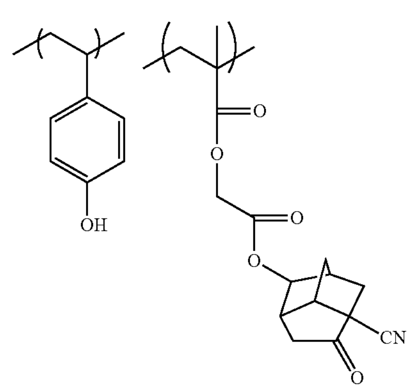

-continued
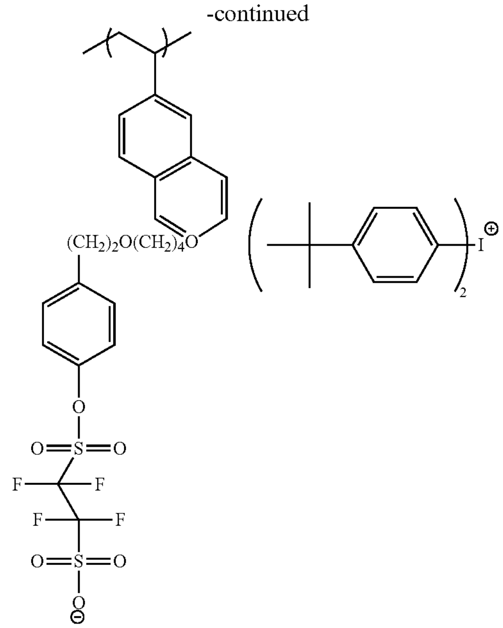
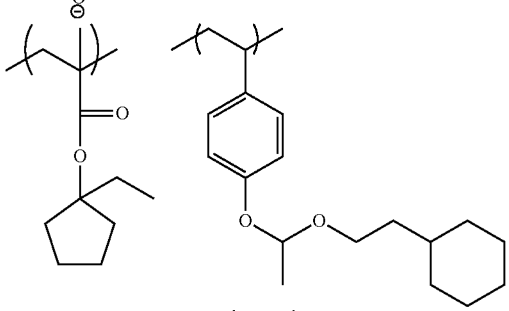
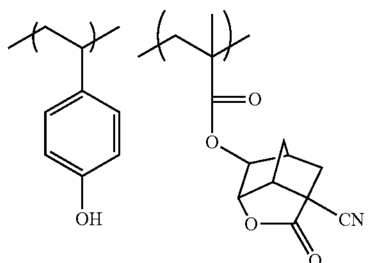
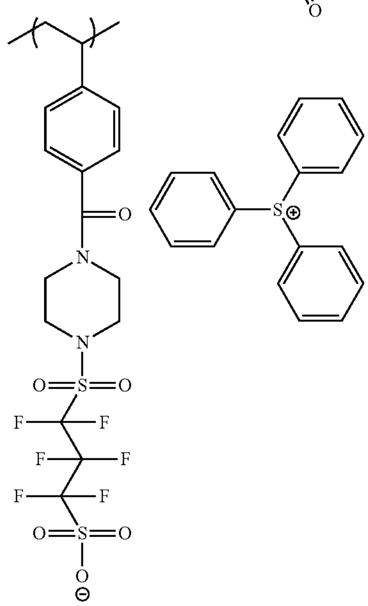
-continued
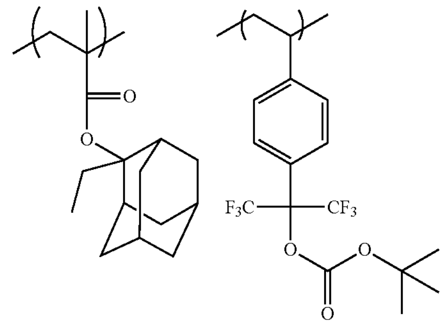
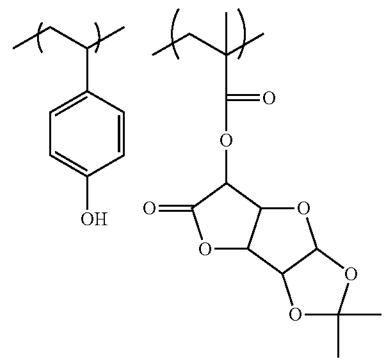
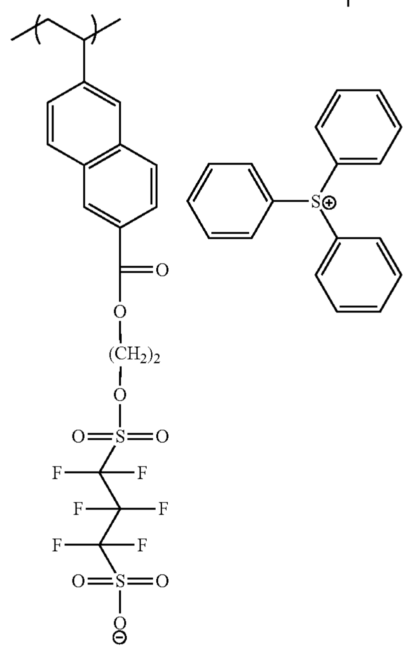
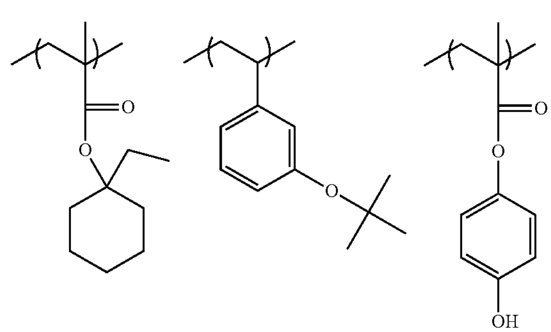

-continued
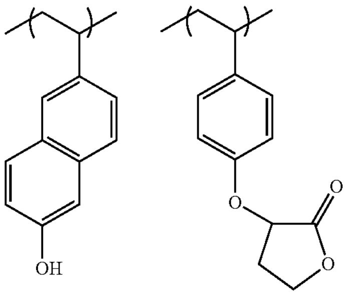
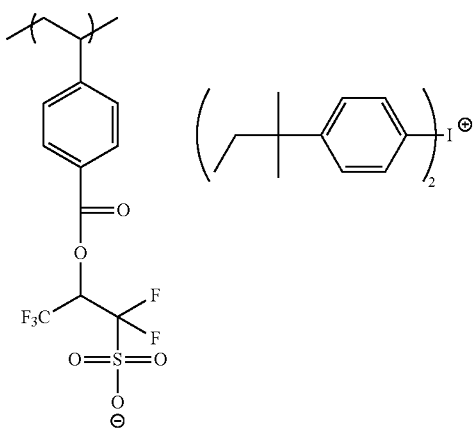
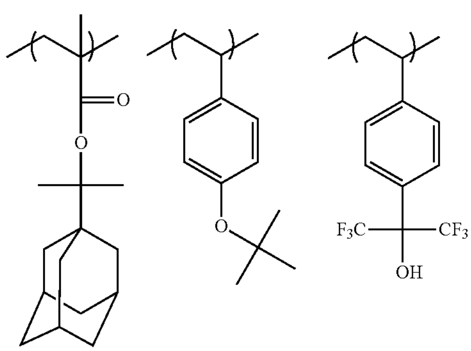
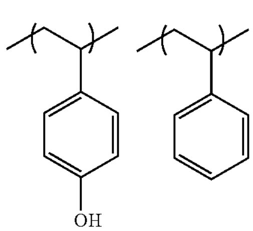
-continued
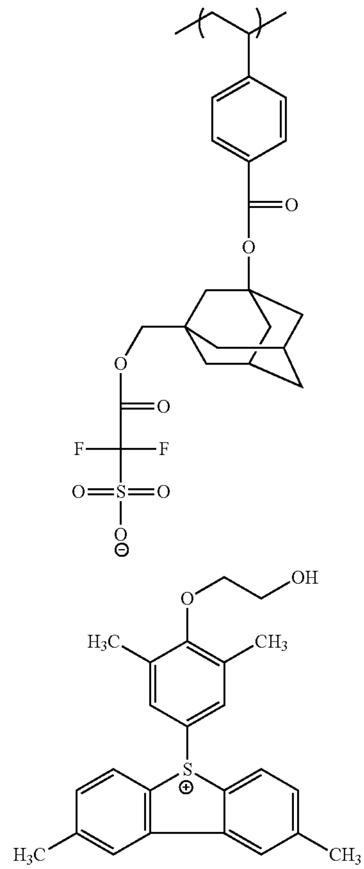
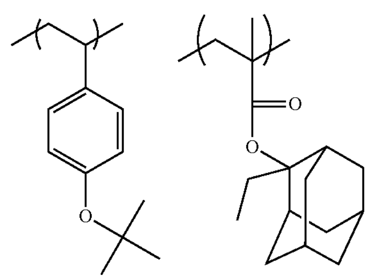
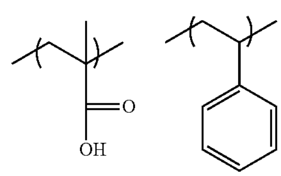
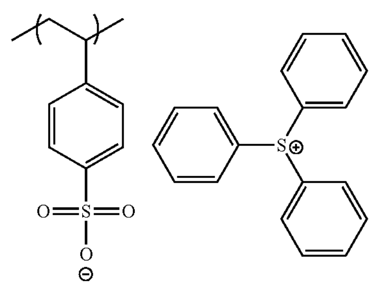

-continued
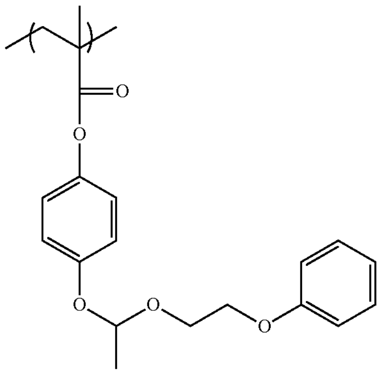
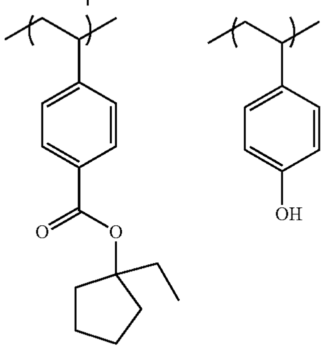
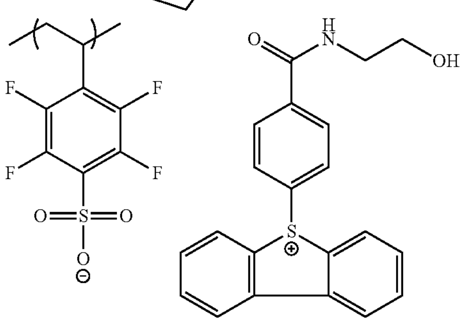
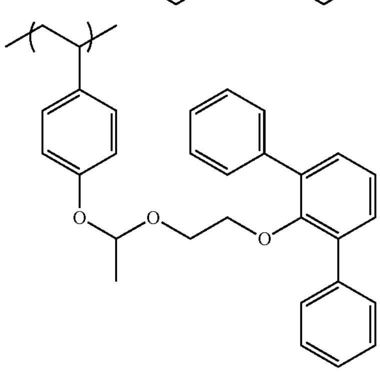
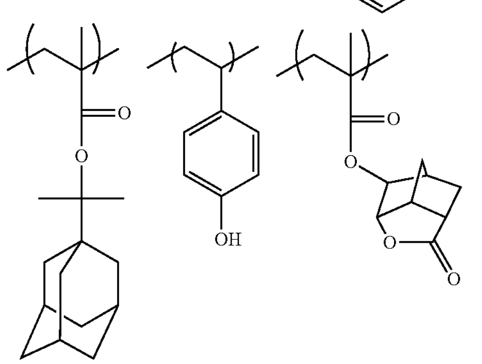
-continued
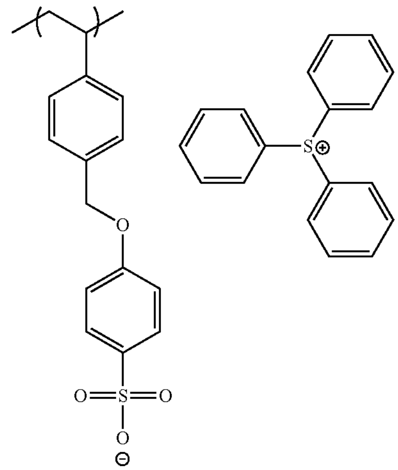
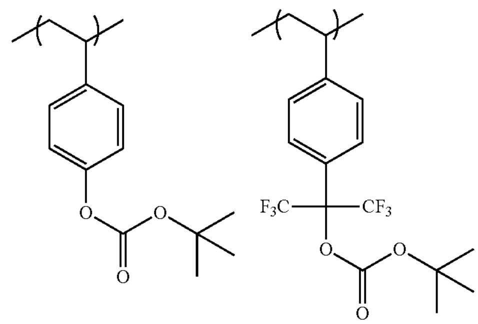
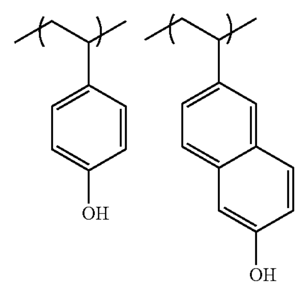
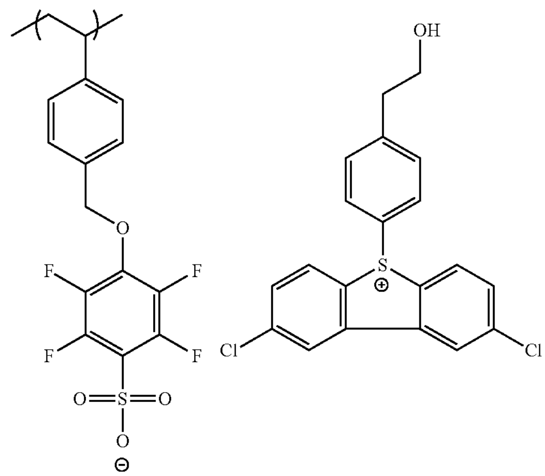

-continued
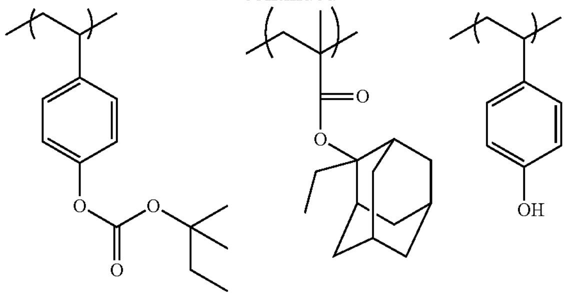
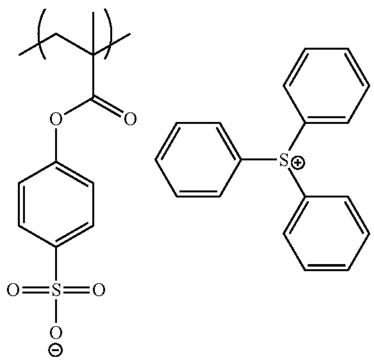
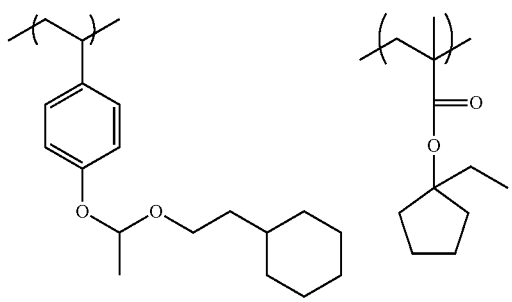
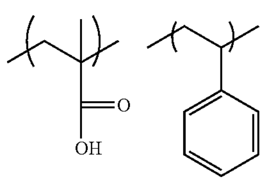
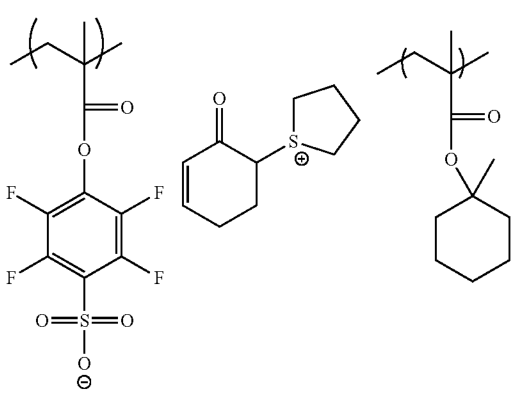
-continued
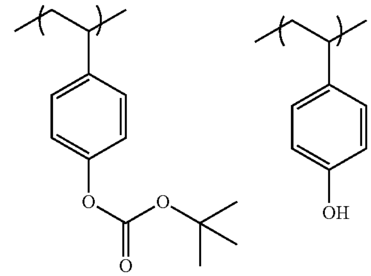
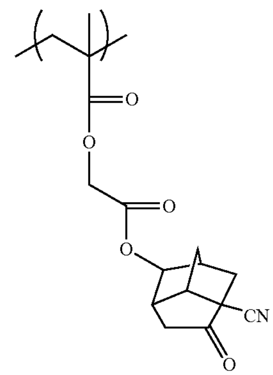
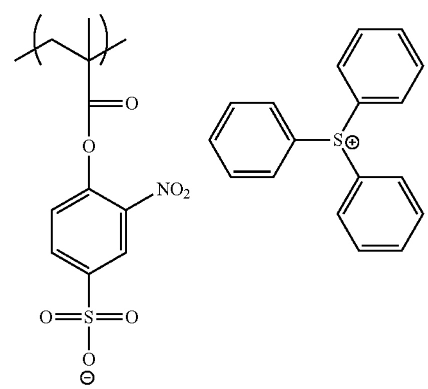
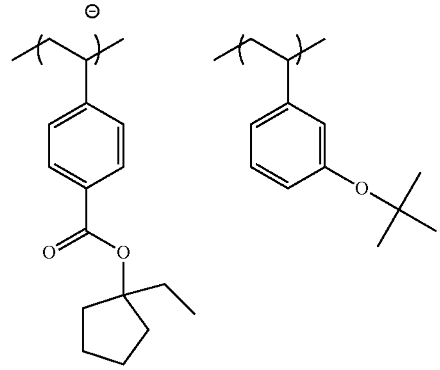
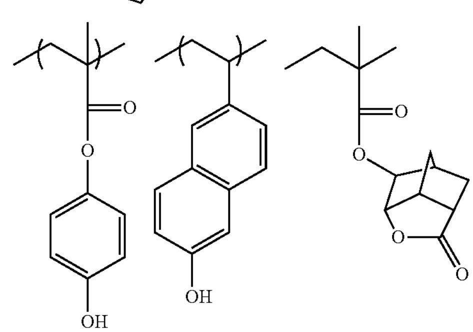

-continued
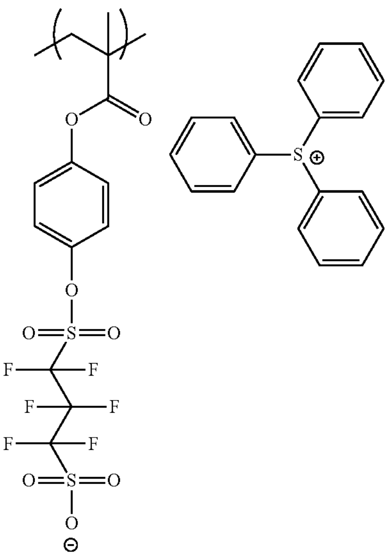
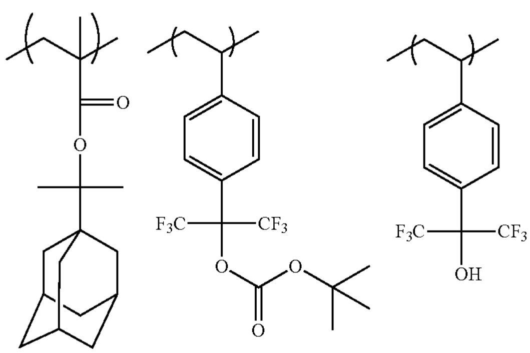
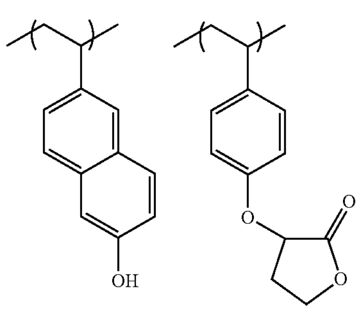
-continued
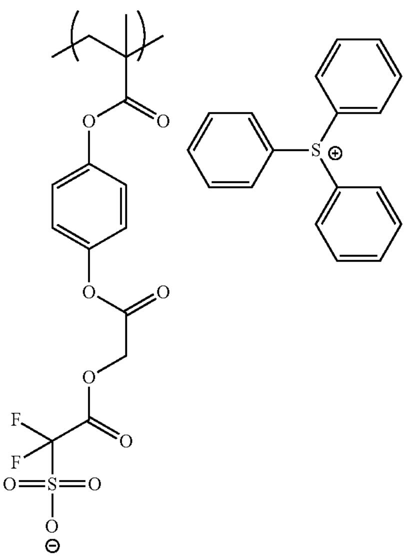
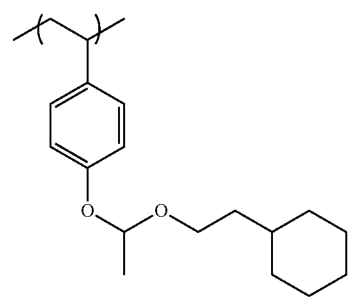
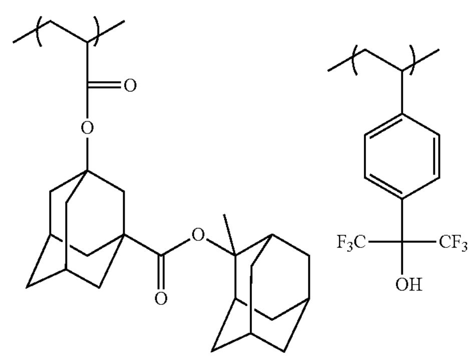
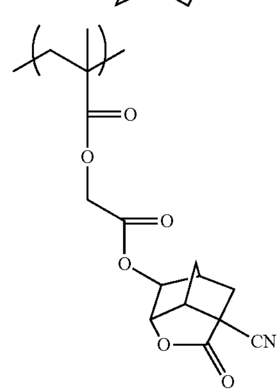

-continued
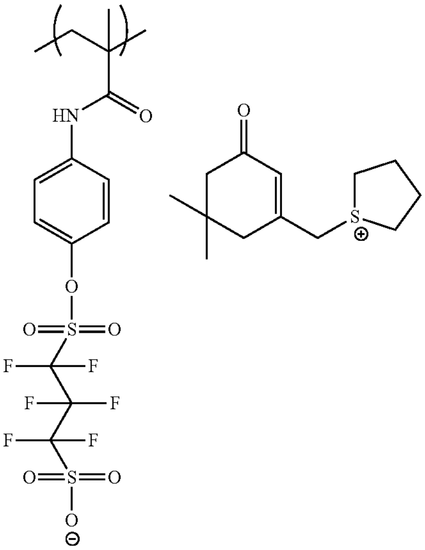
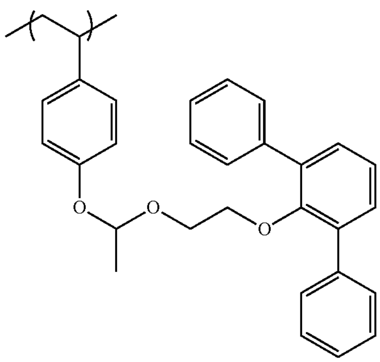
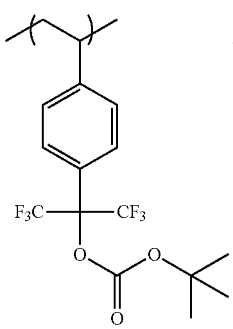
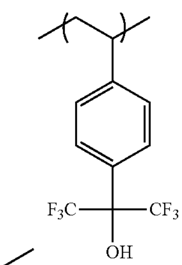
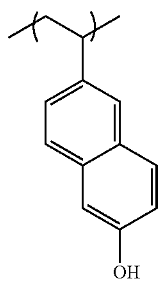
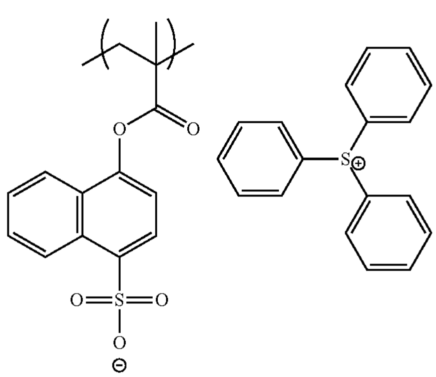
-continued
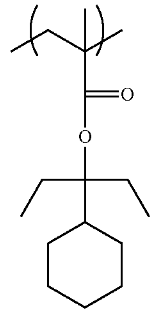
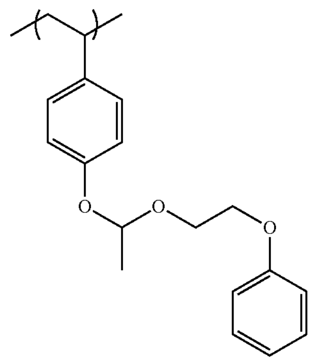
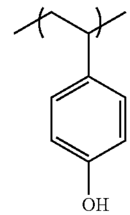
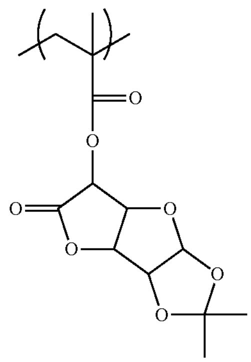
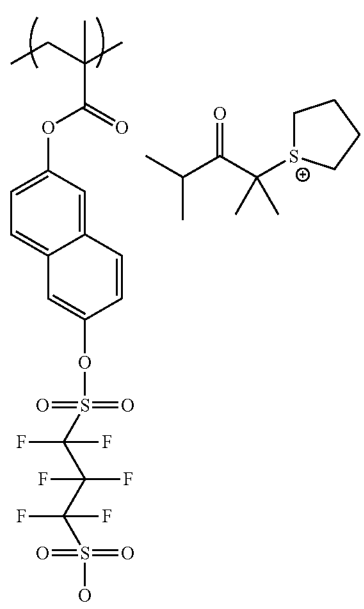

-continued
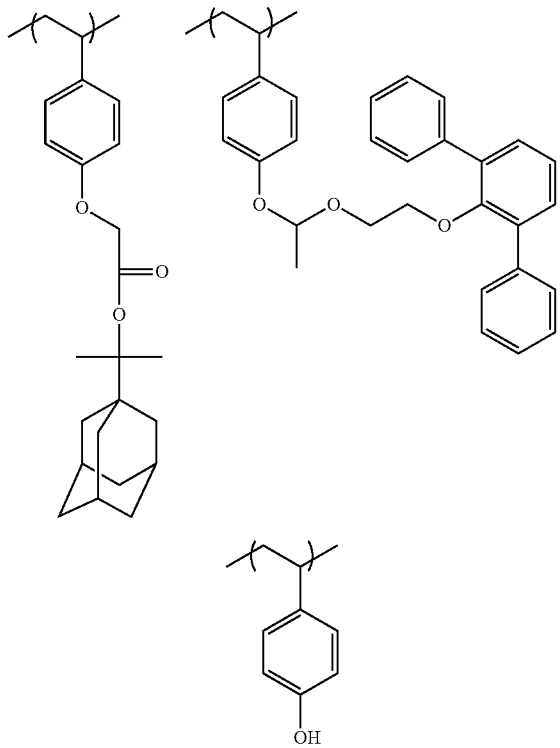
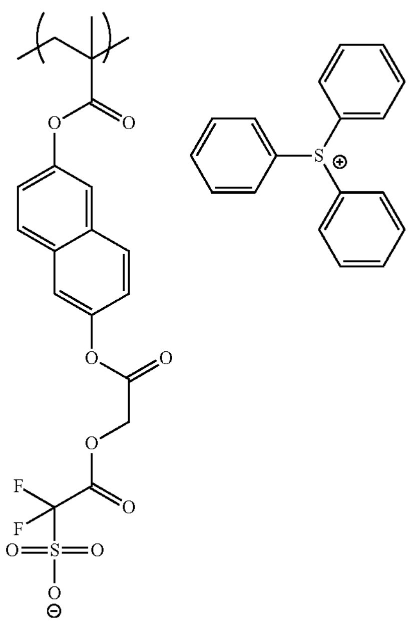
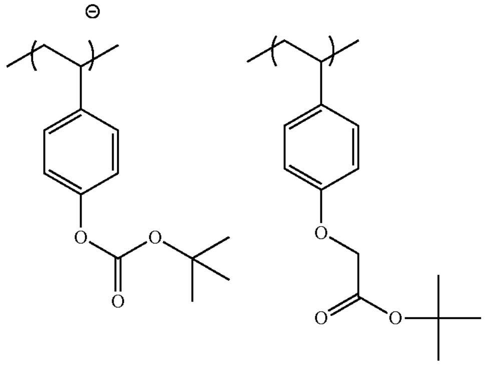
-continued
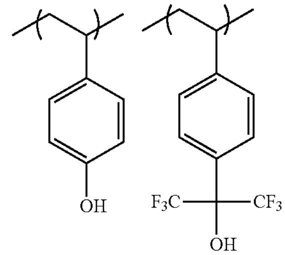
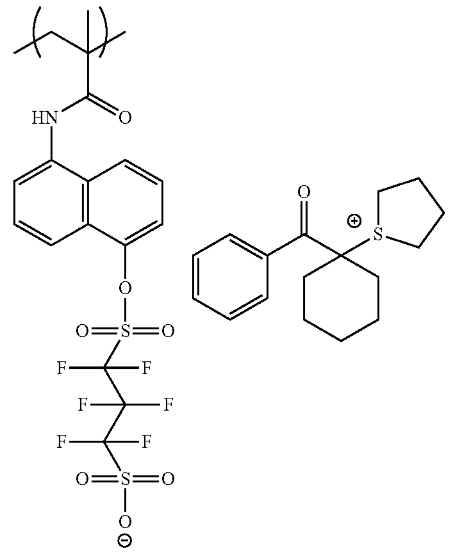
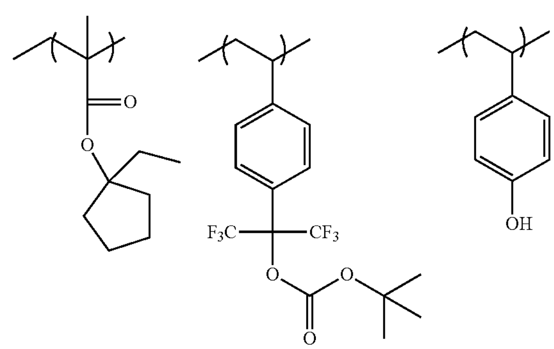
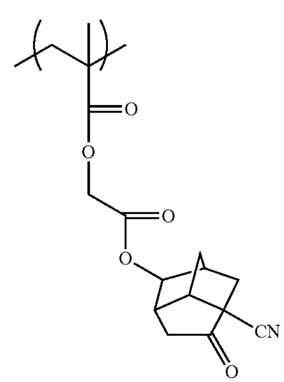

-continued
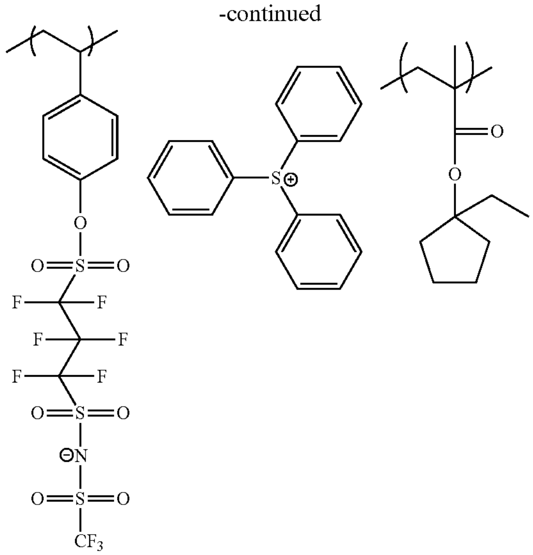
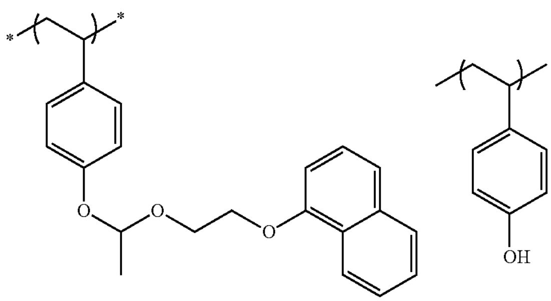
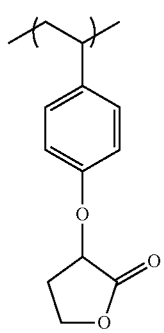
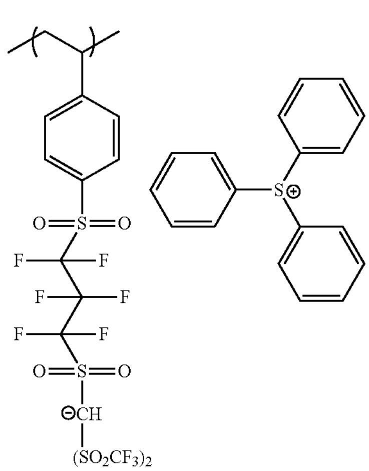
-continued
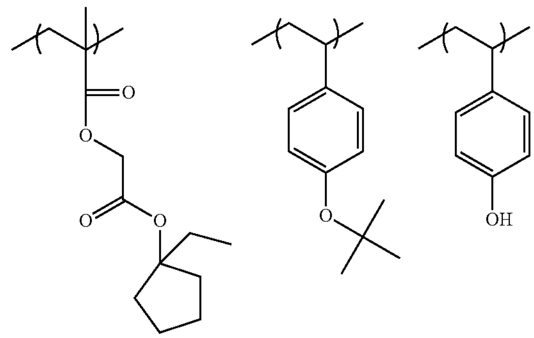
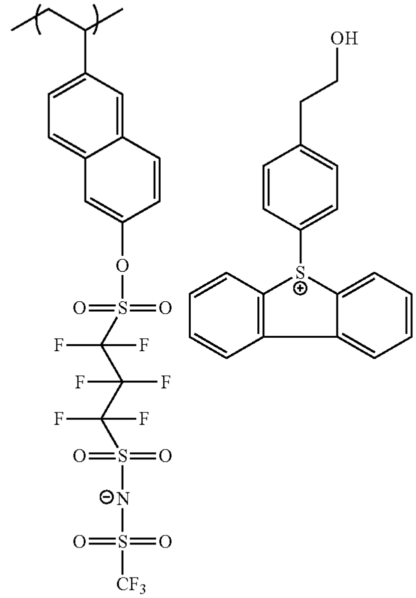
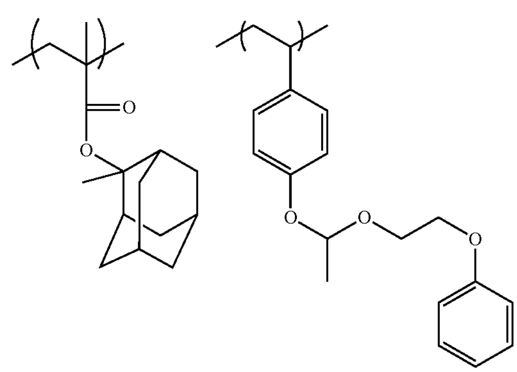
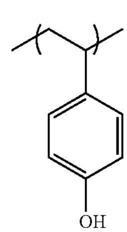

-continued
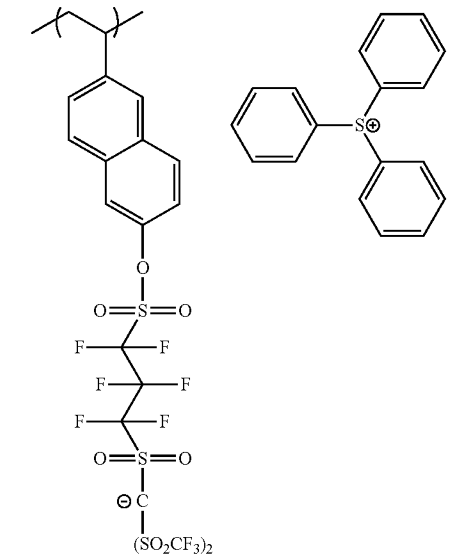
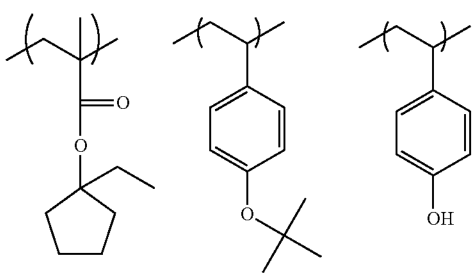
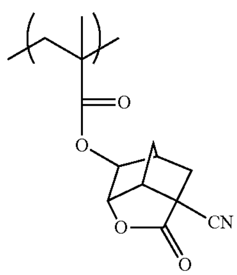
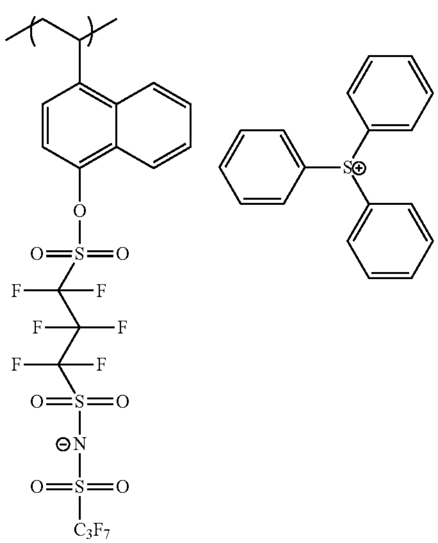
-continued
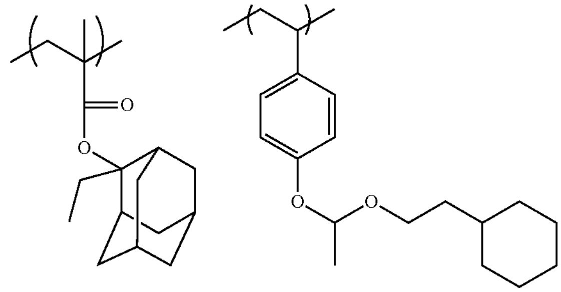
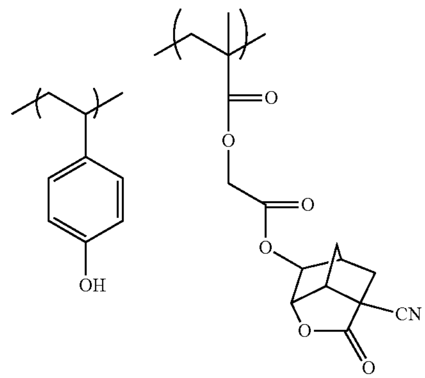
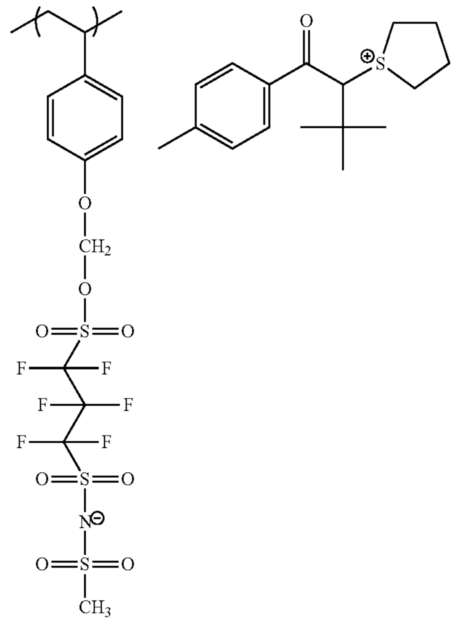
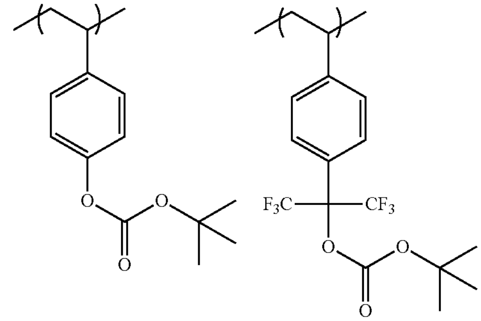

-continued
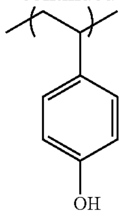
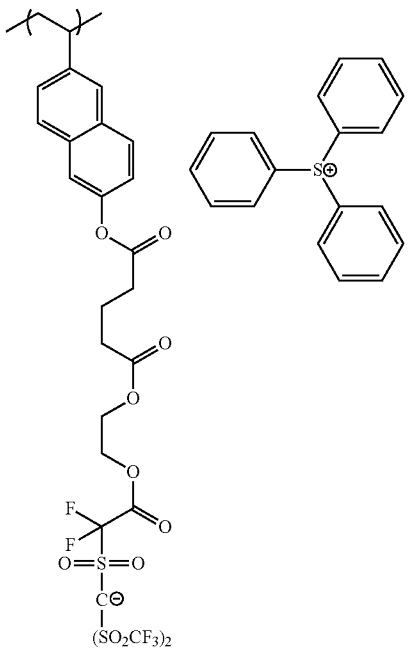
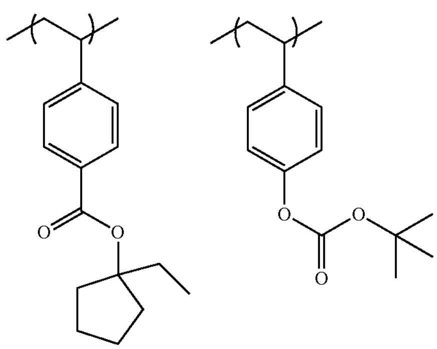
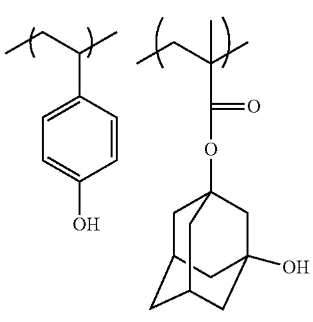
-continued
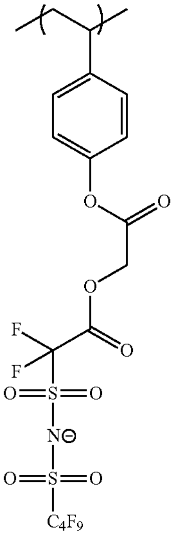
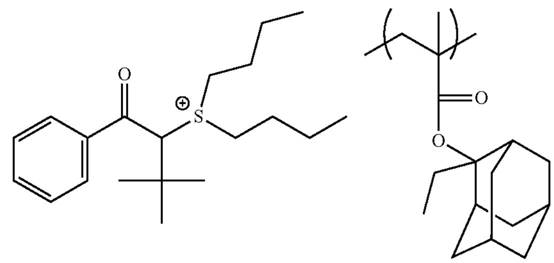
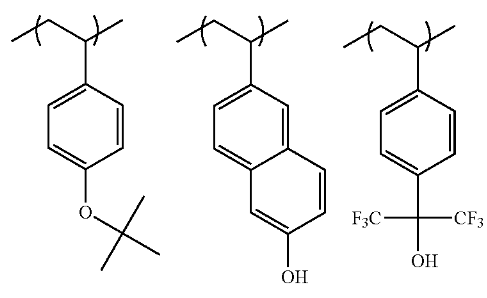
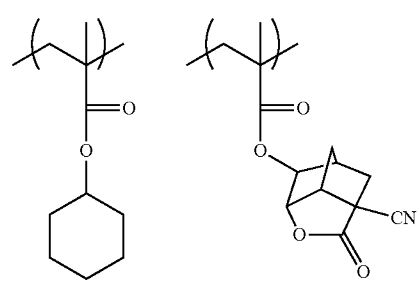

-continued
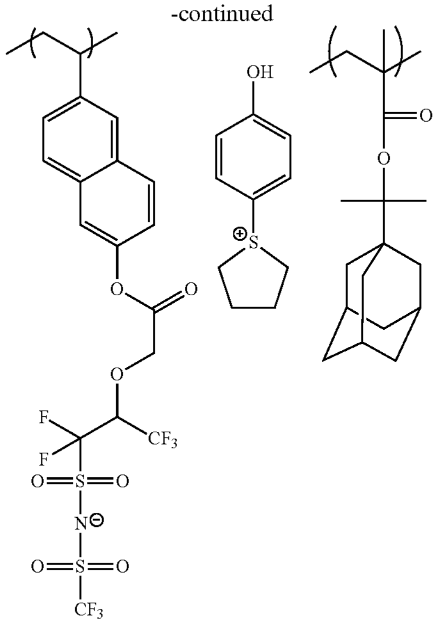
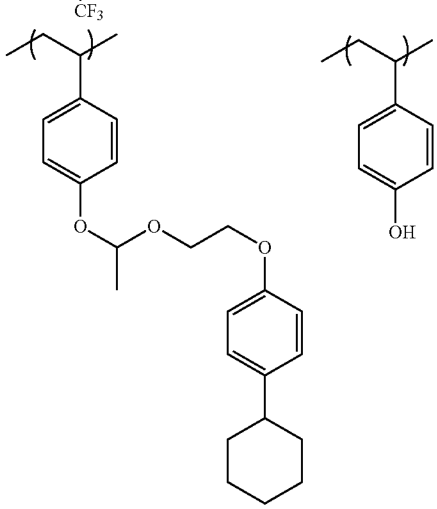
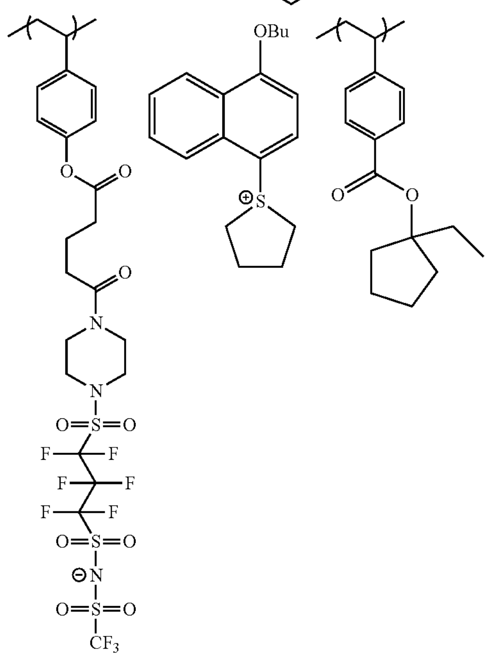
-continued
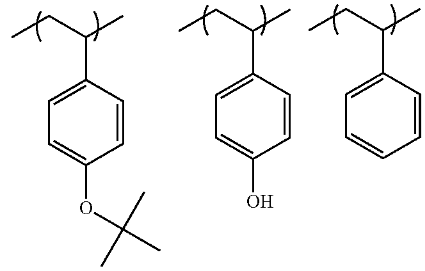
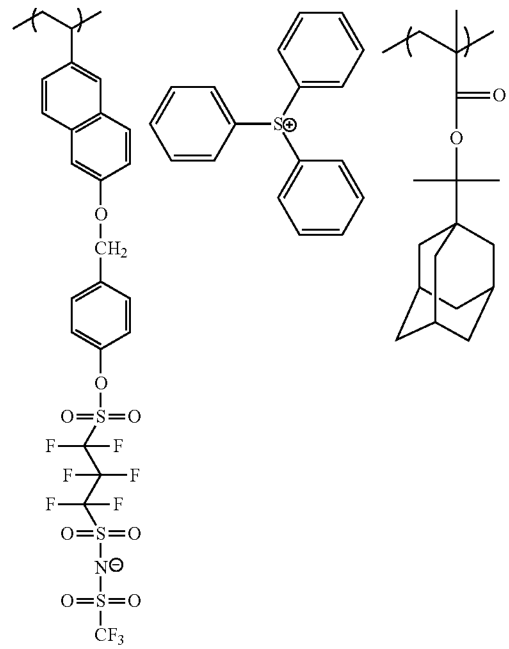
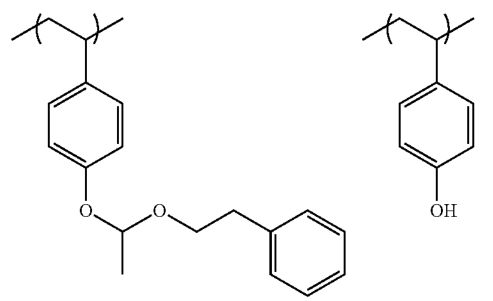
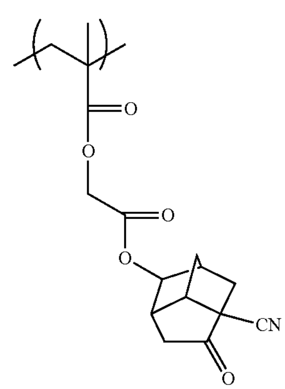

-continued
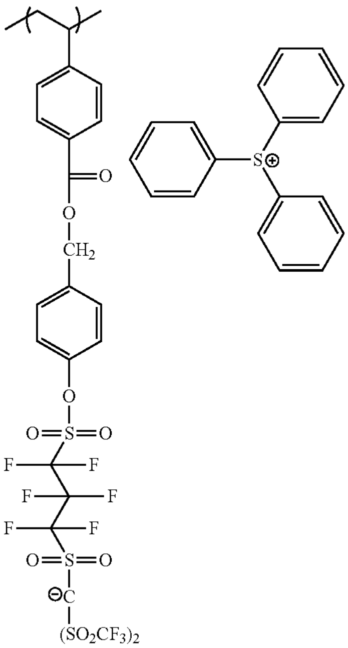
-continued
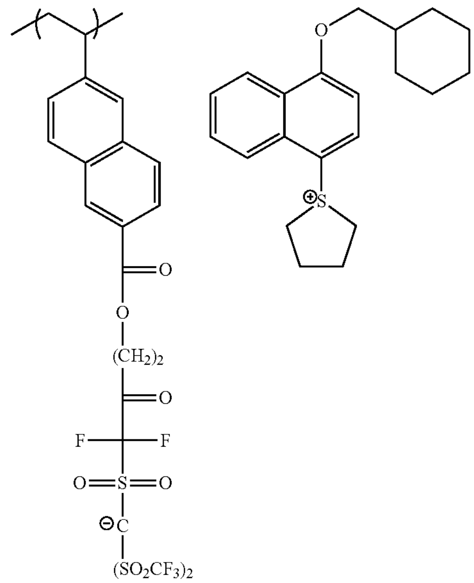
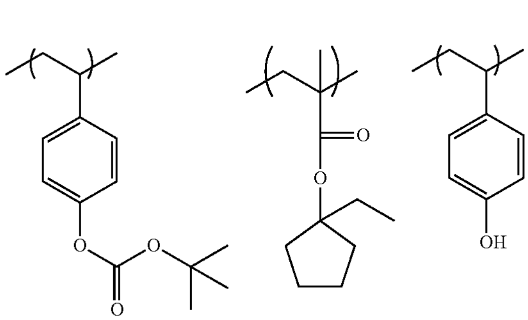
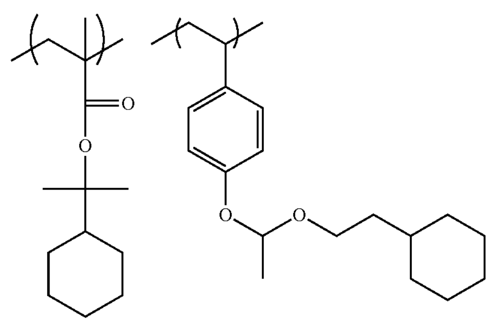
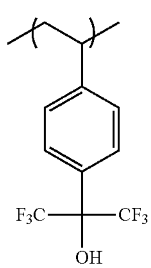
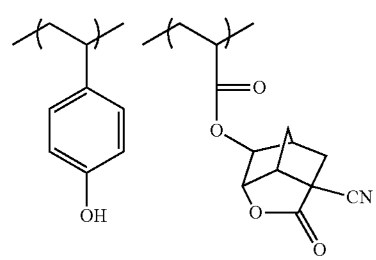

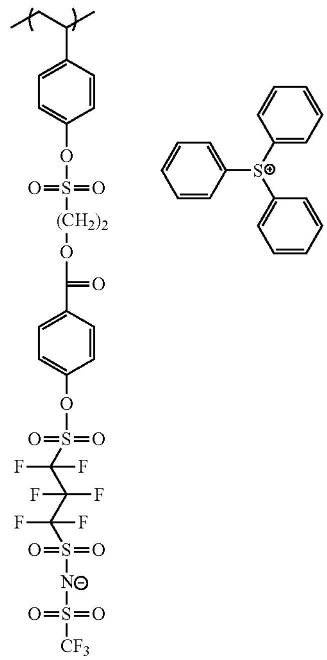
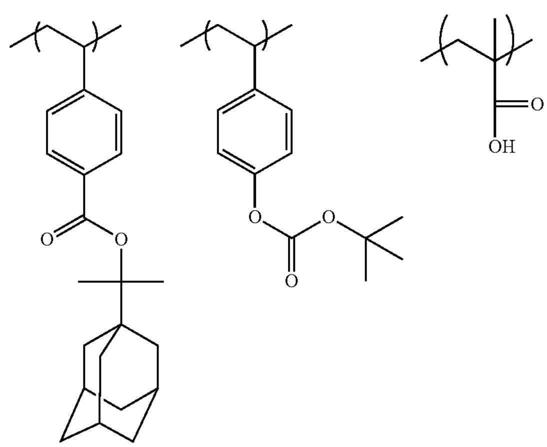
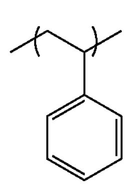
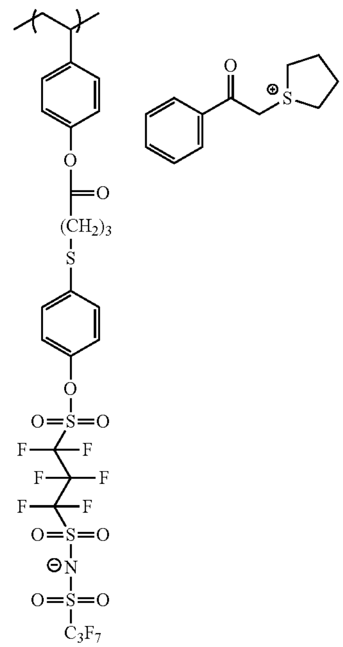
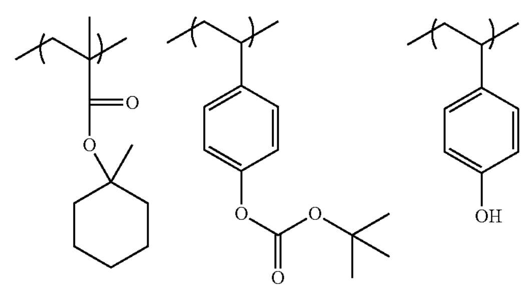
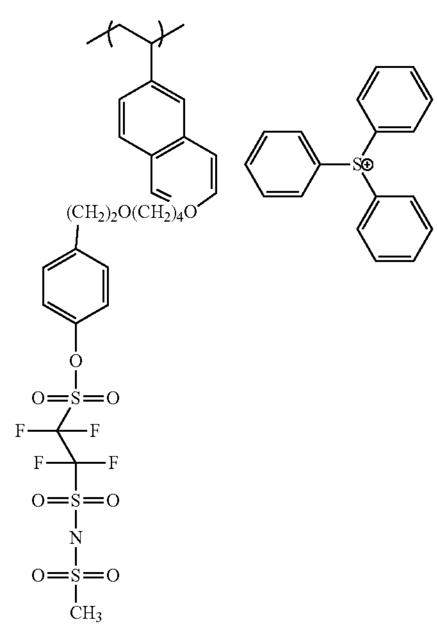

-continued
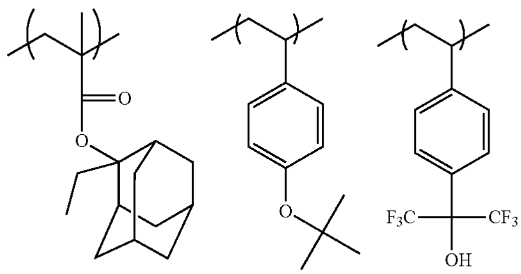
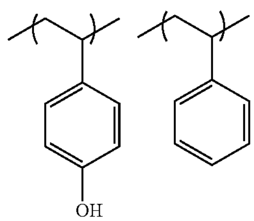
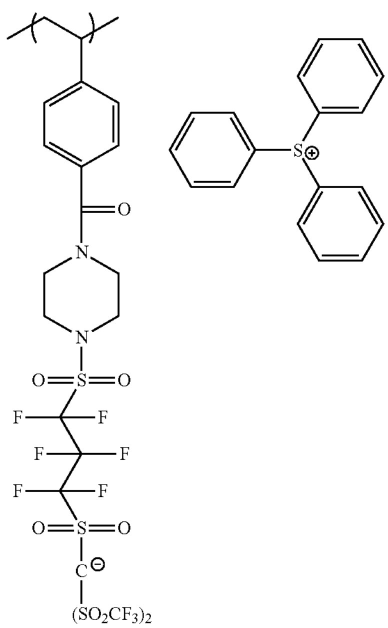
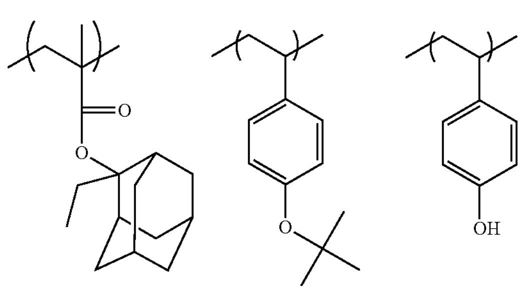
-continued
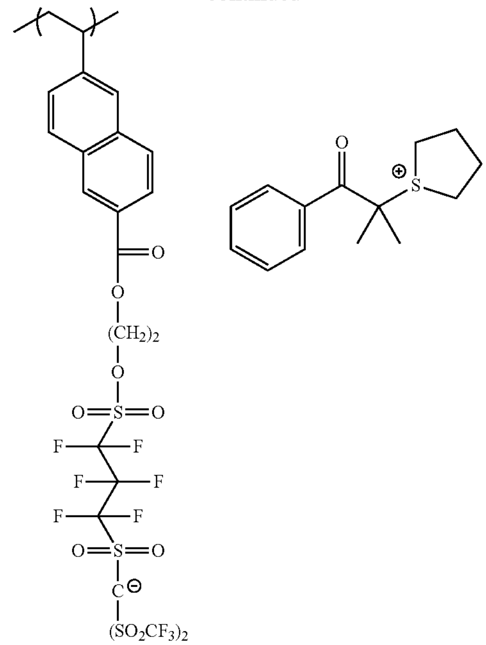
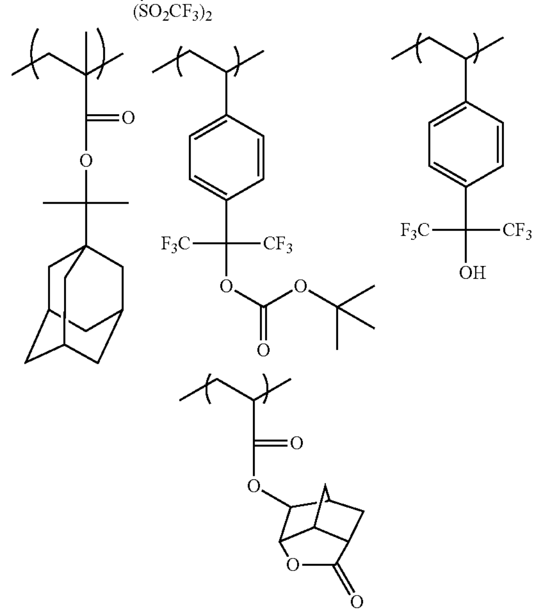
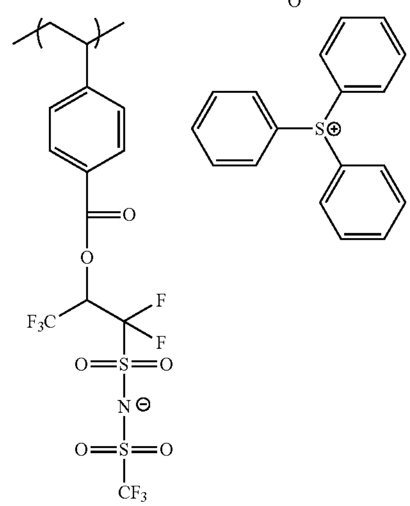

-continued
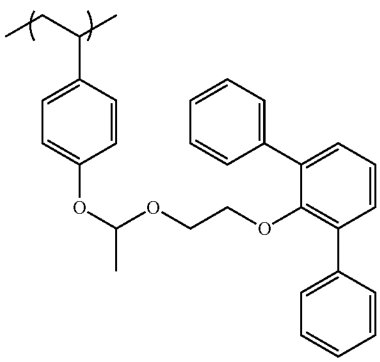
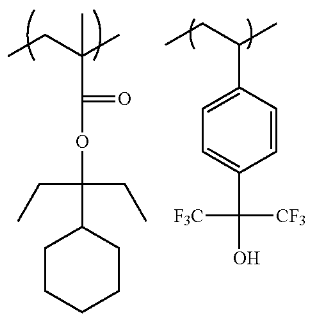
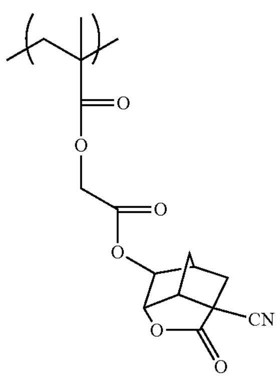
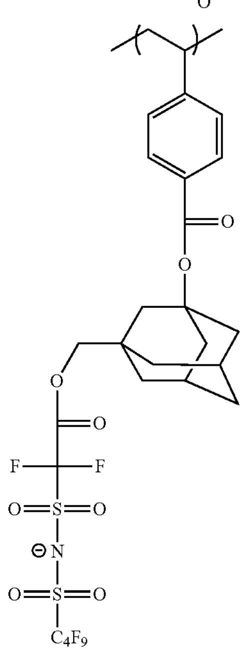
-continued
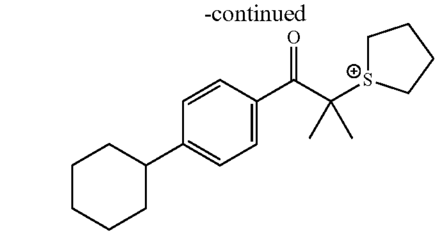
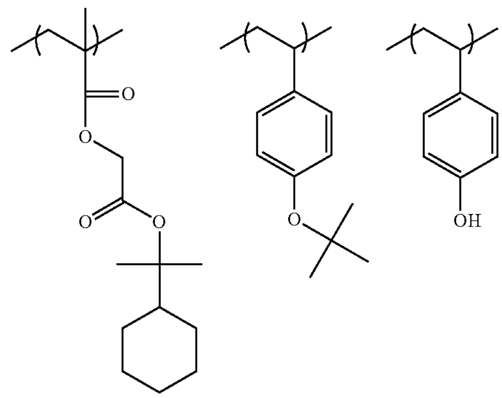
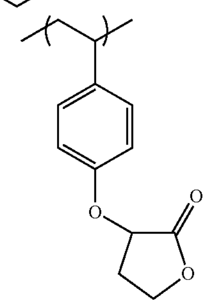
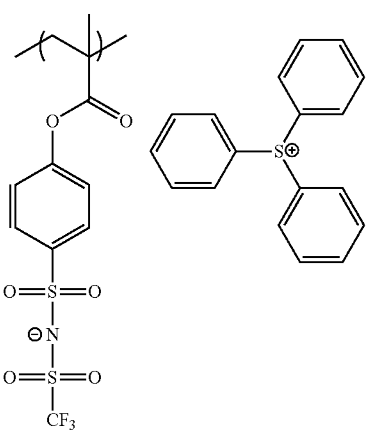
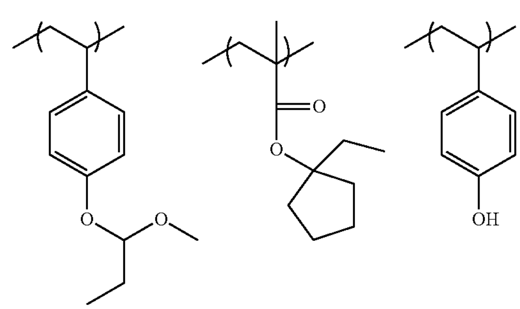

-continued
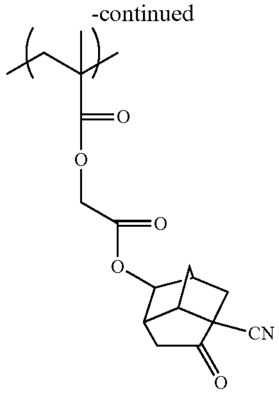
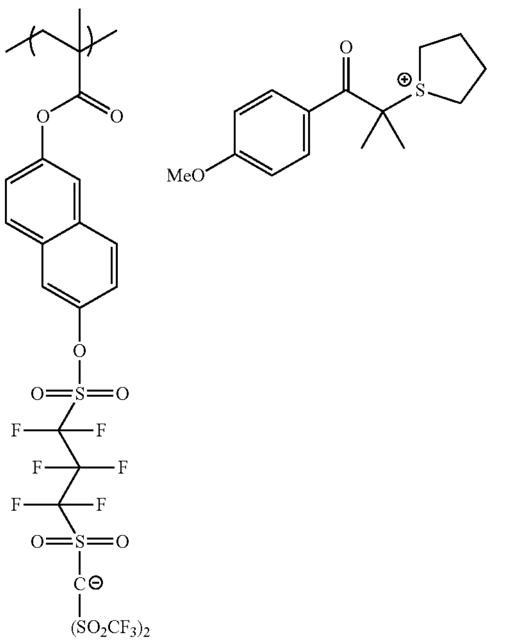
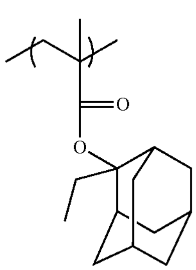
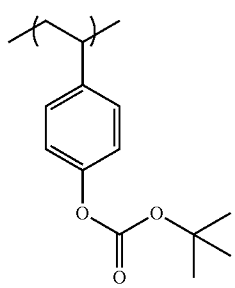
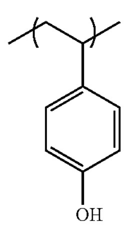
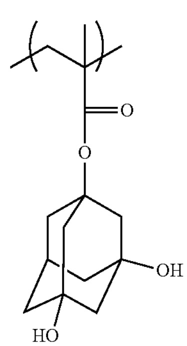
-continued
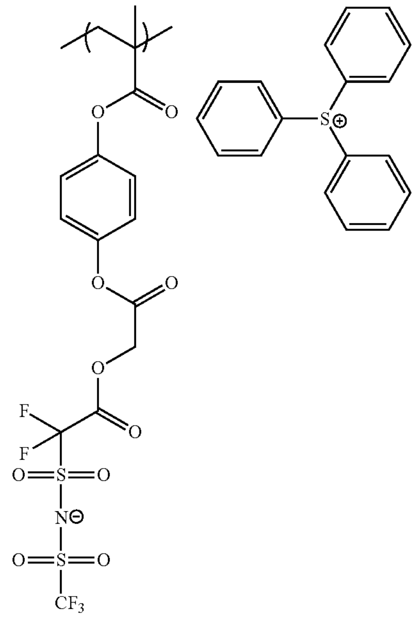
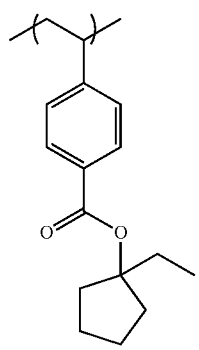
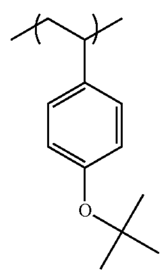
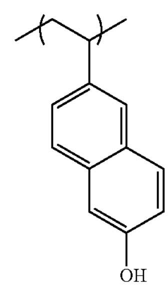
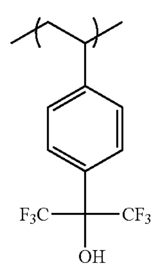
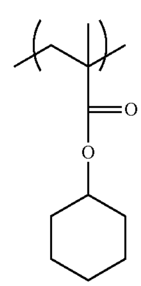

-continued
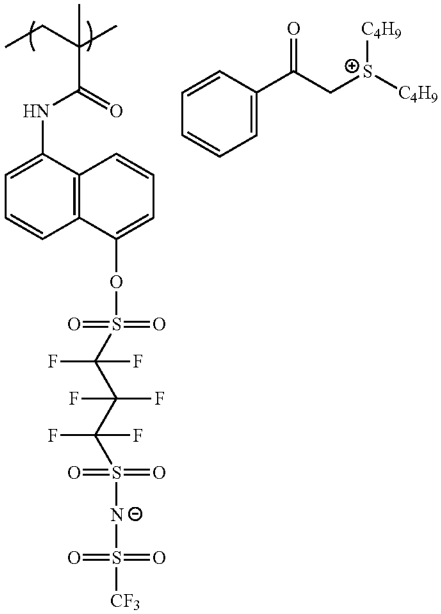
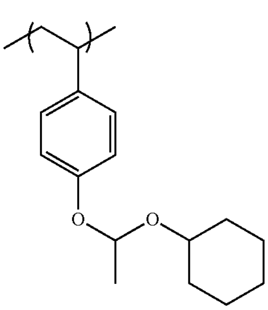
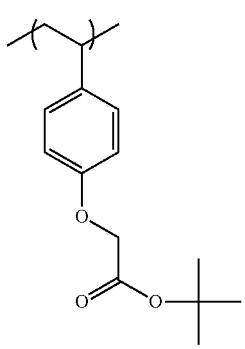
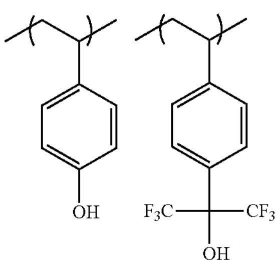
-continued
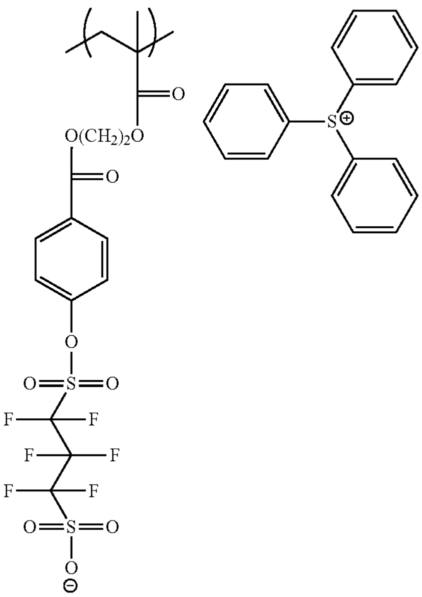
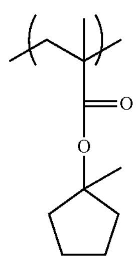
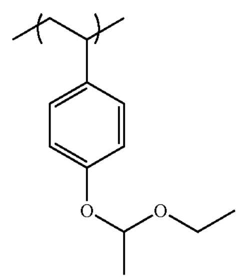
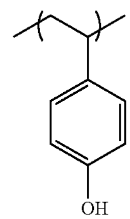
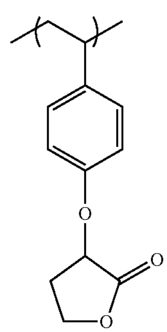

-continued
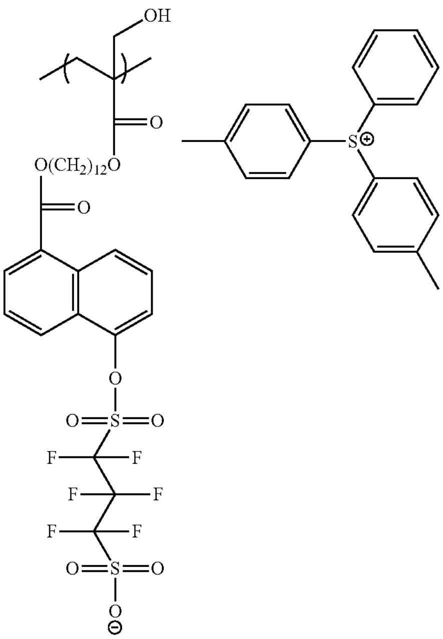
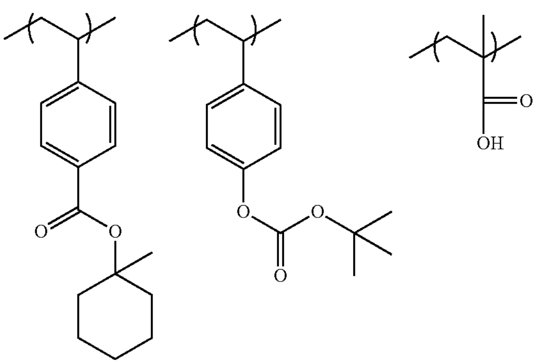
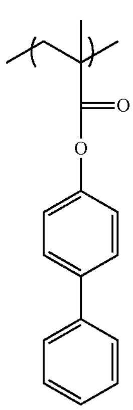
-continued
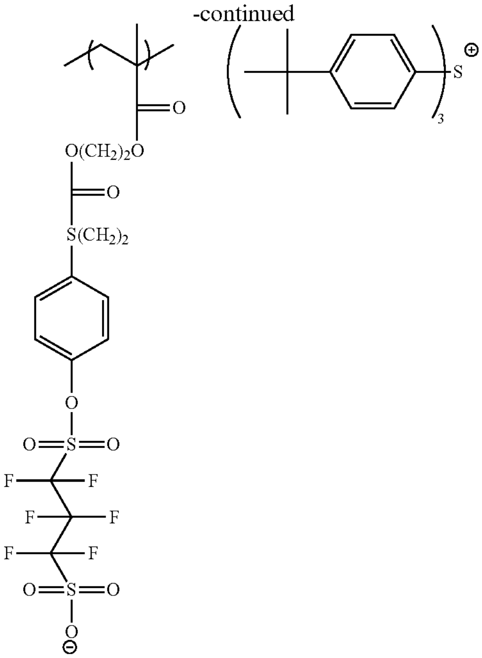
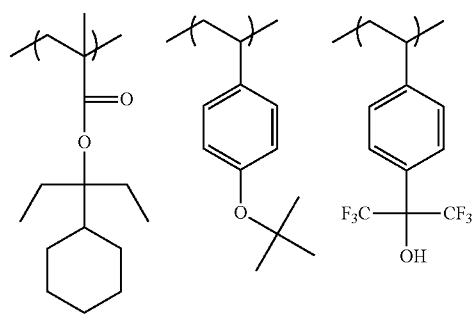
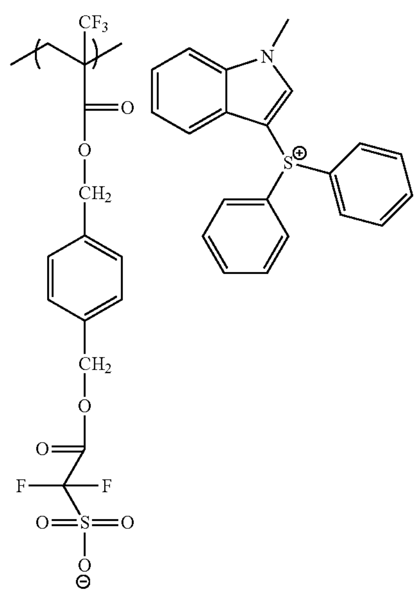

-continued
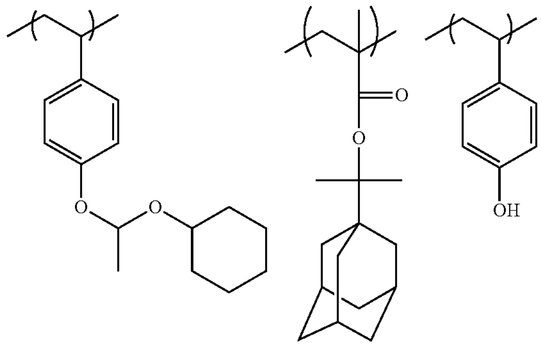
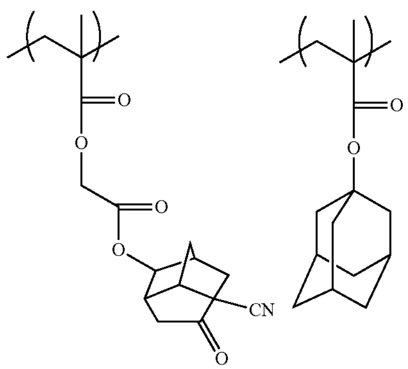
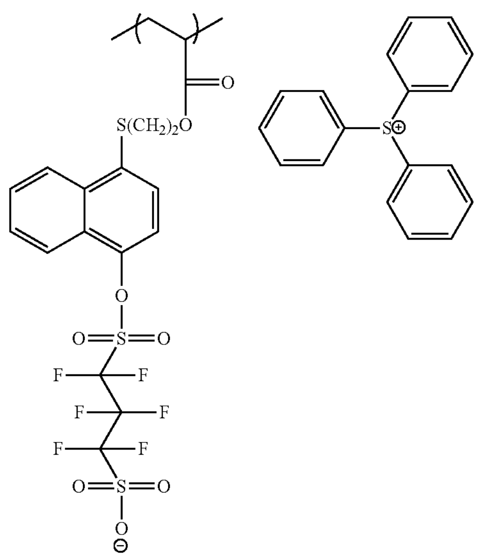
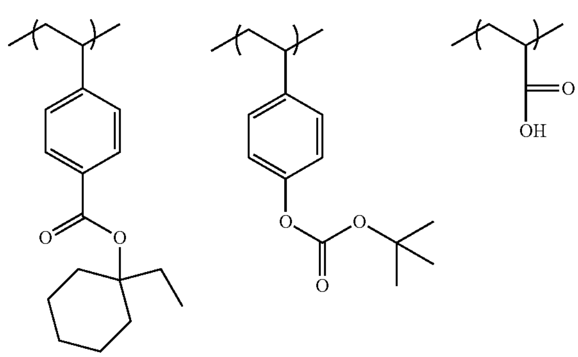
-continued
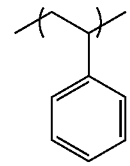
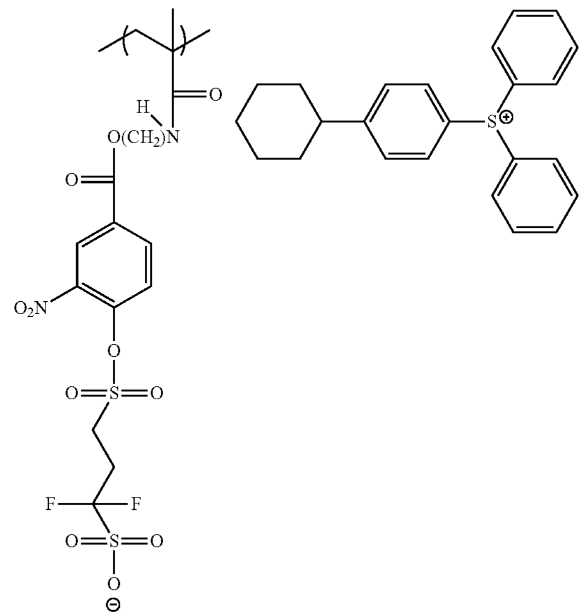
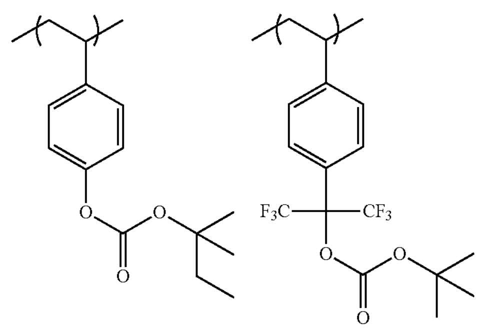
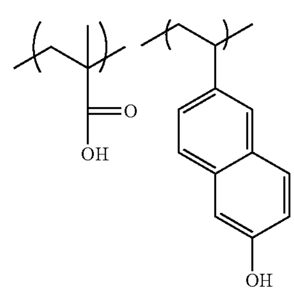

-continued
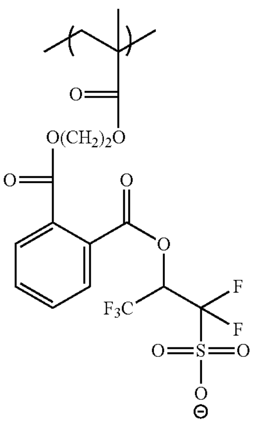
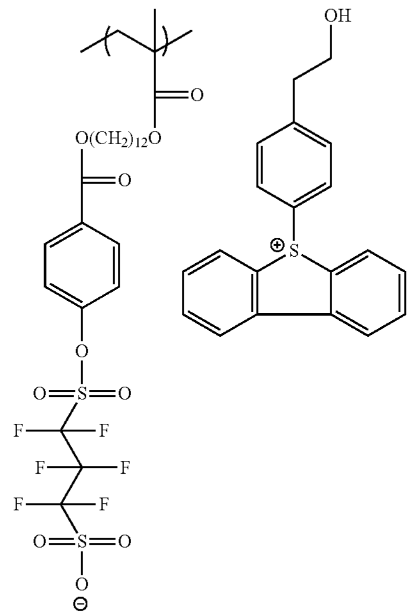
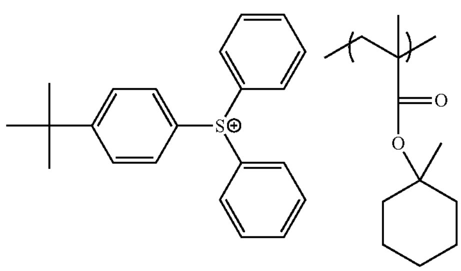
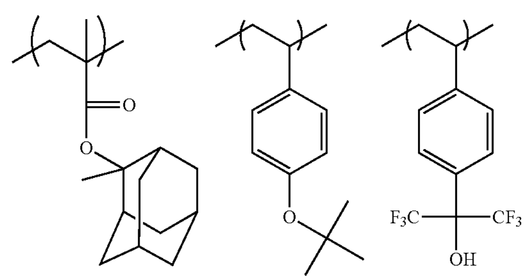
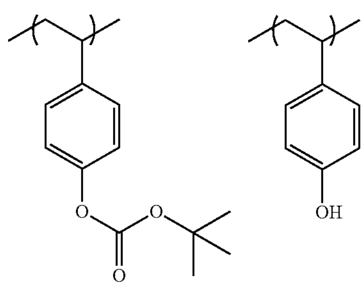
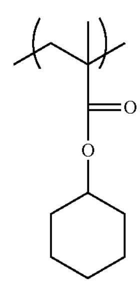
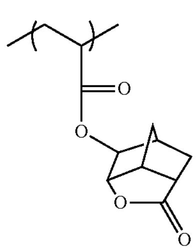
-continued -continued
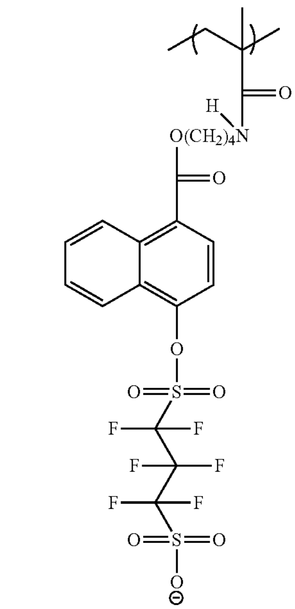
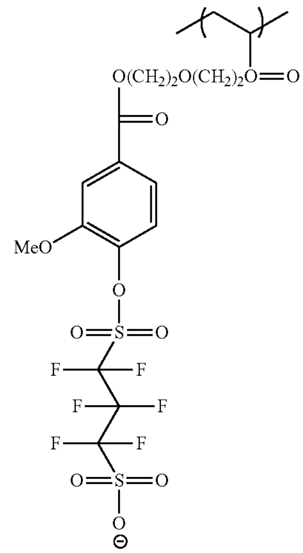
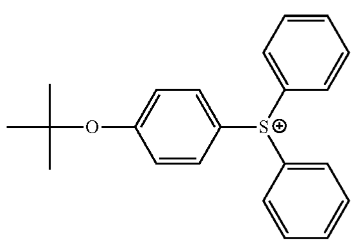
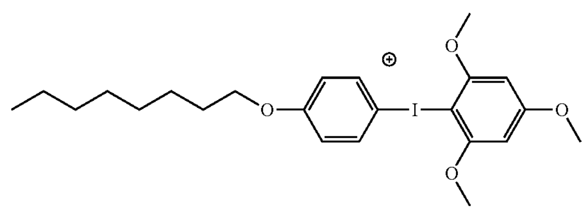
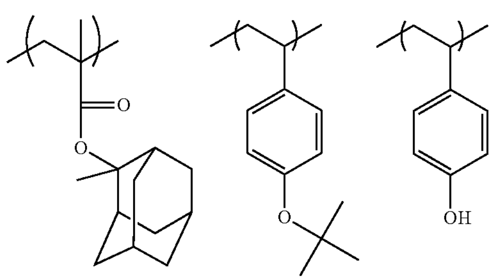
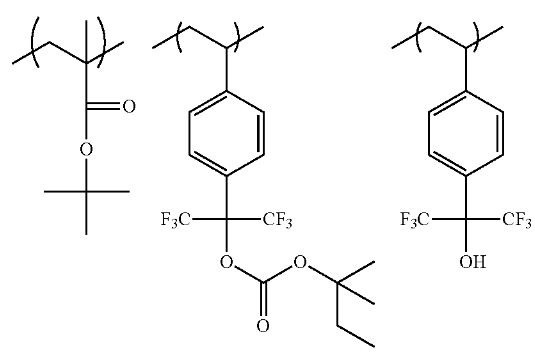
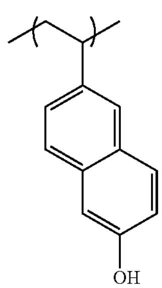
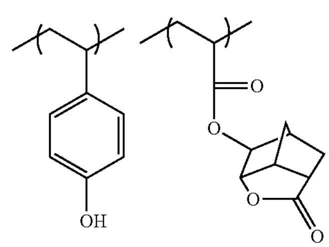

-continued
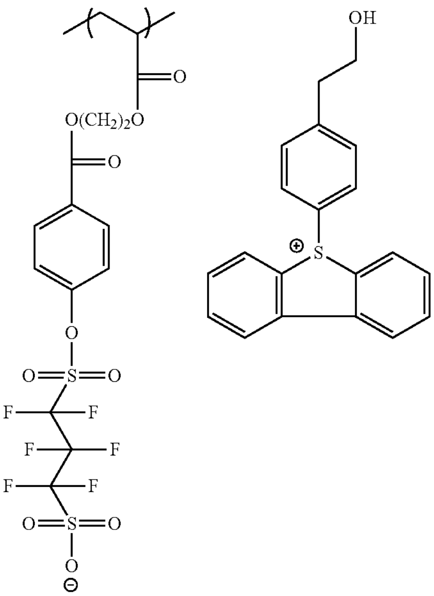
-continued
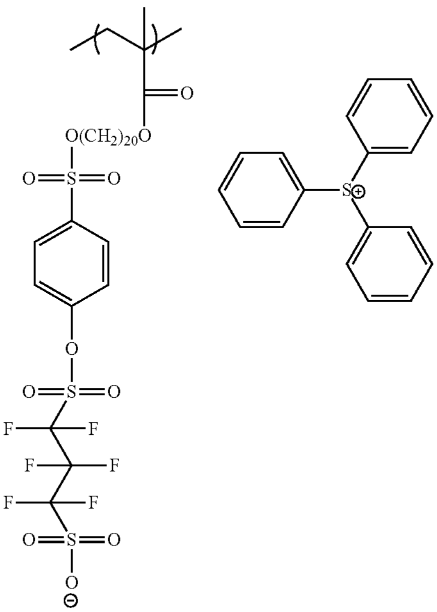
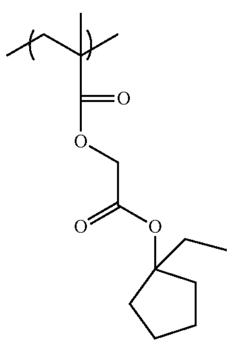
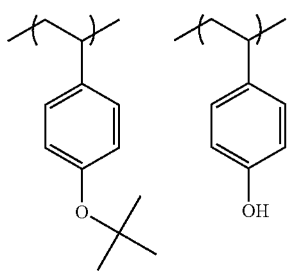
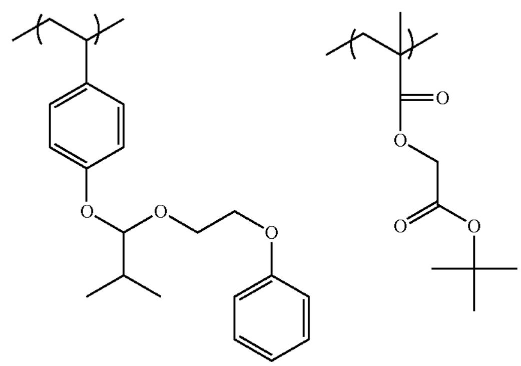
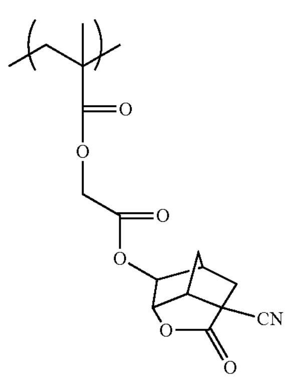
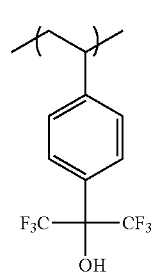

-continued
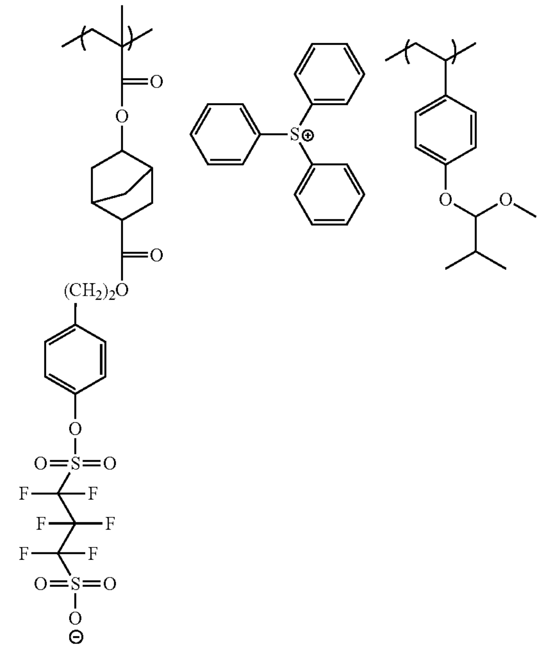
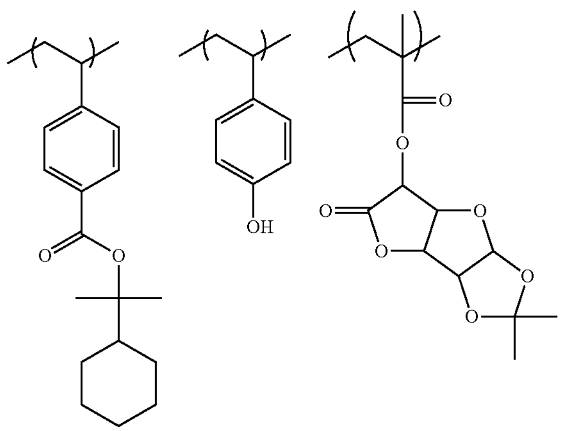
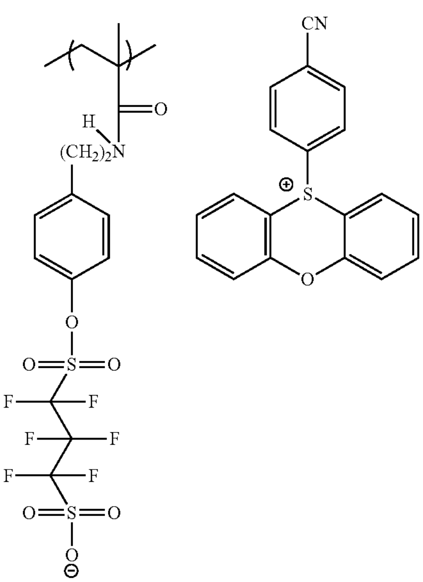
-continued
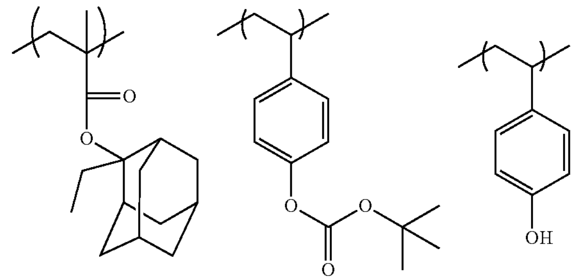
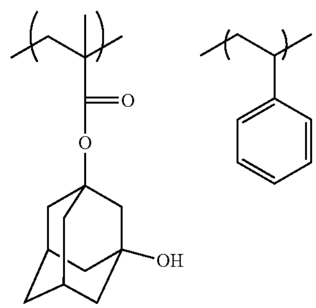
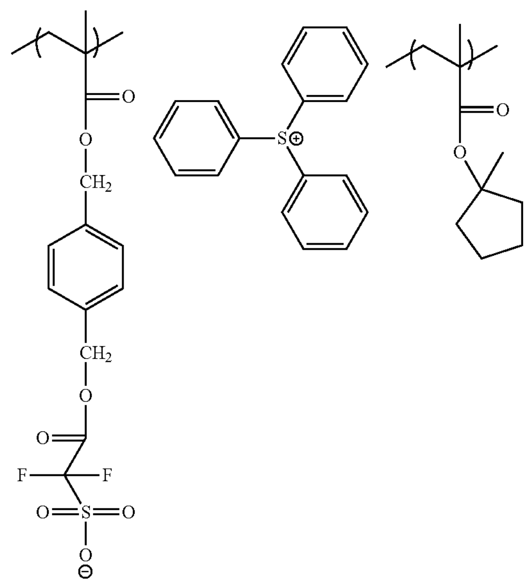
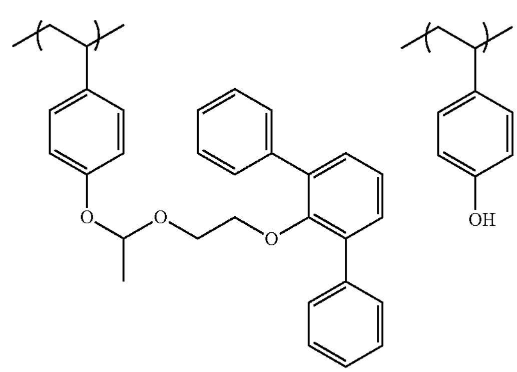

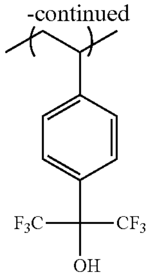
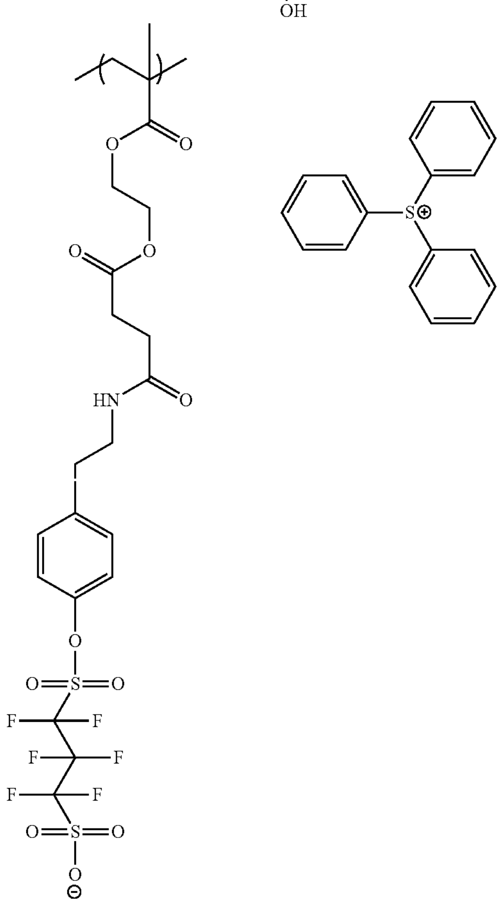
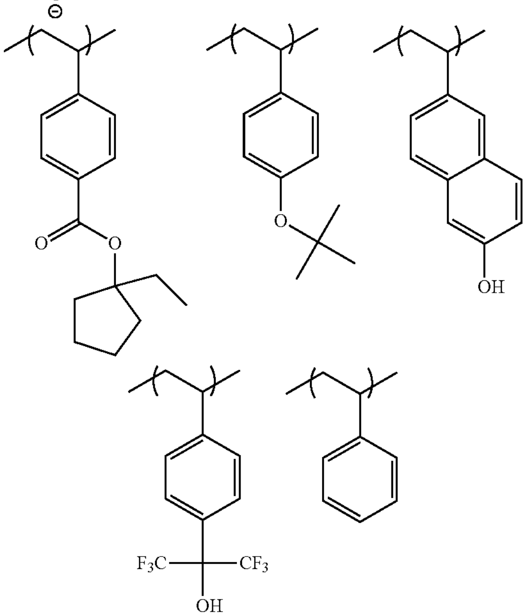
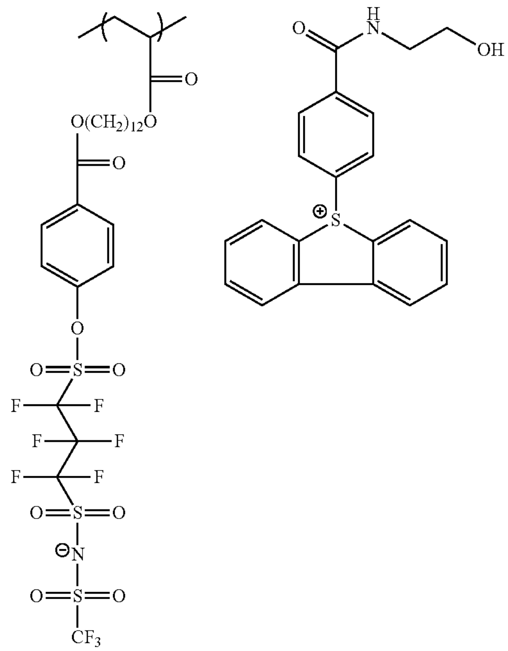
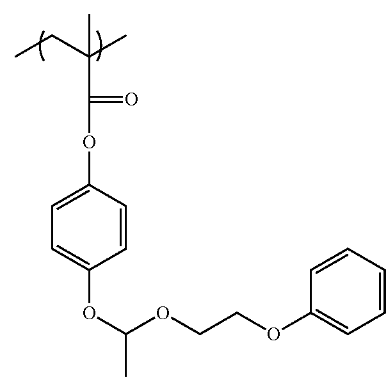
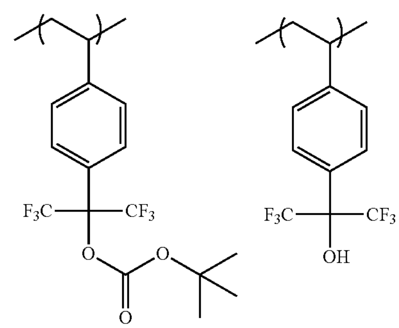

-continued
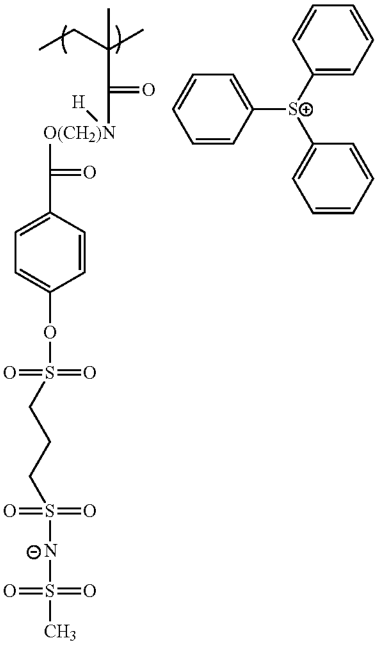
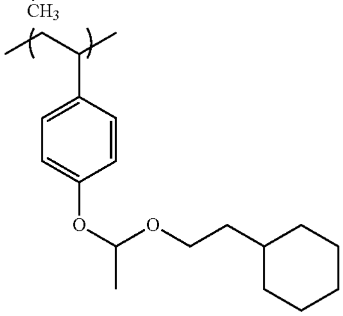
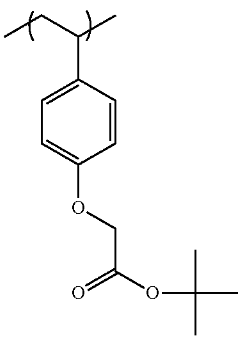
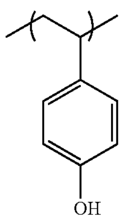
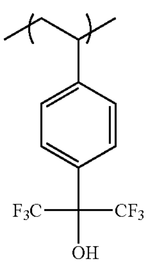
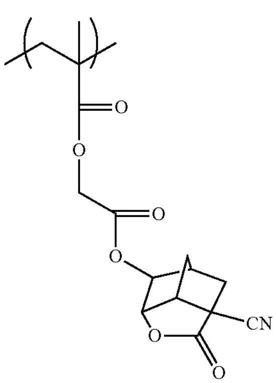
-continued
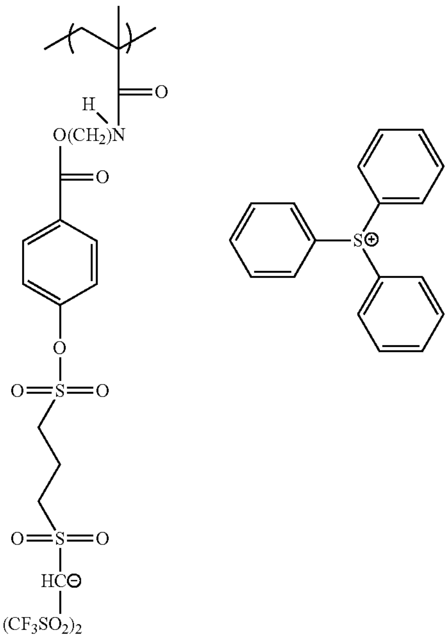
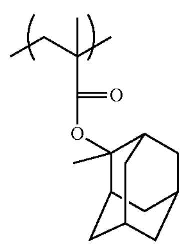
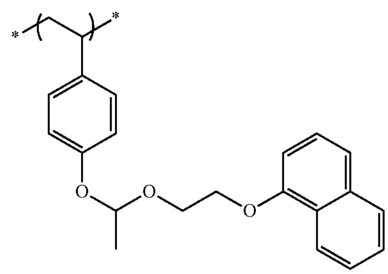
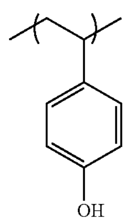
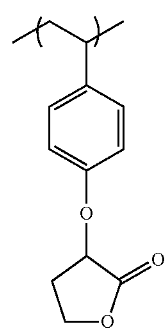

-continued
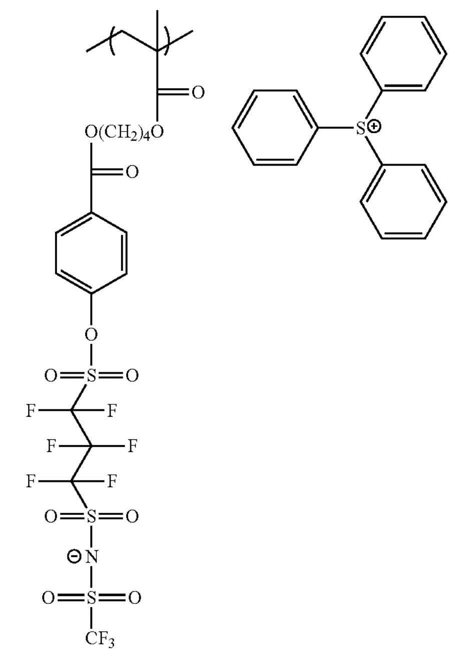
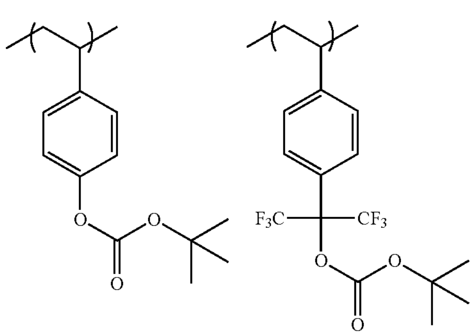
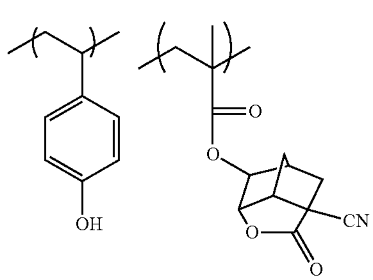
-continued
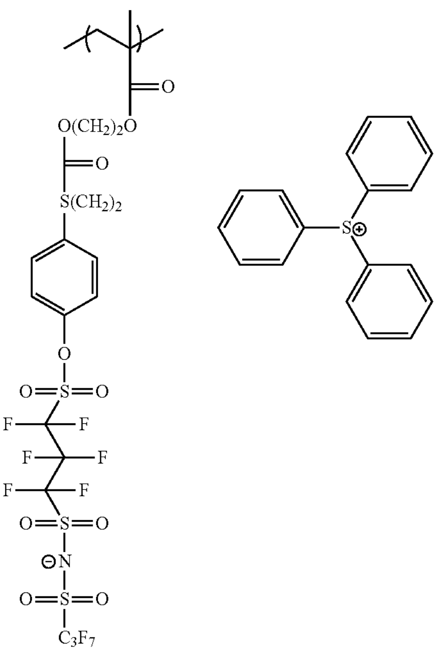
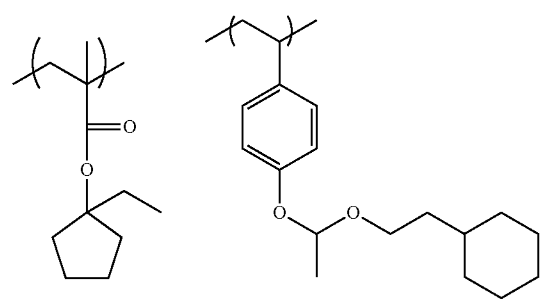
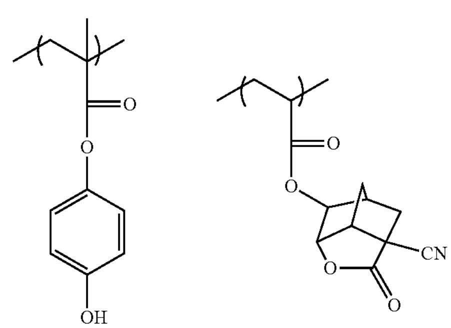

-continued
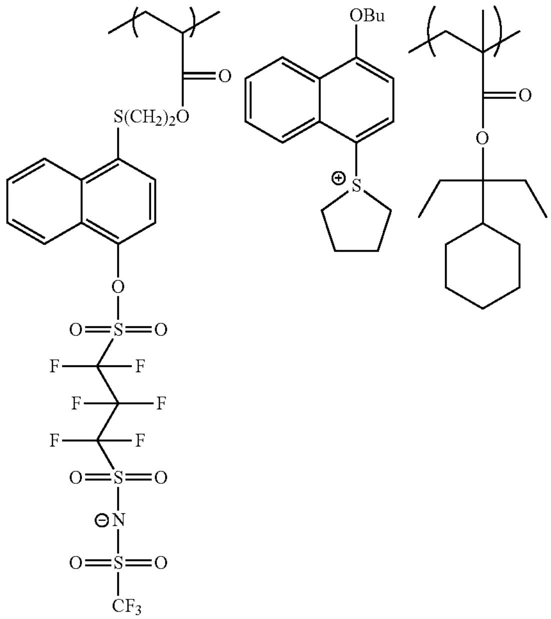
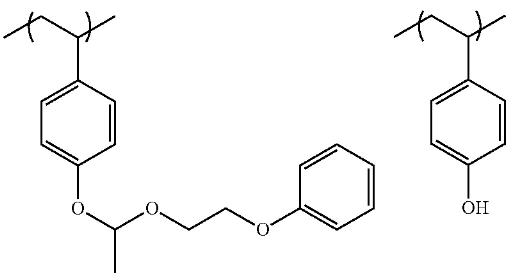
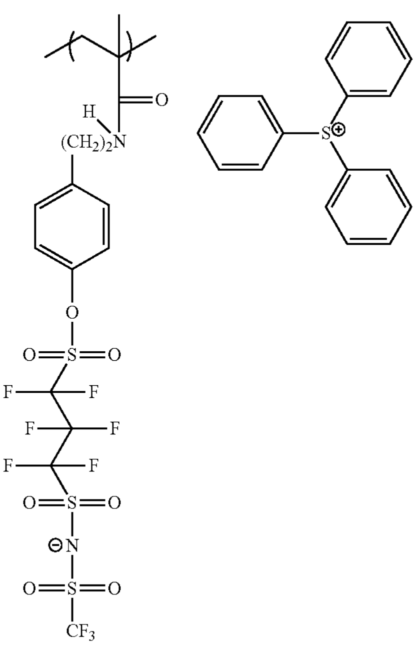
-continued
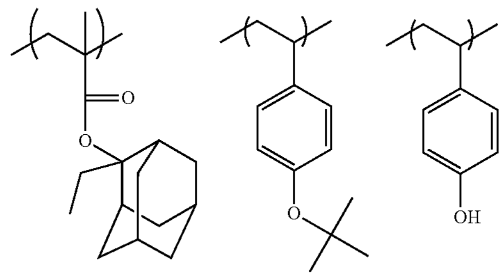
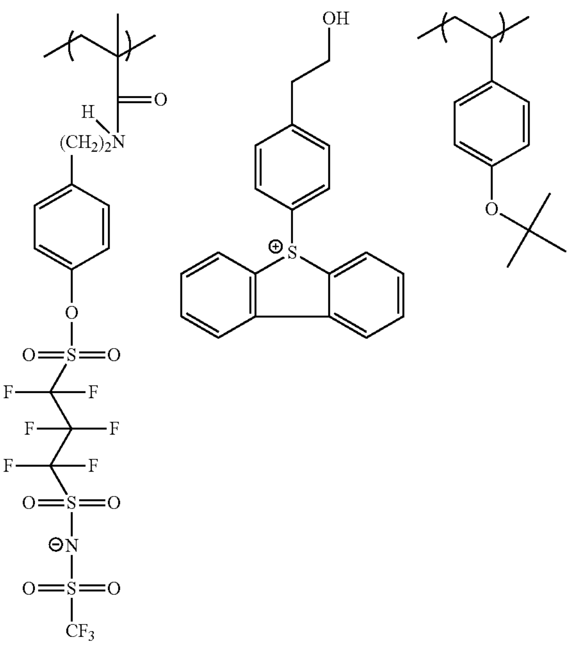
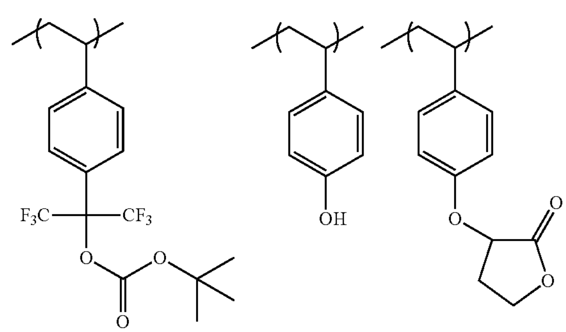

-continued
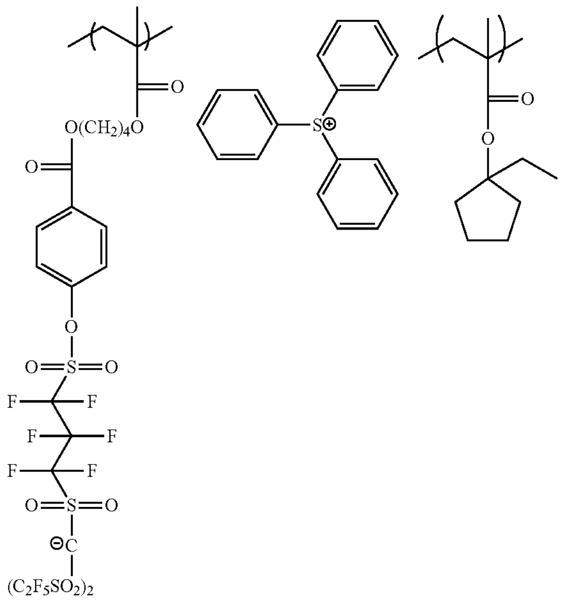
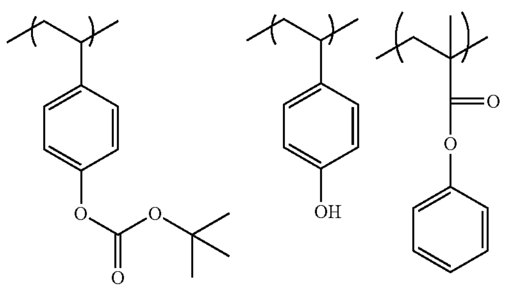
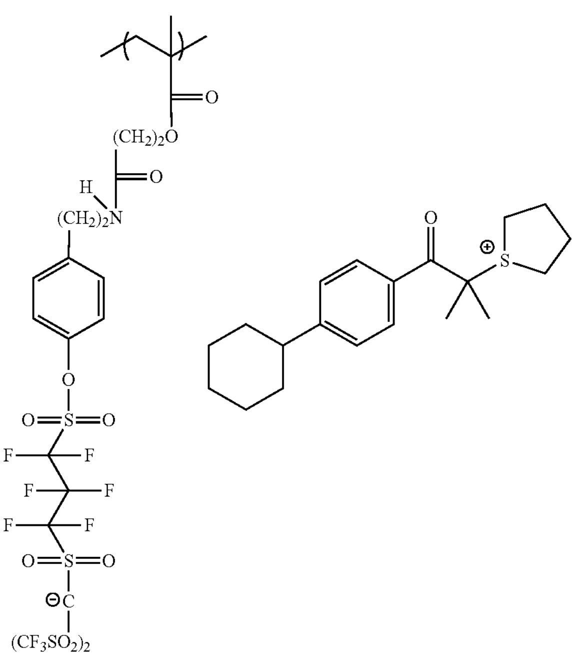
-continued
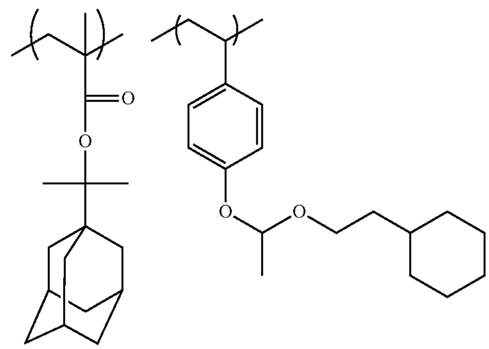
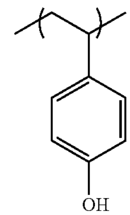
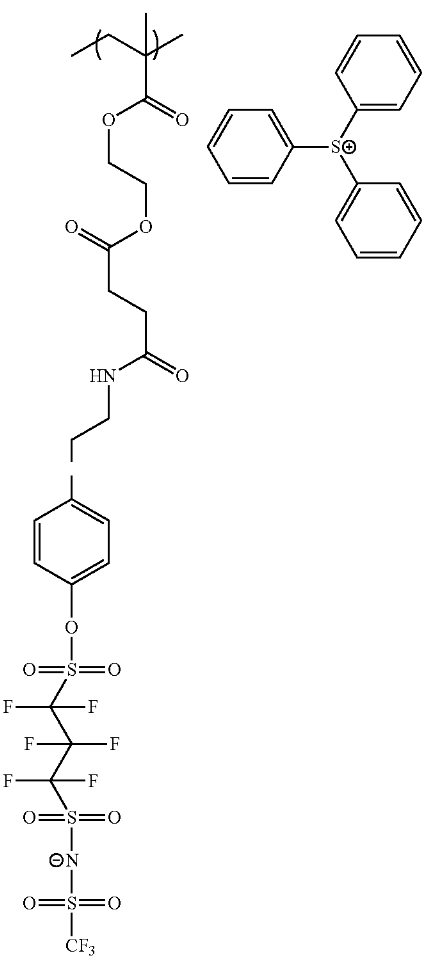

-continued
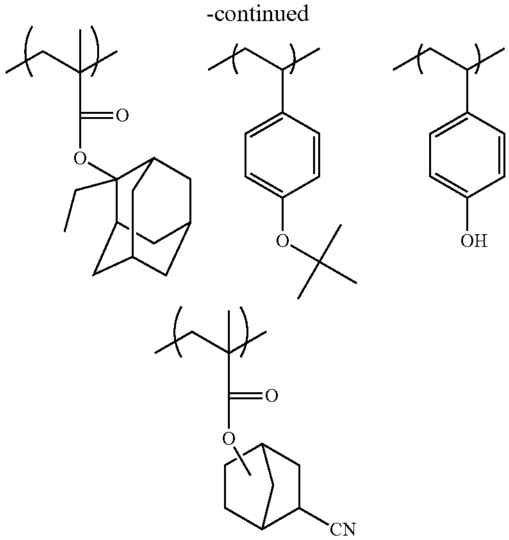
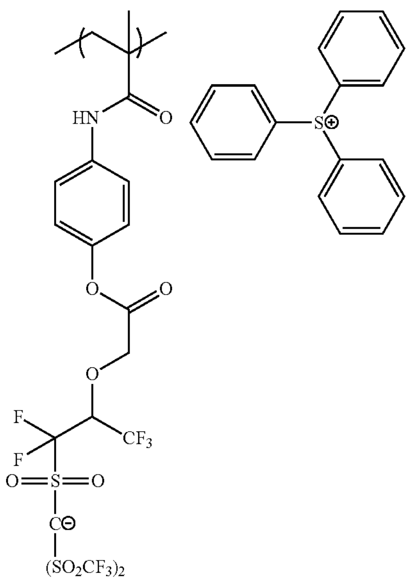
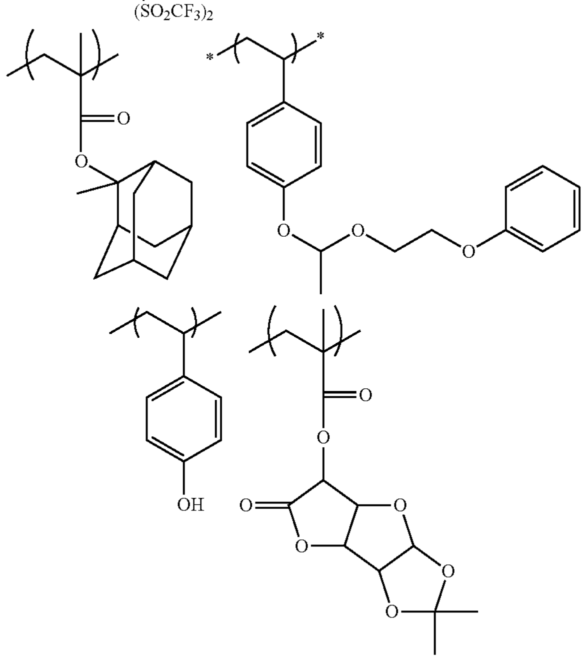
-continued
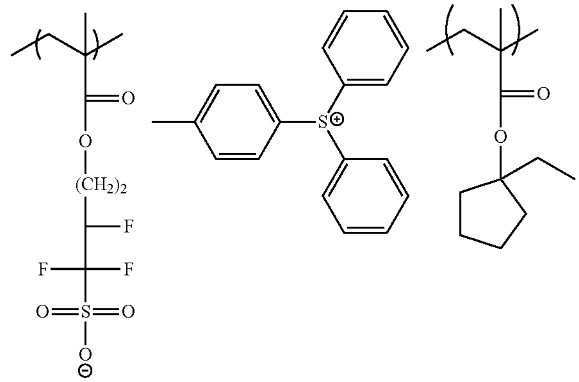
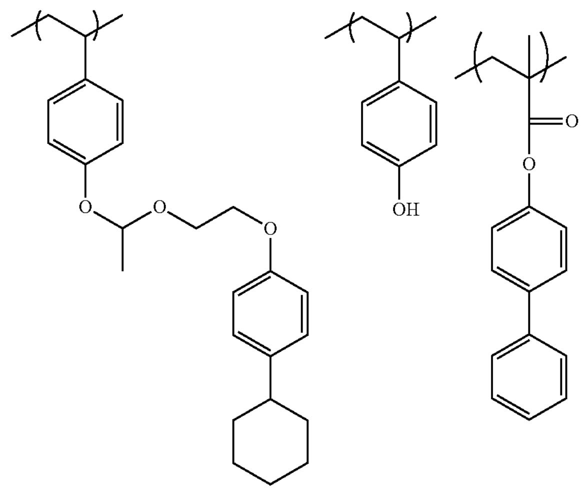
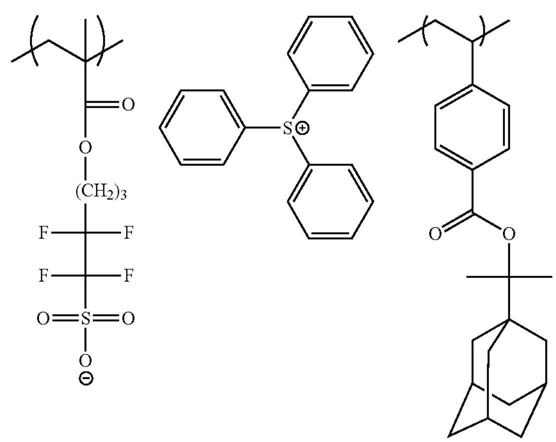
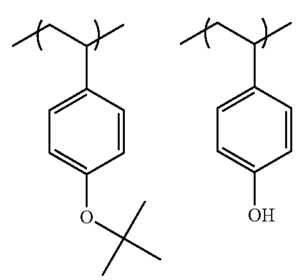

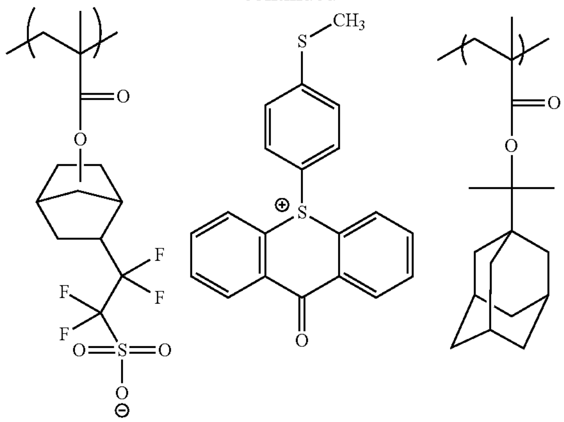
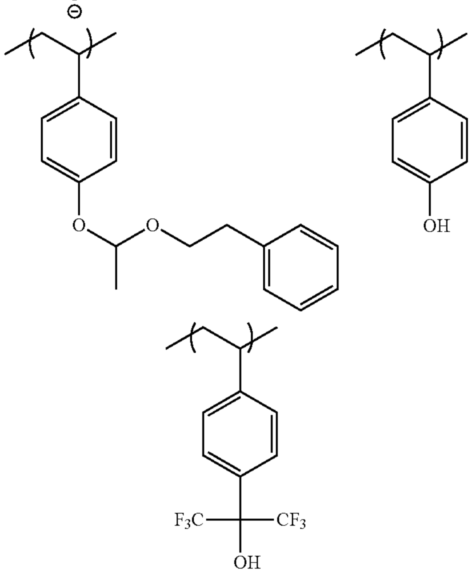
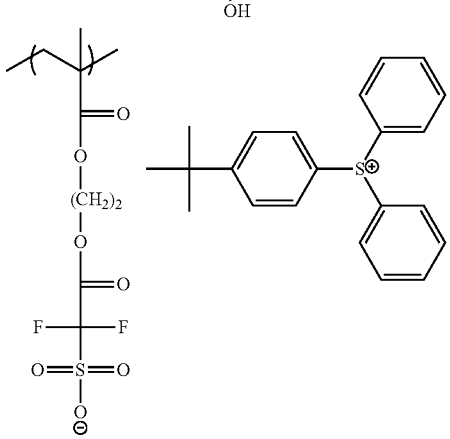
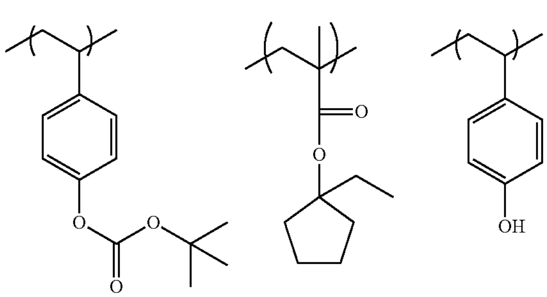
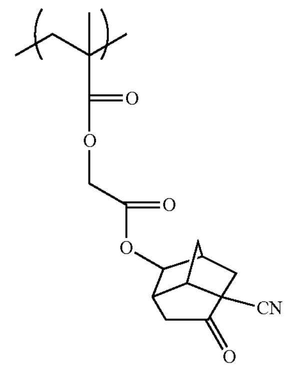
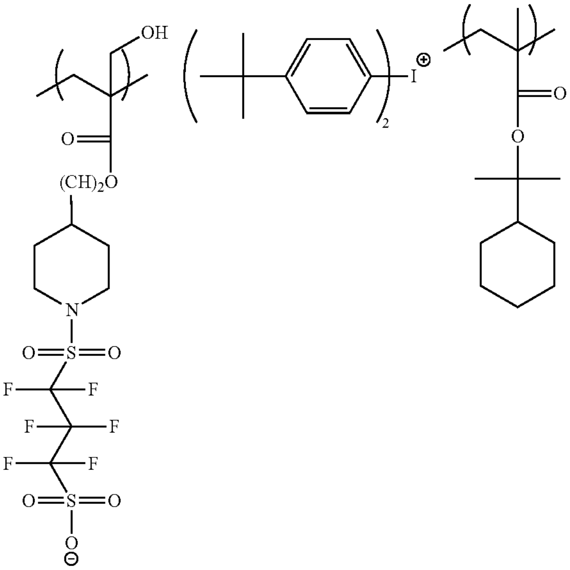
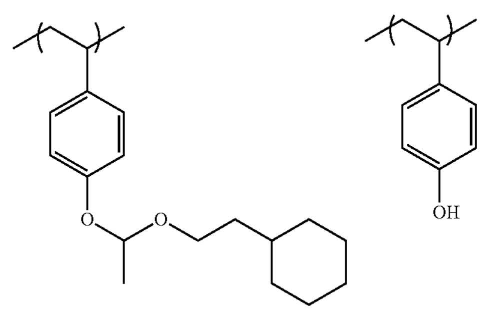
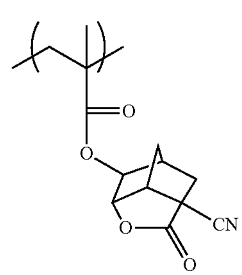

-continued
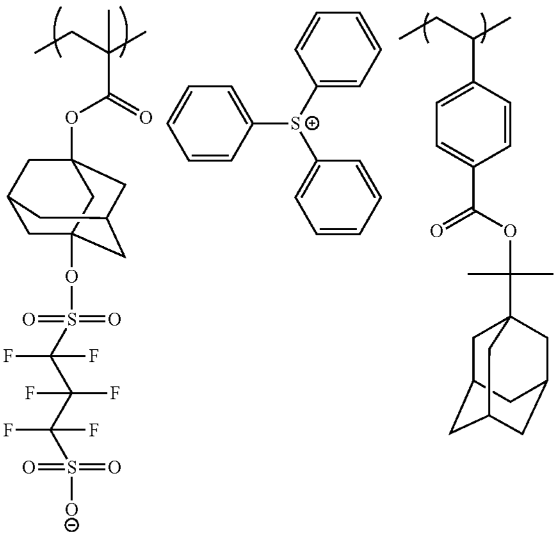
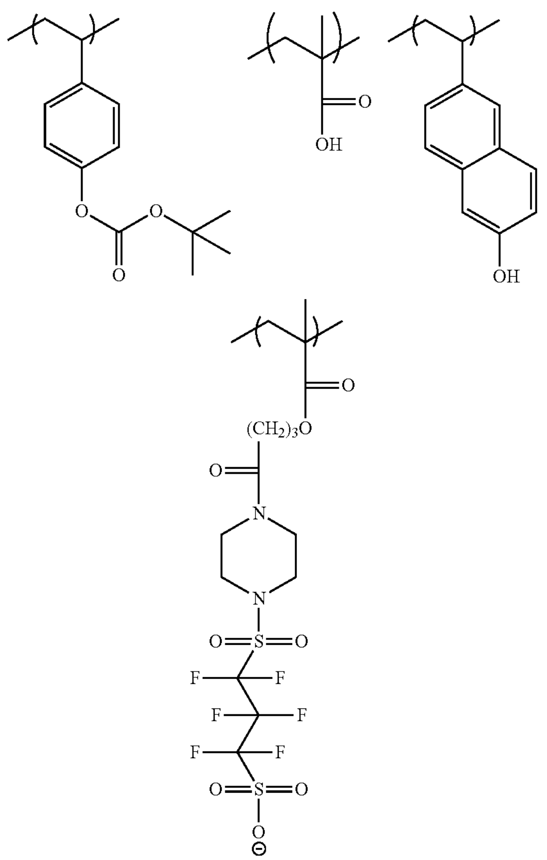
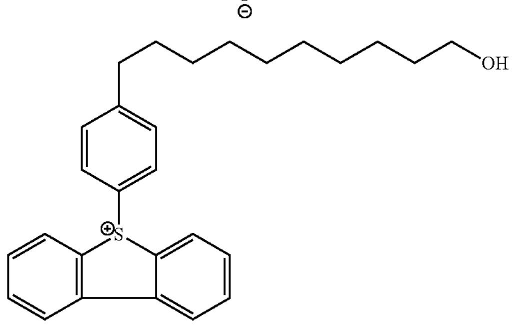
-continued
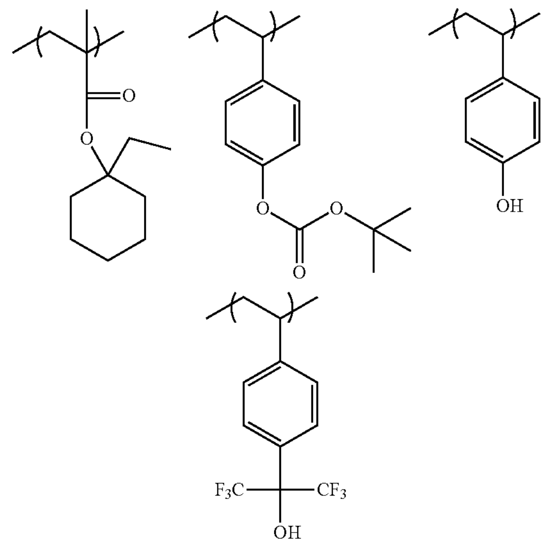
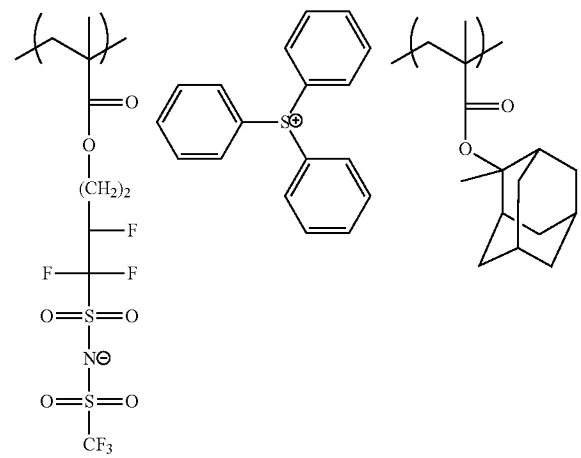
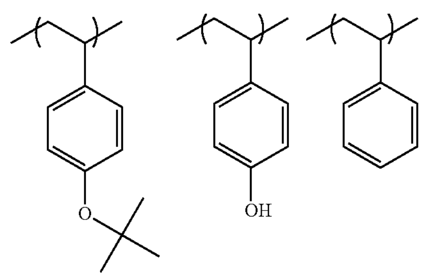
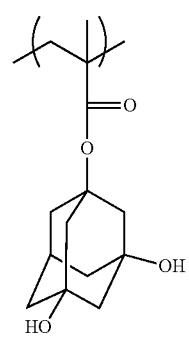

-continued
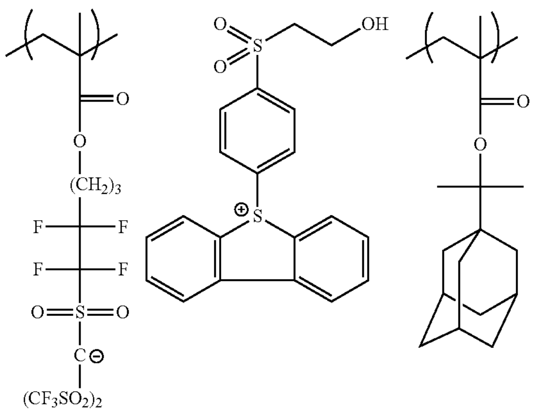
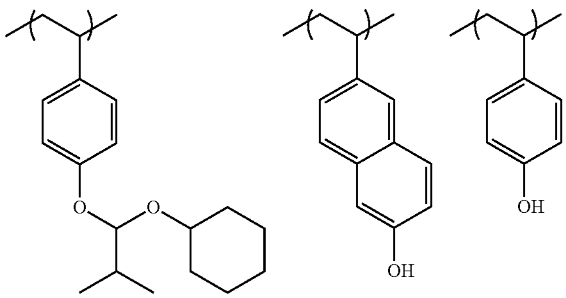
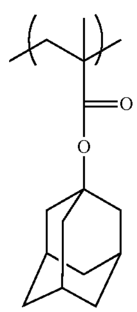
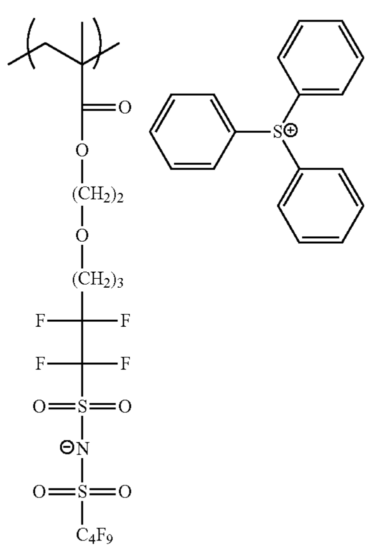
-continued
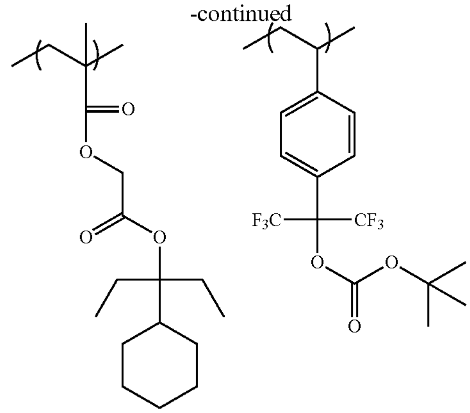
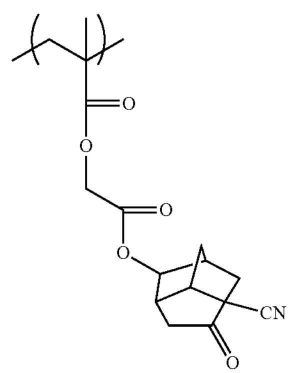
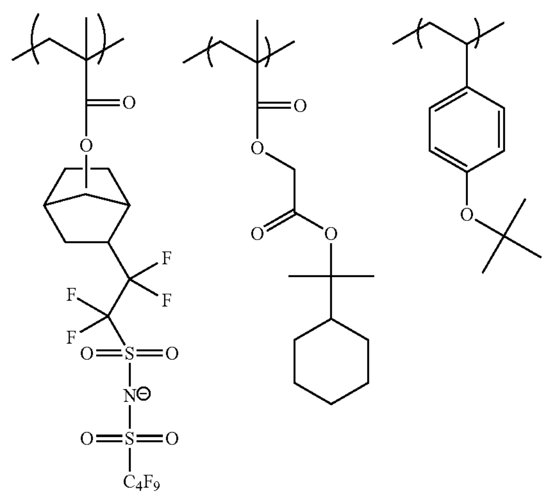
(III-18)
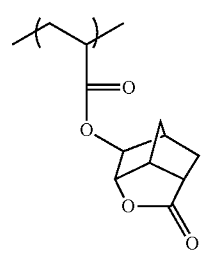

-continued
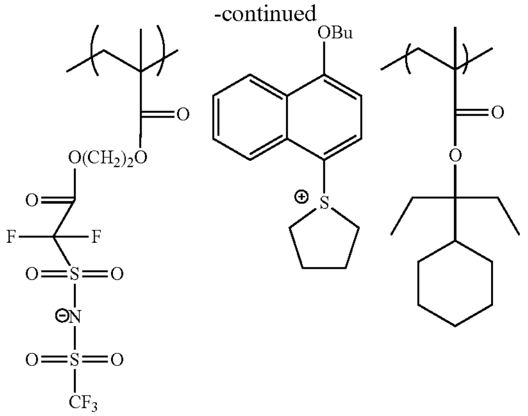
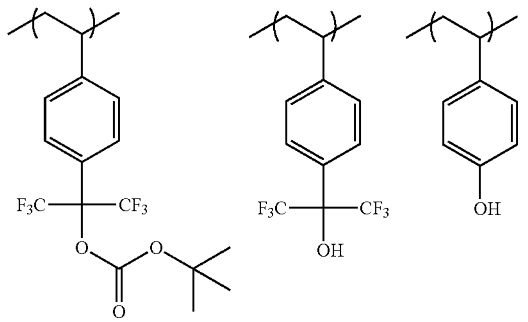
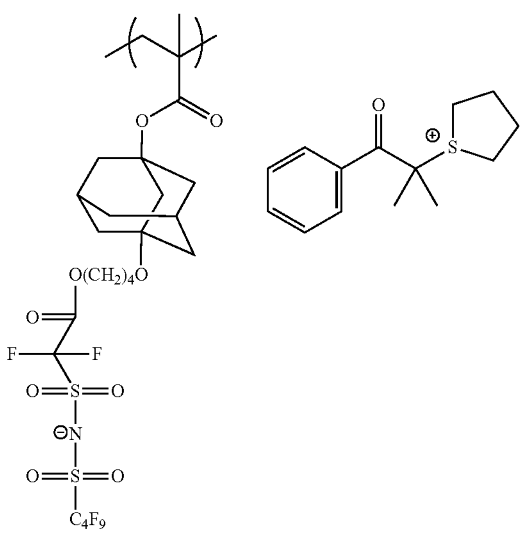
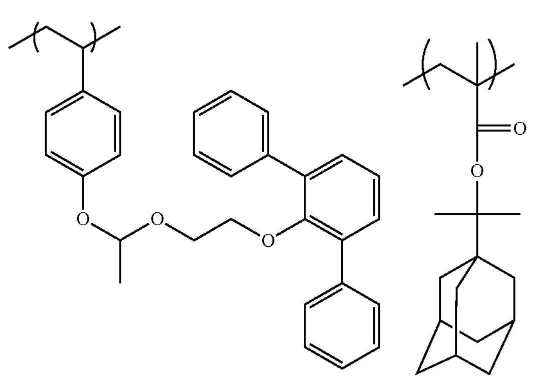
-continued
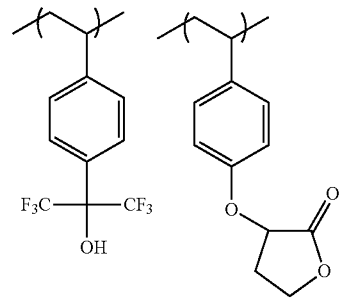
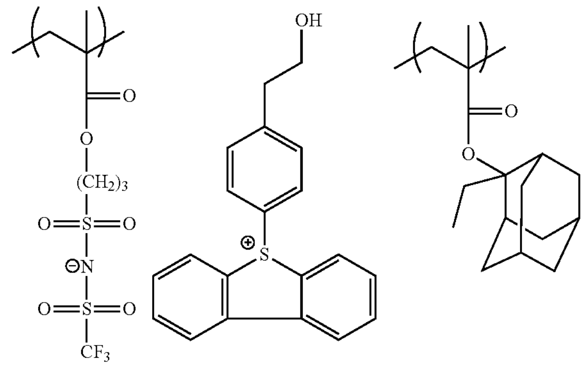
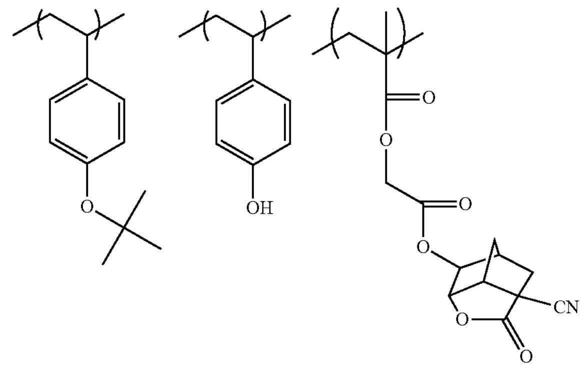
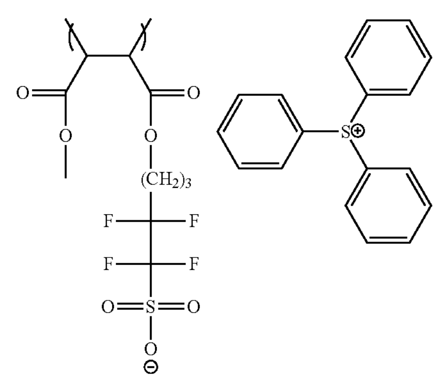
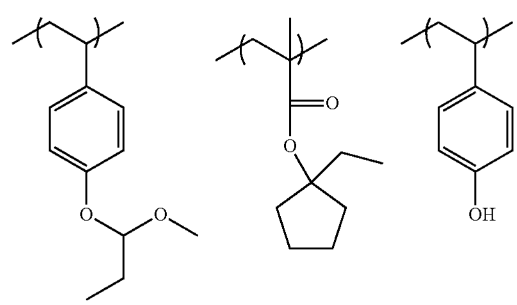

-continued
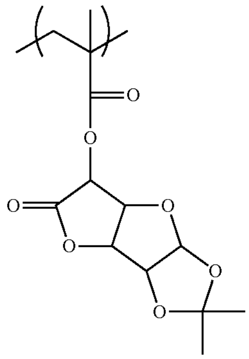
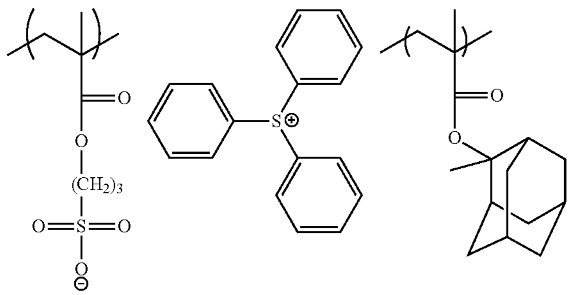
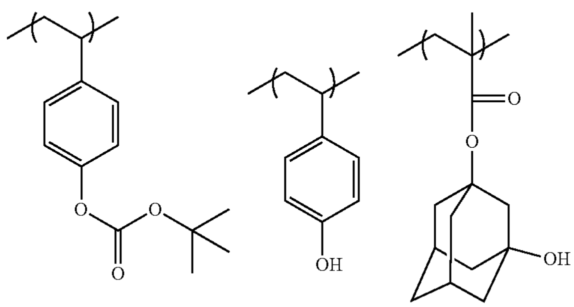
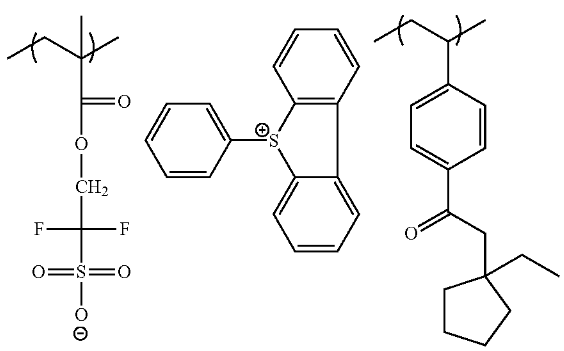
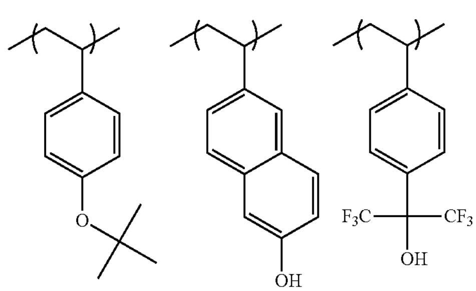
-continued
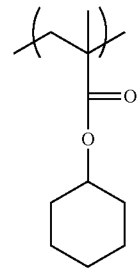
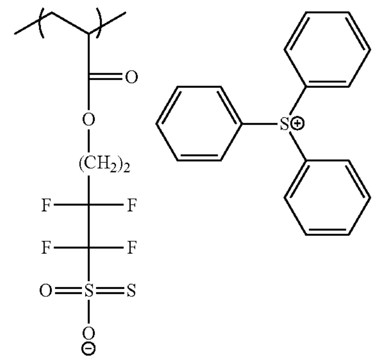
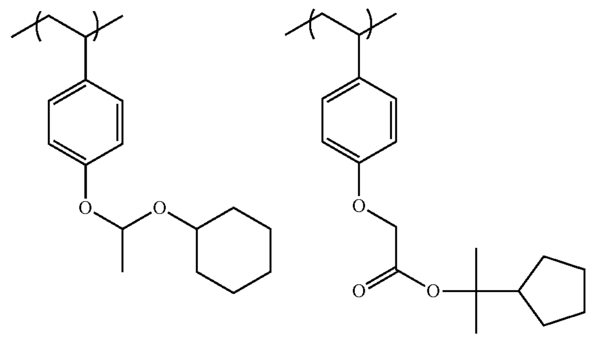
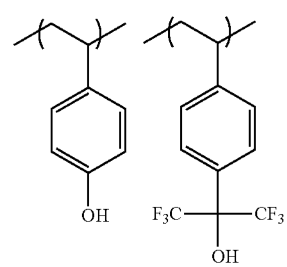
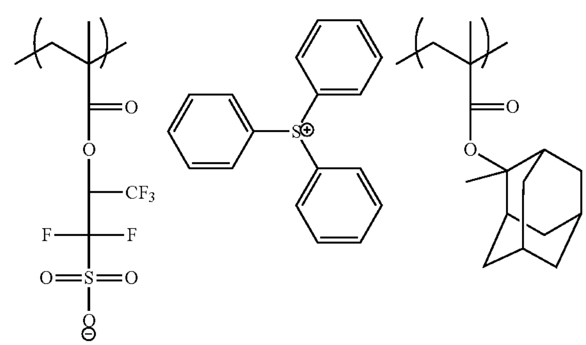

-continued

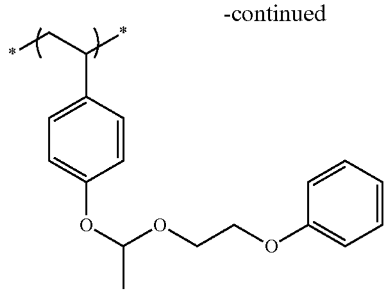

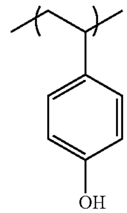

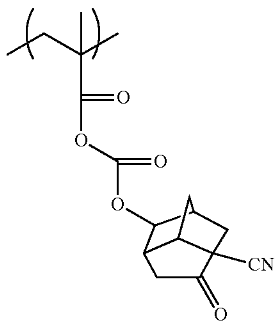

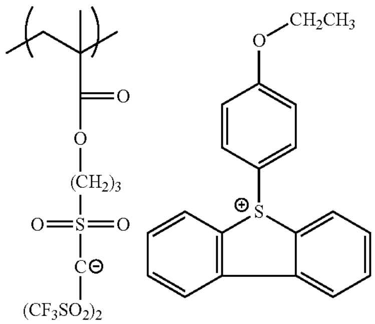

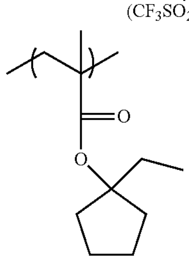

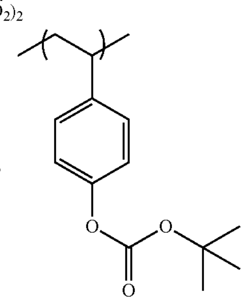

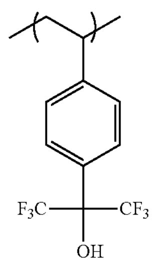

Furthermore according to necessity, the actinic-ray- or radiation-sensitive resin composition of the present invention can be loaded with a resin that when acted on by an acid, is decomposed to thereby increase its dissolution rate in an alkali aqueous solution, a compound that when exposed to actinic rays or radiation, generates an acid (low-molecular photoacid generator (conventional)), a basic compound, a low-molecular compound containing a group that when acted on by an acid, is cleaved, a surfactant, a substance that when acted on by an acid, is decomposed to thereby generate an acid stronger than carboxylic acid, etc.

<Resin that when Acted on by an Acid, is Decomposed to Thereby Increase its Rate of Dissolution in an Alkali Aqueous Solution>

The actinic-ray- or radiation-sensitive resin composition of the present invention may contain, except the resin (P), a resin that when acted on by an acid, is decomposed to thereby increase its rate of dissolution in an alkali aqueous solution:

The resin that when acted on by an acid, is decomposed to thereby increase its rate of dissolution in an alkali aqueous solution (hereinafter also referred to as an "acid-decomposable resin") is a resin provided at its principal chain or side chain or both thereof with a group that is decomposed by the action of an acid to thereby generate an alkali soluble group (acid-decomposable group). The resin provided at its side chain with an acid-decomposable group is preferred.

The acid-decomposable resin can be obtained by either reacting a precursor of acid-decomposable group with an alkali-soluble resin, or copolymerizing an alkali-soluble resin monomer having an acid-decomposable group bonded thereto with any of various monomers, as described in, for example, European Patent No. 254853 and JP-A's 2-25850, 3-223860 and 4-251259.

It is preferred for the acid-decomposable group to be, for example, a group as obtained by, in a resin having an alkali-soluble group such as —COOH or —OH, substituting the hydrogen atom of the alkali soluble group with a group that is cleaved by the action of an acid.

Preferred particular examples of the acid-decomposable groups are the same as set forth above with respect to the resins (P) of the present invention (for example, acid-decomposable groups mentioned above with respect to the repeating unit (B) of the resin (P)).

The resins having alkali-soluble groups are not particularly limited. For example, there can be mentioned poly(o-hydroxystyrene), poly(m-hydroxystyrene), poly(p-hydroxystyrene), copolymers of these, a hydrogenated poly(hydroxystyrene), poly(hydroxystyrene) polymers having substituents of the structures shown below, a resin having phenolic hydroxyl, a styrene-hydroxystyrene copolymer, an α-methylstyrene-hydroxystyrene copolymer, an alkali-soluble resin having a hydroxystyrene structure unit such as a hydrogenated novolak resin, and an alkali-soluble resin comprising a repeating unit containing a carboxyl group such as (meth) acrylic acid or norbornene carboxylic acid.

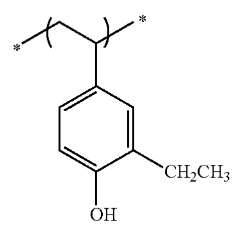

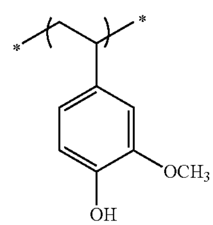

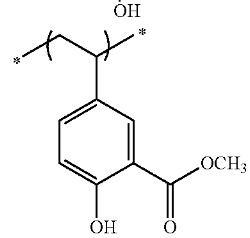

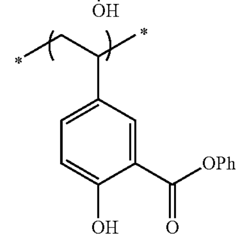

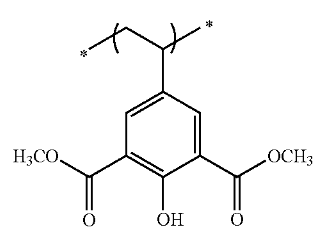

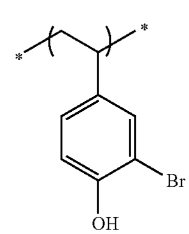

-continued

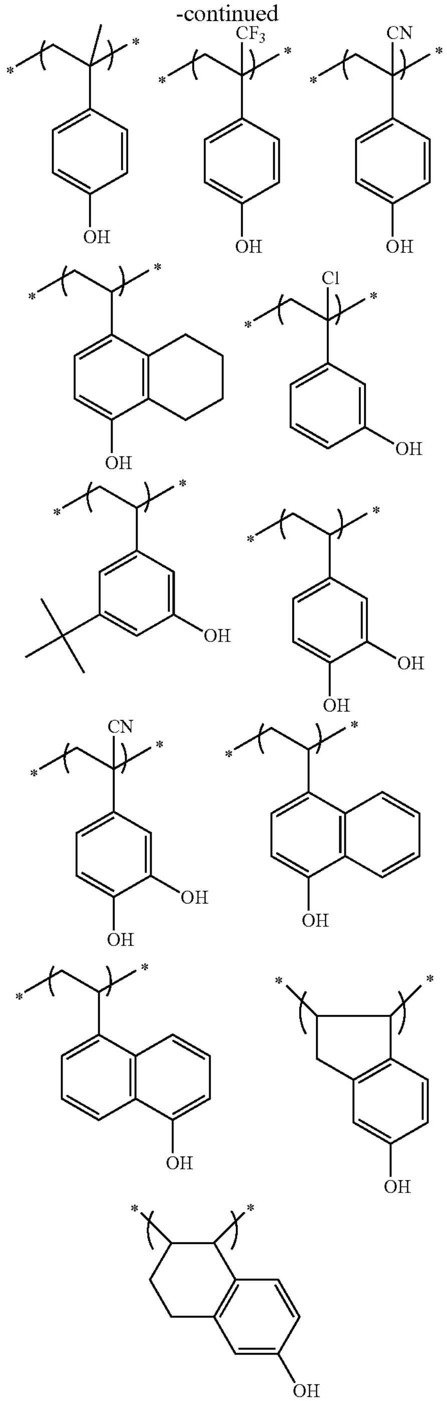

The alkali dissolution rate of these alkali-soluble resins as measured in a 2.38 mass % tetramethylammonium hydroxide (TMAH) solution (23° C.) is preferably 17 nm/sec or greater. The alkali dissolution rate is most preferably 33 nm/sec or greater.

The content of acid-decomposable groups can be expressed as the quotient of the formula X/(X+Y) in which X is the number of repeating units containing groups decomposable by an acid in the resin and Y is the number of repeating units containing alkali-soluble groups not protected by any acid-cleavable group in the resin. The content is preferably in the range of 0.01 to 0.7, more preferably 0.05 to 0.50 and further more preferably 0.05 to 0.40.

The preferred ranges of the molecular weight and dispersity of acid-decomposable resins are the same as those of the resin (P).

Two or more types of acid-decomposable resins may be used in combination.

The amount of acid-decomposable resins, except the resin (P), contained in the actinic-ray- or radiation-sensitive resin composition of the present invention is preferably in the range of 0 to 70 mass %, more preferably 0 to 50 mass % and further more preferably 0 to 30 mass % based on the total solids of the composition.

<Compound that when Exposed to Actinic Rays or Radiation, Generates an Acid (Low-Molecular Acid Generator)>

The actinic-ray- or radiation-sensitive resin composition of the present invention essentially contains the resin with a photoacid generating structure (P). Except the resin (P), a low-molecular compound that when exposed to actinic rays or radiation, generates an acid (hereinafter also referred to as an "acid generator" or "photoacid generator") may be contained in the composition.

As such an acid generator, use can be made of a member appropriately selected from among a photoinitiator for photocationic polymerization, a photoinitiator for photoradical polymerization, a photo-achromatic agent and photo-discoloring agent for dyes, any of generally known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate. As particular examples of these, there can be mentioned, for example, those set forth in Sections [0164] to [0248] of US Patent Application Publication No. 2008/0241737 A1.

When an acid generator, except the resin with a photoacid generating structure (P), is used in the actinic-ray- or radiation-sensitive resin composition of the present invention, a single type of acid generator can be used alone, or two or more types of acid generators can be used in combination. The content of acid generator(s) in the composition, based on the total solids of the composition of the present invention, is preferably in the range of 0 to 20 mass %, more preferably 0 to 10 mass % and further more preferably 0 to 7 mass %. Although these acid generators are not essential components in the present invention, they are generally used in an amount of 0.01 mass % or more in order to attain the effect of the addition thereof.

<Basic Compound>

The actinic-ray- or radiation-sensitive resin composition of the present invention preferably contains a basic compound. The basic compound is preferably a nitrogen-containing organic compound.

Useful basic compounds are not particularly limited. However, for example, the compounds of categories (1) to (4) below are preferably used.

(1) Compounds of General Formula (BS-1) Below (BS-1)

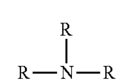

In general formula (BS-1), each of Rs independently represents any of a hydrogen atom, an alkyl group (linear or branched), a monovalent aliphatic hydrocarbon ring group (monocyclic or polycyclic), an aryl group and an aralkyl group, provided that in no event all the three Rs are hydrogen atoms.

The number of carbon atoms of the alkyl group represented by R is not particularly limited. However, it is generally in the range of 1 to 20, preferably 1 to 12.

The number of carbon atoms of the monovalent aliphatic hydrocarbon ring group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, an aryl group, such as a phenyl group, a naphthyl group and the like, can be mentioned.

The number of carbon atoms of the aralkyl group represented by R is not particularly limited. However, it is generally in the range of 7 to 20, preferably 7 to 11. In particular, an aralkyl group, such as a benzyl group and the like, can be mentioned.

In the alkyl group, monovalent aliphatic hydrocarbon ring group, aryl group and aralkyl group represented by R, a hydrogen atom thereof may be replaced by a substituent. As the substituent, there can be mentioned, for example, an alkyl group, a monovalent aliphatic hydrocarbon ring group, an aryl group, an aralkyl group, an alkoxy group, an aryloxy group, an alkylcarbonyloxy group, an alkyloxycarbonyl group and the like.

In the compounds of general formula (BS-1), it is preferred that only one of the three Rs be a hydrogen atom, and also that none of the Rs be a hydrogen atom.

Specific examples of the compounds of General Formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl)aniline and the like.

Any of the compounds of General Formula (BS-1) in which at least one of the Rs is a hydroxylated alkyl group can be mentioned as a preferred form of compound. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —$CH_2CH_2O$—. As particular examples thereof, there can be mentioned tris(methoxyethoxyethyl)amine, compounds shown in column 3 line 60 et seq. of U.S. Pat. No. 6,040,112 and the like.

(2) Compounds with Nitrogen-Containing Heterocyclic Structure

The heterocyclic structure optionally may have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]-undec-7-ene and the like.

(3) Amine Compounds with Phenoxy Group

The amine compounds with a phenoxy group are those having a phenoxy group at the end of the alkyl group of each amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group and the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —$CH_2CH_2O$— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown in section of US 2007/0224539 A1 and the like.

(4) Ammonium Salts

Ammonium salts can also be appropriately used. Hydroxides and carboxylates are preferred. Preferred particular examples thereof are tetraalkylammonium hydroxides, such as tetrabutylammonium hydroxide.

(5) Compound that when Acted on by an Acid, Increases its Basicity

The compound that when acted on by an acid, increases its basicity can also be used as a type of basic compound. As an example thereof, there can be mentioned compounds with the structure of general formula (A) below. These compounds per se exhibit low basicity because of the presence of an electron withdrawing ester bond adjacent to the N atom. However, when an acid acts on the compounds, it is construed that the moiety —C(Rb)(Rb)(Rb) is first decomposed and subsequently the ester bond moiety is decarbonated, so that the moiety of the electron withdrawing ester bond is removed, thereby exhibiting a substantial basicity.

(A)

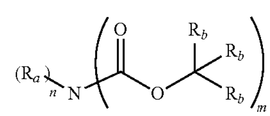

In general formula (A), Ra represents a hydrogen atom, an alkyl group, a monovalent aliphatic hydrocarbon ring group, an aryl group or an aralkyl group. When n=2, two Ra's may be identical to or different from each other, and two Ra's may be bonded to each other to thereby form a bivalent heterocyclic hydrocarbon group (preferably up to 20 carbon atoms) or a derivative thereof.

Each of Rb's independently represents a hydrogen atom, an alkyl group, a monovalent aliphatic hydrocarbon ring group, an aryl group or an aralkyl group, provided that in the formula —C(Rb)(Rb)(Rb), three Rb's are not simultaneously hydrogen atoms.

At least two Rb's may be bonded to each other to thereby form an alicyclic hydrocarbon group, an aromatic hydrocarbon group, a heterocyclic hydrocarbon group or a derivative thereof.

In the formula, n is an integer of 0 to 2, and m is an integer of 1 to 3, provided that n+m=3.

In general formula (A), each of the alkyl groups, monovalent aliphatic hydrocarbon ring groups, aryl groups and aralkyl groups represented by Ra and Rb may be substituted with a functional group, such as a hydroxyl group, a cyano group, an amino group, a pyrrolidino group, a piperidino group, a morpholino group or an oxo group, as well as an alkoxy group or a halogen atom.

As the alkyl group, monovalent aliphatic hydrocarbon ring group, aryl group and aralkyl group represented by Ra and/or Rb (these alkyl group, cycloalkyl group, aryl group and aralkyl group may be substituted with the above functional group, an alkoxy group or a halogen atom), there can be mentioned, for example, a group derived from a linear or branched alkane, such as methane, ethane, propane, butane, pentane, hexane, heptane, octane, nonane, decane, undecane or dodecane; a group as obtained by substituting the above alkane-derived group with at least one or at least one type of cycloalkyl group, such as a cyclobutyl group, a cyclopentyl group or a cyclohexyl group;

a group derived from a cycloalkane, such as cyclobutane, cyclopentane, cyclohexane, cycloheptane, cyclooctane, norbornane, adamantane or noradamantane; a group as obtained by substituting the above cycloalkane-derived group with a linear or branched alkyl group;

a group derived from an aromatic compound, such as benzene, naphthalene or anthracene; a group as obtained by substituting the above aromatic-compound-derived group with a linear or branched alkyl group;

a group derived from a heterocyclic compound, such as pyrrolidine, piperidine, morpholine, tetrahydrofuran, tetrahydropyran, indole, indoline, quinoline, perhydroquinoline, indazole or benzimidazole; a group as obtained by substituting the above heterocyclic-compound-derived group with a linear or branched alkyl group or an aromatic-compound-derived group;

a group as obtained by substituting the above linear or branched-alkane-derived group or cycloalkane-derived group with an aromatic-compound-derived group; any of groups as obtained by substituting the above substituents with a functional group, such as a hydroxyl group, a cyano group, an amino group, a pyrrolidino group, a piperidino group, a morpholino group or an oxo group; and the like.

As the bivalent heterocyclic hydrocarbon group (preferably 2 to 20 carbon atoms) formed by the mutual bonding of Ra's or derivative thereof, there can be mentioned, for example, a group derived from a heterocyclic compound, such as pyrrolidine, piperidine, morpholine, 1,4,5,6-tetrahydropyrimidine, 1,2,3,4-tetrahydroquinoline, 1,2,3,6-tetrahydropyridine, homopiperazine, 4-azabenzimidazole, benzotriazole, 5-azabenzotriazole, 1H-1,2,3-triazole, 1,4,7-triazacyclononane, tetrazole, 7-azaindole, indazole, benzimidazole, imidazo[1,2-a]pyridine, (1S,4S)-(+)-2,5-diazabicyclo[2.2.1]heptane, 1,5,7-triazabicyclo[4.4.0]dec-5-ene, indole, indoline, 1,2,3,4-tetrahydroquinoxaline, perhydroquinoline or 1,5,9-triazacyclododecane; a group as obtained by substituting the above heterocyclic-compound-derived group with at least one or at least one type of linear or branched-alkane-derived group, cycloalkane-derived group, aromatic-compound-derived group, heterocyclic-compound-derived group or functional group, such as a hydroxyl group, a cyano group, an amino group, a pyrrolidino group, a piperidino group, a morpholino group or an oxo group; and the like.

Specific examples of the compound that when acted on by an acid, increases its basicity most preferred in the present invention will be shown below, which should be construed as not limiting the present invention.

(D-1)

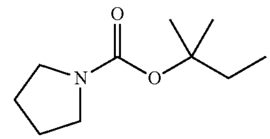

(D-2)

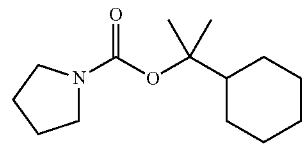

(D-3)

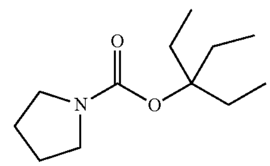

(D-4)

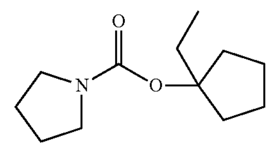

(D-5)

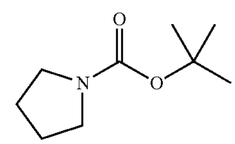

(D-6)

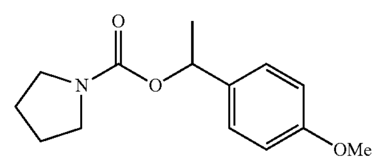

(D-7)

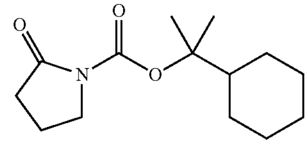

(D-8)

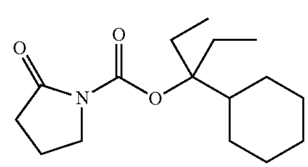

(D-9)

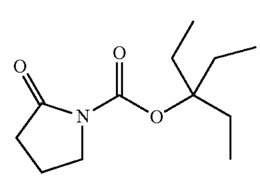

(D-10)

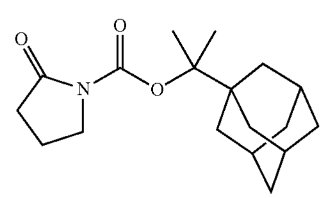

-continued
(D-11)
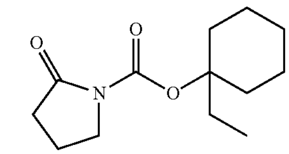
(D-12)
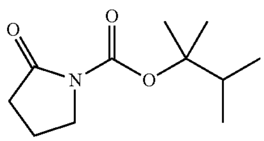
(D-13)
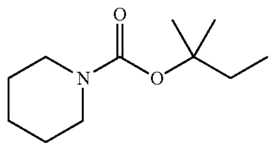
(D-14)
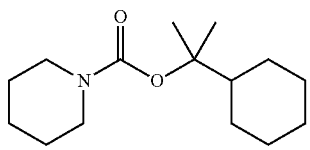
(D-15)
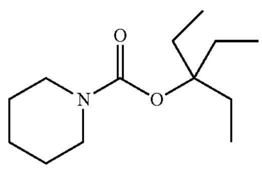
(D-16)
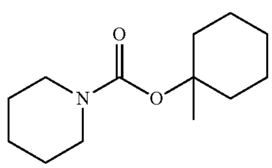
(D-18)
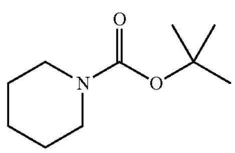
(D-19)
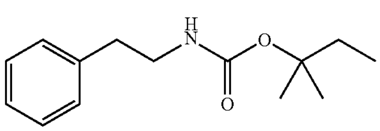
(D-20)
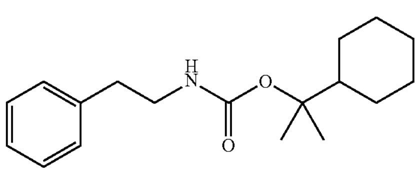
(D-21)
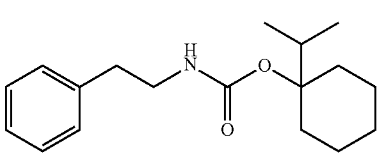
-continued
(D-23)
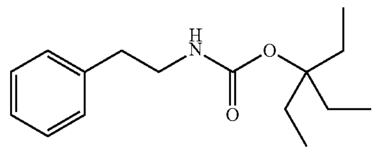
(D-24)
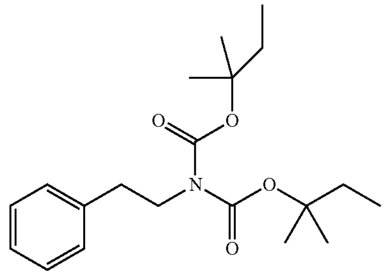
(D-25)
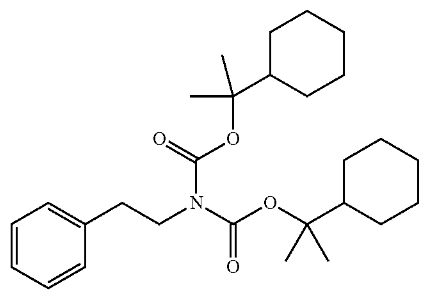
(D-26)
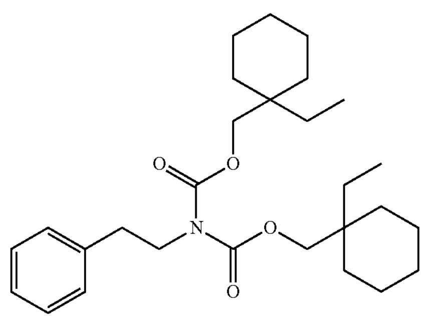
(D-28)
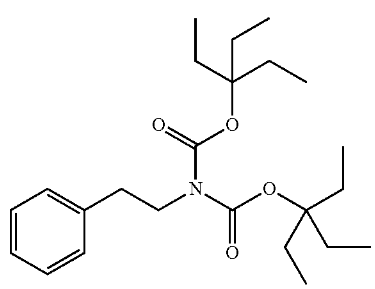
(D-29)
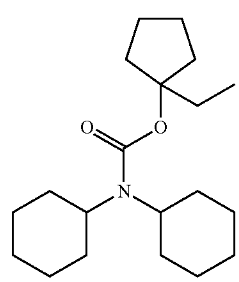

-continued
(D-31)
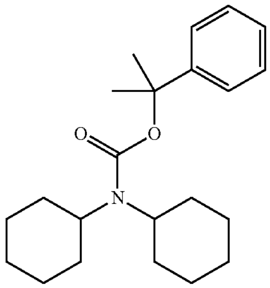
(D-32)
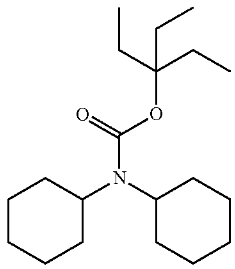
(D-33)
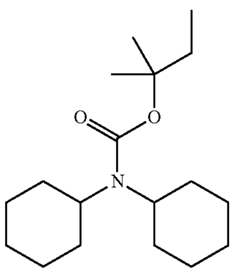
(D-34)
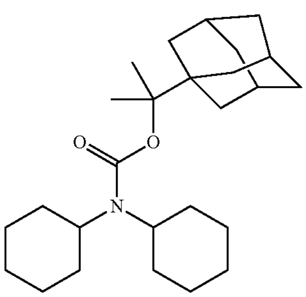
(D-35)
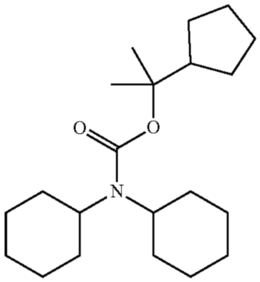
-continued
(D-36)
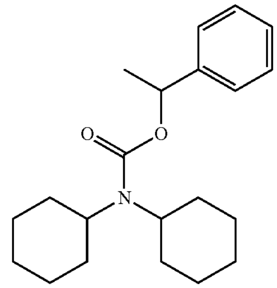
(D-37)
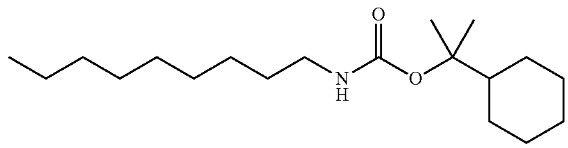
(D-38)
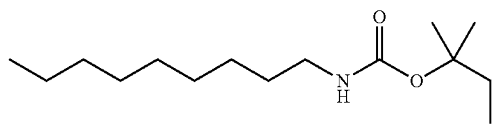
(D-39)
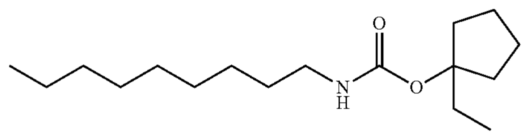
(D-40)
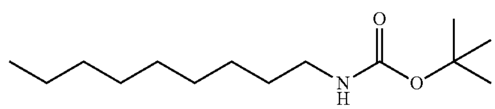
(D-41)
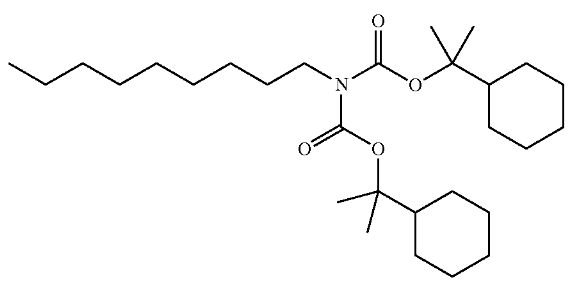
(D-42)
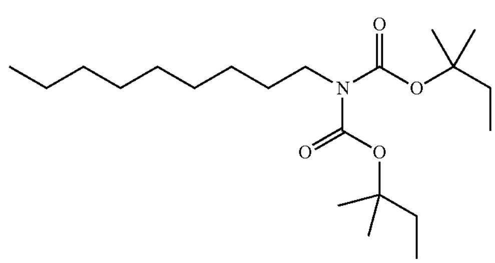

-continued (D-43)

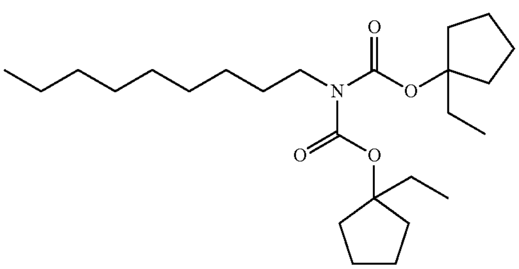

(D-44)

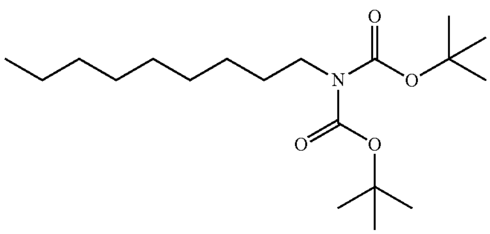

(D-45)

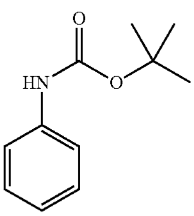

(D-46)

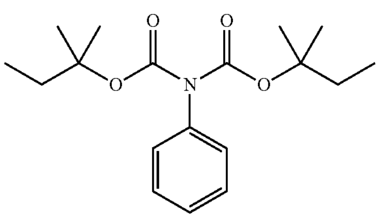

(D-47)

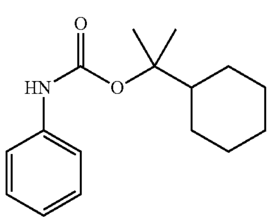

(D-48)

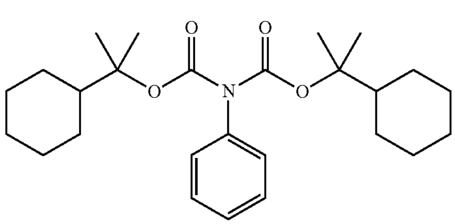

-continued (D-50)

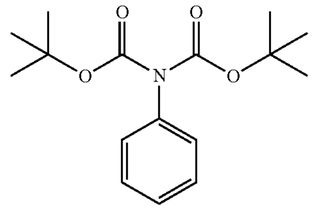

(D-51)

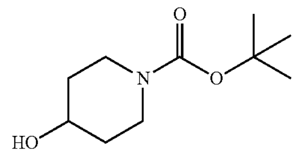

(D-52)

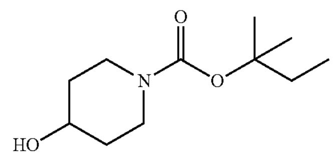

(D-53)

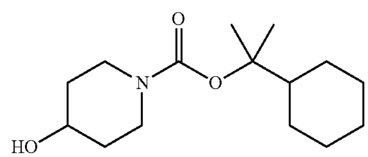

(D-54)

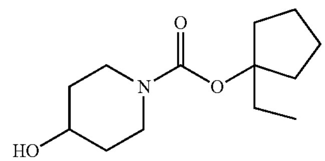

(D-55)

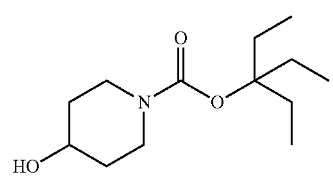

The compounds of general formula (A) can be easily synthesized from commercially available amines by the methods described in, for example, Protective Groups in Organic Synthesis, the fourth edition. The most general method comprises causing a bicarbonic ester or a haloformic ester to act on commercially available amines. In the formulae, X represents a halogen atom.

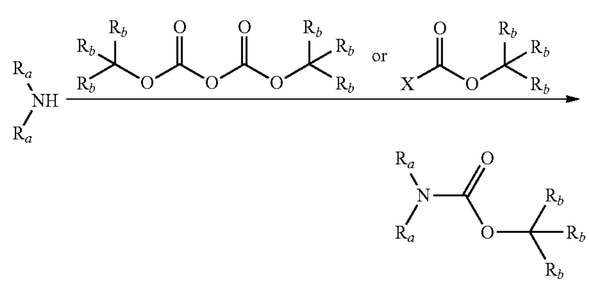

-continued

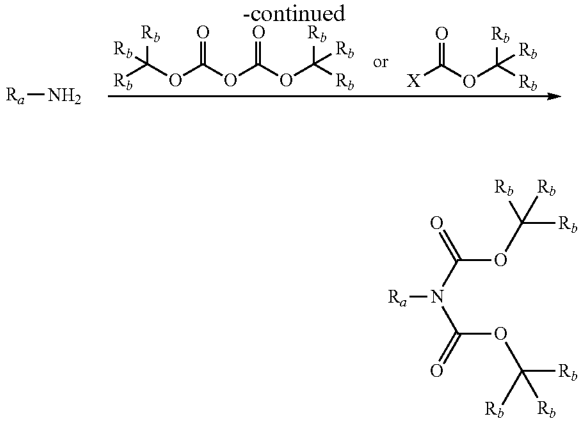

As other compounds usable in the composition of the present invention, there can be mentioned the compounds synthesized in Examples of JP-A-2002-363146, the compounds described in Paragraph 0108 of JP-A-2007-298569, and the like.

These basic compounds can be used alone or in combination.

The amount of basic compound used is generally in the range of 0.001 to 10 mass %, preferably 0.01 to 5 mass % based on the solid contents of the composition of the invention.

With respect to the ratio of the acid generator to basic compound in the composition, preferably, the acid generator/basic compound (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/basic compound (molar ratio) is more preferably in the range of 5.0 to 200, still more preferably 7 to 150.

With respect to the above molar ratio, the acid generator refers to the sum of repeating unit (A) contained in the resin (P) and above-mentioned acid generators other than those of the resin (P).

<Low-Molecular Compound Containing a Group that when Acted on by Acid or Alkali, is Decomposed>

The composition of the present invention can be loaded with a low-molecular compound containing a group that when acted on by an acid or alkali, is decomposed (provided that the above-mentioned compound that when acted on by an acid, increases its basicity is excluded). The group that when acted on by an acid or alkali, is decomposed is not particularly limited. However, an acetal group, a carbonate group, a carbamate group, a tertiary ester group, a tertiary hydroxyl group, a hemiaminal ether group and a lactone structure are preferred. A carbamate group and a hemiaminal ether group are most preferred.

When the composition is exposed to an electron beam or EUV light, it is preferred to contain a compound with a structure resulting from substitution of a phenolic hydroxyl group of phenol compound with an acid-decomposable group. The phenol compound preferably contains 1 to 9, more preferably 2 to 6, phenol skeletons.

Specific examples thereof will be shown below, which in no way limit the scope of the present invention.

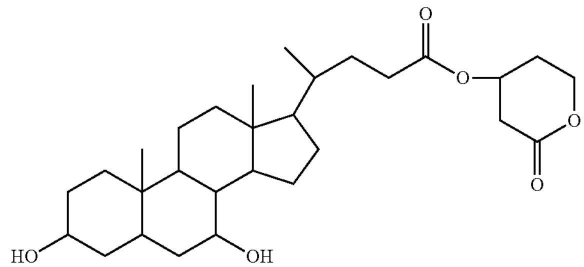

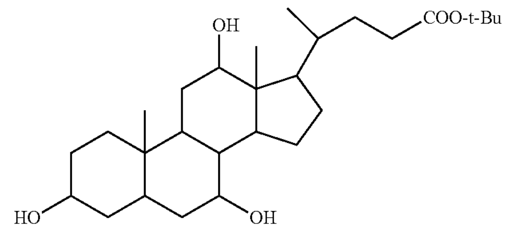

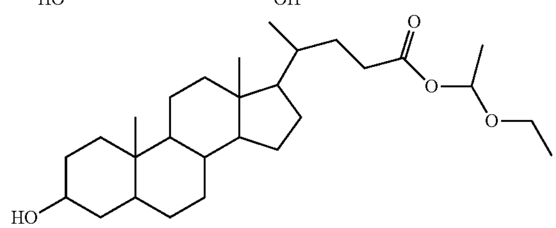

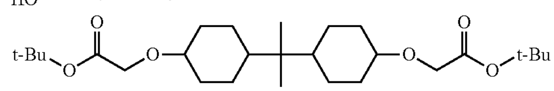

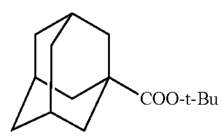

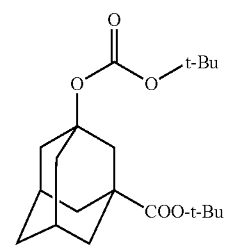

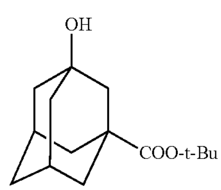

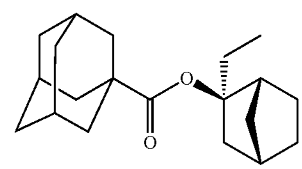

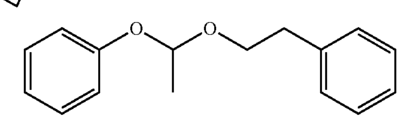

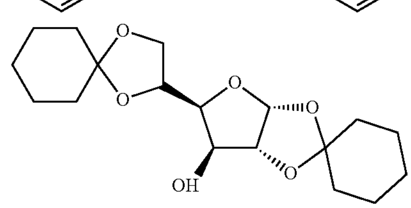

The low-molecular compound containing a group that when acted on by an acid or alkali, is decomposed may be any of commercially available products or any of those synthesized by heretofore known methods.

<Surfactant>

The composition of the present invention may further contain a surfactant. When the composition contains a surfactant, the surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., and the like.

Surfactants other than these fluorinated and/or siliconized surfactants can also be used. In particular, the other surfactants include polyoxyethylene alkyl ethers, polyoxyethylene alkyl aryl ethers and the like.

Moreover, generally known surfactants can also be appropriately used. As useful surfactants, there can be mentioned, for example, those described in section et seq of US 2008/0248425 A1.

These surfactants may be used alone or in combination.

The amount of surfactant added is preferably in the range of 0 to 2 mass %, more preferably 0.0001 to 2 mass %, further more preferably 0.0005 to 1 mass %, based on the total solids of the composition.

On the other hand, it is also preferred to reduce the amount of surfactant added to 10 ppm or less, or nil. This enhances the localization of hydrophobic resins in the surface portion, with the result that the hydrophobicity of the surface of the resist film can be increased, thereby enhancing the water tracking property in the stage of liquid-immersion exposure.

<Solvent>

The solvent that is usable in the preparation of the composition is not particularly limited as long as it can dissolve the components of the composition. As the solvent, there can be mentioned, for example, an alkylene glycol monoalkyl ether carboxylate, an alkylene glycol monoalkyl ether, an alkyl lactate, a cyclolactone, a linear or cyclic ketone, an alkylene carbonate, an alkyl carboxylate, an alkyl alkoxyacetate, an alkyl pyruvate and the like. As other useful solvents, there can be mentioned, for example, those described in section [0244] et seq. of US 2008/0248425 A1 and the like.

As preferred alkylene glycol monoalkyl ether carboxylates, there can be mentioned, for example, propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate and ethylene glycol monoethyl ether acetate.

As preferred alkylene glycol monoalkyl ethers, there can be mentioned, for example, propylene glycol monomethyl ether, propylene glycol monoethyl ether, propylene glycol monopropyl ether, propylene glycol monobutyl ether, ethylene glycol monomethyl ether and ethylene glycol monoethyl ether.

As preferred alkyl lactates, there can be mentioned, for example, methyl lactate, ethyl lactate, propyl lactate and butyl lactate.

As preferred alkyl alkoxypropionates, there can be mentioned, for example, ethyl 3-ethoxypropionate, methyl 3-methoxypropionate, methyl 3-ethoxypropionate and ethyl 3-methoxypropionate.

As preferred cyclolactones, there can be mentioned, for example, β-propiolactone, β-butyrolactone, γ-butyrolactone, α-methyl-γ-butyrolactone, β-methyl-γ-butyrolactone, γ-valerolactone, γ-caprolactone, γ-octanoic lactone and α-hydroxy-γ-butyrolactone.

As preferred chain or cyclic ketones, there can be mentioned, for example, 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone and 3-methylcycloheptanone.

As preferred alkylene carbonates, there can be mentioned, for example, propylene carbonate, vinylene carbonate, ethylene carbonate and butylene carbonate.

As preferred alkyl carboxylate, there can be mentioned, for example, butyl acetate.

As preferred alkyl alkoxyacetates, there can be mentioned, for example, acetic acid 2-methoxyethyl ester, acetic acid 2-ethoxyethyl ester, acetic acid 2-(2-ethoxyethoxy)ethyl ester, acetic acid 3-methoxy-3-methylbutyl ester and acetic acid 1-methoxy-2-propyl ester.

As preferred alkyl pyruvates, there can be mentioned, for example, methyl pyruvate, ethyl pyruvate and propyl pyruvate.

As a preferably employable solvent, there can be mentioned 2-heptanone, cyclopentanone, γ-butyrolactone, cyclohexanone, butyl acetate, ethyl lactate, ethylene glycol monoethyl ether acetate, propylene glycol monomethyl ether acetate, propylene glycol monomethyl ether, ethyl 3-ethoxypropionate, ethyl pyruvate, acetic acid 2-ethoxyethyl ester, acetic acid 2-(2-ethoxyethoxy)ethyl ester or propylene carbonate. Especially preferred solvents are propylene glycol monomethyl ether acetate and propylene glycol monomethyl ether.

These solvents may be used alone or in combination. When a plurality of solvents are mixed together, it is preferred to mix a hydroxylated solvent with a non-hydroxylated solvent. The mass ratio of hydroxylated solvent to non-hydroxylated solvent is in the range of 1/99 to 99/1, preferably 10/90 to 90/10 and more preferably 20/80 to 60/40.

The hydroxylated solvent is preferably an alkylene glycol monoalkyl ether. The non-hydroxylated solvent is preferably an alkylene glycol monoalkyl ether carboxylate.

The ratio of solvents used to the total mass of the composition of the present invention can be appropriately regulated in accordance with desired film thickness, etc. Generally, the ratio is regulated so that the concentration of the total solids of the composition falls within the range of 0.5 to 30 mass %, preferably 1.0 to 20 mass % and more preferably 1.5 to 10 mass %.

<Substance that when Acted on by Acid, is Decomposed to Thereby Generate Acid Stronger than Carboxylic Acid>

The composition of the present invention may be loaded with a substance that when acted on by an acid, is decomposed to thereby generate an acid stronger than carboxylic acid (hereinafter also referred to as an "acid amplifier").

It is preferred for the acid generated by the acid amplifier to exhibit a high acid strength. In particular, the dissociation constant (pKa) of the acid is preferably 3 or below, more preferably 2 or below. It is preferred for the acid generated by the acid amplifier to be sulfonic acid.

The acid amplifiers described in International Publication Nos. 95/29968 and 98/24000, JP-A's H8-305262, H9-34106 and H8-248561, Jpn. PCT National Publication No. H8-503082, U.S. Pat. No. 5,445,917, Jpn. PCT National Publication No. H8-503081, U.S. Pat. Nos. 5,534,393, 5,395,736, 5,741,630, 5,334,489, 5,582,956, 5,578,424, 5,453,345 and 5,445,917, European Patent Nos. 665,960, 757,628 and 665,961, U.S. Pat. No. 5,667,943 and JP-A's H10-1508, H10-282642, H9-512498, 2000-62337, 2005-17730 and 2008-209889, etc. can be used individually or in combination as the acid amplifier according to the present invention.

In particular, the compounds of general formulae (1) to (6) below are preferred.

(1)

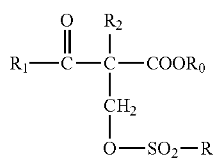

(2)

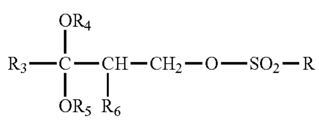

(3)

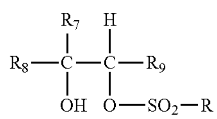

(4)

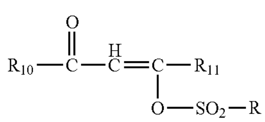

(5)

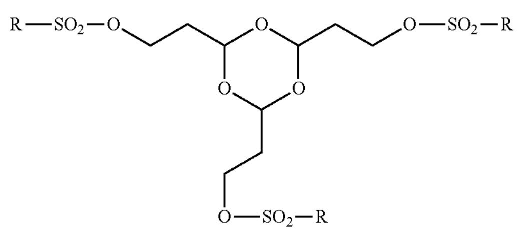

(6)

$$R—SO_2—O—R_{12}$$

In general formulae (1) to (6),

R represents an alkyl group, a monovalent aliphatic hydrocarbon ring group, an aryl group or an aralkyl group.

$R_0$ represents a group that is cleaved under the action of an acid.

$R_1$ represents an alkyl group, a monovalent aliphatic hydrocarbon ring group, an aryl group, an aralkyl group, an alkoxy group or an aryloxy group.

$R_2$ represents an alkyl group or an aralkyl group.

$R_3$ represents an alkyl group, a monovalent aliphatic hydrocarbon ring group, an aryl group or an aralkyl group.

Each of $R_4$ and $R_5$ independently represents an alkyl group, provided that $R_4$ and $R_5$ may be bonded to each other to thereby form a ring.

$R_6$ represents a hydrogen atom or an alkyl group.

$R_7$ represents a hydrogen atom, an alkyl group, a monovalent aliphatic hydrocarbon ring group, an aryl group or an aralkyl group.

$R_8$ represents an alkyl group, a monovalent aliphatic hydrocarbon ring group, an aryl group or an aralkyl group.

$R_9$ represents a hydrogen atom, an alkyl group, a monovalent aliphatic hydrocarbon ring group, an aryl group or an aralkyl group.

$R_9$ and $R_7$ may be bonded to each other to thereby form a ring.

$R_{10}$ represents an alkyl group, a monovalent aliphatic hydrocarbon ring group, an alkoxy group, an aryl group, an aralkyl group, an aryloxy group or an alkenyloxy group.

$R_{11}$ represents an alkyl group, a monovalent aliphatic hydrocarbon ring group, an alkoxy group, an aryl group, an aralkyl group, an aryloxy group or an alkenyl group.

$R_{10}$ and $R_{11}$ may be bonded to each other to thereby form a ring.

$R_{12}$ represents an alkyl group, a monovalent aliphatic hydrocarbon ring group, an aryl group, an alkenyl group, an alkynyl group or a cycloimido group.

In general formulae (1) to (6), the alkyl group can be one having 1 to 8 carbon atoms; the monovalent aliphatic hydrocarbon ring group can be a monocyclic or polycyclic one having 4 to 10 carbon atoms; the aryl group can be one having 6 to 14 carbon atoms; the aralkyl group can be one having 7 to 20 carbon atoms; the alkoxy group can be one having 1 to 8 carbon atoms; the alkenyl group can be one having 2 to 6 carbon atoms; the aryloxy group can be one having 6 to 14 carbon atoms; and the alkenyloxy group can be one having 2 to 8 carbon atoms.

Further substituents may be introduced in these substituents. As examples of such further substituents, there can be mentioned a halogen atom such as Cl, Br or F, a —CN group, an —OH group, an alkyl group having 1 to 4 carbon atoms, a cycloalkyl group having 3 to 8 carbon atoms, an alkoxy group having 1 to 4 carbon atoms, an acylamino group such as an acetylamino group, an aralkyl group such as a benzyl group or a phenethyl group, an aryloxyalkyl group such as a phenoxyethyl group, an alkoxycarbonyl group having 2 to 5 carbon atoms, an acyloxy group having 2 to 5 carbon atoms and the like.

As the ring formed by the mutual bonding of $R_4$ and $R_5$, there can be mentioned a 1,3-dioxorane ring, a 1,3-dioxane ring and the like.

As the ring formed by the mutual bonding of $R_7$ and $R_9$, there can be mentioned a cyclopentyl ring, a cyclohexyl ring and the like.

As the ring formed by the mutual bonding of $R_{10}$ and $R_{11}$, there can be mentioned a 3-oxocyclohexenyl ring, a 3-oxoindenyl ring and the like, in which an oxygen atom may be contained in the ring.

As the group cleaved under the action of an acid, contained in $R_0$, there can be mentioned, for example, a tertiary alkyl group, such as a t-butyl group or a t-amyl group; an isobornyl group; a 1-alkoxyethyl group, such as a 1-ethoxyethyl group, a 1-butoxyethyl group, a 1-isobutoxyethyl group or a 1-cyclohexyloxyethyl group; an alkoxymethyl group, such as a 1-methoxymethyl group or a 1-ethoxymethyl group; a tetrahydropyranyl group; a tetrahydrofuranyl group; a trialkylsilyl group; a 3-oxocyclohexyl group; and the like.

Preferred examples of the groups represented by R, $R_0$ and $R_1$ to $R_{11}$ are as follows.

R: a methyl group, an ethyl group, a propyl group, a butyl group, an octyl group, a trifluoromethyl group, a nonafluorobutyl group, a heptadecafluorooctyl group, a 2,2,2-trifluoroethyl group, a phenyl group, a pentafluorophenyl group, a methoxyphenyl group, a toluoyl group, a mesityl group, a fluorophenyl group, a naphthyl group, a cyclohexyl group or a camphor group.

$R_0$: a t-butyl group, a methoxymethyl group, an ethoxymethyl group, a 1-ethoxyethyl group or a tetrahydropyranyl group.

$R_1$: a methyl group, an ethyl group, a propyl group, a cyclopropyl group, a cyclopentyl group, a cyclohexyl group, a phenyl group, a naphthyl group, a benzyl group, a phenethyl group, a methoxy group, an ethoxy group, a propoxy group, a phenoxy group or a naphthoxy group.

$R_2$: a methyl group, an ethyl group, a propyl group, a butyl group or a benzyl group.

$R_3$: a methyl group, an ethyl group, a propyl group, a cyclopropyl group, a cyclopentyl group, a cyclohexyl group, a phenyl group, a naphthyl group, a benzyl group, a phenethyl group or a naphthylmethyl group.

$R_4$, $R_5$: a methyl group, an ethyl group, a propyl group, or, formed by mutual bonding thereof, an ethylene group or propylene group.

$R_6$: a hydrogen atom, a methyl group or an ethyl group.

$R_7$, $R_9$: a hydrogen atom, a methyl group, an ethyl group, a propyl group, a butyl group, a pentyl group, a cyclopropyl group, a cyclopentyl group, a cyclohexyl group, a phenyl group, a naphthyl group, a benzyl group, a phenethyl group, or, formed by the mutual bonding thereof, a cyclopentyl ring or cyclohexyl ring.

$R_8$: a methyl group, an ethyl group, an isopropyl group, a t-butyl group, a neopentyl group, a cyclohexyl group, a phenyl group or a benzyl group.

$R_{10}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyloxy group, a methylvinyloxy group, or, formed by the mutual bonding thereof, a 3-oxocyclohexenyl ring or 3-oxoindenyl ring in which an oxygen atom may be contained.

$R_{11}$: a methyl group, an ethyl group, a propyl group, an isopropyl group, a butyl group, an isobutyl group, a cyclopropyl group, a cyclopentyl group, a cyclohexyl group, a methoxy group, an ethoxy group, a phenyl group, a naphthyl group, a benzyl group, a phenoxy group, a naphthoxy group, a vinyl group, an allyl group, or, formed by the mutual bonding thereof, a 3-oxocyclohexenyl ring or 3-oxoindenyl ring in which an oxygen atom may be contained.

In general formula (6), when $R_{12}$ is an alkyl group, the alkyl group is preferably a linear one having 1 to 12 carbon atoms or a branched one having 3 to 12 carbon atoms.

When $R_{12}$ is a monovalent aliphatic hydrocarbon ring group, the monovalent aliphatic hydrocarbon ring group is preferably a monocyclic or polycyclic one having 5 to 10 carbon atoms.

When $R_{12}$ is a substituted alkyl group or a substituted aliphatic hydrocarbon ring group, a monovalent nonmetallic atomic group excluding hydrogen is used as the substituent. As preferred examples of such substituents, there can be mentioned a halogen atom (—F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonoxy group, a phosphonatoxy group, an aryl group, an alkenyl group and the like.

When $R_{12}$ is an aryl group, as the aryl group, there can be mentioned a condensed ring formed by 1 to 3 benzene rings or a condensed ring formed by a benzene ring and a 5-membered unsaturated ring. Specific examples thereof include a phenyl group, a naphthyl group, an anthryl group, a phenanthryl group, an indenyl group, an acenaphthenyl group, a fluorenyl group and the like. Among these, a phenyl group and a naphthyl group are preferred. The aryl groups include not only the above carbon-ring aryl groups but also heterocyclic aryl groups. As the heterocyclic aryl groups, there can be mentioned those each containing 3 to 20 carbon atoms and 1 to 5 heteroatoms, such as a pyridyl group and a furyl group as well as, resulting from condensation with a benzene ring, a quinolyl group, benzofuryl group, thioxanthone group and carbazole group.

When $R_{12}$ is a substituted aryl group, as the substituted aryl group, use is made of one resulting from the introduction of, as a substituent, a monovalent nonmetallic atomic group excluding hydrogen in a ring-constructing carbon atom of the above aryl group. Examples of preferred substituents are the same as set forth above with respect to the alkyl group and cycloalkyl group.

When $R_{12}$ is an alkenyl group, a substituted alkenyl group [$—C(R_{14})═C(R_{15})(R_{16})$], an alkynyl group or a substituted alkynyl group [$—C≡C(R_{17})$], $R_{14}$ to $R_{17}$ can be monovalent nonmetallic atomic groups. As preferred examples of the substituents represented by $R_{14}$ to $R_{17}$, there can be mentioned a hydrogen atom, a halogen atom, an alkyl group, a substituted alkyl group, an aryl group and a substituted aryl group. As specific examples thereof, there can be mentioned those set forth above by way of example. As more preferred substituents represented by $R_{14}$ to $R_{17}$, there can be mentioned a hydrogen atom, a halogen atom and a linear, branched or cyclic alkyl group having 1 to 10 carbon atoms.

When $R_{12}$ is a cycloimido group, as the cycloimido, there can be mentioned one having 4 to 20 carbon atoms, such as succinimido, phthalimido, cyclohexanedicarboxyimido or norbornenedicarboxyimido.

As specific examples of the compounds of general formulae (1) to (6), there can be mentioned the compounds (1-1) to (1-11), (2-1) to (2-6), (3-1) to (3-6), (4-1) to (4-7), (5-1) to (5-4) and (6-1) to (6-20) set forth as examples in section [0215] et seq. of JP-A-2008-209889.

<Other Component>

The composition of the present invention can be appropriately loaded with, in addition to the above components, an onium salt of carboxylic acid, any of the dissolution inhibiting compounds of 3000 or less molecular weight described in, for example, Proceeding of SPIE, 2724,355 (1996), a dye, a plasticizer, a photosensitizer, a light absorber, etc.

[Method of Forming Pattern]

In the use of the composition of the present invention, the above components are dissolved in a solvent, filtered and applied onto a support.

The filter medium preferably consists of a polytetrafluoroethylene, polyethylene or nylon having a pore size of 0.1 μm or less, more preferably 0.05 μm or less and further more preferably 0.03 μm or less.

The thickness of formed film is not particularly limited. However, the thickness is preferably in the range of 0.01 to 0.2 μm, more preferably 0.02 to 0.1 μm.

The method of application onto a substrate is preferably a spin coating method, in which the rotating speed is preferably in the range of 1000 to 3000 rpm.

The composition is applied onto a substrate, such as one for use in the production of integrated circuit elements, photomasks, imprint molds, etc. (e.g., silicon/silicon dioxide coating), by appropriate application means, such as a spinner. Thereafter, the applied composition is dried to thereby obtain a photosensitive film.

This film is exposed through a given mask to actinic rays or radiation, preferably baked (heated), developed and rinsed. Thus, a favorable pattern can be obtained. When the film is exposed to an electron beam, lithography without a mask (direct lithography) is generally carried out.

With respect to the particulars of the fabrication of an imprint mold structure using the composition of the present invention, reference can be made to, for example, "Fundamentals of nanoimprint and its technology development/application deployment—technology of nanoimprint substrate and its latest technology deployment" edited by Yoshihiko Hirai, published by Frontier Publishing (issued in June, 2006), Japanese Patent No. 4109085 and JP-A-2008-162101.

The actinic rays or radiation is not particularly limited, and, for example, a KrF excimer laser, an ArF excimer laser, EUV light, an electron beam and the like can be preferably used. EUV light and an electron beam are most preferred.

In the development step, an alkali developer is generally used. Generally, a quaternary ammonium salt, typically tetramethylammonium hydroxide, is used in the alkali developer for the development step. The alkali developer is not limited to this, and use can be made of an aqueous solution of an alkali selected from among an inorganic alkali (for example, sodium hydroxide, potassium hydroxide, sodium carbonate, sodium silicate, sodium metasilicate and the like), a primary to tertiary amine (for example, ethylamine, n-propylamine, diethylamine, di-n-butylamine, triethylamine, methyldiethylamine and the like), an alcoholamine (for example, dimethylethanolamine, triethanolamine and the like), a cycloamine (for example, pyrrole, piperidine and the like) and the like.

Before the use of the above alkali developer, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

Pure water can be used as the rinse liquid. Before the use, an appropriate amount of surfactant may be added thereto.

Prior to the formation of a film, the substrate may be coated with an antireflection film. As the antireflection film, use can be made of not only an inorganic film of titanium, titanium oxide, titanium nitride, chromium oxide, carbon, amorphous silicon and the like but also an organic film composed of a light absorber and a polymer material. Also, as the organic antireflection film, use can be made of commercially available organic antireflection films, such as the DUV30 Series and DUV40 Series produced by Brewer Science Inc. and AR-2, AR-3 and AR-5 produced by Shipley Co., Ltd.

The present invention will be described in greater detail below by way of its examples. However, the gist of the present invention is in no way limited to these examples.

SYNTHETIC EXAMPLE 1

Synthesis of Compound M-I-1

First, 100.00 parts by mass of p-acetoxystyrene was dissolved in 400 parts by mass of ethyl acetate, and cooled to 0° C. Subsequently, 47.60 parts by mass of sodium methoxide (28% methanol solution) was dropped into the cooled solution over a period of 30 minutes, and agitated at room temperature for five hours. Ethyl acetate was added, and the resultant organic phase was washed with distilled water thrice. The washed organic phase was dried over anhydrous sodium sulfate, and the solvent was distilled off. Thus, 131.70 parts by mass of p-hydroxystyrene (54% ethyl acetate solution) was obtained.

From the obtained p-hydroxystyrene (54% ethyl acetate solution), 18.52 parts by mass was taken and was dissolved in 56.00 parts by mass of ethyl acetate. Subsequently, 31.58 parts by mass of 1,1,2,2,3,3-hexafluoropropane-1,3-disulfonyl difluoride was added to the solution and cooled to 0° C. A solution obtained by dissolving 12.63 parts by mass of triethylamine in 25.00 parts by mass of ethyl acetate was dropped into the mixture over a period of 30 minutes, and agitated while cooling at 0° C. for four hours. Ethyl acetate was added, and the resultant organic phase was washed with saturated saline thrice. The washed organic phase was dried over anhydrous sodium sulfate, and the solvent was distilled off. Thus, 32.90 parts by mass of compound A was obtained.

Thereafter, 35.00 parts by mass of compound A was dissolved in 315 parts by mass of methanol and cooled to 0° C., and 245 parts by mass of 1N aqueous sodium hydroxide solution was added. The mixture was agitated at room temperature for two hours, and the solvent was distilled off. Ethyl acetate was added, and the resultant organic phase was washed with saturated saline thrice. The washed organic phase was dried over anhydrous sodium sulfate, and the solvent was distilled off, thereby obtaining 34.46 parts by mass of compound B.

Finally, 28.25 parts by mass of obtained compound B was dissolved in 254.25 parts by mass of methanol, and 23.34 parts by mass of triphenylsulfonium bromide was added to the solution. The mixture was agitated at room temperature for three hours. The solvent was distilled off, and distilled water was added to the residue and extracted with chloroform three times. The thus obtained organic phase was washed with distilled water thrice. The solvent was distilled off, thereby obtaining 42.07 parts by mass of desired compound (M-I-1).

SYNTHETIC EXAMPLE 2

Synthesis of Monomer M-II-24

First, 13.9 parts by mass of N-(4-hydroxyphenylethyl) methacrylamide and 21.4 parts by mass of 1,1,2,2,3,3-hexafluoropropane-1,3-disulfonyl difluoride were dissolved in 160 parts by mass of THF, and 160 parts by mass of triethylamine was added to the solution. The mixture was agitated at 50° C. for two hours, and 11.1 parts by mass of trifluoromethanesulfonamide was added. The mixture was further agitated at 80° C. for four hours. Ethyl acetate was added, and the resultant organic phase was sequentially washed with dilute hydrochloric acid and water. The washed organic phase was dried over sodium sulfate.

The solvent was evaporated off, and the residual brown oil was dissolved in 400 parts by mass of methanol. To the solution, 20 parts by mass of solid sodium hydrogen carbonate was added, and agitated at 50° C. for four hours. Ethyl acetate was added, and the resultant organic phase was sequentially washed with saturated saline and water. The washed organic phase was dried over sodium sulfate, thereby obtaining 24.5 parts by mass of, in the form of a brown oil, N-(trifluoromethanesulfonyl)-1,1,2,2,3,3-hexafluoro-3-((4-(2-(methacrylamido)ethyl)phenoxy)sulfonyl)-1-propanesulfonamide sodium salt. Then, 24.4 parts by mass of obtained brown oil was dissolved in 200 parts by mass of methanol, and 12.9 parts by mass of triphenylsulfonium bromide was added to the solution. The mixture was agitated at room temperature for three hours. Chloroform amounting to 400 parts by mass was added, and the resultant organic phase was washed with water. The solvent was evaporated off, thereby obtaining 27.9 parts by mass of brown transparent oily compound (M-II-24).

Other monomers M-I-29, M-I-34, M-I-43, M-I-75, M-I-89, M-I-92, M-II-28, M-II-69, M-I-96, M-III-15, M-III-41, M-III-92, M-III-100, M-IV-1 and M-IV-2 were also synthesized in the same manner as described above.
M-I-1
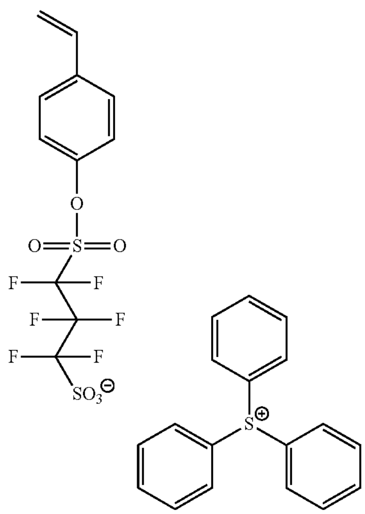
M-I-29
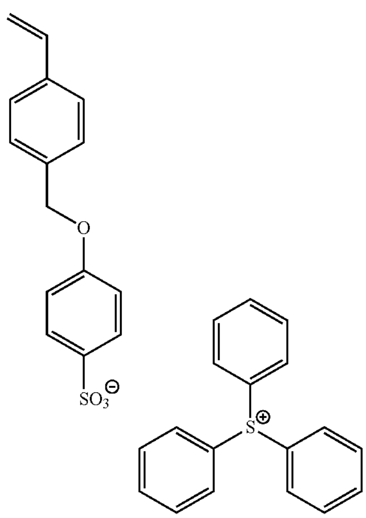
M-I-34
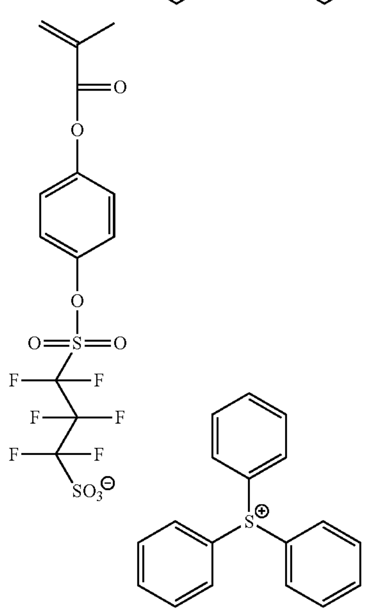
-continued
M-I-43
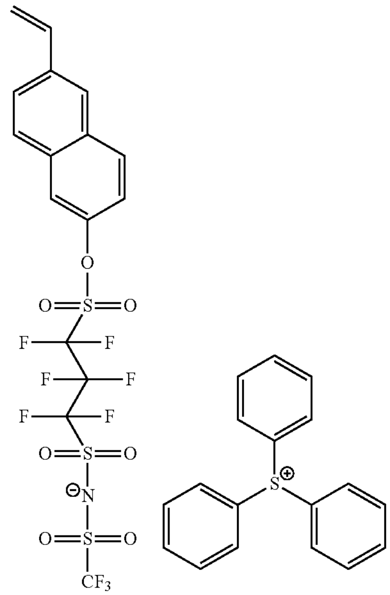
M-I-75
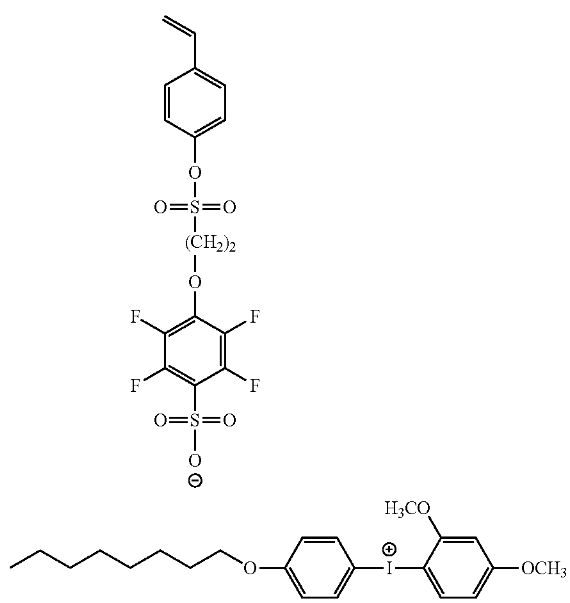

-continued
M-I-89
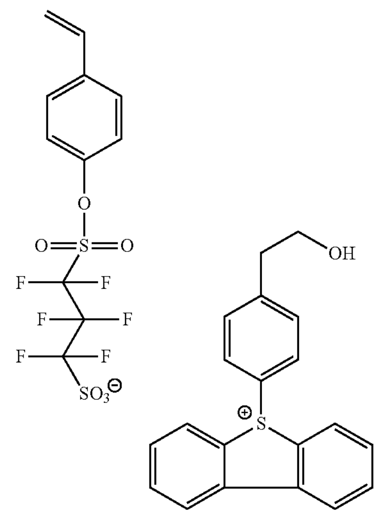
M-I-92
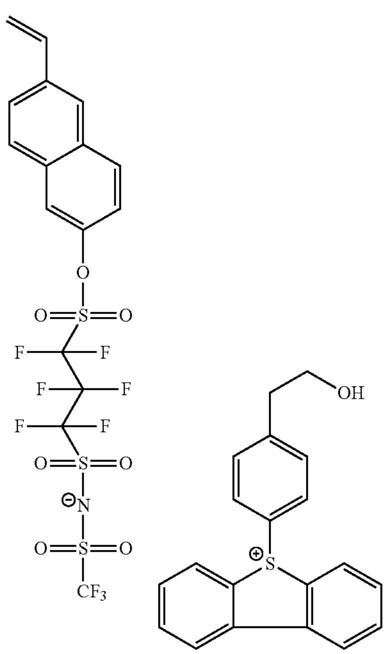
-continued
M-I-24
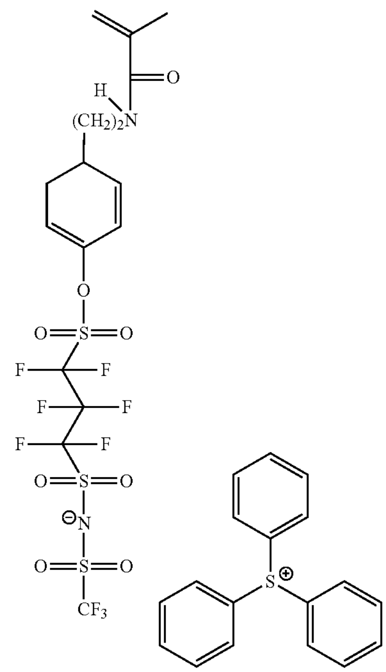
M-I-28
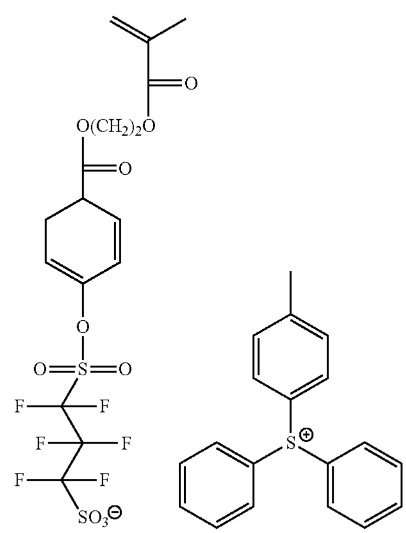

-continued
M-I-69
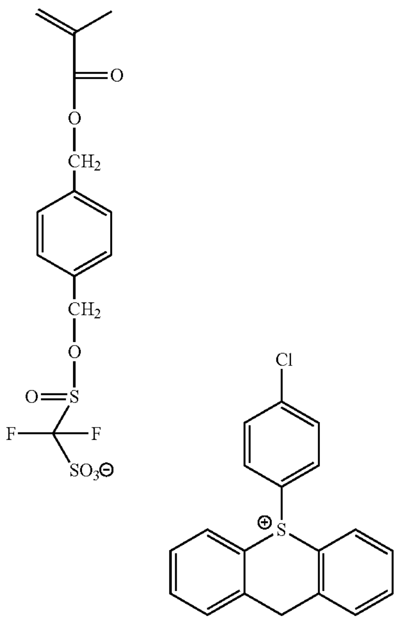
M-I-96
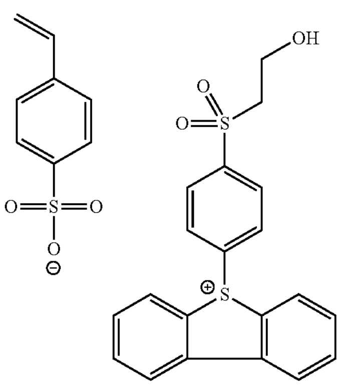
M-III-15
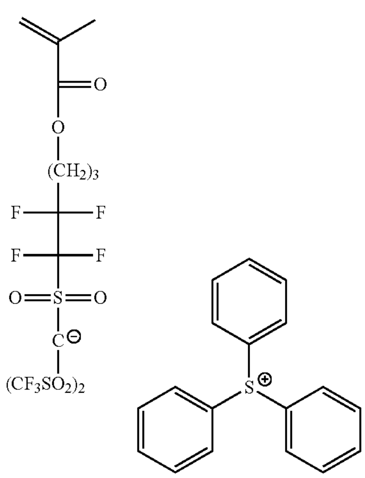
-continued
M-III-41
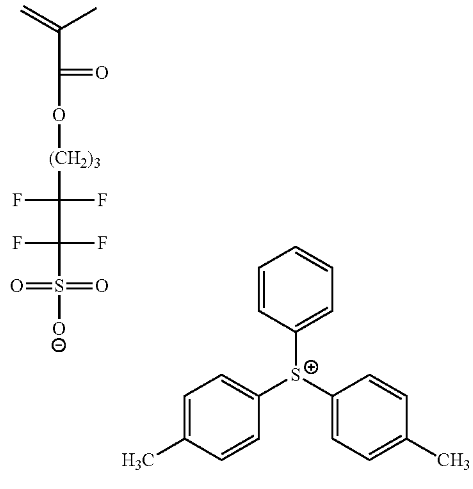
M-III-92
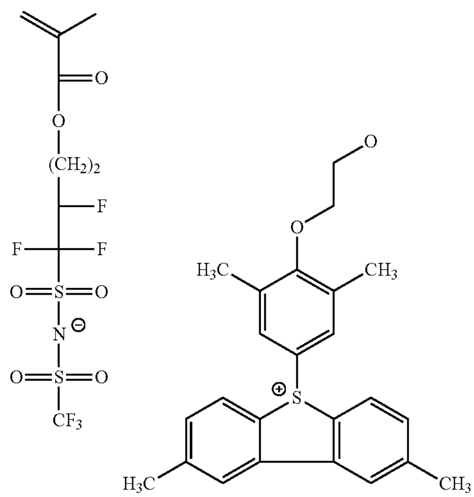
M-III-100
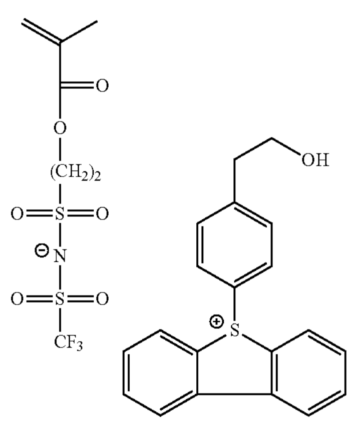

-continued

M-IV-1

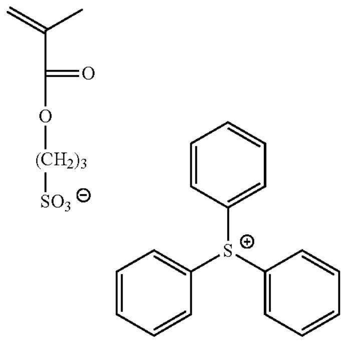

M-IV-2

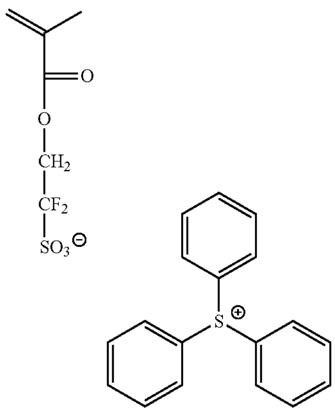

SYNTHETIC EXAMPLE 3

Synthesis of Resin P-1

In a nitrogen stream, 9.33 parts by mass of 1-methoxy-2-propanol was heated at 80° C. While agitating the liquid, a mixed solution consisting of 2.85 parts by mass of monomer M-I-29 expressed by general formula (I), 5.66 parts by mass of monomer of structural formula A below, 4.06 by mass of monomer of structural formula B below, 7.43 by mass of monomer of structural formula C below, 37.33 parts by mass of 1-methoxy-2-propanol and 2.37 parts by mass of dimethyl 2,2'-azobisisobutyrate (V601 produced by Wako Pure Chemical Industries, Ltd.) was dropped thereinto over a period of two hours. After the completion of the dropping, the mixture was further agitated at 80° C. for four hours. The thus obtained reaction liquid was allowed to stand still to cool, and the cooled reaction liquid was recrystallized from a large volume of hexane/ethyl acetate and dried in vacuum, thereby obtaining 11.8 parts by mass of resin P-1 according to the present invention.

M-I-29

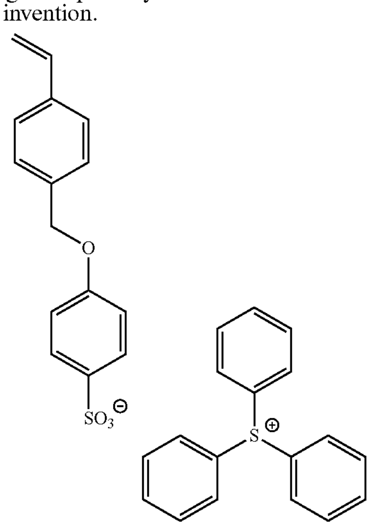

-continued

A

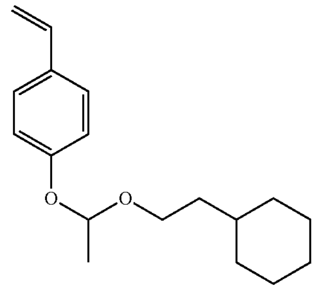 [SMILES: C=Cc1ccc(OC(C)OCCC2CCCCC2)cc1]

B

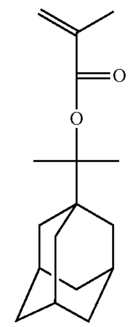

C

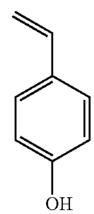

(P-1)

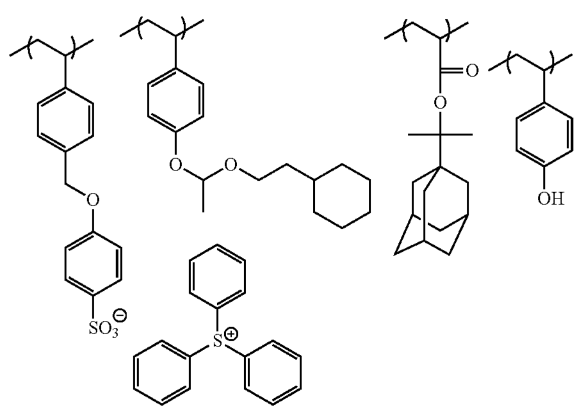

The weight average molecular weight (Mw: polystyrene equivalent) of the obtained resin as determined by GPC (carrier: N-methyl-2-pyrrolidone (NMP)) was 6600, and the dispersity (Mw/Mn) thereof was 1.63.

Resins P-2 to P-24 were synthesized in the same manner as described above. With respect to each of the syntheses, the employed monomer structures, component ratio, weight average molecular weight and dispersity are listed in Table given below.

| Resin | Component 1 | Component 2 |
| --- | --- | --- |
| P-1 | M-I-29 | 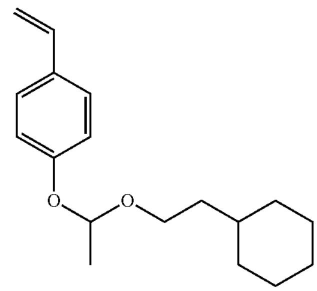 |
| P-2 | M-III-15 | 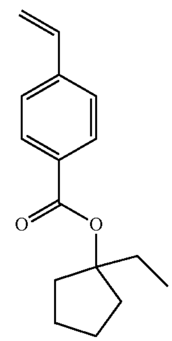 [SMILES: C=Cc1ccc(C(=O)OC2(CC)CCCC2)cc1] |
| P-3 | M-I-34 | 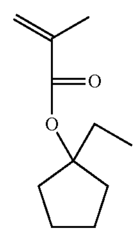 |
| P-4 | M-II-28 | 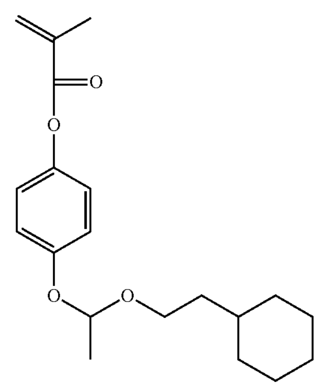 [SMILES: C=C(C)C(=O)Oc1ccc(OC(C)OCCC2CCCCC2)cc1] |
| P-5 | M-I-1 | 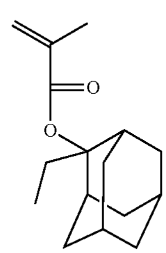 [SMILES: C=C(C)C(=O)OC1(CC)C2CC3CC(C2)CC1C3] |

-continued
| | | |
|---|---|---|
| P-6 | M-I-92 | 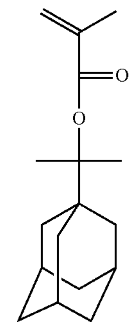 |
| P-7 | M-II-69 | 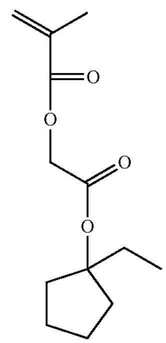 [SMILES: C=C(C)C(=O)OCC(=O)OC1(CC)CCCC1] |
| P-8 | M-III-41 | 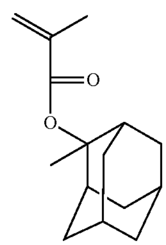 [SMILES: C=C(C)C(=O)OC1(C)C2CC3CC(C2)CC1C3] |
| P-9 | M-III-92 | 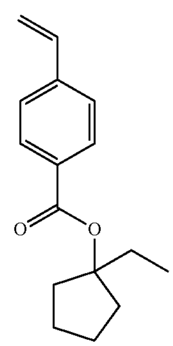 [SMILES: C=Cc1ccc(C(=O)OC2(CC)CCCC2)cc1] |
| P-10 | M-I-96 | 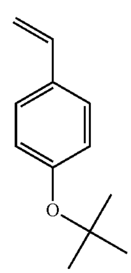 |

-continued
| | | |
|---|---|---|
| P-11 | M-II-24 | 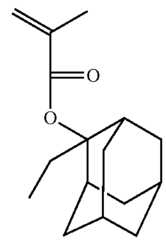 [SMILES: C=C(C)C(=O)OC1(CC)C2CC3CC(C2)CC1C3] |
| P-12 | M-I-89 | 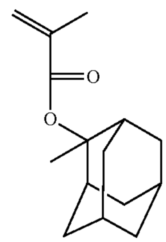 [SMILES: C=C(C)C(=O)OC1(C)C2CC3CC(C2)CC1C3] |
| P-13 | M-I-43 | 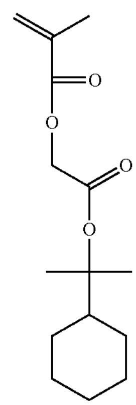 |
| P-14 | M-I-89 | 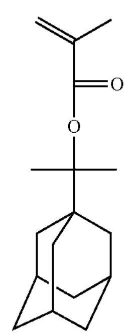 |
| P-15 | M-III-100 | 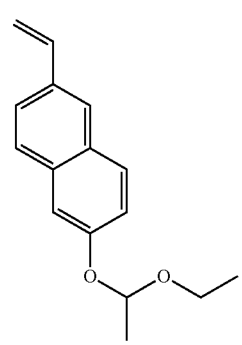 [SMILES: C=Cc1ccc2cc(OC(C)OCC)ccc2c1] |

-continued
P-16 M-I-75
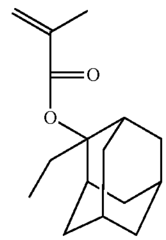 [SMILES: C=C(C)C(=O)OC1(CC)C2CC3CC(C2)CC1C3]
P-17 M-III-31
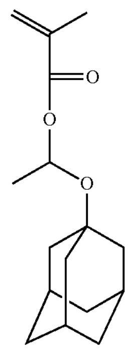 [SMILES: C=C(C)C(=O)OC(C)OC12CC3CC(CC(C3)C1)C2]
P-18 M-III-32
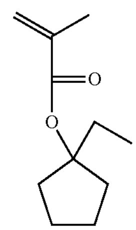
P-19 M-III-100
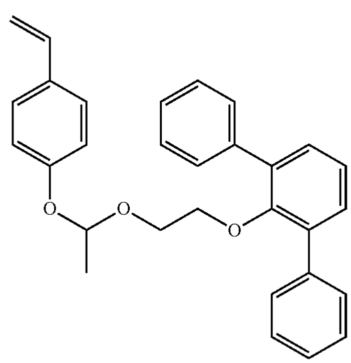 [SMILES: C=Cc1ccc(OC(C)OCCOc2c(-c3ccccc3)cccc2-c2ccccc2)cc1]
P-20 M-I-92
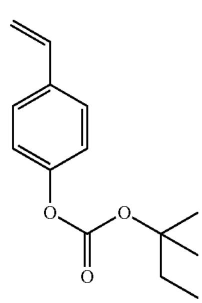 [SMILES: C=Cc1ccc(OC(=O)OC(C)(C)CC)cc1]

-continued
| | | |
|---|---|---|
| P-21 | None | 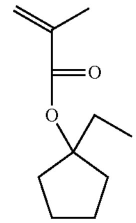 |
| P-22 | 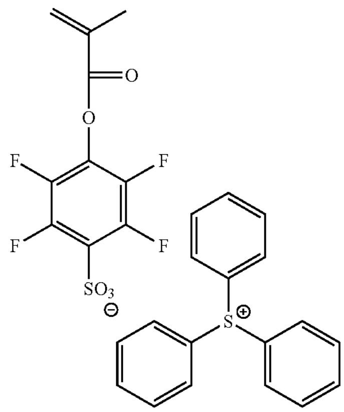 | 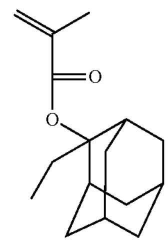 [SMILES: C=C(C)C(=O)OC1(CC)C2CC3CC(C2)CC1C3] |
| P-23 | 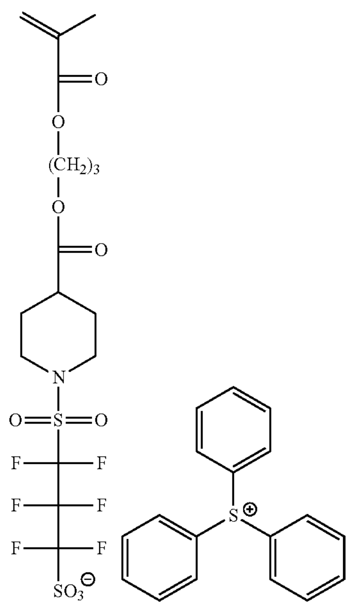 | 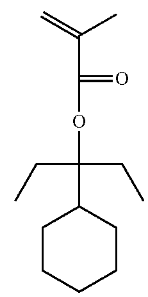 [SMILES: C=C(C)C(=O)OC(CC)(CC)C1CCCCC1] |
| P-24 | 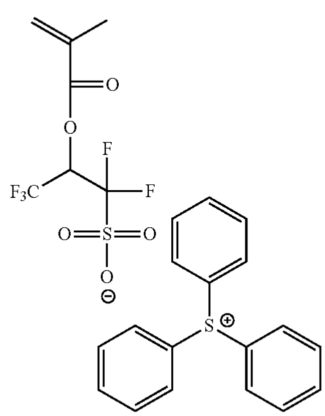 [SMILES: C=C(C)C(=O)OC(C(F)(F)F)C(F)(F)S(=O)(=O)[O-] ; c1ccc([S+](c2ccccc2)c2ccccc2)cc1] | 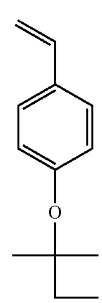 |

-continued
| Resin | Component 3 | Component 4 | Component 5 |
|---|---|---|---|
| P-1 | 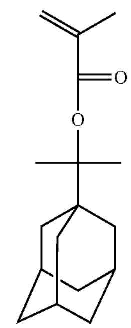 [SMILES: C=C(C)C(=O)OC(C)(C)C12CC3CC(CC(C3)C1)C2] | 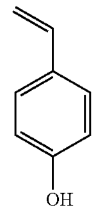 | |
| P-2 | 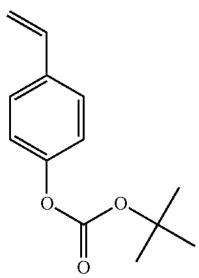 [SMILES: C=Cc1ccc(OC(=O)OC(C)(C)C)cc1] | 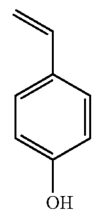 | |
| P-3 | 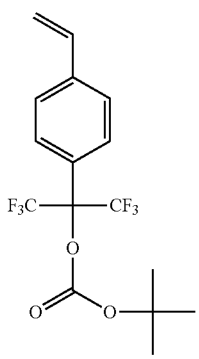 [SMILES: C=Cc1ccc(C(OC(=O)OC(C)(C)C)(C(F)(F)F)C(F)(F)F)cc1] | 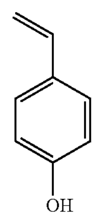 | |
| P-4 | 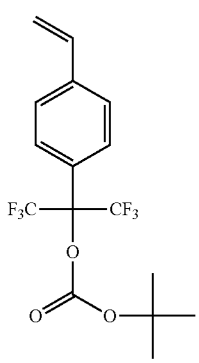 [SMILES: C=Cc1ccc(C(OC(=O)OC(C)(C)C)(C(F)(F)F)C(F)(F)F)cc1] | 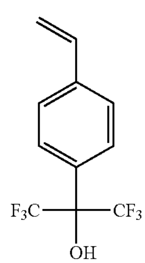 [SMILES: C=Cc1ccc(C(O)(C(F)(F)F)C(F)(F)F)cc1] | 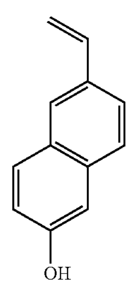 |

-continued
P-5
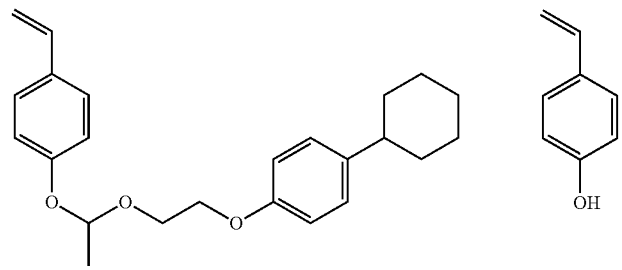
P-6
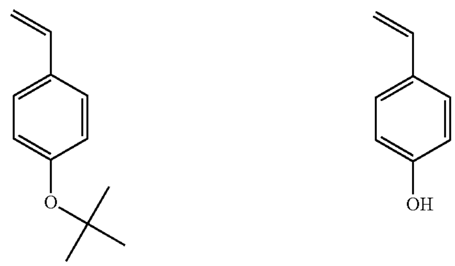
P-7
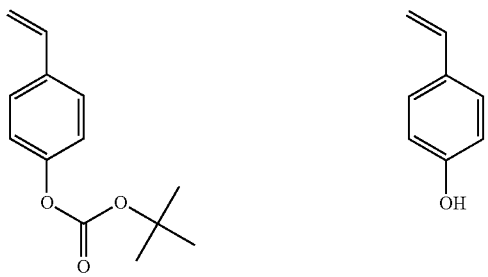
P-8
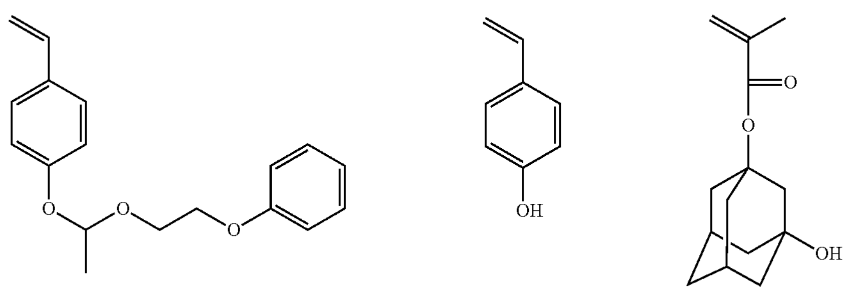
P-9
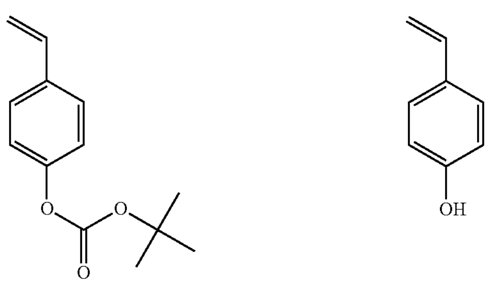

-continued
P-10
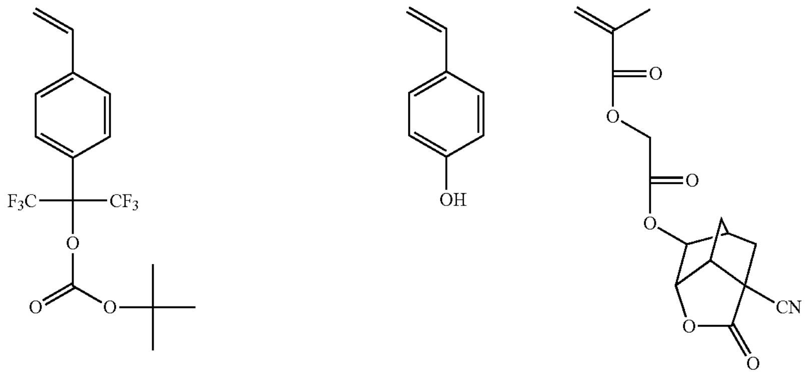
P-11
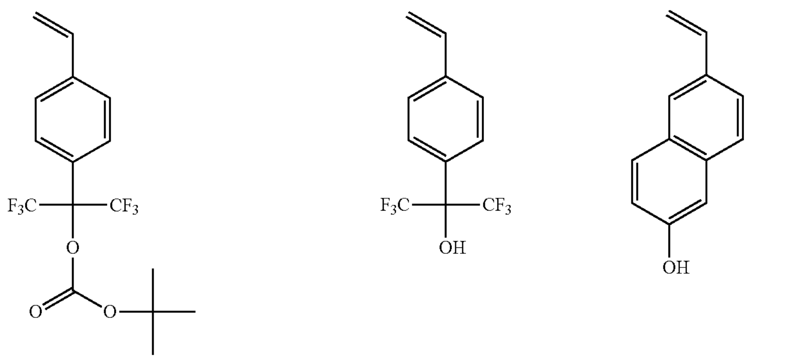
P-12
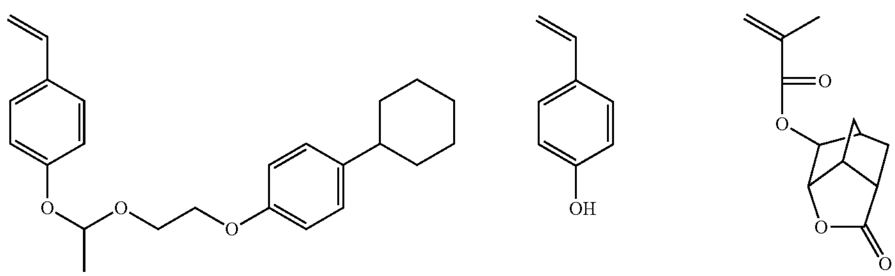
P-13
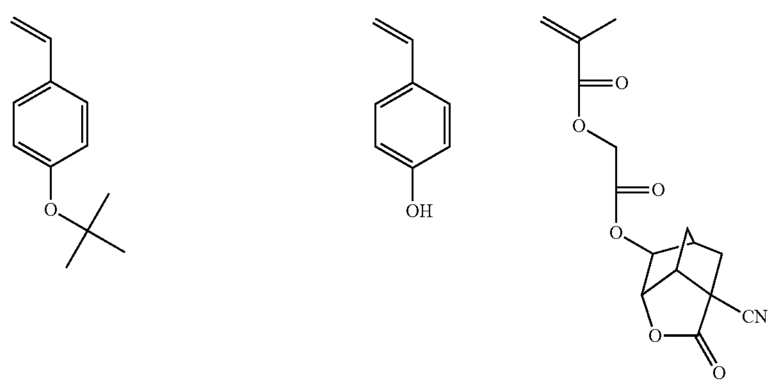

-continued
P-14
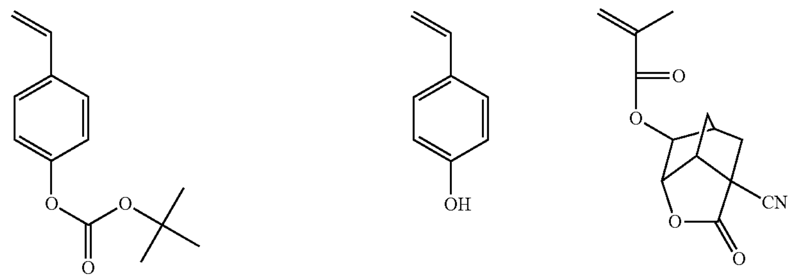
P-15
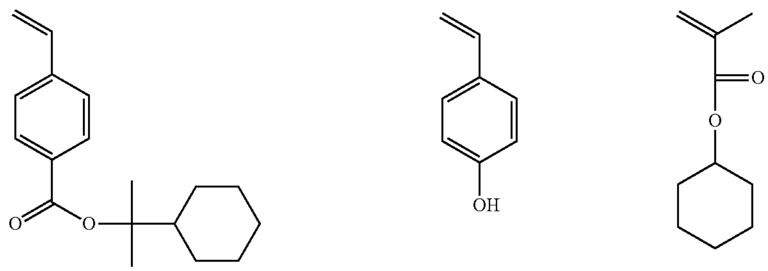
P-16
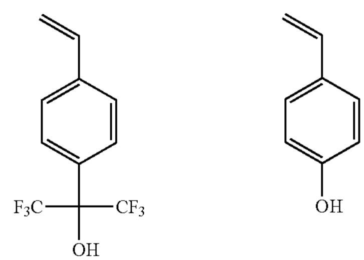
P-17
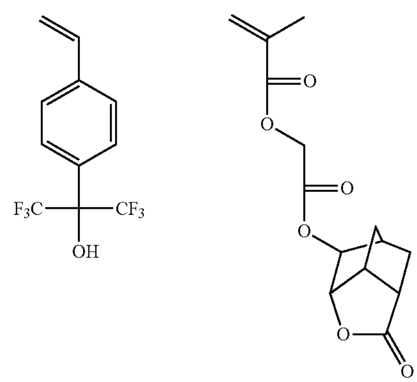
P-18
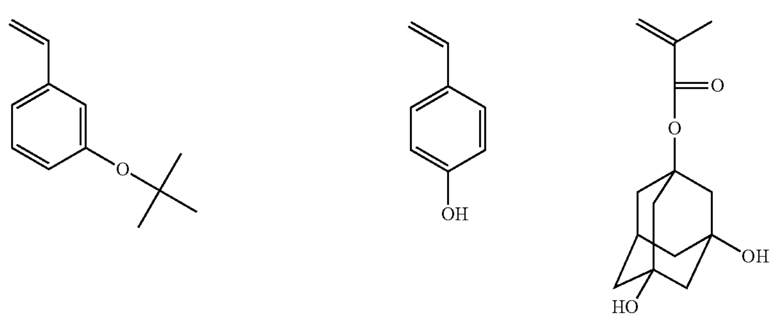

-continued
P-19
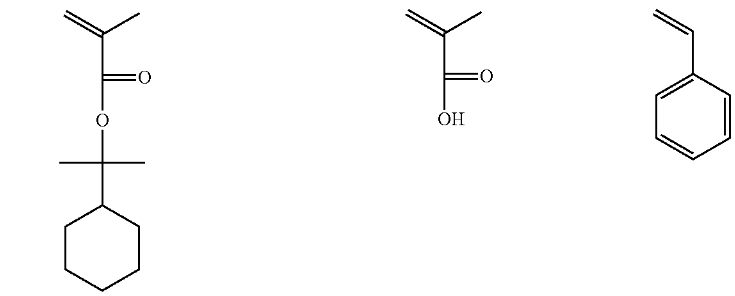
P-20
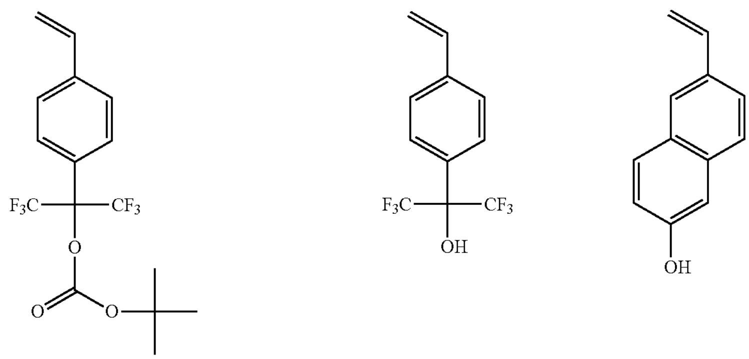
P-21
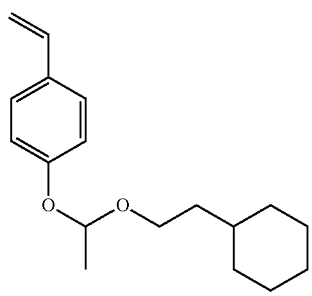 [SMILES: C=Cc1ccc(OC(C)OCCC2CCCCC2)cc1]
P-22
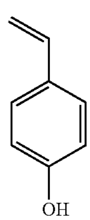
P-23
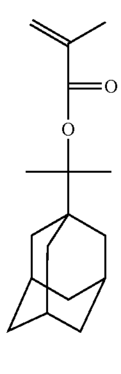 [SMILES: C=C(C)C(=O)OC(C)(C)C12CC3CC(CC(C3)C1)C2]

-continued
| | | | |
|---|---|---|---|
| P-24 | 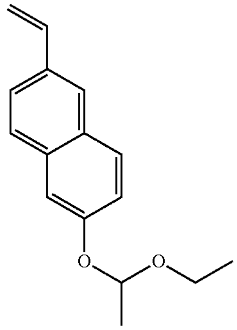 [SMILES: C=Cc1ccc2cc(OC(C)OCC)ccc2c1] | 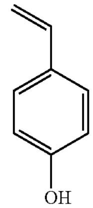 | |
| Resin | Component 6 | Comp. ratio (molar ratio) | Mw | Mw/Mn |
|---|---|---|---|---|
| P-1 | | 5/20/15/60 | 6600 | 1.63 |
| P-2 | | 10/20/15/55 | 10200 | 1.75 |
| P-3 | | 5/10/25/60 | 7200 | 1.78 |
| P-4 | | 10/15/15/40/20 | 6400 | 1.68 |
| P-5 | | 5/20/15/60 | 6300 | 1.64 |
| P-6 | | 10/15/20/55 | 7500 | 1.74 |
| P-7 | | 5/20/20/55 | 9100 | 1.71 |
| P-8 | | 10/15/15/55/5 | 6400 | 1.73 |
| P-9 | | 5/25/10/60 | 8700 | 1.69 |
| P-10 | | 10/15/15/55/5 | 6800 | 1.73 |
| P-11 | 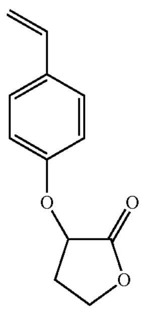 | 5/15/10/50/10/10 | 5200 | 1.72 |
| P-12 | | 5/20/10/50/15 | 6800 | 1.64 |
| P-13 | | 10/15/15/50/10 | 6300 | 1.76 |
| P-14 | | 10/15/10/45/20 | 7700 | 1.83 |
| P-15 | | 5/20/15/57/3 | 7300 | 1.71 |
| P-16 | 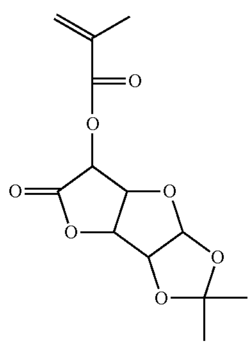 [SMILES: C=C(C)C(=O)OC1C(=O)OC2C3OC(C)(C)OC3OC12] | 7/15/15/10/50/3 | 8200 | 1.73 |
| P-17 | 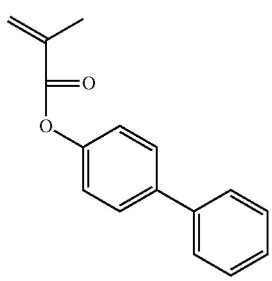 [SMILES: C=C(C)C(=O)Oc1ccc(-c2ccccc2)cc1] | 7/15/15/55/5/3 | 7500 | 1.74 |
| P-18 | | 10/20/15/50/5 | 9900 | 1.70 |

-continued
| | | | | |
|---|---|---|---|---|
| P-19 | 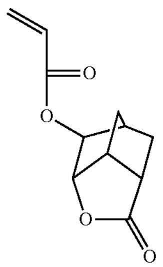 | 10/25/25/5/15/10 | 6900 | 1.76 |
| P-20 | | 5/20/15/40/20 | 8300 | 1.74 |
| P-21 | | 20/20/60 | 7600 | 1.79 |
| P-22 | | 5/35/60 | 5500 | 1.65 |
| P-23 | | 5/40/55 | 8900 | 1.73 |
| P-24 | | 5/20/20/55 | 9600 | 1.71 |
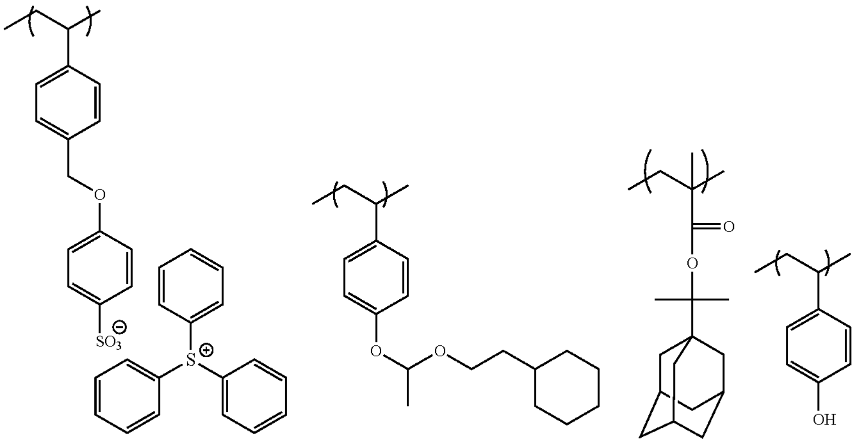
(P-1)
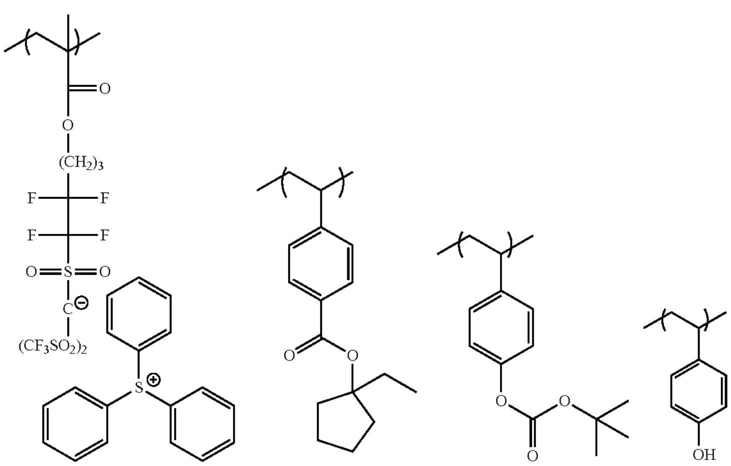
(P-2)

-continued
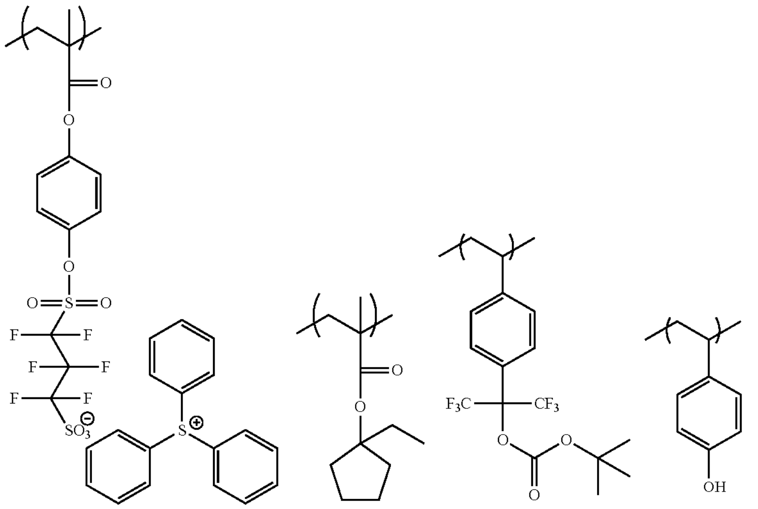
(P-3)
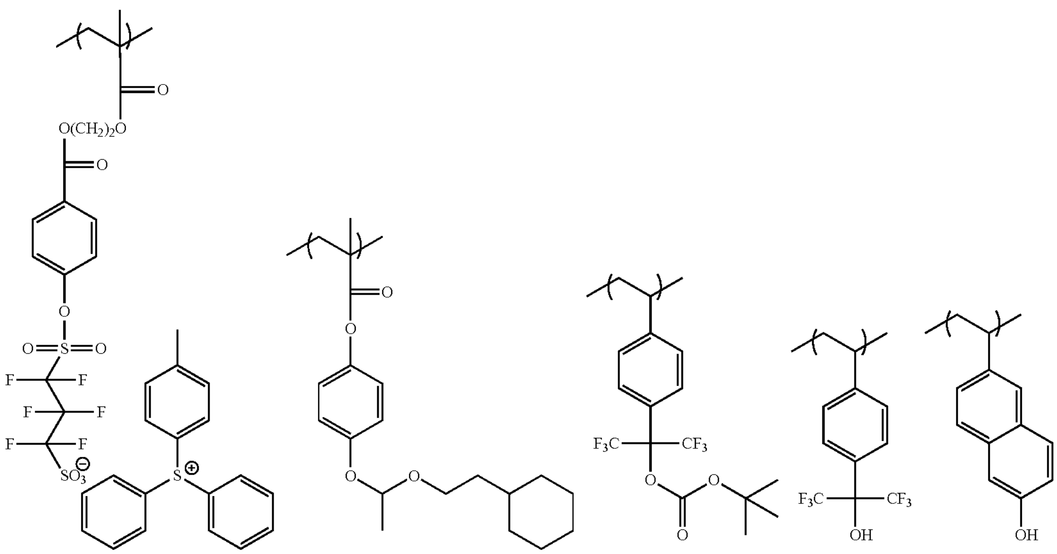
(P-4)
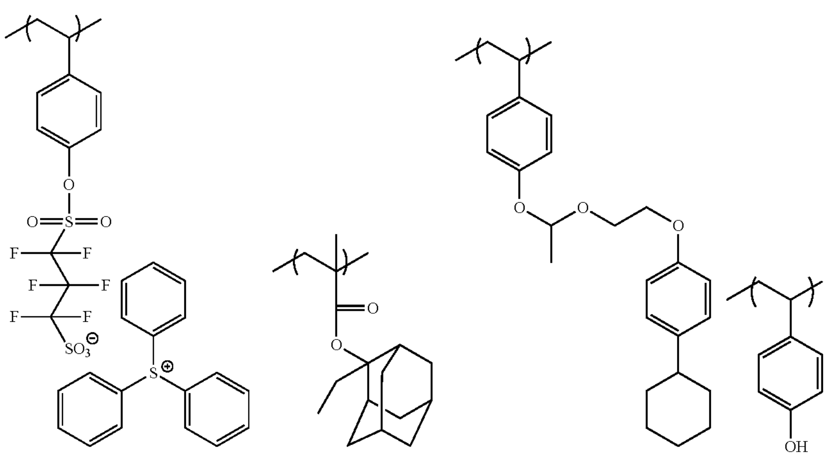
(P-5)

-continued
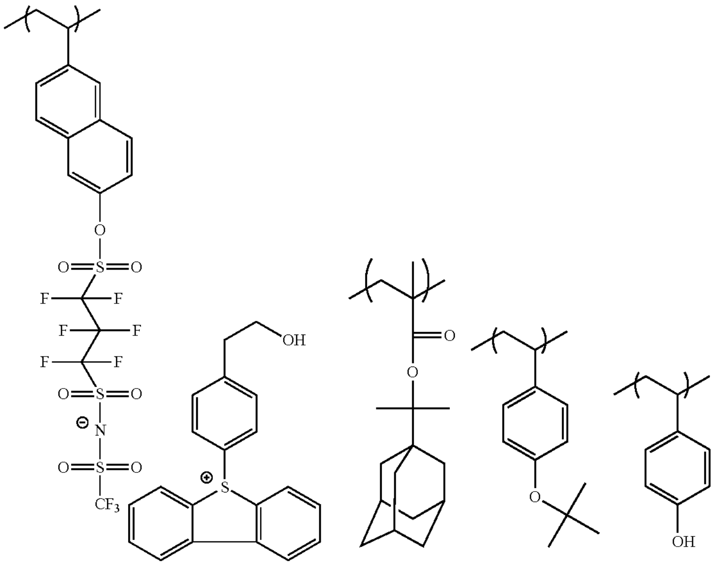
(P-6)
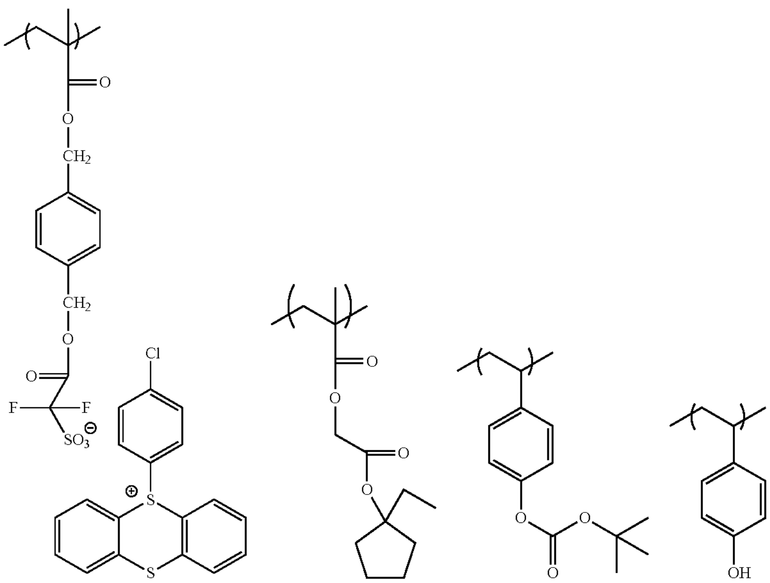
(P-7)
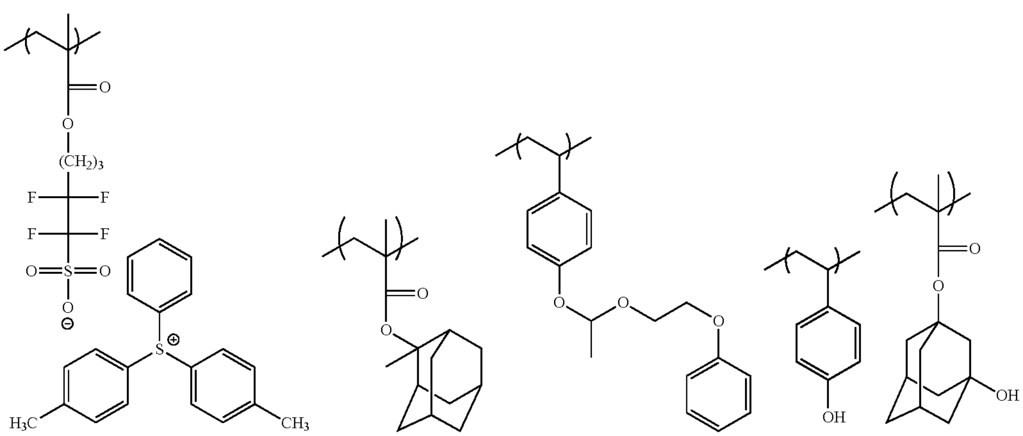
(P-8)

-continued
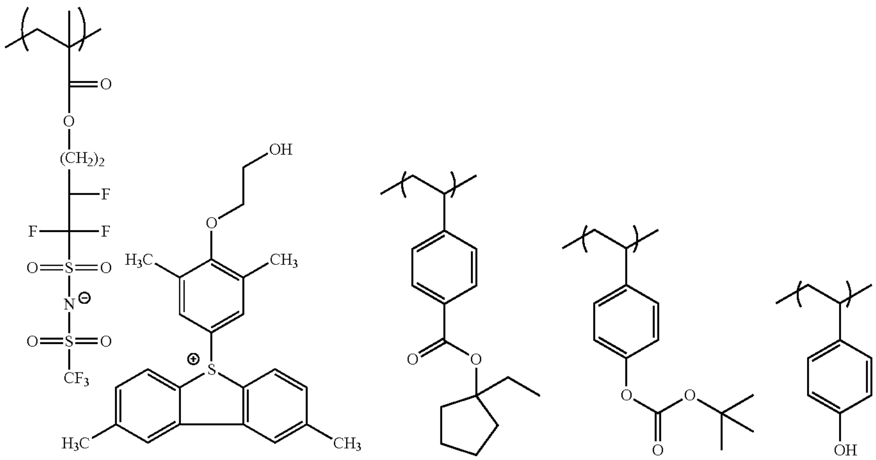
(P-9)
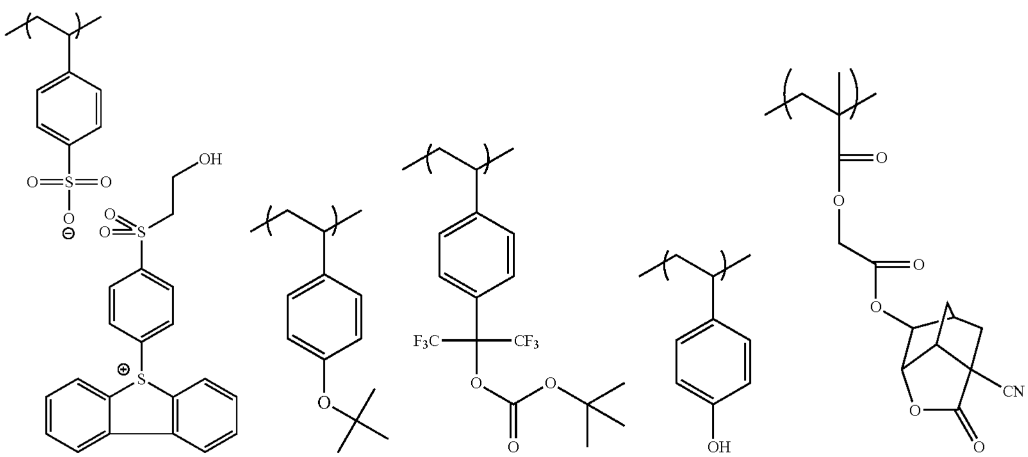
(P-10)
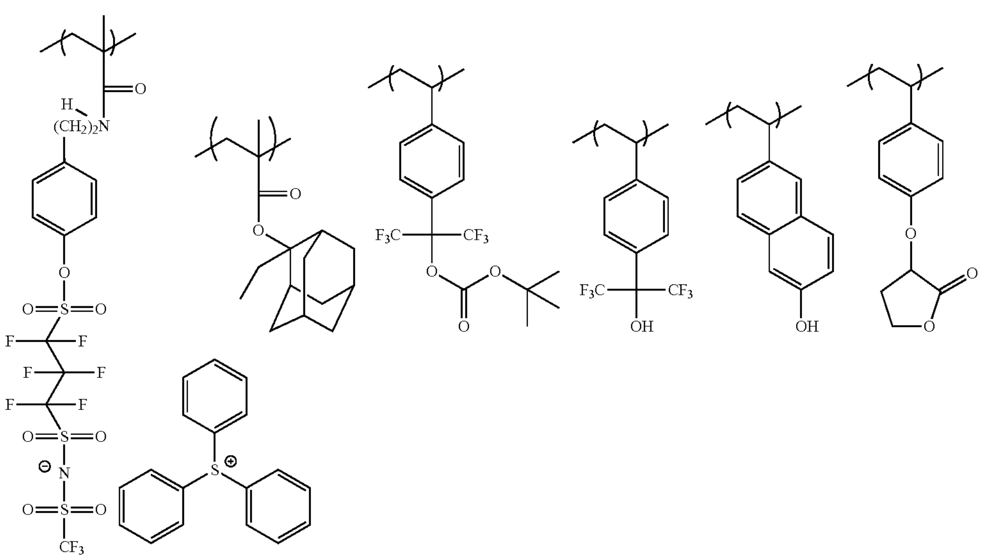
(P-11)

-continued
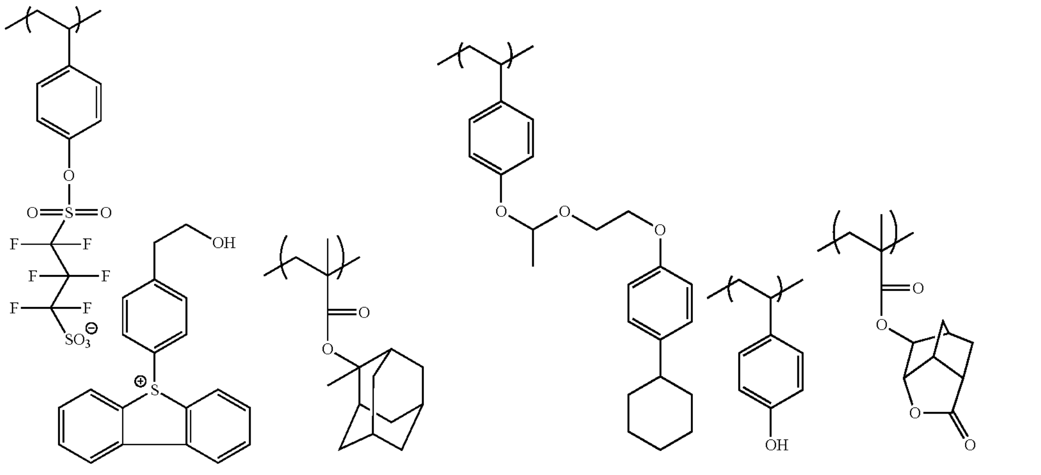
(P-12)
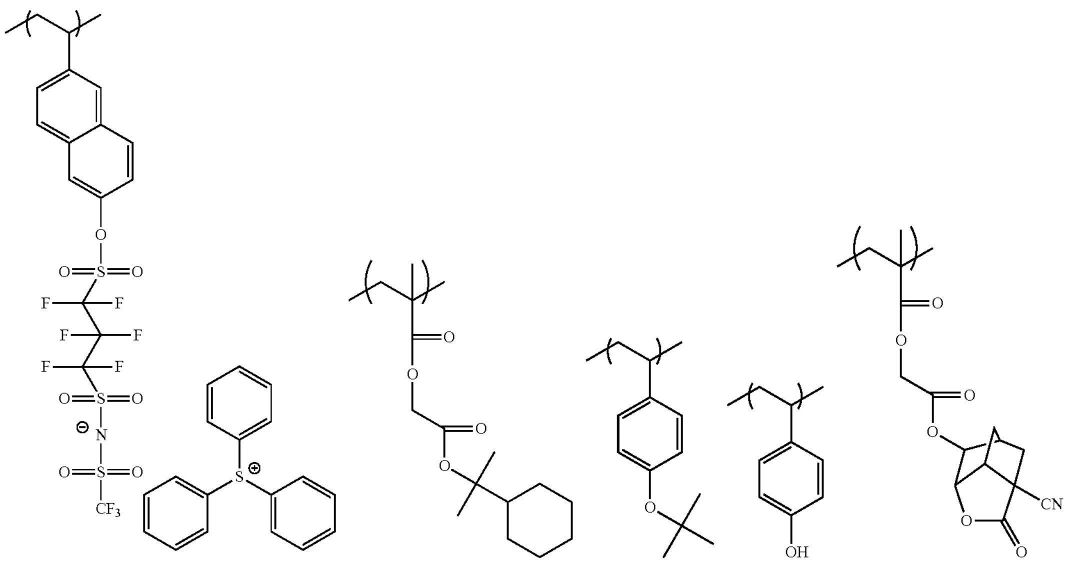
(P-13)
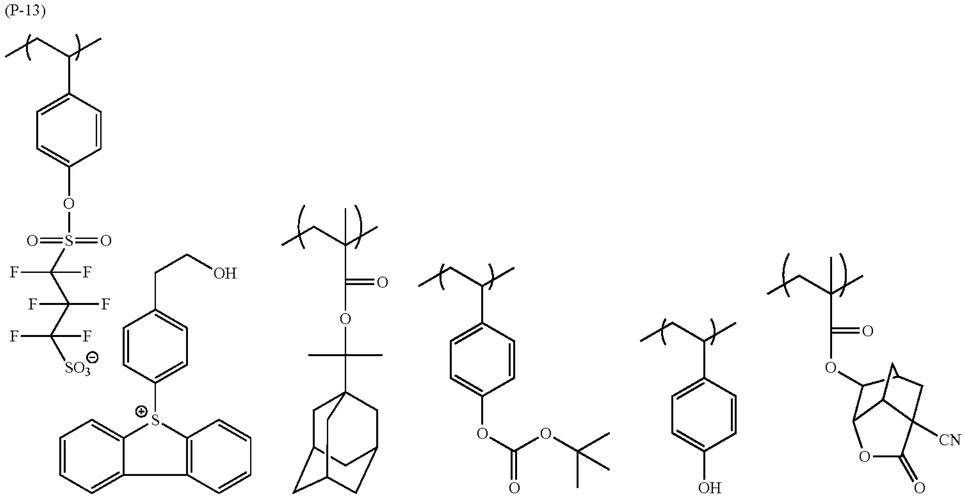
(P-14)

-continued
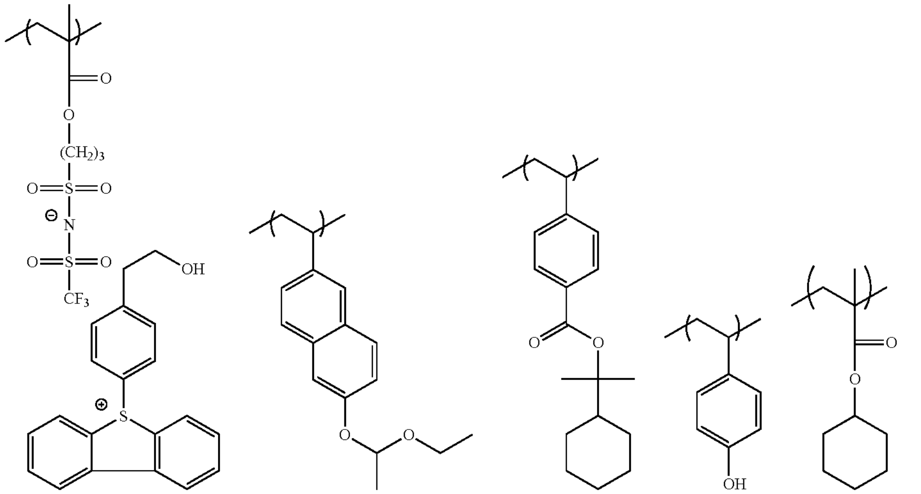
(P-15)
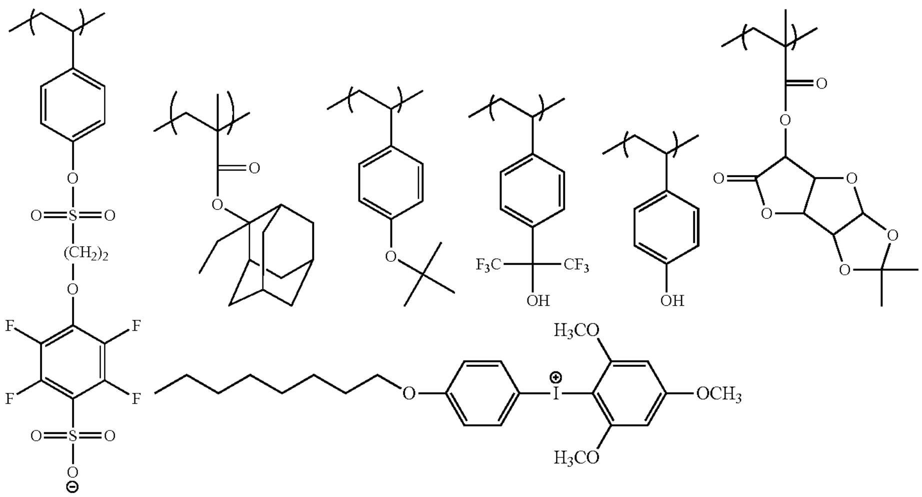
(P-16)
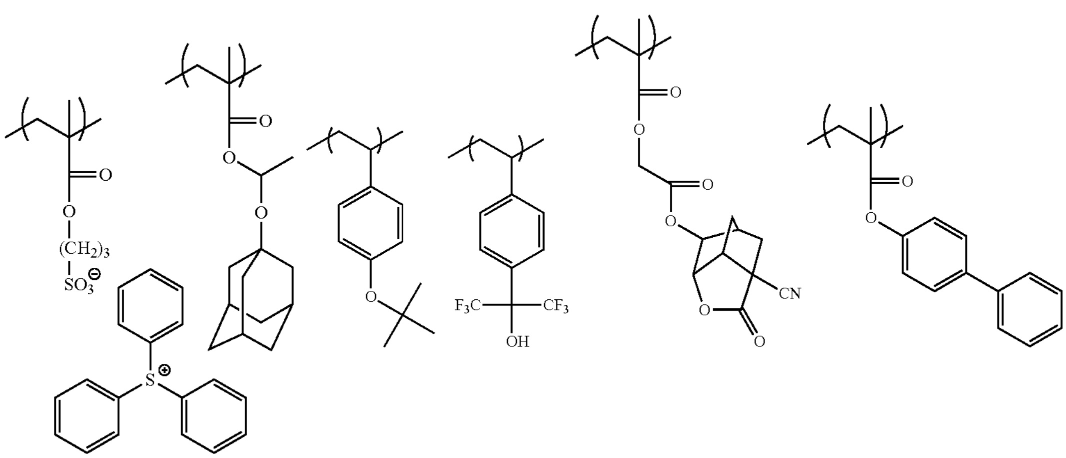
(P-17)

-continued
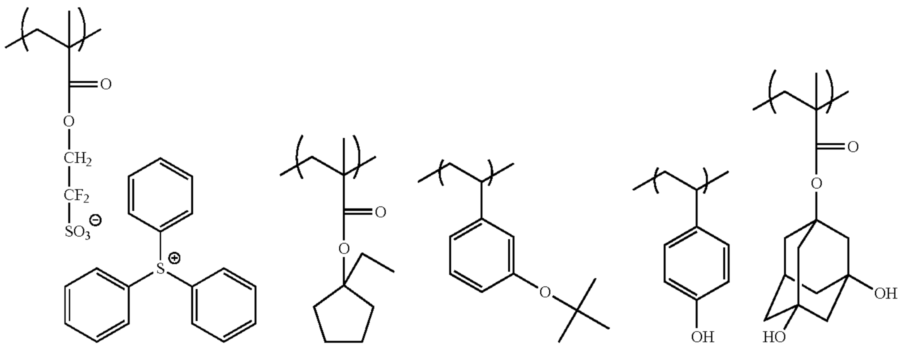
(P-18)
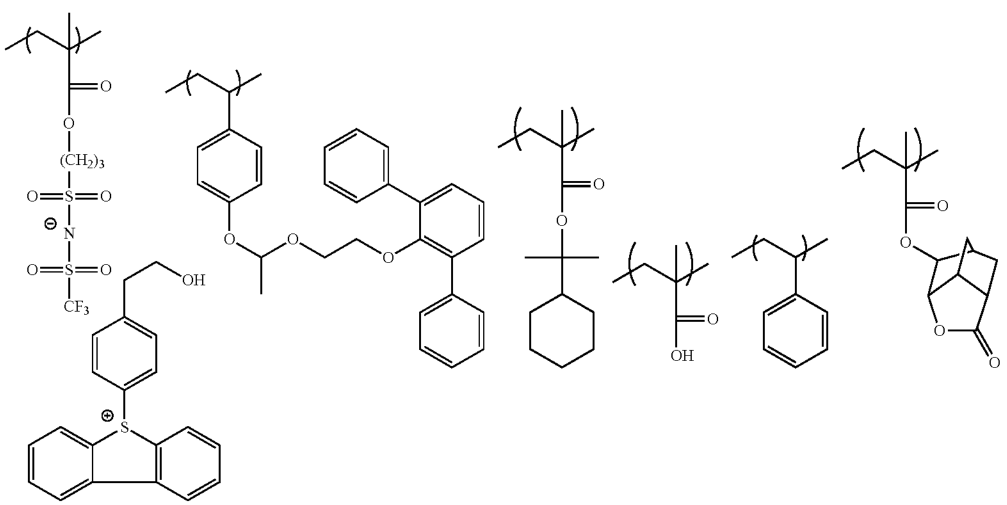
(P-19)
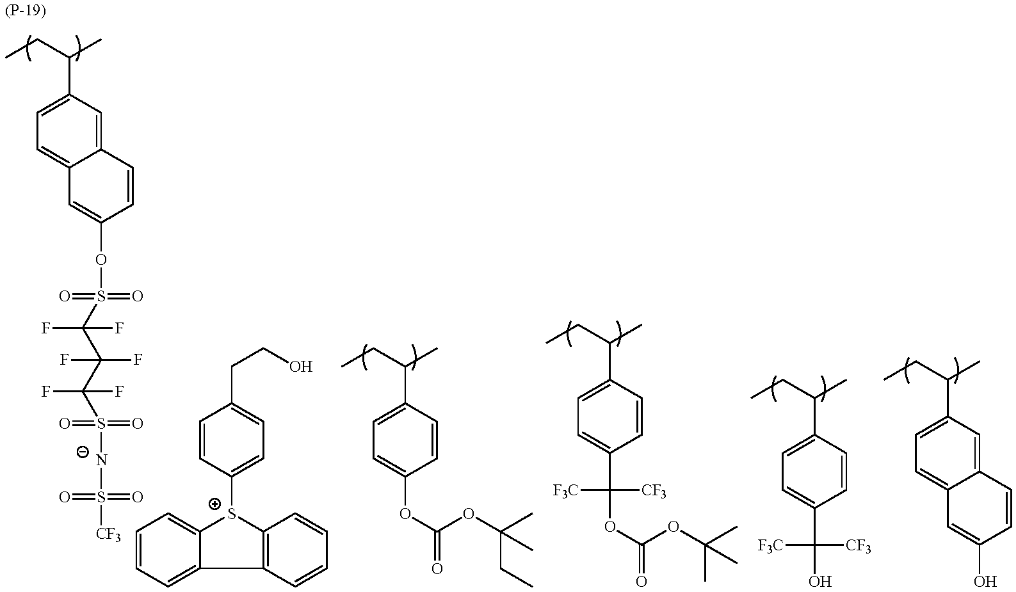
(P-20)

-continued
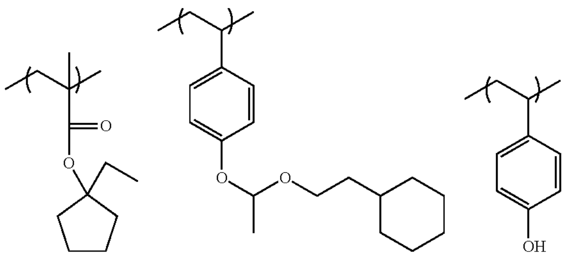
(P-21)
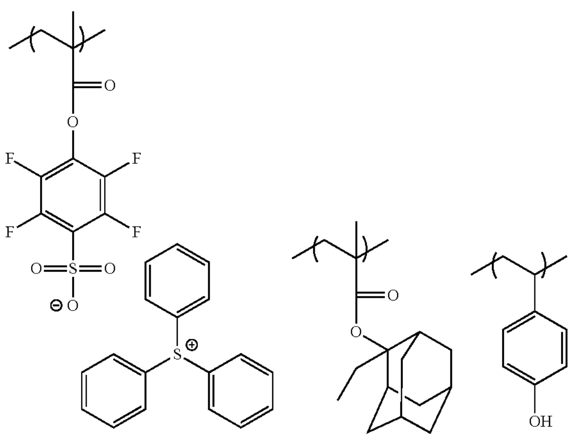
(P-22)
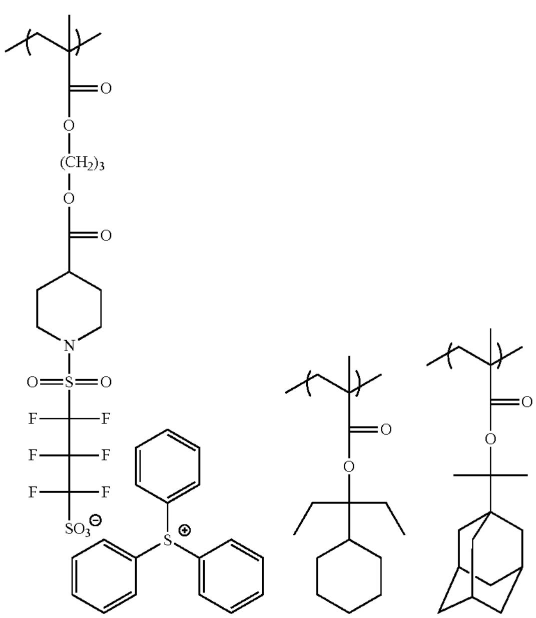
(P-23)

-continued

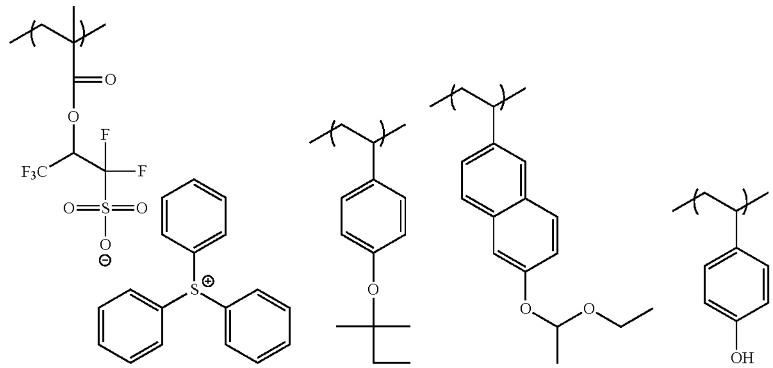

(P-24)

<Evaluation of Resist>

Referring to Table below, with respect to each of the resists, the individual components were dissolved in the solvent, thereby obtaining a solution of 4 mass % solid content. The solution was passed through a polytetrafluoroethylene filter of 0.10 μm pore size. Thus, the intended actinic-ray- or radiation-sensitive resin compositions were obtained. The actinic-ray- or radiation-sensitive resin compositions were evaluated by the following methods. The evaluation results are also given in the Table below.

With respect to each of the components of the Table, the ratio indicated when a plurality of species are used are mass ratio.

Exposure Condition 1: EB Exposure

Examples 1 to 30 and Comparative Examples 1 to 5

Each of the prepared radiation-sensitive resin compositions was uniformly applied onto a silicon substrate having undergone hexamethyldisilazane treatment by means of a spin coater, and dried by heating on a hot plate at 120° C. for 90 seconds. Thus, radiation-sensitive films each having a thickness of 100 nm were formed. Each of the formed radiation-sensitive films was irradiated with an electron beam by means of an electron beam irradiation apparatus (model HL750 manufactured by Hitachi, Ltd., acceleration voltage 50 keV). The irradiated film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and spin dried. Thus, resist patterns were formed.

Exposure Condition 2: EUV Exposure

Examples 31 to 35

Each of the prepared radiation-sensitive resin compositions was uniformly applied onto a silicon substrate having undergone hexamethyldisilazane treatment by means of a spin coater, and dried by heating on a hot plate at 120° C. for 90 seconds. Thus, radiation-sensitive films each having a thickness of 100 nm were formed. Each of the formed radiation-sensitive films was irradiated with EUV by means of an EUV exposure apparatus. The irradiated film was immediately baked on a hot plate at 110° C. for 90 seconds. The baked film was developed with a 2.38 mass % aqueous tetramethylammonium hydroxide solution at 23° C. for 60 seconds, rinsed with pure water for 30 seconds and spin dried. Thus, resist patterns were obtained.

(Evaluation of Sensitivity)

The configuration of a cross section of each of the obtained patterns was observed by means of a scanning electron microscope (model S-9220, manufactured by Hitachi, Ltd.). The sensitivity was defined as the minimum exposure energy at which a 100-nm line (line:space=1:1) could be resolved.

(Evaluation of Resolving Power)

The resolving power was defined as a limiting resolving power (line and space separated and resolved from each other) under the amount of exposure exhibiting the above sensitivity.

(Evaluation of Pattern Configuration)

The configuration of a cross section of each 100-nm line pattern formed under the amount of exposure exhibiting the above sensitivity was observed by means of a scanning electron microscope (model S-4300, manufactured by Hitachi, Ltd.) The pattern configuration was evaluated into being rectangular, slightly tapering and tapering on a 3-point scale.

(Evaluation of LER)

A 100-nm line pattern formed under the amount of exposure exhibiting the above sensitivity was observed by means of a scanning electron microscope (model S-9220, manufactured by Hitachi, Ltd.). The distance between actual edge and a reference line on which edges were to be present was measured on arbitrary 30 points within 50 μm in the longitudinal direction of the pattern. The standard deviation of measured distances was determined, and 3σ was computed therefrom.

(Evaluation of Iso/Dense Bias)

In the amount of exposure forming a 100-nm line-and-space pattern (1:1), with respect to a 100-nm line pattern, the line width of a dense pattern (line:space=1:1) and the line width of an isolated pattern (line:space=1:5) were measured. The line width difference was calculated as a parameter for iso/dense bias. The evaluation mark "○" was given when the line width difference was less than 30 nm, the evaluation mark "Δ" given when the line width difference was from 30 nm to less than 35 nm, and the evaluation mark "x" given when the line width difference was 35 nm or greater.

| EB exposure (resist composition) | | | | | | | |
|---|---|---|---|---|---|---|---|
| | Resin (P) (conc.) * | Other resin (conc.) * | Traditional acid generator (conc.) * | Basic compound (conc.) * | Organic solvent (D) (mass ratio) | Surfactant (conc.) * | Total solid conc. [mass %] |
| Ex. 1 | P-1 (99.95) | None | None | None | S1/S2/S5 (35/60/5) | W-1 (0.05) | 4.0 |
| Ex. 2 | P-2 (99.85) | None | None | TBAH (0.1) | S1/S2 (40/60) | W-2 (0.05) | 4.0 |
| Ex. 3 | P-3 (99.95) | None | None | None | S1/S2/S4 (35/60/5) | W-3 (0.05) | 4.0 |
| Ex. 4 | P-4 (99.95) | None | None | None | S1/S2 (30/70) | W-1 (0.05) | 4.0 |
| Ex. 5 | P-5 (99.95) | None | None | None | S1/S2 (40/60) | W-4 (0.05) | 4.0 |
| Ex. 6 | P-5 (99.75) | None | None | TBAH (0.1) TOA (0.1) | S1/S2 (40/60) | W-1 (0.05) | 4.0 |
| Ex. 7 | P-6 (99.85) | None | None | TBAH (0.1) | S1/S2/S3 (30/60/10) | W-3 (0.05) | 4.0 |
| Ex. 8 | P-7 (99.95) | None | None | None | S1/S2/S6 (30/60/10) | W-1 (0.05) | 4.0 |
| Ex. 9 | P-8 (99.85) | None | None | TBAH (0.1) | S1/S2 (40/60) | W-3 (0.05) | 4.0 |
| Ex. 10 | P-9 (99.95) | None | None | None | S1/S2/S4 (35/60/5) | W-2 (0.05) | 4.0 |
| Ex. 11 | P-10 (99.85) | None | None | TOA (0.1) | S1/S2/S7 (35/60/5) | W-2 (0.05) | 4.0 |
| Ex. 12 | P-11 (99.95) | None | None | None | S1/S2 (40/60) | W-3 (0.05) | 4.0 |
| Ex. 13 | P-11 (99.65) | None | PAG2 (1) | TOA (0.3) | S1/S2/S3 (30/60/10) | W-1 (0.05) | 4.0 |
| Ex. 14 | P-12 (99.95) | None | None | None | S1/S2 (40/60) | W-4 (0.05) | 4.0 |
| Ex. 15 | P-12/P-14 (50/49.8) | None | None | TBAH (0.15) | S1/S2 (40/60) | W-1 (0.05) | 4.0 |
| Ex. 16 | P-12 (99.85) | None | None | TPI (0.1) | S1/S2/S3 (30/60/10) | W-3 (0.05) | 4.0 |
| Ex. 17 | P-13 (99.95) | None | None | None | S1/S2/S5 (35/60/5) | W-1 (0.05) | 4.0 |
| Ex. 18 | P-13 (99.85) | None | None | TBAH (0.1) | S1/S2 (30/70) | W-2 (0.05) | 4.0 |
| Ex. 19 | P-14 (99.95) | None | None | None | S1/S2/S3 (30/60/10) | W-1 (0.05) | 4.0 |
| Ex. 20 | P-14 (99.85) | None | None | TOA (0.1) | S1/S2 (40/60) | W-3 (0.05) | 4.0 |
| Ex. 21 | P-14 (89.85) | P-21 (10) | None | TBAH (0.1) | S1/S2/S6 (35/60/5) | W-2 (0.05) | 4.0 |
| Ex. 22 | P-15 (100) | None | None | None | S1/S2/S5 (35/60/5) | None | 4.0 |
| Ex. 23 | P-16 (99.95) | None | None | None | S1/S2/S3 (30/60/10) | W-1 (0.05) | 4.0 |
| Ex. 24 | P-16 (99.8) | None | None | TPI (0.15) | S1/S2/S5 (35/60/5) | W-3 (0.05) | 4.0 |
| Ex. 25 | P-17 (99.95) | None | None | None | S1/S2 (40/60) | W-2 (0.05) | 4.0 |
| Ex. 26 | P-18 (99.85) | None | None | TBAH (0.1) | S1/S2/S6 (35/60/5) | W-1 (0.05) | 4.0 |
| Ex. 27 | P-19 (99.95) | None | None | None | S1/S2/S7 (35/60/75) | W-2 (0.05) | 4.0 |
| Ex. 28 | P-19 (99.85) | None | None | TOA (0.1) | S1/S2 (30/70) | W-3 (0.05) | 4.0 |
| Ex. 29 | P-20 (99.95) | None | None | None | S1/S2 (40/60) | W-2 (0.05) | 4.0 |
| Ex. 30 | P-20 (99.85) | None | None | TPI (0.1) | S1/S2/S4 (35/60/5) | W-1 (0.05) | 4.0 |
| Comp. 1 | P-21 (89.95) | None | PAG2 (10) | None | S1/S2 (40/60) | W-2 (0.05) | 4.0 |
| Comp. 2 | P-21 (78.45) | None | PAG2 (20) | TOA (1.5) | S1/S2 (40/60) | W-2 (0.05) | 4.0 |
| Comp. 3 | P-22 (99.85) | None | None | TBAH (0.1) | S1/S2/S3 (30/60/10) | W-1 (0.05) | 4.0 |
| Comp. 4 | P-23 (99.85) | None | None | TBAH (0.1) | S1/S2/S5 (30/60/5) | W-3 (0.05) | 4.0 |
| Comp. 5 | P-24 (99.85) | None | None | TBAH (0.1) | S1/S2 (40/60) | W-1 (0.05) | 4.0 |

| EB exposure (evaluation result) | | | | | |
|---|---|---|---|---|---|
| | Sensitivity ($\mu C/cm^2$) | Resolving power (nm) | Pattern configuration | LER (nm) | iso/dense bias |
| Ex.1 | 20.5 | 65 | Rectangle | 5.6 | ○ |
| Ex.2 | 18.4 | 60 | Rectangle | 5.3 | ○ |
| Ex.3 | 19.6 | 70 | Rectangle | 5.9 | ○ |
| Ex.4 | 17.8 | 70 | Rectangle | 6.1 | ○ |
| Ex.5 | 19.3 | 70 | Rectangle | 5.7 | ○ |
| Ex.6 | 24.9 | 65 | Rectangle | 5.2 | ○ |
| Ex.7 | 18.7 | 65 | Rectangle | 5.4 | ○ |
| Ex.8 | 18.8 | 70 | Rectangle | 5.8 | ○ |
| Ex.9 | 18.6 | 60 | Rectangle | 5.3 | ○ |
| Ex.10 | 19.1 | 65 | Rectangle | 5.5 | ○ |
| Ex.11 | 19.2 | 70 | Rectangle | 5.7 | ○ |
| Ex.12 | 20.5 | 65 | Rectangle | 5.2 | ○ |
| Ex.13 | 27.5 | 60 | Rectangle | 5.4 | ○ |
| Ex.14 | 19.5 | 55 | Rectangle | 4.9 | ○ |
| Ex.15 | 20.4 | 50 | Rectangle | 4.7 | ○ |
| Ex.16 | 23.1 | 50 | Rectangle | 4.3 | ○ |
| Ex.17 | 14.7 | 55 | Rectangle | 4.8 | ○ |
| Ex.18 | 19.3 | 50 | Rectangle | 4.2 | ○ |
| Ex.19 | 13.6 | 55 | Rectangle | 4.9 | ○ |
| Ex.20 | 18.7 | 50 | Rectangle | 4.3 | ○ |
| Ex.21 | 20.1 | 55 | Rectangle | 5.8 | ○ |
| Ex.22 | 20.4 | 65 | Rectangle | 5.5 | ○ |
| Ex.23 | 18.7 | 55 | Rectangle | 4.9 | ○ |
| Ex.24 | 20.8 | 50 | Rectangle | 4.3 | ○ |
| Ex.25 | 21.3 | 65 | Rectangle | 5.4 | ○ |
| Ex.26 | 19.1 | 60 | Rectangle | 5.1 | ○ |
| Ex.27 | 13.8 | 55 | Rectangle | 4.9 | ○ |
| Ex.28 | 18.2 | 50 | Rectangle | 4.5 | ○ |

-continued

| | | | | | |
|---|---|---|---|---|---|
| Ex.29 | 20.4 | 70 | Rectangle | 5.8 | ○ |
| Ex.30 | 24.8 | 65 | Rectangle | 5.4 | ○ |
| Comp.1 | 100-nm LS patten could not be formed. | | | | |
| Comp.2 | 20.8 | 85 | Taper | 8.8 | ○ |
| Comp.3 | 24.0 | 70 | Slightly tapering | 5.7 | x |
| Comp.4 | 51.3 | 80 | Rectangle | 7.5 | x |
| Comp.5 | 25.3 | 70 | Slightly tapering | 6.0 | x |

EUV exposure (resist composition)

| | Resin (P) (conc.) * | Other resin (conc.) * | Traditional acid generator (conc.) * | Basic compound (conc.) * | Organic solvent (D) (mass ratio) | Surfactant (conc.)* | Total solid conc.[mass %] |
|---|---|---|---|---|---|---|---|
| Ex.31 | P-5 (98.45) | None | None | TBAH (1.5) | S1/S2/S3 (30/60/10) | W-3 (0.05) | 4.0 |
| Ex.32 | P-6 (98.45) | None | None | TOA (1.5) | S1/S2 (40/60) | W-1 (0.05) | 4.0 |
| Ex.33 | P-12 (98.45) | None | None | TOA (1.5) | S1/S2/S3 (30/60/10) | W-1 (0.05) | 4.0 |

EUV exposure (evaluation result)

| | Sensitivity (mJ/cm$^2$) | Pattern configuration |
|---|---|---|
| Ex. 31 | 23.7 | Rectangle |
| Ex. 32 | 20.4 | Rectangle |
| Ex. 33 | 22.2 | Rectangle |

* The concentration of each of the components refers to the concentration (mass %) based on the mass of total solid contents.

Photoacid generator (PAG-2)

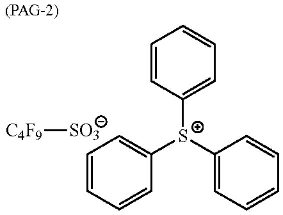

Basic compound

TBAH: tetrabutylammonium hydroxide,

TOA: tri(n-octyl)amine, and

TPI: triphenylimidazole.

Surfactant

W-1: Megafac F176 (produced by Dainippon Ink & Chemicals, Inc., fluorinated),

W-2: Megafac R08 (produced by Dainippon Ink & Chemicals, Inc., fluorinated and siliconized), W-3: polysiloxane polymer (produced by Shin-Etsu Chemical Co., Ltd., siliconized), and W-4: PF6320 (produced by Omnova Solutiond, INC., fluorinated).

Solvent

S1: propylene glycol monomethyl ether acetate (PGMEA; 1-methoxy-2-acetoxypropane), S2: propylene glycol monomethyl ether (PGME; 1-methoxy-2- propanol), S3: ethyl lactate, S4: 2-heptanone, S5: cyclohexanone, S6: γ-butyrolactone, and S7: propylene carbonate.

It is apparent from the results of foregoing tables that the actinic-ray- or radiation-sensitive resin compositions of the present invention are satisfactory in all the high sensitivity, high resolution, good pattern configuration, good line edge roughness and iso/dense bias under EB exposure.

It is also apparent that the actinic-ray- or radiation-sensitive resin compositions of the present invention simultaneously satisfy the requirements for high sensitivity and good pattern configuration under EUV exposure.

What is claimed is:

1. An actinic-ray- or radiation-sensitive resin composition comprising a resin (P) containing a repeating unit (A) represented by general formula (II) below that when exposed to actinic rays or radiation, is decomposed to thereby generate an acid and at least two types of repeating units (B1), (B2) that when acted on by an acid, are decomposed to thereby generate an alkali-soluble group, wherein the alkali-soluble group generated by the repeating unit (B1) is different from the alkali-soluble group generated by the repeating unit (B2), (II)

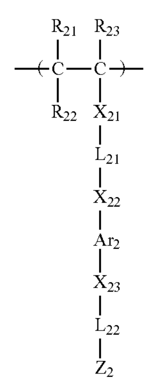

wherein in general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group, $X_{21}$ represents —O—, —S—, —CO—, —$SO_2$—, —NR— (R represents a hydrogen atom or an alkyl group), a bivalent nitrogen-containing nonaromatic heterocyclic group or a group composed of a combination of these, $L_{21}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group, a bivalent aromatic ring group or a group composed of a combination of these, each of $X_{22}$ and $X_{23}$ independently represents a single bond, —O—, —S—, —CO—, —$SO_2$—, —NR— (R represents a hydrogen atom or an alkyl group), a bivalent nitrogen-containing nonaromatic heterocyclic group or a group composed of a combination of these, $Ar_2$ represents a bivalent aromatic ring group or a group composed of a combination of a bivalent aromatic ring group and an alkylene group, $L_{22}$ represents an alkylene groupprovided that the hydrogen atoms of the alkylene group are partially or entirely substituted with a substituent selected from among a fluorine atom, a fluoroalkyl group, a nitro group and a cyano group, and $Z_2$ represents a moiety that when exposed to actinic rays or radiation, becomes a sulfonic acid group, an imidate group or a methide group.

2. The actinic-ray- or radiation-sensitive resin composition according to claim 1, wherein the repeating unit (B1) is expressed by general formula (V) below, and the repeating unit (B2) is expressed by general formula (VI) below, (V)

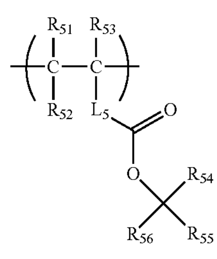

(VI)

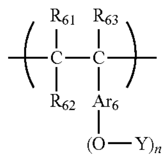

in general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring, which $R_{52}$ represents an alkylene group;

$L_5$ represents a single bond or a bivalent connecting group, provided that when a ring is formed in cooperation with $R_{52}$, $L_5$ represents a trivalent connecting group; and $R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, and provided that $R_{55}$ and $R_{56}$ are not simultaneously hydrogen atoms, and in general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, which $R_{62}$ represents an alkylene group;

$Ar_6$ represents a bivalent aromatic ring group;

Y, or each of Y's independently, represents a hydrogen atom or a group that when acted on by an acid, is cleaved, provided that at least one of Y's is a group that when acted on by an acid, is cleaved; and n is an integer of 1 to 4.

3. The actinic-ray- or radiation-sensitive resin composition according to claim 1, wherein the resin (P) further comprises a repeating unit (C) containing a group that when acted on by an alkali developer, is decomposed to thereby increase its solubility in the alkali developer.

4. A resist film produced from the composition according to claim 1.

5. A method of forming a pattern, comprising forming the actinic-ray- or radiation-sensitive resin composition according to claim 1 into a film, exposing the film and developing the exposed film.

6. The actinic-ray- or radiation-sensitive resin composition according to claim 1, wherein the resin (P) further comprises a repeating unit (D) expressed by general formula (IV) below, (IV)

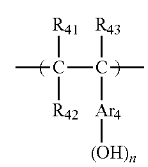

in the formula, each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring, which $R_{42}$ in this instance is an alkylene group, $Ar_4$ represents a bivalent aromatic ring group, and n is an integer of 1 to 4.

7. The actinic-ray- or radiation-sensitive resin composition according to claim 1, wherein $L_{22}$ in general formula (II) is an alkylene group substituted with a fluorine atom.

8. The actinic-ray- or radiation-sensitive resin composition according to claim 3, wherein the repeating unit (C) comprises a lactone structure.

9. The actinic-ray- or radiation-sensitive resin composition according to claim 1, further comprising an ammonium salt.

10. The actinic-ray- or radiation-sensitive resin composition according to claim 1, further comprising a compound that when acted on by an acid, increases its basicity.

11. An actinic-ray- or radiation-sensitive resin composition comprising a resin (P) containing a repeating unit (A) represented by either of general formula (I) and (II) below that when exposed to actinic rays or radiation, is decomposed to thereby generate an acid and at least two types of repeating units (B1), (B2) that when acted on by an acid, are decomposed to thereby generate an alkali-soluble group, wherein the alkali-soluble group generated by the repeating unit (B1) is different from the alkali-soluble group generated by the repeating unit (B2), (I)

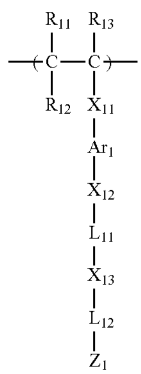

(II)

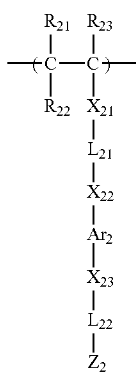

wherein in general formula (I), each of $R_{11}$, $R_{12}$ and $R_{13}$ independently represents a hydrogen atom, an alkyl group, a monovalent aliphatic hydrocarbon ring group, a halogen atom, a cyano group or an alkoxycarbonyl group, $X_{11}$ represents a single bond, $X_{12}$ represents —O—, —$SO_2$—, or a group composed of a combination of these, $X_{13}$ represents a single bond, —O—,—S—, —CO—, —$SO_2$—, —NR— (R represents a hydrogen atom or an alkyl group), a bivalent nitrogen-containing nonaromatic heterocyclic group or a group composed of a combination of these, $L_{11}$ represents a single bond, an alkylene group, an alkenylene group, a bivalent aliphatic hydrocarbon ring group, a bivalent aromatic ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these, $L_{12}$ represents an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these, $Ar_1$ represents a bivalent aromatic ring group or a group composed of a combination of a bivalent aromatic ring group and an alkylene group, $Z_1$ represents a moiety that when exposed to actinic rays or radiation, is converted to a sulfonic acid group, an imidate group or a methide group, in general formula (II), each of $R_{21}$, $R_{22}$ and $R_{23}$ independently represents a hydrogen atom, an alkyl group, a monovalent aliphatic hydrocarbon ring group, a halogen atom, a cyano group or an alkoxycarbonyl group, $X_{21}$ represents —O—, —S—, —CO—, —$SO_2$—, —NR— (R represents a hydrogen atom or an alkyl group), a bivalent nitrogen-containing nonaromatic heterocyclic group or a group composed of a combination of these, $L_{21}$ represents an alkylene group, an alkenylene group, a bivalent aliphatic hydrocarbon ring group or a group composed of a combination of two or more of these, provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group, a bivalent aromatic ring group or a group composed of a combination of these, each of $X_{22}$ and $X_{23}$ independently represents a single bond, —O—, —S—, —CO—, —$SO_2$—, —NR— (R represents a hydrogen atom or an alkyl group), a bivalent nitrogen-containing nonaromatic heterocyclic group or a group composed of a combination of these, $Ar_2$ represents a bivalent aromatic ring group or a group composed of a combination of a bivalent aromatic ring group and an alkylene group, $L_{22}$ represents an alkylene group, an alkenylene group, a bivalent aliphatic hydrocarbon ring group, a bivalent aromatic ring group or a group composed of a combination of two or more of these, provided that the hydrogen atoms of these groups are partially or entirely substituted with a substituent selected from among a fluorine atom, a fluoroalkyl group, a nitro group and a cyano group, and provided that in the group composed of a combination, two or more groups combined together may be identical to or different from each other and may be linked to each other through, as a connecting group, —O—, —S—, —CO—, —$SO_2$—, —NR— (R represents a hydrogen atom or an alkyl group), a bivalent nitrogen-containing nonaromatic heterocyclic group or a group composed of a combination of these, and $Z_2$ represents a moiety that when exposed to actinic rays or radiation, becomes a sulfonic acid group, an imidate group or a methide group.

12. The actinic-ray- or radiation-sensitive resin composition according to claim 11, wherein the repeating unit (B1) is expressed by general formula (V) below, and the repeating unit (B2) is expressed by general formula (VI) below, (V)

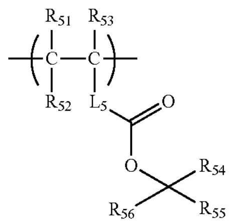

(VI)

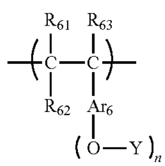

in general formula (V), each of $R_{51}$, $R_{52}$ and $R_{53}$ independently represents a hydrogen atom, an alkyl group, a monovalent aliphatic hydrocarbon ring group, a halogen atom, a cyano group or an alkoxycarbonyl group, provided that $R_{52}$ may be bonded to $L_5$ to thereby form a ring, which $R_{52}$ represents an alkylene group;

$L_5$ represents a single bond or a bivalent connecting group, provided that when a ring is formed in cooperation with $R_{52}$, $L_5$ represents a trivalent connecting group; and $R_{54}$ represents an alkyl group, and each of $R_{55}$ and $R_{56}$ independently represents a hydrogen atom, an alkyl group, a monovalent aliphatic hydrocarbon ring group or a monovalent aromatic ring group, provided that $R_{55}$ and $R_{56}$ may be bonded to each other to thereby form a ring, and provided that $R_{55}$ and $R_{56}$ are not simultaneously hydrogen atoms, and in general formula (VI), each of $R_{61}$, $R_{62}$ and $R_{63}$ independently represents a hydrogen atom, an alkyl group, a monovalent aliphatic hydrocarbon ring group, a halogen atom, a cyano group or an alkoxycarbonyl group, provided that $R_{62}$ may be bonded to $Ar_6$ to thereby form a ring, which $R_{62}$ represents an alkylene group;

$Ar_6$ represents a bivalent aromatic ring group;

Y, or each of Y's independently, represents a hydrogen atom or a group that when acted on by an acid, is cleaved, provided that at least one of Y's is a group that when acted on by an acid, is cleaved; and n is an integer of 1 to 4.

13. The actinic-ray- or radiation-sensitive resin composition according to claim 11, wherein the resin (P) further comprises a repeating unit (C) containing a group that when acted on by an alkali developer, is decomposed to thereby increase its solubility in the alkali developer.

14. The actinic-ray- or radiation-sensitive resin composition according to claim 11, wherein the resin (P) further comprises a repeating unit (D) expressed by general formula (IV) below, (IV)

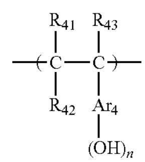

in the formula, each of $R_{41}$, $R_{42}$ and $R_{43}$ independently represents a hydrogen atom, an alkyl group, a monovalent aliphatic hydrocarbon ring group, a halogen atom, a cyano group or an alkoxycarbonyl group, provided that $R_{42}$ may be bonded to $Ar_4$ to thereby form a ring, which $R_{42}$ in this instance is an alkylene group, $Ar_4$ represents a bivalent aromatic ring group, and n is an integer of 1 to 4.

15. The actinic-ray- or radiation-sensitive resin composition according to claim 13, wherein the repeating unit (C) comprises a lactone structure.

* * * * *